United States Patent
Miles

(10) Patent No.: US 12,253,391 B2
(45) Date of Patent: Mar. 18, 2025

(54) MULTIELECTRODE CAPACITIVE SENSOR WITHOUT PULL-IN RISK

(71) Applicant: The Research Foundation for The State University of new York, Binghamton, NY (US)

(72) Inventor: Ronald N. Miles, Newark Valley, NY (US)

(73) Assignee: The Research Foundation for The State University of New York, Binghamton, NY (US)

( * ) Notice: Subject to any disclaimer, the term of this patent is extended or adjusted under 35 U.S.C. 154(b) by 680 days.

(21) Appl. No.: 17/058,102

(22) PCT Filed: May 23, 2019

(86) PCT No.: PCT/US2019/033855
§ 371 (c)(1),
(2) Date: Nov. 23, 2020

(87) PCT Pub. No.: WO2019/226958
PCT Pub. Date: Nov. 28, 2019

(65) Prior Publication Data
US 2021/0199494 A1    Jul. 1, 2021

Related U.S. Application Data

(60) Provisional application No. 62/676,058, filed on May 24, 2018, provisional application No. 62/676,071, filed on May 24, 2018.

(51) Int. Cl.
*G01D 5/241*      (2006.01)
*G01H 11/06*     (2006.01)
(Continued)

(52) U.S. Cl.
CPC .......... *G01D 5/2412* (2013.01); *G01H 11/06* (2013.01); *H03K 17/955* (2013.01); *H04R 19/04* (2013.01)

(58) Field of Classification Search
CPC ...... G01D 5/2412; G01H 11/06; G01R 27/26; G06F 3/044; H03K 17/955; H04R 19/04
See application file for complete search history.

(56) References Cited

U.S. PATENT DOCUMENTS 3,931,469 A    1/1976   Elliott et al.
3,935,397 A    1/1976   West
(Continued)

FOREIGN PATENT DOCUMENTS

| EP | 2773131 | 9/2014 | |
|---|---|---|---|
| WO | WO-2007062496 A1 * | 6/2007 | ............ G01P 15/125 |
| WO | WO 2010/140106 | 12/2010 | |

OTHER PUBLICATIONS

He, Siyuan, R. Ben Mrad, and J. S. Chang. "Development of a high-performance microelectrostatic repulsive-force rotation actuator." Journal of microelectromechanical systems 19, No. 3 (2010): 561-569. (Year: 2010).*

(Continued)

*Primary Examiner* — David L Singer
(74) *Attorney, Agent, or Firm* — Hoffberg & Associates; Steven M. Hoffberg

(57) ABSTRACT

A dynamic capacitive sensor configuration is disclosed which imposes minimal force and resistance to motion on the moving electrode. Moving electrodes avoid adverse effects of large bias voltages such as pull-in instability, despite arbitrary levels of compliance. This configuration facilitates incorporation of highly compliant and thin electrode materials that present the least possible resistance to motion. This type of material is particularly useful for sensing sound. A large bias voltage can be applied without (Continued)

influencing its motion, e.g., 400 V. The electrical sensitivity to sound is high, e.g., approximately 0.5 volts/pascal, two orders of magnitude greater than typical acoustic sensors.

20 Claims, 9 Drawing Sheets

(51) Int. Cl.
  *H03K 17/955* (2006.01)
  *H04R 19/04* (2006.01)

(56) References Cited

U.S. PATENT DOCUMENTS

| | | | |
|---|---|---|---|
| 3,941,946 A | 3/1976 | Kawakami et al. | |
| 3,942,029 A | 3/1976 | Kawakami et al. | |
| 3,944,756 A | 3/1976 | Lininger | |
| 3,946,422 A | 3/1976 | Yagi et al. | |
| 3,958,662 A | 5/1976 | Brzezinski et al. | |
| 3,961,202 A | 6/1976 | Kono et al. | |
| 3,980,838 A | 9/1976 | Yakushiji et al. | |
| 3,992,585 A | 11/1976 | Turner et al. | |
| 4,006,317 A | 2/1977 | Freeman | |
| 4,014,091 A | 3/1977 | Kodera et al. | |
| 4,034,332 A | 7/1977 | Alais | |
| 4,037,062 A | 7/1977 | Fergason | |
| 4,046,974 A | 9/1977 | Baumhauer, Jr. et al. | |
| 4,063,050 A | 12/1977 | Carlson et al. | |
| 4,081,626 A | 3/1978 | Muggli et al. | |
| 4,085,297 A | 4/1978 | Paglia | |
| 4,093,884 A | 6/1978 | Dreyfus et al. | |
| 4,122,302 A | 10/1978 | Bobb | |
| 4,149,095 A | 4/1979 | Poirier et al. | |
| 4,151,480 A | 4/1979 | Carlson et al. | |
| 4,160,882 A | 7/1979 | Driver | |
| 4,170,721 A | 10/1979 | Ishibashi et al. | |
| 4,188,513 A | 2/1980 | Morrell et al. | |
| 4,207,442 A | 6/1980 | Freeman | |
| 4,215,249 A | 7/1980 | Reynard et al. | |
| 4,225,755 A | 9/1980 | Block | |
| 4,246,448 A | 1/1981 | Tam et al. | |
| 4,246,449 A | 1/1981 | Biber | |
| 4,249,043 A | 2/1981 | Morgan et al. | |
| 4,281,221 A | 7/1981 | DelBello | |
| 4,288,735 A | 9/1981 | Crites | |
| 4,289,936 A | 9/1981 | Civitello | |
| 4,302,634 A | 11/1981 | Paglia | |
| 4,311,881 A | 1/1982 | Reynard | |
| 4,323,736 A | 4/1982 | Strickland | |
| 4,329,547 A | 5/1982 | Imai | |
| 4,360,955 A | 11/1982 | Block | |
| 4,401,858 A | 8/1983 | Reynard et al. | |
| 4,403,117 A | 9/1983 | Paglia | |
| 4,409,441 A | 10/1983 | Murray, Jr. et al. | |
| 4,414,433 A | 11/1983 | Horie et al. | |
| 4,420,790 A | 12/1983 | Golke et al. | |
| 4,429,189 A | 1/1984 | Berkley et al. | |
| 4,429,191 A | 1/1984 | Busch-Vishniac et al. | |
| 4,429,192 A | 1/1984 | Busch-Vishniac et al. | |
| 4,429,193 A | 1/1984 | Busch-Vishniac et al. | |
| 4,434,327 A | 2/1984 | Busch-Vishniac et al. | |
| 4,436,648 A | 3/1984 | Khanna et al. | |
| 4,439,641 A | 3/1984 | Paglia | |
| 4,439,642 A | 3/1984 | Reynard | |
| 4,461,931 A | 7/1984 | Peters | |
| 4,489,278 A | 12/1984 | Sawazaki | |
| 4,491,697 A | 1/1985 | Tanaka et al. | |
| 4,492,825 A | 1/1985 | Brzezinski et al. | |
| 4,515,997 A | 5/1985 | Stinger, Jr. | |
| 4,524,247 A | 6/1985 | Lindenberger et al. | |
| 4,533,795 A | 8/1985 | Baumhauer, Jr. et al. | |
| 4,541,112 A | 9/1985 | Kern | |
| 4,542,264 A | 9/1985 | Schmidt et al. | |
| 4,558,184 A | 12/1985 | Busch-Vishniac et al. | |
| 4,567,445 A | 1/1986 | Berg | |
| 4,582,961 A | 4/1986 | Frederiksen | |
| 4,615,105 A | 10/1986 | Wada et al. | |
| 4,621,171 A | 11/1986 | Wada et al. | |
| 4,764,690 A | 8/1988 | Murphy et al. | |
| 4,767,973 A | 8/1988 | Jacobsen et al. | |
| 4,790,021 A | 12/1988 | Pribyl | |
| 4,796,725 A | 1/1989 | Katayama | |
| 4,802,227 A | 1/1989 | Elko et al. | |
| 4,849,050 A | 7/1989 | Evans et al. | |
| 4,849,071 A | 7/1989 | Evans et al. | |
| 4,922,471 A | 5/1990 | Kuehnel | |
| 4,977,590 A | 12/1990 | Milovancevic | |
| 4,993,072 A | 2/1991 | Murphy | |
| 5,014,322 A | 5/1991 | Yasuda et al. | |
| 5,038,459 A | 8/1991 | Yasuda et al. | |
| 5,054,081 A | 10/1991 | West | |
| 5,097,224 A | 3/1992 | Madaffari et al. | |
| 5,161,128 A | 11/1992 | Kenney | |
| 5,206,914 A | 4/1993 | Fortney et al. | |
| 5,208,789 A | 5/1993 | Ling | |
| 5,214,709 A | 5/1993 | Ribic | |
| 5,335,210 A | 8/1994 | Bernstein | |
| 5,392,358 A | 2/1995 | Driver | |
| 5,452,268 A | 9/1995 | Bernstein | |
| 5,471,540 A | 11/1995 | Maeda | |
| 5,490,220 A | 2/1996 | Loeppert | |
| 5,570,428 A | 10/1996 | Madaffari et al. | |
| 5,573,679 A | 11/1996 | Mitchell et al. | |
| 5,590,212 A | 12/1996 | Uryu et al. | |
| 5,600,610 A | 2/1997 | Hill et al. | |
| 5,712,598 A | 1/1998 | Tomikawa | |
| 5,745,438 A | 4/1998 | Hill et al. | |
| 5,802,198 A | 9/1998 | Beavers et al. | |
| 5,854,846 A | 12/1998 | Beavers | |
| 5,862,239 A | 1/1999 | Kubli et al. | |
| 5,870,482 A * | 2/1999 | Loeppert | G01H 11/06 381/174 |
| 5,948,981 A | 9/1999 | Woodruff | |
| 5,978,491 A | 11/1999 | Papadopoulos | |
| 6,075,867 A | 6/2000 | Bay et al. | |
| 6,104,492 A | 8/2000 | Giles et al. | |
| 6,125,189 A | 9/2000 | Yasuno et al. | |
| 6,128,122 A | 10/2000 | Drake et al. | |
| 6,145,186 A | 11/2000 | Beavers | |
| 6,164,134 A | 12/2000 | Cargille | |
| 6,175,636 B1 | 1/2001 | Norris et al. | |
| 6,178,249 B1 | 1/2001 | Hietanen et al. | |
| 6,188,772 B1 | 2/2001 | Norris et al. | |
| 6,199,575 B1 | 3/2001 | Widner | |
| 6,201,629 B1 | 3/2001 | McClelland et al. | |
| 6,201,874 B1 | 3/2001 | Croft, III et al. | |
| 6,218,883 B1 | 4/2001 | Takeuchi | |
| 6,243,474 B1 | 6/2001 | Tai et al. | |
| 6,249,075 B1 | 6/2001 | Bishop et al. | |
| 6,273,544 B1 | 8/2001 | Silverbrook | |
| 6,304,662 B1 | 10/2001 | Norris et al. | |
| 6,308,398 B1 | 10/2001 | Beavers | |
| 6,309,048 B1 | 10/2001 | Silverbrook | |
| 6,312,114 B1 | 11/2001 | Silverbrook | |
| 6,312,393 B1 | 11/2001 | Abreu | |
| 6,343,129 B1 | 1/2002 | Pelrine et al. | |
| 6,353,492 B2 | 3/2002 | McClelland et al. | |
| 6,357,299 B1 | 3/2002 | Aigner et al. | |
| 6,360,035 B1 | 3/2002 | Hurst, Jr. et al. | |
| 6,360,601 B1 | 3/2002 | Challoner et al. | |
| 6,366,678 B1 | 4/2002 | Madaffari et al. | |
| 6,376,971 B1 | 4/2002 | Pelrine et al. | |
| 6,378,989 B1 | 4/2002 | Silverbrook | |
| 6,393,129 B1 | 5/2002 | Conrad et al. | |
| 6,408,878 B2 | 6/2002 | Unger et al. | |
| 6,424,466 B1 | 7/2002 | Flanders | |
| 6,427,015 B1 | 7/2002 | Backram et al. | |
| 6,433,911 B1 | 8/2002 | Chen et al. | |
| 6,434,245 B1 | 8/2002 | Zimmermann | |
| 6,439,689 B1 | 8/2002 | Silverbrook | |
| 6,439,699 B1 | 8/2002 | Silverbrook | |
| 6,441,451 B1 | 8/2002 | Ikeda et al. | |
| 6,443,558 B1 | 9/2002 | Silverbrook | |
| 6,449,370 B1 | 9/2002 | Yasuno et al. | |

(56) References Cited

U.S. PATENT DOCUMENTS

| | | |
|---|---|---|
| 6,450,628 B1 | 9/2002 | Jeanmaire et al. |
| 6,474,781 B1 | 11/2002 | Jeanmaire |
| 6,480,645 B1 | 11/2002 | Peale et al. |
| 6,481,835 B2 | 11/2002 | Hawkins et al. |
| 6,483,924 B1 | 11/2002 | Kirjavainen |
| 6,491,362 B1 | 12/2002 | Jeanmaire |
| 6,493,288 B2 | 12/2002 | Khuri-Yakub et al. |
| 6,504,937 B1 | 1/2003 | Papadopoulos et al. |
| 6,508,546 B2 | 1/2003 | Silverbrook |
| 6,510,231 B2 | 1/2003 | Barnert |
| 6,517,197 B2 | 2/2003 | Hawkins et al. |
| 6,529,652 B1 | 3/2003 | Brener |
| 6,531,668 B1 | 3/2003 | Ma |
| 6,535,460 B2 | 3/2003 | Loeppert et al. |
| 6,535,612 B1 | 3/2003 | Croft, III et al. |
| 6,538,799 B2 | 3/2003 | McClelland et al. |
| 6,543,110 B1 | 4/2003 | Pelrine et al. |
| 6,544,193 B2 | 4/2003 | Abreu |
| 6,545,384 B1 | 4/2003 | Pelrine et al. |
| 6,547,371 B2 | 4/2003 | Silverbrook |
| 6,549,692 B1 | 4/2003 | Harel et al. |
| 6,554,410 B2 | 4/2003 | Jeanmaire et al. |
| 6,572,220 B1 | 6/2003 | Ross et al. |
| 6,575,566 B1 | 6/2003 | Jeanmaire et al. |
| 6,580,797 B1 | 6/2003 | Papadopoulos et al. |
| 6,583,533 B2 | 6/2003 | Pelrine et al. |
| 6,584,206 B2 | 6/2003 | Ohashi |
| 6,588,882 B2 | 7/2003 | Silverbrook |
| 6,591,029 B1 | 7/2003 | Lin et al. |
| 6,592,207 B1 | 7/2003 | Silverbrook |
| 6,594,057 B1 | 7/2003 | Drake et al. |
| 6,598,964 B2 | 7/2003 | Silverbrook |
| 6,600,825 B1 | 7/2003 | Leysieffer |
| 6,621,134 B1 | 9/2003 | Zurn |
| 6,623,108 B2 | 9/2003 | Silverbrook |
| 6,625,399 B1 | 9/2003 | Davis |
| 6,628,791 B1 | 9/2003 | Bank et al. |
| 6,630,639 B2 | 10/2003 | McSwiggen |
| 6,634,735 B1 | 10/2003 | Silverbrook |
| 6,641,273 B1 | 11/2003 | Staker et al. |
| 6,642,067 B2 | 11/2003 | Dwyer |
| 6,644,793 B2 | 11/2003 | Silverbrook |
| 6,652,082 B2 | 11/2003 | Silverbrook |
| 6,661,897 B2 | 12/2003 | Smith |
| 6,664,718 B2 | 12/2003 | Pelrine et al. |
| 6,666,548 B1 | 12/2003 | Sadasivan et al. |
| 6,667,189 B1 | 12/2003 | Wang et al. |
| 6,670,809 B1 | 12/2003 | Edelstein et al. |
| 6,677,176 B2 | 1/2004 | Wong et al. |
| 6,698,867 B2 | 3/2004 | Silverbrook |
| 6,724,058 B2 | 4/2004 | Aigner et al. |
| 6,731,766 B2 | 5/2004 | Yasuno et al. |
| 6,733,116 B1 | 5/2004 | Silverbrook |
| 6,741,709 B2 | 5/2004 | Kay et al. |
| 6,742,873 B1 | 6/2004 | Silverbrook |
| 6,744,896 B2 | 6/2004 | Tanabe et al. |
| 6,745,627 B1 | 6/2004 | Woodruff et al. |
| 6,746,108 B1 | 6/2004 | Jeanmaire |
| 6,749,568 B2 | 6/2004 | Fleischman et al. |
| 6,756,248 B2 | 6/2004 | Ikeda et al. |
| 6,760,455 B2 | 7/2004 | Croft, III et al. |
| 6,768,181 B2 | 7/2004 | Dwyer |
| 6,781,284 B1 | 8/2004 | Pelrine et al. |
| 6,784,500 B2 | 8/2004 | Lemkin |
| 6,785,393 B2 | 8/2004 | Lipponen et al. |
| 6,786,573 B2 | 9/2004 | Silverbrook |
| 6,788,794 B2 | 9/2004 | Corsaro et al. |
| 6,788,795 B2 | 9/2004 | Scheeper et al. |
| 6,793,328 B2 | 9/2004 | Jeanmaire |
| 6,793,753 B2 | 9/2004 | Unger et al. |
| 6,798,729 B1 | 9/2004 | Hurst, Jr. et al. |
| 6,798,796 B2 | 9/2004 | Hiroshi et al. |
| 6,799,835 B2 | 10/2004 | Silverbrook |
| 6,804,362 B1 | 10/2004 | Zimmermann et al. |
| 6,805,435 B2 | 10/2004 | Silverbrook |
| 6,805,454 B2 | 10/2004 | Staker et al. |
| 6,806,593 B2 | 10/2004 | Tai et al. |
| 6,808,253 B2 | 10/2004 | Silverbrook |
| 6,812,620 B2 | 11/2004 | Scheeper et al. |
| 6,812,624 B1 | 11/2004 | Pei et al. |
| 6,818,092 B2 | 11/2004 | Cho et al. |
| 6,819,769 B1 | 11/2004 | Zimmermann |
| 6,824,257 B2 | 11/2004 | Silverbrook |
| 6,827,428 B2 | 12/2004 | Silverbrook |
| 6,827,429 B2 | 12/2004 | Jeanmaire et al. |
| 6,829,131 B1 | 12/2004 | Loeb et al. |
| 6,832,828 B2 | 12/2004 | Silverbrook |
| 6,842,964 B1 | 1/2005 | Tucker et al. |
| 6,847,036 B1 | 1/2005 | Darling et al. |
| 6,848,181 B1 | 2/2005 | Silverbrook |
| 6,848,317 B2 | 2/2005 | Kim |
| 6,851,796 B2 | 2/2005 | Jeanmaire et al. |
| 6,860,590 B2 | 3/2005 | Silverbrook |
| 6,863,378 B2 | 3/2005 | Silverbrook |
| 6,863,384 B2 | 3/2005 | Jeanmaire |
| 6,866,369 B2 | 3/2005 | Silverbrook |
| 6,870,938 B2 | 3/2005 | Takeuchi et al. |
| 6,870,939 B2 | 3/2005 | Chiang et al. |
| 6,880,235 B2 | 4/2005 | Ma |
| 6,880,922 B2 | 4/2005 | Silverbrook |
| 6,883,904 B2 | 4/2005 | Jeanmaire et al. |
| 6,883,906 B2 | 4/2005 | Silverbrook |
| 6,886,915 B2 | 5/2005 | Silverbrook |
| 6,889,555 B1 | 5/2005 | Ganapathi |
| 6,890,059 B2 | 5/2005 | Silverbrook |
| 6,891,240 B2 | 5/2005 | Dunec et al. |
| 6,899,137 B2 | 5/2005 | Unger et al. |
| 6,899,416 B2 | 5/2005 | Silverbrook |
| 6,902,255 B1 | 6/2005 | Silverbrook |
| 6,905,195 B2 | 6/2005 | Silverbrook |
| 6,905,620 B2 | 6/2005 | Silverbrook |
| 6,911,764 B2 | 6/2005 | Pelrine et al. |
| 6,913,347 B2 | 7/2005 | Silverbrook |
| 6,916,087 B2 | 7/2005 | Silverbrook |
| 6,916,091 B2 | 7/2005 | Silverbrook |
| 6,918,655 B2 | 7/2005 | Silverbrook |
| 6,921,150 B2 | 7/2005 | Silverbrook |
| 6,922,118 B2 | 7/2005 | Kubena et al. |
| 6,923,526 B2 | 8/2005 | Silverbrook |
| 6,926,670 B2 | 8/2005 | Rich et al. |
| 6,929,030 B2 | 8/2005 | Unger et al. |
| 6,929,350 B2 | 8/2005 | Silverbrook |
| 6,935,165 B2 | 8/2005 | Bashir et al. |
| 6,938,989 B2 | 9/2005 | Silverbrook |
| 6,938,991 B2 | 9/2005 | Silverbrook |
| 6,938,994 B2 | 9/2005 | Silverbrook |
| 6,940,211 B2 | 9/2005 | Pelrine et al. |
| 6,944,308 B2 | 9/2005 | Gullov et al. |
| 6,949,756 B2 | 9/2005 | Gerlach et al. |
| 6,955,428 B2 | 10/2005 | Silverbrook |
| 6,974,206 B2 | 12/2005 | Silverbrook |
| 6,978,029 B1 | 12/2005 | Ikeda |
| 6,987,859 B2 | 1/2006 | Loeppert et al. |
| 6,988,785 B2 | 1/2006 | Silverbrook |
| 6,988,789 B2 | 1/2006 | Silverbrook |
| 6,988,790 B2 | 1/2006 | Silverbrook |
| 6,991,318 B2 | 1/2006 | Silverbrook |
| 6,994,424 B2 | 2/2006 | Silverbrook |
| 6,994,426 B2 | 2/2006 | Silverbrook |
| 6,994,430 B2 | 2/2006 | Silverbrook |
| 6,994,672 B2 | 2/2006 | Fleischman et al. |
| 6,998,278 B2 | 2/2006 | Silverbrook |
| 7,001,007 B2 | 2/2006 | Silverbrook |
| 7,003,127 B1 | 2/2006 | Sjursen et al. |
| 7,004,563 B2 | 2/2006 | Silverbrook |
| 7,004,577 B2 | 2/2006 | Silverbrook |
| 7,006,720 B2 | 2/2006 | Dunec et al. |
| 7,014,296 B2 | 3/2006 | Silverbrook |
| 7,014,298 B2 | 3/2006 | Silverbrook |
| 7,014,785 B2 | 3/2006 | Silverbrook |
| 7,019,955 B2 | 3/2006 | Loeb et al. |
| 7,023,066 B2 | 4/2006 | Lee et al. |
| 7,025,324 B1 | 4/2006 | Slocum et al. |
| 7,028,474 B2 | 4/2006 | Silverbrook |

(56) References Cited

U.S. PATENT DOCUMENTS

| | | |
|---|---|---|
| 7,032,992 B2 | 4/2006 | Silverbrook |
| 7,032,997 B2 | 4/2006 | Silverbrook |
| 7,034,432 B1 | 4/2006 | Pelrine et al. |
| 7,034,854 B2 | 4/2006 | Cruchon-Dupeyrat et al. |
| 7,036,372 B2 | 5/2006 | Chojnacki et al. |
| 7,039,202 B1 | 5/2006 | Takeuchi |
| 7,040,173 B2 | 5/2006 | Dehe |
| 7,040,338 B2 | 5/2006 | Unger et al. |
| 7,041,063 B2 | 5/2006 | Abreu |
| 7,046,002 B1 | 5/2006 | Edelstein |
| 7,048,868 B2 | 5/2006 | Silverbrook |
| 7,049,732 B2 | 5/2006 | Pei et al. |
| 7,052,114 B2 | 5/2006 | Silverbrook |
| 7,052,120 B2 | 5/2006 | Silverbrook |
| 7,054,456 B2 | 5/2006 | Smits et al. |
| 7,054,519 B1 | 5/2006 | Novotny |
| 7,062,055 B2 | 6/2006 | Pelrine et al. |
| 7,064,472 B2 | 6/2006 | Pelrine et al. |
| 7,064,883 B2 | 6/2006 | Payne et al. |
| 7,066,579 B2 | 6/2006 | Silverbrook |
| 7,070,256 B2 | 7/2006 | Silverbrook |
| 7,070,258 B2 | 7/2006 | Silverbrook |
| 7,073,397 B2 | 7/2006 | Ganapathi |
| 7,073,881 B2 | 7/2006 | Silverbrook |
| 7,074,634 B2 | 7/2006 | Foglietti et al. |
| 7,077,010 B2 | 7/2006 | Ganapathi |
| 7,078,796 B2 | 7/2006 | Dunn et al. |
| 7,080,893 B2 | 7/2006 | Silverbrook |
| 7,080,895 B2 | 7/2006 | Silverbrook |
| 7,083,262 B2 | 8/2006 | Silverbrook |
| 7,086,717 B2 | 8/2006 | Silverbrook |
| 7,091,715 B2 | 8/2006 | Nemirovsky et al. |
| 7,093,494 B2 | 8/2006 | Silverbrook et al. |
| 7,095,864 B1 | 8/2006 | Billson et al. |
| 7,100,446 B1 | 9/2006 | Acar et al. |
| 7,101,020 B2 | 9/2006 | Silverbrook |
| 7,107,665 B2 | 9/2006 | Horiuchi et al. |
| 7,109,859 B2 | 9/2006 | Peeters |
| 7,111,924 B2 | 9/2006 | Silverbrook |
| 7,123,111 B2 | 10/2006 | Brunson et al. |
| 7,132,056 B2 | 11/2006 | Silverbrook |
| 7,132,307 B2 | 11/2006 | Wang et al. |
| 7,134,740 B2 | 11/2006 | Silverbrook |
| 7,142,684 B2 | 11/2006 | Horiuchi et al. |
| 7,143,652 B2 | 12/2006 | Silverbrook et al. |
| 7,144,519 B2 | 12/2006 | Silverbrook |
| 7,144,616 B1 | 12/2006 | Unger et al. |
| 7,146,016 B2 | 12/2006 | Pedersen |
| 7,147,304 B2 | 12/2006 | Silverbrook |
| 7,147,307 B2 | 12/2006 | Silverbrook |
| 7,152,481 B2 | 12/2006 | Wang |
| 7,152,944 B2 | 12/2006 | Silverbrook |
| 7,152,961 B2 | 12/2006 | Silverbrook |
| 7,152,967 B2 | 12/2006 | Silverbrook |
| 7,155,823 B2 | 1/2007 | Silverbrook |
| 7,157,712 B2 | 1/2007 | Flanders et al. |
| 7,158,646 B2 | 1/2007 | Bank et al. |
| 7,159,441 B2 | 1/2007 | Challoner et al. |
| 7,159,968 B2 | 1/2007 | Silverbrook |
| 7,160,475 B2 | 1/2007 | Scipioni |
| 7,164,117 B2 | 1/2007 | Breed et al. |
| 7,168,167 B2 | 1/2007 | Silverbrook |
| 7,169,106 B2 | 1/2007 | Fleischman et al. |
| 7,169,314 B2 | 1/2007 | Unger et al. |
| 7,175,775 B2 | 2/2007 | Silverbrook |
| 7,178,899 B2 | 2/2007 | Silverbrook |
| 7,182,431 B2 | 2/2007 | Silverbrook |
| 7,182,437 B2 | 2/2007 | Silverbrook |
| 7,183,618 B2 | 2/2007 | Ishii |
| 7,184,193 B2 | 2/2007 | McKinnell et al. |
| 7,188,935 B2 | 3/2007 | Silverbrook |
| 7,188,938 B2 | 3/2007 | Silverbrook |
| 7,189,334 B2 | 3/2007 | Silverbrook |
| 7,193,256 B2 | 3/2007 | Renna et al. |
| 7,194,095 B2 | 3/2007 | Cheng |
| 7,198,346 B2 | 4/2007 | Silverbrook |
| 7,199,501 B2 | 4/2007 | Pei et al. |
| 7,204,162 B2 | 4/2007 | Johnson et al. |
| 7,205,173 B2 | 4/2007 | Brunson et al. |
| 7,207,656 B2 | 4/2007 | Silverbrook |
| 7,208,729 B2 | 4/2007 | Syms |
| 7,208,996 B2 | 4/2007 | Suzuki et al. |
| 7,210,764 B2 | 5/2007 | Silverbroo |
| 7,212,487 B2 | 5/2007 | Gibson |
| 7,214,298 B2 | 5/2007 | Spence et al. |
| 7,215,527 B2 | 5/2007 | Neumann, Jr. et al. |
| 7,216,671 B2 | 5/2007 | Unger et al. |
| 7,216,956 B2 | 5/2007 | Silverbrook |
| 7,218,742 B2 | 5/2007 | Kay et al. |
| 7,219,427 B2 | 5/2007 | Silverbrook |
| 7,219,982 B2 | 5/2007 | Silverbrook |
| 7,221,768 B2 | 5/2007 | Sjursen et al. |
| 7,224,106 B2 | 5/2007 | Pei et al. |
| 7,226,147 B2 | 6/2007 | Silverbrook |
| 7,227,687 B1 | 6/2007 | Trisnadi et al. |
| 7,229,154 B2 | 6/2007 | Silverbrook |
| 7,233,097 B2 | 6/2007 | Rosenthal et al. |
| 7,233,101 B2 | 6/2007 | Jin |
| 7,233,679 B2 | 6/2007 | Muthuswamy et al. |
| 7,234,795 B2 | 6/2007 | Silverbrook |
| 7,249,830 B2 | 7/2007 | Hawkins et al. |
| 7,250,128 B2 | 7/2007 | Unger et al. |
| 7,256,927 B2 | 8/2007 | Selbrede |
| 7,258,421 B2 | 8/2007 | Silverbrook |
| 7,258,774 B2 | 8/2007 | Chou et al. |
| 7,259,503 B2 | 8/2007 | Pei et al. |
| 7,260,980 B2 | 8/2007 | Adams et al. |
| 7,260,993 B2 | 8/2007 | Silverbrook et al. |
| 7,264,333 B2 | 9/2007 | Silverbrook |
| 7,269,267 B2 | 9/2007 | Song et al. |
| 7,269,268 B2 | 9/2007 | Song et al. |
| 7,273,270 B2 | 9/2007 | Katerberg |
| 7,275,433 B2 | 10/2007 | Caminada et al. |
| 7,278,713 B2 | 10/2007 | Silverbrook |
| 7,282,709 B2 | 10/2007 | Darling et al. |
| 7,282,834 B2 | 10/2007 | Kubena et al. |
| 7,284,430 B2 | 10/2007 | Acar et al. |
| 7,284,836 B2 | 10/2007 | Silverbrook |
| 7,286,743 B2 | 10/2007 | Soskind et al. |
| 7,290,859 B2 | 11/2007 | Silverbrook |
| 7,292,700 B1 | 11/2007 | Engbert et al. |
| 7,293,855 B2 | 11/2007 | Silverbrook |
| 7,294,503 B2 | 11/2007 | Quake et al. |
| 7,295,675 B2 | 11/2007 | Akino et al. |
| 7,298,856 B2 | 11/2007 | Tajima et al. |
| 7,305,096 B2 | 12/2007 | Su et al. |
| 7,305,880 B2 | 12/2007 | Caminada et al. |
| 7,308,827 B2 | 12/2007 | Holt et al. |
| 7,317,234 B2 | 1/2008 | Marsh et al. |
| 7,320,457 B2 | 1/2008 | Heim et al. |
| 7,322,680 B2 | 1/2008 | Silverbrook |
| 7,327,851 B2 | 2/2008 | Song |
| 7,328,975 B2 | 2/2008 | Silverbrook |
| 7,329,933 B2 | 2/2008 | Zhe et al. |
| 7,331,101 B2 | 2/2008 | Silverbrook |
| 7,331,659 B2 | 2/2008 | Silverbrook |
| 7,334,874 B2 | 2/2008 | Silverbrook |
| 7,338,147 B2 | 3/2008 | Silverbrook |
| 7,340,941 B1 | 3/2008 | Fruhberger et al. |
| 7,346,178 B2 | 3/2008 | Zhe et al. |
| 7,347,535 B2 | 3/2008 | Silverbrook |
| 7,347,697 B2 | 3/2008 | Grundy et al. |
| 7,350,901 B2 | 4/2008 | Silverbrook |
| 7,350,906 B2 | 4/2008 | Silverbrook |
| 7,351,376 B1 | 4/2008 | Quake et al. |
| 7,352,876 B2 | 4/2008 | Boor et al. |
| 7,354,787 B2 | 4/2008 | Dunec et al. |
| 7,359,106 B1 | 4/2008 | Amm et al. |
| 7,359,286 B2 | 4/2008 | Stuart Savoia et al. |
| 7,360,871 B2 | 4/2008 | Silverbrook |
| 7,362,032 B2 | 4/2008 | Pelrine et al. |
| 7,362,873 B2 | 4/2008 | Pedersen |
| 7,368,312 B1 | 5/2008 | Kranz et al. |
| 7,368,862 B2 | 5/2008 | Pelrine et al. |

(56) References Cited

U.S. PATENT DOCUMENTS

| | | |
|---|---|---|
| 7,370,942 B2 | 5/2008 | Silverbrook |
| 7,375,872 B2 | 5/2008 | Ishii |
| 7,377,175 B2 | 5/2008 | Matsubara |
| 7,380,339 B2 | 6/2008 | Silverbrook |
| 7,380,906 B2 | 6/2008 | Silverbrook |
| 7,380,913 B2 | 6/2008 | Silverbrook |
| 7,384,131 B2 | 6/2008 | Silverbrook |
| 7,386,136 B2 | 6/2008 | Ohbayashi et al. |
| 7,387,365 B2 | 6/2008 | Silverbrook |
| 7,387,368 B2 | 6/2008 | Silverbrook |
| 7,393,083 B2 | 7/2008 | Silverbrook |
| 7,394,182 B2 | 7/2008 | Pelrine et al. |
| 7,396,108 B2 | 7/2008 | Silverbrook |
| 7,397,421 B2 | 7/2008 | Smith |
| 7,399,068 B2 | 7/2008 | Anagnostopoulos et al. |
| 7,400,737 B2 | 7/2008 | Pedersen |
| 7,401,884 B2 | 7/2008 | Silverbrook |
| 7,401,895 B2 | 7/2008 | Silverbrook |
| 7,401,900 B2 | 7/2008 | Silverbrook |
| 7,401,906 B2 | 7/2008 | Hawkins et al. |
| 7,402,449 B2 | 7/2008 | Fukuda et al. |
| 7,403,805 B2 | 7/2008 | Abreu |
| 7,410,243 B2 | 8/2008 | Silverbrook |
| 7,410,250 B2 | 8/2008 | Silverbrook |
| 7,413,293 B2 | 8/2008 | Jeanmaire |
| 7,416,275 B2 | 8/2008 | Silverbrook |
| 7,419,244 B2 | 9/2008 | Silverbrook |
| 7,419,247 B2 | 9/2008 | Silverbrook |
| 7,419,250 B2 | 9/2008 | Silverbrook |
| 7,421,898 B2 | 9/2008 | Acar et al. |
| 7,425,749 B2 | 9/2008 | Hartzell et al. |
| 7,431,427 B2 | 10/2008 | Silverbrook |
| 7,434,919 B2 | 10/2008 | Hawkins et al. |
| 7,441,867 B2 | 10/2008 | Silverbrook |
| 7,442,317 B2 | 10/2008 | Silverbrook |
| 7,447,326 B2 | 11/2008 | Akino |
| 7,447,547 B2 | 11/2008 | Palanker |
| 7,448,728 B2 | 11/2008 | Silverbrook |
| 7,448,995 B2 | 11/2008 | Wiklof et al. |
| 7,451,647 B2 | 11/2008 | Matsuhisa et al. |
| 7,457,021 B2 | 11/2008 | Desai |
| 7,461,281 B2 | 12/2008 | Miyazaki |
| 7,466,835 B2 | 12/2008 | Stenberg et al. |
| 7,467,850 B2 | 12/2008 | Silverbrook |
| 7,468,575 B2 | 12/2008 | Pelrine et al. |
| 7,468,997 B2 | 12/2008 | Jayaraman |
| 7,469,834 B2 | 12/2008 | Schelinski et al. |
| 7,472,984 B2 | 1/2009 | Silverbrook |
| 7,474,872 B2 | 1/2009 | Nojima |
| 7,475,965 B2 | 1/2009 | Silverbrook |
| 7,481,111 B2 | 1/2009 | Caminada et al. |
| 7,482,589 B2 | 1/2009 | Flanders et al. |
| 7,485,100 B2 | 2/2009 | Garcia-Webb et al. |
| 7,489,791 B2 | 2/2009 | Kunnen et al. |
| 7,493,821 B2 | 2/2009 | Wang |
| 7,494,555 B2 | 2/2009 | Unger et al. |
| 7,506,966 B2 | 3/2009 | Silverbrook |
| 7,517,055 B2 | 4/2009 | Silverbrook |
| 7,518,493 B2 | 4/2009 | Bryzek et al. |
| 7,518,504 B2 | 4/2009 | Peeters |
| 7,521,257 B2 | 4/2009 | Adams et al. |
| 7,524,029 B2 | 4/2009 | Silverbrook |
| 7,524,032 B2 | 4/2009 | Silverbrook |
| 7,527,357 B2 | 5/2009 | Silverbrook |
| 7,528,691 B2 | 5/2009 | Wallis et al. |
| 7,537,314 B2 | 5/2009 | Silverbrook |
| 7,537,325 B2 | 5/2009 | Silverbrook |
| 7,539,532 B2 | 5/2009 | Tran |
| 7,539,533 B2 | 5/2009 | Tran |
| 7,543,502 B2 | 6/2009 | Niblock |
| 7,545,945 B2 | 6/2009 | Miles |
| 7,549,726 B2 | 6/2009 | Silverbrook |
| 7,553,001 B2 | 6/2009 | Silverbrook |
| RE40,860 E | 7/2009 | Billson et al. |
| 7,556,351 B2 | 7/2009 | Silverbrook |
| 7,556,352 B2 | 7/2009 | Silverbrook |
| 7,556,353 B2 | 7/2009 | Silverbrook |
| 7,556,358 B2 | 7/2009 | Silverbrook |
| 7,556,361 B2 | 7/2009 | Silverbrook |
| 7,558,622 B2 | 7/2009 | Tran |
| 7,562,573 B2 | 7/2009 | Yazdi |
| 7,562,962 B2 | 7/2009 | Silverbrook |
| 7,562,963 B2 | 7/2009 | Silverbrook |
| 7,569,926 B2 | 8/2009 | Carlson et al. |
| 7,570,773 B2 | 8/2009 | Ohbayashi et al. |
| 7,578,569 B2 | 8/2009 | Silverbrook |
| 7,578,582 B2 | 8/2009 | Silverbrook |
| 7,579,678 B2 | 8/2009 | Suzuki et al. |
| 7,585,047 B2 | 9/2009 | Silverbrook |
| 7,585,066 B2 | 9/2009 | Silverbrook |
| 7,585,743 B2 | 9/2009 | Renna et al. |
| 7,588,327 B2 | 9/2009 | Silverbrook |
| 7,591,539 B2 | 9/2009 | Silverbrook |
| 7,591,541 B2 | 9/2009 | Silverbrook |
| 7,595,580 B2 | 9/2009 | Heim |
| 7,597,435 B2 | 10/2009 | Silverbrook |
| 7,601,270 B1 | 10/2009 | Unger et al. |
| 7,607,355 B2 | 10/2009 | Shirasaka et al. |
| 7,608,989 B2 | 10/2009 | Heydt et al. |
| 7,611,220 B2 | 11/2009 | Silverbrook |
| 7,615,744 B1 | 11/2009 | Syms |
| 7,616,367 B2 | 11/2009 | Desai |
| 7,620,197 B2 | 11/2009 | Han et al. |
| 7,622,081 B2 | 11/2009 | Chou et al. |
| 7,625,061 B2 | 12/2009 | Silverbrook |
| 7,625,067 B2 | 12/2009 | Silverbrook |
| 7,625,068 B2 | 12/2009 | Silverbrook |
| 7,628,468 B2 | 12/2009 | Silverbrook |
| 7,637,582 B2 | 12/2009 | Silverbrook |
| 7,640,803 B1 | 1/2010 | Gutierrez et al. |
| 7,642,575 B2 | 1/2010 | Wong et al. |
| 7,652,752 B2 | 1/2010 | Fetzer et al. |
| 7,654,628 B2 | 2/2010 | Silverbrook |
| 7,654,642 B2 | 2/2010 | Silverbrook |
| 7,654,957 B2 | 2/2010 | Abreu |
| 7,658,473 B2 | 2/2010 | Silverbrook |
| 7,661,793 B2 | 2/2010 | Silverbrook |
| 7,661,796 B2 | 2/2010 | Silverbrook |
| 7,661,797 B2 | 2/2010 | Silverbrook |
| 7,663,502 B2 | 2/2010 | Breed |
| 7,668,323 B2 | 2/2010 | Miyazaki |
| 7,669,950 B2 | 3/2010 | Silverbrook |
| 7,669,951 B2 | 3/2010 | Silverbrook |
| 7,669,964 B2 | 3/2010 | Silverbrook |
| 7,669,971 B2 | 3/2010 | Silverbrook |
| 7,673,976 B2 | 3/2010 | Piatt et al. |
| 7,677,099 B2 | 3/2010 | Nasiri et al. |
| 7,677,685 B2 | 3/2010 | Silverbrook |
| 7,677,686 B2 | 3/2010 | Silverbrook |
| 7,689,159 B2 | 3/2010 | Nojima |
| 7,694,346 B2 | 4/2010 | Adams et al. |
| 7,697,899 B2 | 4/2010 | Rofougaran |
| 7,699,440 B2 | 4/2010 | Silverbrook |
| 7,702,118 B2 | 4/2010 | Park et al. |
| 7,702,124 B2 | 4/2010 | Niederdraenk et al. |
| 7,703,890 B2 | 4/2010 | Silverbrook |
| 7,708,372 B2 | 5/2010 | Silverbrook |
| 7,708,381 B2 | 5/2010 | Silverbrook |
| 7,710,371 B2 | 5/2010 | Mei et al. |
| 7,714,278 B2 | 5/2010 | Boyle et al. |
| 7,715,583 B2 | 5/2010 | Van Halteren et al. |
| 7,717,542 B2 | 5/2010 | Silverbrook |
| 7,731,334 B2 | 6/2010 | Silverbrook |
| 7,731,336 B2 | 6/2010 | Silverbrook |
| 7,731,341 B2 | 6/2010 | Trauernicht et al. |
| 7,732,302 B2 | 6/2010 | Yazdi |
| 7,733,224 B2 | 6/2010 | Tran |
| 7,735,963 B2 | 6/2010 | Silverbrook |
| 7,735,968 B2 | 6/2010 | Silverbrook |
| 7,740,337 B2 | 6/2010 | Silverbrook |
| 7,746,538 B2 | 6/2010 | Ishii |
| 7,748,272 B2 | 7/2010 | Kranz et al. |
| 7,748,827 B2 | 7/2010 | Silverbrook |
| 7,753,469 B2 | 7/2010 | Silverbrook |

(56) References Cited

U.S. PATENT DOCUMENTS

| | | | |
|---|---|---|---|
| 7,753,487 | B2 | 7/2010 | Silverbrook |
| 7,753,491 | B2 | 7/2010 | Silverbrook |
| 7,753,504 | B2 | 7/2010 | Silverbrook |
| 7,754,010 | B2 | 7/2010 | Unger et al. |
| 7,756,279 | B2 | 7/2010 | Deruginsky et al. |
| 7,756,559 | B2 | 7/2010 | Abreu |
| 7,758,160 | B2 | 7/2010 | Silverbrook |
| 7,758,162 | B2 | 7/2010 | Silverbrook |
| 7,758,166 | B2 | 7/2010 | Silverbrook |
| 7,758,171 | B2 | 7/2010 | Brost |
| 7,761,981 | B2 | 7/2010 | Rosenthal et al. |
| 7,762,638 | B2 | 7/2010 | Cruchon-Dupeyrat et al. |
| 7,766,055 | B2 | 8/2010 | Unger et al. |
| 7,769,193 | B2 | 8/2010 | Matsuzawa |
| 7,771,025 | B2 | 8/2010 | Silverbrook |
| 7,771,032 | B2 | 8/2010 | Silverbrook |
| 7,775,215 | B2 | 8/2010 | Hassler, Jr. et al. |
| 7,775,634 | B2 | 8/2010 | Silverbrook |
| 7,775,966 | B2 | 8/2010 | Dlugos et al. |
| 7,780,264 | B2 | 8/2010 | Silverbrook |
| 7,781,249 | B2 | 8/2010 | Laming et al. |
| 7,784,344 | B2 | 8/2010 | Pavelescu et al. |
| 7,784,905 | B2 | 8/2010 | Silverbrook |
| 7,784,910 | B2 | 8/2010 | Silverbrook |
| 7,786,738 | B2 | 8/2010 | Lang et al. |
| 7,791,027 | B2 | 9/2010 | McAllister et al. |
| 7,794,050 | B2 | 9/2010 | Silverbrook |
| 7,795,695 | B2 | 9/2010 | Weigold et al. |
| 7,804,374 | B1 | 9/2010 | Brown et al. |
| 7,804,968 | B2 | 9/2010 | Akino |
| 7,804,969 | B2 | 9/2010 | Wang et al. |
| 7,804,971 | B2 | 9/2010 | Matsuzawa |
| 7,805,821 | B2 | 10/2010 | Suzuki |
| 7,809,417 | B2 | 10/2010 | Abreu |
| 7,810,394 | B2 | 10/2010 | Yazdi |
| 7,812,418 | B2 | 10/2010 | Hsu et al. |
| 7,815,290 | B2 | 10/2010 | Silverbrook |
| 7,815,291 | B2 | 10/2010 | Silverbrook |
| 7,818,871 | B2 | 10/2010 | Shcheglov |
| 7,822,510 | B2 | 10/2010 | Paik et al. |
| 7,826,629 | B2 | 11/2010 | Miles et al. |
| 7,827,864 | B2 | 11/2010 | Prandi et al. |
| 7,829,366 | B2 | 11/2010 | Miller et al. |
| 7,835,055 | B2 | 11/2010 | Desai |
| 7,835,533 | B2 | 11/2010 | Yonehara et al. |
| 7,836,765 | B2 | 11/2010 | Challoner et al. |
| 7,848,532 | B2 | 12/2010 | Akino |
| 7,849,745 | B2 | 12/2010 | Wang et al. |
| 7,855,095 | B2 | 12/2010 | Miyashita et al. |
| 7,856,804 | B2 | 12/2010 | Laming et al. |
| 7,860,258 | B2 | 12/2010 | Azuma et al. |
| 7,864,006 | B2 | 1/2011 | Foster et al. |
| 7,874,644 | B2 | 1/2011 | Silverbrook |
| 7,878,075 | B2 | 2/2011 | Johansson et al. |
| 7,880,565 | B2 | 2/2011 | Huang |
| 7,884,467 | B2 | 2/2011 | Huang et al. |
| 7,888,840 | B2 | 2/2011 | Shimaoka et al. |
| 7,889,882 | B2 | 2/2011 | Marshall |
| 7,891,773 | B2 | 2/2011 | Silverbrook |
| 7,893,798 | B2 | 2/2011 | Foster et al. |
| 7,894,616 | B2 | 2/2011 | Song et al. |
| 7,896,468 | B2 | 3/2011 | Silverbrook |
| 7,896,473 | B2 | 3/2011 | Silverbrook |
| 7,898,159 | B2 | 3/2011 | Heydt et al. |
| 7,899,196 | B2 | 3/2011 | Furst et al. |
| 7,901,023 | B2 | 3/2011 | Silverbrook |
| 7,903,831 | B2 | 3/2011 | Song |
| 7,905,574 | B2 | 3/2011 | Silverbrook |
| 7,905,588 | B2 | 3/2011 | Silverbrook |
| 7,907,743 | B2 | 3/2011 | Izuchi et al. |
| 7,911,115 | B2 | 3/2011 | Pelrine et al. |
| 7,912,235 | B2 | 3/2011 | Chen |
| 7,912,236 | B2 | 3/2011 | Dehe et al. |
| 7,914,115 | B2 | 3/2011 | Silverbrook |
| 7,915,891 | B2 | 3/2011 | Edelstein |
| 7,916,879 | B2 | 3/2011 | Pedersen |
| 7,918,540 | B2 | 4/2011 | Silverbrook |
| 7,918,541 | B2 | 4/2011 | Silverbrook |
| 7,923,064 | B2 | 4/2011 | Pelrine et al. |
| 7,923,902 | B2 | 4/2011 | Heim |
| 7,923,999 | B2 | 4/2011 | Edelstein |
| 7,925,033 | B2 | 4/2011 | Okazawa |
| 7,925,221 | B2 | 4/2011 | Rofougaran |
| 7,931,351 | B2 | 4/2011 | Silverbrook |
| 7,932,117 | B2 | 4/2011 | Ueya |
| 7,934,797 | B2 | 5/2011 | Silverbrook |
| 7,934,799 | B2 | 5/2011 | Silverbrook |
| 7,934,808 | B2 | 5/2011 | Silverbrook |
| 7,938,524 | B2 | 5/2011 | Silverbrook |
| 7,939,021 | B2 | 5/2011 | Smith et al. |
| 7,939,994 | B2 | 5/2011 | Kunze et al. |
| 7,940,944 | B2 | 5/2011 | Song |
| 7,946,671 | B2 | 5/2011 | Silverbrook |
| 7,948,731 | B2 | 5/2011 | Kinbara |
| 7,949,142 | B2 | 5/2011 | Song |
| 7,950,281 | B2 | 5/2011 | Hammerschmidt |
| 7,950,771 | B2 | 5/2011 | Silverbrook |
| 7,950,773 | B2 | 5/2011 | Silverbrook |
| 7,950,774 | B2 | 5/2011 | Silverbrook |
| 7,951,636 | B2 | 5/2011 | Lee et al. |
| 7,953,235 | B2 | 5/2011 | Song |
| 7,960,208 | B2 | 6/2011 | Carlson et al. |
| 7,967,422 | B2 | 6/2011 | Silverbrook |
| 7,970,154 | B2 | 6/2011 | Akino |
| 7,971,967 | B2 | 7/2011 | Silverbrook |
| 7,971,972 | B2 | 7/2011 | Silverbrook |
| 7,971,975 | B2 | 7/2011 | Silverbrook |
| 7,973,278 | B2 | 7/2011 | Syms |
| 7,974,430 | B2 | 7/2011 | Izuchi et al. |
| 7,976,131 | B2 | 7/2011 | Silverbrook |
| 7,977,635 | B2 | 7/2011 | Edwards |
| 7,984,648 | B2 | 7/2011 | Horning et al. |
| 7,987,784 | B2 | 8/2011 | Daniel et al. |
| 7,990,539 | B2 | 8/2011 | Li |
| 7,992,968 | B2 | 8/2011 | Silverbrook |
| 8,000,483 | B2 | 8/2011 | de Haan et al. |
| 8,000,789 | B2 | 8/2011 | Denison |
| 8,002,933 | B2 | 8/2011 | Unger et al. |
| 8,004,373 | B2 | 8/2011 | Huang |
| 8,005,242 | B2 | 8/2011 | Hsu et al. |
| 8,009,838 | B2 | 8/2011 | Lee et al. |
| 8,011,757 | B2 | 9/2011 | Silverbrook |
| 8,016,744 | B2 | 9/2011 | Dlugos et al. |
| 8,018,301 | B2 | 9/2011 | Huang |
| 8,020,440 | B2 | 9/2011 | Modugno et al. |
| 8,021,614 | B2 | 9/2011 | Huang et al. |
| 8,022,779 | B2 | 9/2011 | Ayazi et al. |
| 8,023,667 | B2 | 9/2011 | Lin |
| 8,025,355 | B2 | 9/2011 | Silverbrook |
| 8,036,401 | B2 | 10/2011 | Poulsen et al. |
| 8,037,756 | B2 | 10/2011 | Caminada et al. |
| 8,037,757 | B2 | 10/2011 | Johnson |
| 8,041,059 | B2 | 10/2011 | Miyazaki |
| 8,042,264 | B2 | 10/2011 | Rosenthal et al. |
| 8,045,733 | B2 | 10/2011 | Zhe et al. |
| 8,045,734 | B2 | 10/2011 | Zhe et al. |
| 8,047,633 | B2 | 11/2011 | Silverbrook |
| 8,047,995 | B2 | 11/2011 | Wakabayashi et al. |
| 8,051,698 | B2 | 11/2011 | Prandi et al. |
| 8,054,566 | B2 | 11/2011 | Heim et al. |
| 8,057,014 | B2 | 11/2011 | Silverbrook |
| 8,059,837 | B2 | 11/2011 | Wu |
| 8,059,838 | B2 | 11/2011 | Wu |
| 8,059,842 | B2 | 11/2011 | Suzuki et al. |
| 8,061,201 | B2 | 11/2011 | Ayazi et al. |
| 8,061,795 | B2 | 11/2011 | Silverbrook |
| 8,064,620 | B2 | 11/2011 | Huang et al. |
| 8,066,355 | B2 | 11/2011 | Silverbrook |
| 8,072,010 | B2 | 12/2011 | Lutz |
| 8,073,166 | B2 | 12/2011 | Takeuchi et al. |
| 8,073,167 | B2 | 12/2011 | Miles |
| 8,073,179 | B2 | 12/2011 | Wu et al. |
| 8,079,669 | B2 | 12/2011 | Silverbrook |
| 8,079,688 | B2 | 12/2011 | Silverbrook |

(56) References Cited

U.S. PATENT DOCUMENTS

| | | |
|---|---|---|
| 8,080,835 B2 | 12/2011 | Nakatani |
| 8,081,784 B2 | 12/2011 | Liou et al. |
| 8,085,956 B2 | 12/2011 | Jennings |
| 8,085,965 B2 | 12/2011 | Akino |
| 8,087,740 B2 | 1/2012 | Piatt et al. |
| 8,087,757 B2 | 1/2012 | Silverbrook |
| 8,090,125 B2 | 1/2012 | Zheng et al. |
| 8,093,783 B2 | 1/2012 | Rosenthal et al. |
| 8,094,839 B2 | 1/2012 | Lee et al. |
| 8,094,841 B2 | 1/2012 | Trusov et al. |
| 8,094,844 B2 | 1/2012 | Sung |
| 8,098,853 B2 | 1/2012 | Tanaka et al. |
| 8,098,855 B2 | 1/2012 | Lee et al. |
| 8,103,039 B2 | 1/2012 | van Halteren et al. |
| 8,103,333 B2 | 1/2012 | Tran |
| 8,104,354 B2 | 1/2012 | Hsu et al. |
| 8,104,497 B2 | 1/2012 | Unger et al. |
| 8,104,515 B2 | 1/2012 | Unger et al. |
| 8,104,878 B2 | 1/2012 | Montz et al. |
| 8,107,651 B2 | 1/2012 | Liou et al. |
| 8,108,036 B2 | 1/2012 | Tran |
| 8,110,813 B2 | 2/2012 | Baars et al. |
| 8,111,847 B2 | 2/2012 | Lee et al. |
| 8,111,871 B2 | 2/2012 | Zhang et al. |
| 8,114,700 B2 | 2/2012 | Miyashita et al. |
| 8,118,751 B2 | 2/2012 | Dobak, III |
| 8,121,673 B2 | 2/2012 | Tran |
| 8,121,687 B2 | 2/2012 | Jensen et al. |
| 8,124,218 B2 | 2/2012 | Unger et al. |
| 8,126,166 B2 | 2/2012 | Song |
| 8,126,167 B2 | 2/2012 | Hirade et al. |
| 8,126,171 B2 | 2/2012 | Sekino et al. |
| 8,129,176 B2 | 3/2012 | Quake et al. |
| 8,129,802 B2 | 3/2012 | Fukuda et al. |
| 8,130,986 B2 | 3/2012 | White et al. |
| 8,134,375 B2 | 3/2012 | Boom |
| 8,136,385 B2 | 3/2012 | Adams et al. |
| 8,138,034 B2 | 3/2012 | Han et al. |
| 8,139,762 B2 | 3/2012 | Kuroda et al. |
| 8,139,790 B2 | 3/2012 | Wu |
| 8,139,794 B2 | 3/2012 | Chen et al. |
| 8,143,576 B2 | 3/2012 | Edwards |
| 8,146,424 B2 | 4/2012 | Johnson et al. |
| 8,164,588 B2 | 4/2012 | Lauxtermann et al. |
| 8,165,323 B2 | 4/2012 | Zhou |
| 8,167,406 B2 | 5/2012 | Panchawagh et al. |
| 8,170,237 B2 | 5/2012 | Shajaan et al. |
| 8,171,794 B2 | 5/2012 | Spahlinger |
| 8,175,293 B2 | 5/2012 | Suvanto |
| 8,175,294 B2 | 5/2012 | Jansen |
| 8,183,739 B2 | 5/2012 | Heim |
| 8,184,832 B2 | 5/2012 | Harman |
| 8,187,795 B2 | 5/2012 | Jain et al. |
| 8,188,557 B2 | 5/2012 | Rombach et al. |
| 8,193,869 B1 | 6/2012 | Brown et al. |
| 8,194,908 B2 | 6/2012 | Akino |
| 8,196,282 B2 | 6/2012 | Chen et al. |
| 8,199,939 B2 | 6/2012 | Suvanto et al. |
| 8,215,168 B2 | 7/2012 | Merz et al. |
| 8,218,794 B2 | 7/2012 | Pahl |
| 8,220,318 B2 | 7/2012 | Degertekin |
| 8,220,487 B2 | 7/2012 | Unger et al. |
| 8,226,199 B2 | 7/2012 | Hawkins et al. |
| 8,226,217 B2 | 7/2012 | Montz et al. |
| 8,226,236 B2 | 7/2012 | Williams et al. |
| 8,229,140 B2 | 7/2012 | Jennings |
| 8,231,207 B2 | 7/2012 | Montz et al. |
| 8,235,055 B2 | 8/2012 | Mintchev et al. |
| 8,242,840 B2 | 8/2012 | Van Veldhoven |
| 8,243,962 B2 | 8/2012 | Qiao |
| 8,243,966 B2 | 8/2012 | Lin et al. |
| 8,251,495 B2 | 8/2012 | Silverbrook |
| 8,252,539 B2 | 8/2012 | Quake et al. |
| 8,254,598 B2 | 8/2012 | Holzmann |
| 8,257,666 B2 | 9/2012 | Quake et al. |
| 8,259,963 B2 | 9/2012 | Stenberg et al. |
| 8,263,336 B2 | 9/2012 | Rothberg et al. |
| 8,264,307 B2 | 9/2012 | Foster et al. |
| 8,265,287 B2 | 9/2012 | Kageyama |
| 8,268,630 B2 | 9/2012 | Fedder et al. |
| 8,278,919 B2 | 10/2012 | Fischer et al. |
| 8,282,181 B2 | 10/2012 | Silverbrook |
| 8,282,202 B2 | 10/2012 | Irving et al. |
| 8,284,967 B2 | 10/2012 | Yang et al. |
| 8,288,211 B2 | 10/2012 | Foster et al. |
| 8,295,514 B2 | 10/2012 | Song |
| 8,295,528 B2 | 10/2012 | Rombach et al. |
| 8,300,858 B2 | 10/2012 | Nakaya et al. |
| 8,300,860 B2 | 10/2012 | Chiang et al. |
| 8,319,177 B2 | 11/2012 | Boyle et al. |
| 8,322,213 B2 | 12/2012 | Trusov et al. |
| 8,323,188 B2 | 12/2012 | Tran |
| 8,323,189 B2 | 12/2012 | Tran et al. |
| 8,323,982 B2 | 12/2012 | LeBoeuf et al. |
| 8,327,521 B2 | 12/2012 | Dirksen et al. |
| 8,327,711 B2 | 12/2012 | Kasai et al. |
| 8,328,718 B2 | 12/2012 | Tran |
| 8,333,112 B2 | 12/2012 | Schwartz et al. |
| 8,335,328 B2 | 12/2012 | Holzmann |
| 8,336,990 B2 | 12/2012 | Silverbrook |
| 8,338,896 B2 | 12/2012 | Kanemoto |
| 8,339,014 B2 | 12/2012 | Kandori et al. |
| 8,344,322 B2 | 1/2013 | Edwards |
| 8,345,898 B2 | 1/2013 | Reining |
| 8,345,910 B2 | 1/2013 | Chae et al. |
| 8,347,717 B2 | 1/2013 | Seeger et al. |
| 8,352,030 B2 | 1/2013 | Denison |
| 8,367,426 B2 | 2/2013 | Adams |
| 8,368,154 B2 | 2/2013 | Trusov et al. |
| 8,369,545 B2 | 2/2013 | Lee |
| 8,369,552 B2 | 2/2013 | Engbert et al. |
| 8,371,166 B2 | 2/2013 | Robert |
| 8,374,363 B2 | 2/2013 | Onishi |
| 8,376,513 B2 | 2/2013 | Silverbrook |
| 8,379,890 B2 | 2/2013 | Kuo et al. |
| 8,382,258 B2 | 2/2013 | Xie et al. |
| 8,382,259 B2 | 2/2013 | Panchawagh et al. |
| 8,385,570 B2 | 2/2013 | Chiang et al. |
| 8,385,586 B2 | 2/2013 | Liou et al. |
| 8,389,349 B2 | 3/2013 | Zhou |
| 8,390,916 B2 | 3/2013 | Sampsell |
| 8,391,517 B2 | 3/2013 | Avenson et al. |
| 8,391,520 B2 | 3/2013 | Liou et al. |
| 8,393,714 B2 | 3/2013 | Silverbrook |
| 8,397,579 B2 | 3/2013 | Niblock |
| 8,398,210 B2 | 3/2013 | Baumer et al. |
| 8,398,221 B2 | 3/2013 | Xie et al. |
| 8,398,222 B2 | 3/2013 | Gao et al. |
| 8,401,217 B2 | 3/2013 | Shams et al. |
| 8,401,513 B2 | 3/2013 | Langereis et al. |
| 8,405,449 B2 | 3/2013 | Muza |
| 8,406,437 B2 | 3/2013 | Johansen et al. |
| 8,411,882 B2 | 4/2013 | Lee et al. |
| 8,416,973 B2 | 4/2013 | Medley et al. |
| 8,418,556 B2 | 4/2013 | Chen et al. |
| 8,419,176 B2 | 4/2013 | Dockery et al. |
| 8,425,415 B2 | 4/2013 | Tran |
| 8,427,177 B2 | 4/2013 | Jeong et al. |
| 8,427,249 B1 | 4/2013 | Swanson et al. |
| 8,427,657 B2 | 4/2013 | Milanovi |
| 8,433,084 B2 | 4/2013 | Conti et al. |
| 8,434,160 B1 | 4/2013 | Adams et al. |
| 8,434,161 B1 | 4/2013 | Adams et al. |
| 8,438,710 B2 | 5/2013 | Li |
| 8,440,093 B1 | 5/2013 | Nassef et al. |
| 8,444,260 B2 | 5/2013 | Gao et al. |
| 8,445,210 B2 | 5/2013 | Quake et al. |
| 8,447,049 B2 | 5/2013 | Shajaan et al. |
| 8,448,326 B2 | 5/2013 | Sinclair |
| 8,449,471 B2 | 5/2013 | Tran |
| 8,451,068 B2 | 5/2013 | Asamura et al. |
| 8,455,570 B2 | 6/2013 | Lindstrom et al. |
| 8,456,958 B2 | 6/2013 | Felix et al. |
| 8,459,787 B2 | 6/2013 | Sowinski et al. |

(56) References Cited

U.S. PATENT DOCUMENTS

| | | |
|---|---|---|
| 8,461,936 B2 | 6/2013 | Vermeeren et al. |
| 8,461,988 B2 | 6/2013 | Tran |
| 8,464,571 B1 | 6/2013 | Sparks et al. |
| 8,465,129 B2 | 6/2013 | Panchawagh et al. |
| 8,465,142 B2 | 6/2013 | Irving et al. |
| 8,467,133 B2 | 6/2013 | Miller |
| 8,467,550 B2 | 6/2013 | Akino |
| 8,467,559 B2 | 6/2013 | Zhe |
| 8,468,665 B2 | 6/2013 | Chen |
| 8,468,939 B2 | 6/2013 | Daniel et al. |
| 8,469,496 B2 | 6/2013 | Panchawagh et al. |
| 8,472,120 B2 | 6/2013 | Border et al. |
| 8,475,368 B2 | 7/2013 | Tran et al. |
| 8,477,425 B2 | 7/2013 | Border et al. |
| 8,477,983 B2 | 7/2013 | Weigold et al. |
| 8,480,224 B2 | 7/2013 | Irving et al. |
| 8,482,300 B2 | 7/2013 | Trumper et al. |
| 8,482,859 B2 | 7/2013 | Border et al. |
| 8,485,654 B2 | 7/2013 | Sowinski et al. |
| 8,488,246 B2 | 7/2013 | Border et al. |
| 8,488,973 B2 | 7/2013 | Avenson et al. |
| 8,497,149 B2 | 7/2013 | Laming et al. |
| 8,500,636 B2 | 8/2013 | Tran |
| 8,502,329 B2 | 8/2013 | Hsieh et al. |
| 8,503,702 B2 | 8/2013 | Kao et al. |
| 8,506,039 B2 | 8/2013 | Katerberg et al. |
| 8,508,109 B2 | 8/2013 | Pelrine et al. |
| 8,509,459 B1 | 8/2013 | Isvan |
| 8,515,100 B2 | 8/2013 | Shajaan et al. |
| 8,516,905 B2 | 8/2013 | Nakamura et al. |
| 8,517,516 B2 | 8/2013 | Katerberg et al. |
| 8,519,492 B2 | 8/2013 | Song |
| 8,523,327 B2 | 9/2013 | Vaeth et al. |
| 8,523,328 B2 | 9/2013 | Ellinger et al. |
| 8,525,673 B2 | 9/2013 | Tran |
| 8,525,687 B2 | 9/2013 | Tran |
| 8,526,656 B2 | 9/2013 | Tanaka et al. |
| 8,529,021 B2 | 9/2013 | Baumer et al. |
| 8,530,854 B1 | 9/2013 | Derzon et al. |
| 8,531,291 B2 | 9/2013 | Tran |
| 8,534,127 B2 | 9/2013 | Seeger et al. |
| 8,534,818 B2 | 9/2013 | Mehta et al. |
| 8,542,365 B2 | 9/2013 | Pruessner et al. |
| 8,542,850 B2 | 9/2013 | Wang et al. |
| 8,542,852 B2 | 9/2013 | Kageyama |
| 8,542,853 B2 | 9/2013 | Dehe et al. |
| 8,546,170 B2 | 10/2013 | Traynor et al. |
| 8,548,178 B2 | 10/2013 | Miles |
| 8,550,119 B2 | 10/2013 | Unger et al. |
| 8,553,913 B2 | 10/2013 | Akino |
| 8,556,428 B2 | 10/2013 | Williams et al. |
| 8,559,660 B2 | 10/2013 | Chiang et al. |
| 8,562,120 B2 | 10/2013 | Xie et al. |
| 8,562,565 B2 | 10/2013 | Fonacier et al. |
| 8,565,452 B2 | 10/2013 | Coronato et al. |
| 8,565,454 B2 | 10/2013 | Kelloniemi et al. |
| 8,578,775 B2 | 11/2013 | Hayner et al. |
| 8,580,597 B2 | 11/2013 | Ollier et al. |
| 8,582,787 B2 | 11/2013 | David et al. |
| 8,585,189 B1 | 11/2013 | Marcus et al. |
| 8,585,971 B2 | 11/2013 | Huang et al. |
| 8,586,918 B2 | 11/2013 | Brucker et al. |
| 8,588,433 B2 | 11/2013 | Saulespurens et al. |
| 8,588,438 B2 | 11/2013 | Tseng et al. |
| 8,588,451 B2 | 11/2013 | Matsunaga |
| 8,590,136 B2 | 11/2013 | Yang et al. |
| 8,592,153 B1 | 11/2013 | Bustillo et al. |
| 8,592,154 B2 | 11/2013 | Rearick |
| 8,592,215 B2 | 11/2013 | Quake et al. |
| 8,594,349 B2 | 11/2013 | Chen et al. |
| 8,600,083 B2 | 12/2013 | Chiang et al. |
| 8,602,531 B2 | 12/2013 | Ellinger et al. |
| 8,602,535 B2 | 12/2013 | Panchawagh et al. |
| 8,604,411 B2 | 12/2013 | Wieland et al. |
| 8,605,919 B2 | 12/2013 | Awamura et al. |
| 8,611,566 B2 | 12/2013 | Pahl et al. |
| 8,615,374 B1 | 12/2013 | Discenzo |
| 8,618,718 B2 | 12/2013 | Qu et al. |
| 8,625,809 B2 | 1/2014 | Josefsson et al. |
| 8,625,823 B2 | 1/2014 | Buck |
| 8,625,824 B2 | 1/2014 | Chen et al. |
| 8,625,825 B2 | 1/2014 | Lee |
| 8,627,511 B2 | 1/2014 | Polesel |
| 8,629,393 B1 | 1/2014 | Kirkpatrick et al. |
| 8,630,429 B2 | 1/2014 | Daley |
| 8,630,430 B2 | 1/2014 | Akino |
| 8,632,162 B2 | 1/2014 | Vaeth et al. |
| 8,633,955 B2 | 1/2014 | Marcus et al. |
| 8,637,945 B2 | 1/2014 | Reichenbach et al. |
| 8,638,249 B2 | 1/2014 | Kropfitsch et al. |
| 8,641,175 B2 | 2/2014 | Panchawagh et al. |
| 8,643,129 B2 | 2/2014 | Laming et al. |
| 8,643,382 B2 | 2/2014 | Steele et al. |
| 8,644,529 B2 | 2/2014 | Ejaz et al. |
| 8,646,308 B2 | 2/2014 | Mueck |
| 8,646,882 B2 | 2/2014 | Marcus et al. |
| 8,646,883 B2 | 2/2014 | Marcus et al. |
| 8,650,955 B2 | 2/2014 | Swanson et al. |
| 8,651,632 B2 | 2/2014 | Marcus et al. |
| 8,651,633 B2 | 2/2014 | Marcus et al. |
| 8,652,038 B2 | 2/2014 | Tran et al. |
| 8,652,409 B2 | 2/2014 | LeBoeuf et al. |
| 8,656,958 B2 | 2/2014 | Unger et al. |
| 8,657,419 B2 | 2/2014 | Panchawagh et al. |
| 8,658,367 B2 | 2/2014 | Quake et al. |
| 8,658,368 B2 | 2/2014 | Quake et al. |
| 8,659,631 B2 | 2/2014 | Marcus et al. |
| 8,664,733 B2 | 3/2014 | Rombach |
| 8,666,094 B2 | 3/2014 | Matsuzawa |
| 8,666,095 B2 | 3/2014 | Hanzlik et al. |
| 8,666,097 B2 | 3/2014 | Ichikawa et al. |
| 8,668,312 B2 | 3/2014 | Xie et al. |
| 8,668,313 B2 | 3/2014 | Xie et al. |
| 8,669,771 B2 | 3/2014 | Trumper et al. |
| 8,669,814 B2 | 3/2014 | Muguet |
| 8,670,581 B2 | 3/2014 | Harman |
| 8,673,732 B2 | 3/2014 | Hsieh et al. |
| 8,675,895 B2 | 3/2014 | Hovesten et al. |
| 8,677,821 B2 | 3/2014 | Ayazi et al. |
| 8,680,991 B2 | 3/2014 | Tran |
| 8,684,253 B2 | 4/2014 | Giordano et al. |
| 8,684,483 B2 | 4/2014 | Grace et al. |
| 8,684,900 B2 | 4/2014 | Tran |
| 8,684,922 B2 | 4/2014 | Tran |
| 8,686,519 B2 | 4/2014 | Langereis et al. |
| 8,686,802 B1 | 4/2014 | Brown et al. |
| 8,692,340 B1 | 4/2014 | Ata et al. |
| 8,695,640 B2 | 4/2014 | Unger et al. |
| 8,696,094 B2 | 4/2014 | Marcus et al. |
| 8,698,212 B2 | 4/2014 | Milgrew |
| 8,698,255 B2 | 4/2014 | Reichenbach et al. |
| 8,698,256 B2 | 4/2014 | Traynor et al. |
| 8,699,726 B2 | 4/2014 | Steele et al. |
| 8,699,728 B2 | 4/2014 | Kasai et al. |
| 8,699,740 B2 | 4/2014 | Chiang et al. |
| 8,705,767 B2 | 4/2014 | Hiensch |
| 8,705,775 B2 | 4/2014 | Sheplak et al. |
| 8,708,903 B2 | 4/2014 | Tran |
| 8,710,601 B2 | 4/2014 | Huang et al. |
| 8,713,711 B2 | 4/2014 | Adams et al. |
| 8,714,676 B2 | 5/2014 | Grace et al. |
| 8,717,046 B2 | 5/2014 | Jensen et al. |
| 8,717,395 B2 | 5/2014 | Marcus et al. |
| 8,718,297 B1 | 5/2014 | Norris |
| 8,719,960 B2 | 5/2014 | King |
| 8,723,277 B2 | 5/2014 | Dehe et al. |
| 8,724,832 B2 | 5/2014 | Stephanou et al. |
| 8,727,978 B2 | 5/2014 | Tran et al. |
| 8,731,220 B2 | 5/2014 | Zhang et al. |
| 8,736,081 B2 | 5/2014 | Foster et al. |
| 8,737,646 B2 | 5/2014 | Wismar |
| 8,742,469 B2 | 6/2014 | Milgrew |
| 8,742,517 B2 | 6/2014 | Langereis et al. |
| 8,742,770 B2 | 6/2014 | Trumper et al. |

(56) References Cited

U.S. PATENT DOCUMENTS

| | | |
|---|---|---|
| 8,742,944 B2 | 6/2014 | Mitchell et al. |
| 8,744,117 B2 | 6/2014 | Daley |
| 8,746,039 B2 | 6/2014 | Adams et al. |
| 8,746,048 B2 | 6/2014 | Agache et al. |
| 8,747,313 B2 | 6/2014 | Tran et al. |
| 8,747,336 B2 | 6/2014 | Tran |
| 8,748,947 B2 | 6/2014 | Milgrew |
| 8,750,971 B2 | 6/2014 | Tran |
| 8,755,539 B2 | 6/2014 | Huang et al. |
| 8,755,541 B2 | 6/2014 | Liu et al. |
| 8,755,556 B2 | 6/2014 | Cohen et al. |
| 8,758,253 B2 | 6/2014 | Sano et al. |
| 8,760,031 B2 | 6/2014 | Chang |
| 8,764,651 B2 | 7/2014 | Tran |
| 8,766,327 B2 | 7/2014 | Milgrew |
| 8,767,980 B2 | 7/2014 | Statham |
| 8,770,722 B2 | 7/2014 | Panchawagh et al. |
| 8,774,428 B2 | 7/2014 | Jaar et al. |
| 8,774,885 B2 | 7/2014 | Abreu |
| 8,776,573 B2 | 7/2014 | Rearick et al. |
| 8,783,113 B2 | 7/2014 | Robert et al. |
| 8,783,804 B2 | 7/2014 | Panchawagh et al. |
| 8,784,549 B2 | 7/2014 | Bermel et al. |
| 8,787,117 B2 | 7/2014 | Kandori |
| 8,787,600 B2 | 7/2014 | Conti et al. |
| 8,787,601 B2 | 7/2014 | Suzuki et al. |
| 8,790,567 B2 | 7/2014 | Uchida et al. |
| 8,791,971 B2 | 7/2014 | Marcus et al. |
| 8,792,658 B2 | 7/2014 | Baliga et al. |
| 8,793,811 B1 | 7/2014 | Prater et al. |
| 8,800,369 B2 | 8/2014 | Caminada et al. |
| 8,802,568 B2 | 8/2014 | Mayer et al. |
| 8,803,261 B2 | 8/2014 | Traynor et al. |
| 8,804,982 B2 | 8/2014 | Michel et al. |
| 8,806,751 B2 | 8/2014 | Xie et al. |
| 8,811,635 B2 | 8/2014 | Sridharan et al. |
| 8,814,691 B2 | 8/2014 | Haddick et al. |
| 8,818,007 B2 | 8/2014 | Robert |
| 8,822,205 B2 | 9/2014 | Milgrew |
| 8,822,906 B2 | 9/2014 | Yuan et al. |
| 8,824,706 B2 | 9/2014 | Stephanou et al. |
| 8,824,707 B2 | 9/2014 | Bachman et al. |
| 8,824,713 B2 | 9/2014 | Engbert et al. |
| 8,831,246 B2 | 9/2014 | Josefsson |
| 8,831,705 B2 | 9/2014 | Dobak |
| 8,833,171 B2 | 9/2014 | Besling et al. |
| 8,833,175 B2 | 9/2014 | Chandrasekharan et al. |
| 8,836,111 B2 | 9/2014 | Conti et al. |
| 8,837,754 B2 | 9/2014 | Formosa et al. |
| 8,842,858 B2 | 9/2014 | Lillelund |
| 8,844,340 B2 | 9/2014 | Agache |
| 8,845,557 B1 | 9/2014 | Giuffrida et al. |
| 8,845,914 B2 | 9/2014 | Nassef et al. |
| 8,846,183 B2 | 9/2014 | Unger et al. |
| 8,847,148 B2 | 9/2014 | Kirkpatrick et al. |
| 8,847,289 B2 | 9/2014 | Wang |
| 8,848,197 B2 | 9/2014 | Pruessner et al. |
| 8,848,950 B2 | 9/2014 | Shimura |
| 8,850,893 B2 | 10/2014 | Seppa et al. |
| 8,855,335 B2 | 10/2014 | Henriksen |
| 8,855,337 B2 | 10/2014 | van Lippen et al. |
| 8,860,154 B2 | 10/2014 | Wang |
| 8,861,764 B2 | 10/2014 | Tanaka et al. |
| 8,873,777 B2 | 10/2014 | Yoshino |
| 8,875,576 B2 | 11/2014 | Swanson et al. |
| 8,875,578 B2 | 11/2014 | Smith |
| 8,878,528 B2 | 11/2014 | Quevy |
| 8,885,853 B2 | 11/2014 | Yamashita et al. |
| 8,897,465 B2 | 11/2014 | Muza |
| 8,912,580 B2 | 12/2014 | Milgrew |
| 8,913,762 B2 | 12/2014 | Steele et al. |
| 8,914,089 B2 | 12/2014 | Abreu |
| 8,916,395 B2 | 12/2014 | Adiga et al. |
| 8,921,957 B1 | 12/2014 | Zhang et al. |
| 8,924,166 B2 | 12/2014 | Von Herzen et al. |
| 8,928,203 B2 | 1/2015 | Kandori et al. |
| 8,929,584 B2 | 1/2015 | Zoellin et al. |
| 8,932,677 B2 | 1/2015 | Marcus et al. |
| 8,936,353 B2 | 1/2015 | Panchawagh et al. |
| 8,936,354 B2 | 1/2015 | Panchawagh et al. |
| 8,939,154 B2 | 1/2015 | Mintchev et al. |
| 8,939,551 B2 | 1/2015 | Panchawagh et al. |
| 8,942,389 B2 | 1/2015 | Sridharan et al. |
| 8,942,394 B2 | 1/2015 | Conti et al. |
| 8,953,414 B2 | 2/2015 | Kandori |
| 8,958,574 B2 | 2/2015 | Fukuzawa et al. |
| 8,958,581 B2 | 2/2015 | Ito et al. |
| 8,962,368 B2 | 2/2015 | Wang |
| 8,963,262 B2 | 2/2015 | Bulovic et al. |
| 8,964,298 B2 | 2/2015 | Haddick et al. |
| 8,965,008 B2 | 2/2015 | Nystrom |
| 8,965,013 B2 | 2/2015 | Eriksson et al. |
| 8,965,027 B2 | 2/2015 | Bolognia et al. |
| 8,968,195 B2 | 3/2015 | Tran |
| 8,975,791 B2 | 3/2015 | Leonov |
| 8,975,984 B2 | 3/2015 | Huang |
| 8,976,997 B1 | 3/2015 | Hecht et al. |
| 8,983,090 B2 | 3/2015 | Kim et al. |
| 8,983,097 B2 | 3/2015 | Dehe et al. |
| 8,983,099 B2 | 3/2015 | Takano et al. |
| 8,988,911 B2 | 3/2015 | Norris |
| 8,991,986 B2 | 3/2015 | Sowinski et al. |
| 8,992,858 B2 | 3/2015 | Chou et al. |
| 8,994,076 B2 | 3/2015 | Milgrew et al. |
| 8,994,954 B2 | 3/2015 | Atia et al. |
| 8,995,690 B2 | 3/2015 | Hammerschmidt et al. |
| 9,000,833 B2 | 4/2015 | Caffee et al. |
| 9,001,622 B2 | 4/2015 | Perry |
| 9,002,037 B2 | 4/2015 | Dehe et al. |
| 9,002,043 B2 | 4/2015 | Norris et al. |
| 9,007,119 B2 | 4/2015 | Caffee et al. |
| 9,008,332 B2 | 4/2015 | Wang et al. |
| 9,008,336 B2 | 4/2015 | Akino |
| 9,008,344 B2 | 4/2015 | Melanson et al. |
| 9,010,909 B2 | 4/2015 | Nelson et al. |
| 9,017,537 B2 | 4/2015 | Adiga et al. |
| 9,020,766 B2 | 4/2015 | Von Herzen et al. |
| 9,028,405 B2 | 5/2015 | Tran |
| 9,031,266 B2 | 5/2015 | Dehe et al. |
| 9,034,764 B2 | 5/2015 | O'Brien |
| 9,042,578 B2 | 5/2015 | Dunser |
| 9,046,547 B2 | 6/2015 | Westberg et al. |
| 9,052,194 B2 | 6/2015 | Seeger et al. |
| 9,052,335 B2 | 6/2015 | Coronato et al. |
| 9,056,760 B2 | 6/2015 | Feiertag et al. |
| 9,059,630 B2 | 6/2015 | Gueorguiev |
| 9,060,683 B2 | 6/2015 | Tran |
| 9,061,318 B2 | 6/2015 | Rothberg et al. |
| 9,071,694 B2 | 6/2015 | Klinghult |
| 9,072,429 B2 | 7/2015 | Kandori et al. |
| 9,074,985 B2 | 7/2015 | Lebental et al. |
| 9,078,069 B2 | 7/2015 | Bharatan et al. |
| 9,083,286 B2 | 7/2015 | Kropfitsch et al. |
| 9,083,288 B2 | 7/2015 | Thomsen et al. |
| 9,084,366 B2 | 7/2015 | Pahl |
| 9,085,012 B2 | 7/2015 | Machida et al. |
| 9,086,302 B2 | 7/2015 | Franke |
| 9,094,027 B2 | 7/2015 | Tao et al. |
| 9,094,110 B2 | 7/2015 | Perry |
| 9,094,111 B2 | 7/2015 | Perry |
| 9,094,112 B2 | 7/2015 | Perry |
| 9,094,764 B2 | 7/2015 | Rosener |
| 9,096,424 B2 | 8/2015 | Conti et al. |
| 9,097,890 B2 | 8/2015 | Miller et al. |
| 9,097,891 B2 | 8/2015 | Border et al. |
| 9,103,761 B2 | 8/2015 | Nassef et al. |
| 9,107,008 B2 | 8/2015 | Leitner |
| 9,107,586 B2 | 8/2015 | Tran |
| 9,111,548 B2 | 8/2015 | Nandy et al. |
| 9,113,260 B2 | 8/2015 | Norris |
| 9,113,263 B2 | 8/2015 | Furst et al. |
| 9,118,338 B2 | 8/2015 | Juang et al. |
| 9,124,220 B2 | 9/2015 | Muza et al. |
| 9,128,136 B2 | 9/2015 | Wurzinger et al. |

(56) References Cited

U.S. PATENT DOCUMENTS

| | | |
|---|---|---|
| 9,128,281 B2 | 9/2015 | Osterhout et al. |
| 9,129,295 B2 | 9/2015 | Border et al. |
| 9,131,319 B2 | 9/2015 | Zoellin et al. |
| 9,133,016 B2 | 9/2015 | Rombach |
| 9,134,534 B2 | 9/2015 | Border et al. |
| 9,139,418 B2 | 9/2015 | Zoellin et al. |
| 9,143,869 B2 | 9/2015 | Daley et al. |
| 9,143,870 B2 | 9/2015 | Liu et al. |
| 9,143,876 B2 | 9/2015 | Kropfitsch et al. |
| 9,146,109 B2 | 9/2015 | Magnoni et al. |
| 9,148,712 B2 | 9/2015 | Dehe |
| 9,148,726 B2 | 9/2015 | Dehe |
| 9,148,729 B2 | 9/2015 | Josefsson |
| 9,148,730 B2 | 9/2015 | Takano |
| 9,151,723 B2 | 10/2015 | Vasan et al. |
| 9,151,949 B2 | 10/2015 | Hofmann et al. |
| 9,154,886 B2 | 10/2015 | Chen et al. |
| 9,159,710 B2 | 10/2015 | Lal et al. |
| 9,161,113 B1 | 10/2015 | Fenton et al. |
| 9,162,878 B2 | 10/2015 | Gudeman et al. |
| 9,167,354 B2 | 10/2015 | Nowak |
| 9,170,164 B2 | 10/2015 | Naegele-Preissmann et al. |
| 9,174,222 B2 | 11/2015 | Huang et al. |
| 9,174,438 B2 | 11/2015 | Xie et al. |
| 9,179,221 B2 | 11/2015 | Barzen et al. |
| 9,181,080 B2 | 11/2015 | Dehe et al. |
| 9,181,086 B1 | 11/2015 | Miles et al. |
| 9,182,454 B1 | 11/2015 | Williams et al. |
| 9,182,596 B2 | 11/2015 | Border et al. |
| 9,190,937 B2 | 11/2015 | Lin et al. |
| 9,194,704 B2 | 11/2015 | Lin et al. |
| 9,197,967 B2 | 11/2015 | Mortensen |
| 9,199,201 B2 | 12/2015 | Puleo et al. |
| 9,200,887 B2 | 12/2015 | Potsaid et al. |
| 9,204,224 B2 | 12/2015 | Hosoe |
| 9,204,796 B2 | 12/2015 | Tran |
| 9,209,746 B2 | 12/2015 | Phan Le et al. |
| 9,210,516 B2 | 12/2015 | Herzum et al. |
| 9,212,046 B2 | 12/2015 | Zinn |
| 9,214,151 B2 | 12/2015 | Perry |
| 9,215,532 B2 | 12/2015 | Melanson et al. |
| 9,215,980 B2 | 12/2015 | Tran et al. |
| 9,216,897 B2 | 12/2015 | Chan et al. |
| 9,217,641 B2 | 12/2015 | Caminada et al. |
| 9,219,963 B2 | 12/2015 | Yang et al. |
| 9,221,675 B2 | 12/2015 | Hu et al. |
| 9,222,867 B2 | 12/2015 | Norling et al. |
| 9,223,134 B2 | 12/2015 | Miller et al. |
| 9,226,079 B2 | 12/2015 | Sciutti et al. |
| 9,228,916 B2 | 1/2016 | Valdevit et al. |
| 9,229,227 B2 | 1/2016 | Border et al. |
| 9,232,317 B2 | 1/2016 | Norris |
| 9,233,395 B2 | 1/2016 | Kandori et al. |
| 9,234,797 B1 | 1/2016 | Newman et al. |
| 9,236,837 B2 | 1/2016 | Kropfitsch et al. |
| 9,237,211 B2 | 1/2016 | Tabe |
| 9,238,250 B2 | 1/2016 | Kandori et al. |
| 9,238,580 B2 | 1/2016 | Alagarsamy et al. |
| 9,241,205 B2 | 1/2016 | Fukuoka et al. |
| 9,242,275 B2 | 1/2016 | Rothberg et al. |
| 9,247,331 B2 | 1/2016 | Suvanto |
| 9,250,113 B2 | 2/2016 | Bashir et al. |
| 9,250,142 B2 | 2/2016 | Fukuzawa et al. |
| 9,252,707 B2 | 2/2016 | Seth et al. |
| 9,253,579 B2 | 2/2016 | Formosa |
| 9,258,651 B2 | 2/2016 | Norris et al. |
| 9,258,660 B2 | 2/2016 | Zeleznik |
| 9,264,815 B2 | 2/2016 | Wang et al. |
| 9,266,713 B2 | 2/2016 | Johansen et al. |
| 9,267,923 B2 | 2/2016 | Urey et al. |
| 9,270,238 B2 | 2/2016 | Lee et al. |
| 9,270,281 B1 | 2/2016 | Wojciechowski et al. |
| 9,271,067 B2 | 2/2016 | Suvanto et al. |
| 9,277,327 B2 | 3/2016 | Terazono et al. |
| 9,277,329 B2 | 3/2016 | Schelling et al. |
| 9,281,744 B2 | 3/2016 | Kropfitsch |
| 9,282,389 B1 | 3/2016 | Khenkin et al. |
| 9,282,415 B2 | 3/2016 | Chang |
| 9,285,589 B2 | 3/2016 | Osterhout et al. |
| 9,287,834 B2 | 3/2016 | Lasseuguette et al. |
| 9,288,583 B2 | 3/2016 | Nakano et al. |
| 9,290,375 B2 | 3/2016 | Rothberg et al. |
| 9,291,638 B2 | 3/2016 | Merrill, Jr. et al. |
| 9,294,847 B2 | 3/2016 | Harman |
| 9,301,036 B2 | 3/2016 | Akino |
| 9,301,055 B2 | 3/2016 | Honkakoski et al. |
| 9,307,319 B2 | 4/2016 | Reimann et al. |
| 9,319,765 B2 | 4/2016 | Ravnkilde |
| 9,319,772 B2 | 4/2016 | Chen et al. |
| 9,321,626 B2 | 4/2016 | Shaw et al. |
| 9,322,685 B2 | 4/2016 | Ray |
| 9,327,967 B2 | 5/2016 | Huang |
| 9,329,689 B2 | 5/2016 | Osterhout et al. |
| 9,332,332 B2 | 5/2016 | Bolognia et al. |
| 9,332,342 B2 | 5/2016 | Kanaya et al. |
| 9,332,345 B1 | 5/2016 | Melanson et al. |
| 9,335,271 B2 | 5/2016 | Pruessner et al. |
| 9,337,722 B2 | 5/2016 | Josefsson |
| 9,338,557 B2 | 5/2016 | Nakamura |
| 9,338,559 B2 | 5/2016 | Yang et al. |
| 9,340,413 B2 | 5/2016 | Merassi et al. |
| 9,341,843 B2 | 5/2016 | Border et al. |
| 9,342,179 B2 | 5/2016 | Fuji et al. |
| 9,344,805 B2 | 5/2016 | Felberer et al. |
| 9,344,807 B2 | 5/2016 | Uchida |
| 9,344,808 B2 | 5/2016 | Chan et al. |
| 9,344,809 B2 | 5/2016 | Muza et al. |
| 9,344,810 B2 | 5/2016 | Okita |
| 9,350,305 B2 | 5/2016 | David et al. |
| 9,351,062 B2 | 5/2016 | Inoda et al. |
| 9,351,074 B2 | 5/2016 | Kim |
| 9,351,083 B2 | 5/2016 | Hecht et al. |
| 9,351,640 B2 | 5/2016 | Tran |
| 9,357,294 B2 | 5/2016 | Rombach et al. |
| 9,357,296 B2 | 5/2016 | Josefsson et al. |
| 9,359,188 B1 | 6/2016 | Bharatan |
| 9,363,610 B2 | 6/2016 | Traynor et al. |
| 9,364,362 B2 | 6/2016 | Berkcan et al. |
| 9,366,862 B2 | 6/2016 | Haddick et al. |
| 9,369,804 B2 | 6/2016 | Buck et al. |
| 9,369,810 B2 | 6/2016 | Kamitani et al. |
| 9,372,154 B2 | 6/2016 | Prater |
| 9,382,109 B2 | 7/2016 | Johansen et al. |
| 9,389,077 B2 | 7/2016 | Comi et al. |
| 9,389,079 B2 | 7/2016 | Lee et al. |
| 9,389,215 B2 | 7/2016 | Von Herzen et al. |
| 9,392,359 B2 | 7/2016 | Akino |
| 9,395,317 B2 | 7/2016 | Cannon et al. |
| 9,400,233 B2 | 7/2016 | Lin et al. |
| 9,402,137 B2 | 7/2016 | Hsu et al. |
| 9,403,670 B2 | 8/2016 | Schelling et al. |
| 9,404,954 B2 | 8/2016 | Roy et al. |
| 9,407,991 B2 | 8/2016 | Melanson et al. |
| 9,408,555 B2 | 8/2016 | Akingba et al. |
| 9,411,000 B2 | 8/2016 | Van der Plas et al. |
| 9,413,317 B2 | 8/2016 | Kropfitsch et al. |
| 9,414,175 B2 | 8/2016 | Doller |
| 9,419,562 B1 | 8/2016 | Melanson et al. |
| 9,420,365 B2 | 8/2016 | Xu |
| 9,420,380 B2 | 8/2016 | Inoue et al. |
| 9,420,391 B2 | 8/2016 | Wiesbauer et al. |
| 9,423,254 B2 | 8/2016 | Waters et al. |
| 9,426,563 B2 | 8/2016 | Gasparini et al. |
| 9,428,379 B2 | 8/2016 | Ata et al. |
| 9,438,979 B2 | 9/2016 | Dehe |
| 9,439,002 B2 | 9/2016 | Berger et al. |
| 9,441,940 B2 | 9/2016 | Sumant et al. |
| 9,444,404 B2 | 9/2016 | Opris et al. |
| 9,444,928 B1 | 9/2016 | Iyer et al. |
| 9,445,173 B2 | 9/2016 | Wiesbauer et al. |
| 9,445,188 B2 | 9/2016 | Okita |
| 9,448,069 B2 | 9/2016 | El-Gamal et al. |
| 9,451,359 B2 | 9/2016 | Mucha et al. |
| 9,455,671 B2 | 9/2016 | Kropfitsch et al. |

(56) References Cited

U.S. PATENT DOCUMENTS

| | | |
|---|---|---|
| 9,456,283 B2 | 9/2016 | Chiang et al. |
| 9,459,100 B2 | 10/2016 | Balachandran et al. |
| 9,459,673 B2 | 10/2016 | Richter et al. |
| 9,462,364 B2 | 10/2016 | Uchida et al. |
| 9,462,395 B2 | 10/2016 | Nicollini et al. |
| 9,465,064 B2 | 10/2016 | Roy et al. |
| 9,466,277 B1 | 10/2016 | Myers |
| 9,467,774 B2 | 10/2016 | Hammerschmidt et al. |
| 9,470,710 B2 | 10/2016 | Wygant et al. |
| 9,470,910 B2 | 10/2016 | Fenton et al. |
| 9,473,831 B2 | 10/2016 | Von Herzen et al. |
| 9,476,975 B2 | 10/2016 | Viikari et al. |
| 9,479,875 B2 | 10/2016 | Hall et al. |
| 9,488,541 B2 | 11/2016 | Fukuzawa et al. |
| 9,491,531 B2 | 11/2016 | Wang |
| 9,494,477 B2 | 11/2016 | Wiesbauer et al. |
| 9,497,552 B2 | 11/2016 | Akiyama et al. |
| 9,499,395 B2 | 11/2016 | Rothberg et al. |
| 9,502,019 B2 | 11/2016 | Muza et al. |
| 9,503,814 B2 | 11/2016 | Schultz et al. |
| 9,503,820 B2 | 11/2016 | Hall et al. |
| 9,503,821 B2 | 11/2016 | Atkins et al. |
| 9,503,823 B2 | 11/2016 | Barzen et al. |
| 9,508,823 B2 | 11/2016 | Mayer et al. |
| 9,510,108 B2 | 11/2016 | Han et al. |
| 9,510,121 B2 | 11/2016 | Xu et al. |
| 9,515,676 B2 | 12/2016 | Sugnet et al. |
| 9,516,415 B2 | 12/2016 | Nielsen |
| 9,516,420 B2 | 12/2016 | Kim et al. |
| 9,516,425 B2 | 12/2016 | Daley et al. |
| 9,516,428 B2 | 12/2016 | Dehe et al. |
| 9,518,884 B2 | 12/2016 | Tsai |
| 9,518,886 B2 | 12/2016 | Baldo et al. |
| 9,520,505 B2 | 12/2016 | Nakatani |
| 9,521,492 B2 | 12/2016 | Okita |
| 9,522,276 B2 | 12/2016 | Shen et al. |
| 9,525,925 B2 | 12/2016 | Wurzinger et al. |
| 9,528,831 B2 | 12/2016 | Entringer et al. |
| 9,534,974 B2 | 1/2017 | Vaiana et al. |
| 9,535,137 B2 | 1/2017 | van Beek et al. |
| 9,537,359 B2 | 1/2017 | Perry |
| 9,538,273 B2 | 1/2017 | Akino |
| 9,540,226 B2 | 1/2017 | Klein et al. |
| 9,541,464 B2 | 1/2017 | Kuisma |
| 9,544,672 B2 | 1/2017 | Nawrocki |
| 9,544,697 B2 | 1/2017 | Uchida |
| 9,548,632 B2 | 1/2017 | Perry |
| 9,548,655 B2 | 1/2017 | Ersoy et al. |
| 9,549,691 B2 | 1/2017 | Tran |
| 9,554,212 B2 | 1/2017 | Sheplak et al. |
| 9,554,213 B2 | 1/2017 | Miles et al. |
| 9,557,345 B2 | 1/2017 | Maeda et al. |
| 9,559,647 B2 | 1/2017 | Nielsen |
| 9,560,454 B2 | 1/2017 | Kasai |
| 9,568,461 B2 | 2/2017 | Von Herzen et al. |
| 9,571,931 B1 | 2/2017 | Melanson et al. |
| 9,575,089 B1 | 2/2017 | Cazzaniga et al. |
| 9,575,116 B2 | 2/2017 | Steele et al. |
| 9,578,424 B2 | 2/2017 | Sridharan |
| 9,582,072 B2 | 2/2017 | Connor |
| 9,584,924 B2 | 2/2017 | Akino |
| 9,584,931 B2 | 2/2017 | Kohl et al. |
| 9,584,941 B2 | 2/2017 | Dehe |
| 9,588,190 B2 | 3/2017 | Smith et al. |
| 9,590,570 B2 | 3/2017 | Akino |
| 9,591,408 B2 | 3/2017 | Dehe et al. |
| 9,591,417 B2 | 3/2017 | Shams et al. |
| 9,596,988 B2 | 3/2017 | Irazoqui et al. |
| 9,596,995 B2 | 3/2017 | Fuji et al. |
| 9,602,921 B2 | 3/2017 | Zeleznik et al. |
| 9,602,924 B2 | 3/2017 | Josefsson |
| 9,609,429 B2 | 3/2017 | Reining |
| 9,609,432 B2 | 3/2017 | Andersen |
| 9,609,764 B2 | 3/2017 | Won et al. |
| 9,611,135 B1 | 4/2017 | Klein |
| 9,611,139 B2 | 4/2017 | Kuisma |
| 9,615,167 B2 | 4/2017 | Akino |
| 9,618,475 B2 | 4/2017 | Rothberg et al. |
| 9,618,533 B2 | 4/2017 | Waters et al. |
| 9,628,886 B2 | 4/2017 | Dehe et al. |
| 9,628,909 B2 | 4/2017 | Melanson et al. |
| 9,628,919 B2 | 4/2017 | Conti et al. |
| 9,628,920 B2 | 4/2017 | Bach et al. |
| 9,631,996 B2 | 4/2017 | Wiesbauer et al. |
| 9,634,628 B2 | 4/2017 | Nicollini et al. |
| 9,635,460 B2 | 4/2017 | Schultz et al. |
| 9,638,617 B2 | 5/2017 | Birkholz et al. |
| 9,641,949 B2 | 5/2017 | Massoner |
| 9,644,963 B2 | 5/2017 | Lee et al. |
| 9,645,166 B2 | 5/2017 | Waters et al. |
| 9,648,433 B1 | 5/2017 | Doller |
| 9,651,538 B2 | 5/2017 | Von Herzen et al. |
| 9,653,254 B2 | 5/2017 | Zeidler et al. |
| 9,654,071 B2 | 5/2017 | David et al. |
| 9,658,179 B2 | 5/2017 | Rajaraman et al. |
| 9,658,247 B2 | 5/2017 | Yang et al. |
| 9,661,411 B1 | 5/2017 | Han et al. |
| 9,661,423 B2 | 5/2017 | Hecht et al. |
| 9,667,173 B1 | 5/2017 | Kappus et al. |
| 9,668,035 B2 | 5/2017 | McCall |
| 9,668,047 B2 | 5/2017 | Park et al. |
| 9,668,056 B2 | 5/2017 | Dehe et al. |
| 9,668,062 B2 | 5/2017 | Ikeda et al. |
| 9,673,768 B2 | 6/2017 | Perrott |
| 9,673,785 B2 | 6/2017 | Herzum et al. |
| 9,674,627 B2 | 6/2017 | Hsu et al. |
| 9,676,615 B2 | 6/2017 | Miao |
| 9,676,617 B2 | 6/2017 | Huang |
| 9,680,414 B1 | 6/2017 | Chen et al. |
| 9,681,229 B2 | 6/2017 | Rombach et al. |
| 9,681,243 B2 | 6/2017 | Guo et al. |
| 9,683,844 B2 | 6/2017 | Seeger et al. |
| 9,685,254 B2 | 6/2017 | Kokubo et al. |
| 9,686,617 B2 | 6/2017 | Doller et al. |
| 9,686,618 B2 | 6/2017 | Pompei |
| 9,689,889 B1 | 6/2017 | Casiraghi et al. |
| 9,692,372 B2 | 6/2017 | Atkins et al. |
| 9,693,135 B2 | 6/2017 | Haas-Christensen et al. |
| 9,695,038 B2 | 7/2017 | Cargill et al. |
| 9,696,222 B2 | 7/2017 | Sumant et al. |
| 9,696,375 B2 | 7/2017 | Aaltonen et al. |
| 9,702,992 B2 | 7/2017 | Avenson et al. |
| 9,706,294 B2 | 7/2017 | Kopetz et al. |
| 9,706,312 B2 | 7/2017 | Nicollini |
| 9,706,618 B2 | 7/2017 | Furuya et al. |
| 9,708,174 B2 | 7/2017 | Ziglioli |
| 9,708,176 B2 | 7/2017 | Thompson et al. |
| 9,712,923 B2 | 7/2017 | Furst et al. |
| 9,716,945 B2 | 7/2017 | Lesso et al. |
| 9,719,847 B2 | 8/2017 | Kandori |
| 9,722,561 B2 | 8/2017 | Josefsson |
| 9,722,563 B2 | 8/2017 | Kropfitsch et al. |
| 9,723,423 B2 | 8/2017 | Uchida |
| 9,729,014 B2 | 8/2017 | Perry |
| 9,729,114 B2 | 8/2017 | Astgimath |
| 9,729,988 B2 | 8/2017 | Kropfitsch et al. |
| 9,733,230 B2 | 8/2017 | Von Herzen et al. |
| 9,733,268 B2 | 8/2017 | Membretti et al. |
| 9,736,586 B2 | 8/2017 | Akino |
| 9,736,594 B2 | 8/2017 | Khenkin et al. |
| 9,738,514 B2 | 8/2017 | Rothberg et al. |
| 9,740,003 B2 | 8/2017 | Potsaid et al. |
| 9,743,167 B2 | 8/2017 | Nielsen et al. |
| 9,743,191 B2 | 8/2017 | Pal et al. |
| 9,743,196 B2 | 8/2017 | Kropfitsch |
| 9,743,203 B2 | 8/2017 | Zeleznik |
| 9,756,159 B2 | 9/2017 | Park |
| 9,756,430 B2 | 9/2017 | Traynor et al. |
| 9,759,917 B2 | 9/2017 | Osterhout et al. |
| 9,762,188 B2 | 9/2017 | Muza et al. |
| 9,769,573 B2 | 9/2017 | Hecht et al. |
| 9,774,276 B2 | 9/2017 | Kandori et al. |
| 9,774,969 B2 | 9/2017 | Matsumoto |
| 9,775,520 B2 | 10/2017 | Tran |

(56) References Cited

U.S. PATENT DOCUMENTS

| | | |
|---|---|---|
| 9,778,282 B2 | 10/2017 | Yang et al. |
| 9,778,302 B2 | 10/2017 | Wurzinger et al. |
| 9,780,435 B2 | 10/2017 | McAllister |
| 9,781,518 B2 | 10/2017 | Schober et al. |
| 9,781,521 B2 | 10/2017 | Kofod-Hansen et al. |
| 9,787,142 B2 | 10/2017 | Perry |
| 9,790,087 B2 | 10/2017 | Fukuzawa et al. |
| 9,791,341 B2 | 10/2017 | Fuji et al. |
| 9,793,764 B2 | 10/2017 | Perry |
| 9,794,661 B2 | 10/2017 | Watson et al. |
| 9,794,711 B2 | 10/2017 | Sheplak et al. |
| 9,799,488 B2 | 10/2017 | Kirkpatrick et al. |
| 9,800,019 B2 | 10/2017 | Atia et al. |
| 9,800,212 B2 | 10/2017 | Barbieri et al. |
| 9,800,980 B2 | 10/2017 | Palmer et al. |
| 9,801,542 B2 | 10/2017 | Tran et al. |
| 9,804,264 B2 | 10/2017 | Villeneuve et al. |
| 9,809,444 B2 | 11/2017 | Klein |
| 9,809,448 B2 | 11/2017 | Lim et al. |
| 9,809,451 B2 | 11/2017 | Chan et al. |
| 9,810,775 B1 | 11/2017 | Welford et al. |
| 9,810,786 B1 | 11/2017 | Welford et al. |
| 9,812,838 B2 | 11/2017 | Villeneuve et al. |
| 9,812,906 B2 | 11/2017 | Perry |
| 9,813,831 B1 | 11/2017 | Thomsen |
| 9,814,425 B2 | 11/2017 | Tran |
| 9,815,685 B2 | 11/2017 | Chang et al. |
| 9,820,056 B2 | 11/2017 | Ngo et al. |
| 9,820,657 B2 | 11/2017 | Tran |
| 9,820,658 B2 | 11/2017 | Tran |
| 9,823,353 B2 | 11/2017 | Eichenholz et al. |
| 9,825,492 B2 | 11/2017 | Perry |
| 9,828,236 B2 | 11/2017 | Dirksen et al. |
| 9,828,237 B2 | 11/2017 | Walther et al. |
| 9,831,723 B2 | 11/2017 | Perry |
| 9,832,573 B2 | 11/2017 | Hall et al. |
| 9,835,647 B2 | 12/2017 | Opris et al. |
| 9,838,767 B2 | 12/2017 | Northemann |
| 9,839,103 B2 | 12/2017 | Avrahamy |
| 9,843,858 B1 | 12/2017 | Karunasiri et al. |
| 9,843,862 B2 | 12/2017 | Barzen |
| 9,844,335 B2 | 12/2017 | Stein et al. |
| 9,846,097 B2 | 12/2017 | Naumann |
| 9,853,201 B2 | 12/2017 | Grosh et al. |
| 9,854,360 B2 | 12/2017 | Conso |
| 9,854,367 B2 | 12/2017 | Park |
| 9,856,133 B2 | 1/2018 | Boillot et al. |
| 9,857,468 B1 | 1/2018 | Eichenholz et al. |
| 9,860,649 B2 | 1/2018 | Berger et al. |
| 9,863,769 B2 | 1/2018 | Anac et al. |
| 9,864,846 B2 | 1/2018 | Sugnet et al. |
| 9,865,176 B2 | 1/2018 | Tran |
| 9,866,066 B2 | 1/2018 | Arnold et al. |
| 9,866,938 B2 | 1/2018 | Popper et al. |
| 9,866,959 B2 | 1/2018 | van Nieuwkerk et al. |
| 9,866,972 B2 | 1/2018 | Veneri et al. |
| 9,867,263 B2 | 1/2018 | Avrahamy |
| 9,869,754 B1 | 1/2018 | Campbell et al. |
| 9,874,635 B1 | 1/2018 | Eichenholz et al. |
| 9,875,406 B2 | 1/2018 | Haddick et al. |
| 9,877,106 B2 | 1/2018 | Nicollini et al. |
| 9,878,901 B2 | 1/2018 | Geen et al. |
| 9,893,691 B2 | 2/2018 | Akino |
| 9,894,437 B2 | 2/2018 | Pawlowski et al. |
| 9,897,460 B2 | 2/2018 | Coronato et al. |
| 9,897,504 B2 | 2/2018 | Wiesbauer et al. |
| 9,897,530 B2 | 2/2018 | Durack et al. |
| 9,900,707 B1 | 2/2018 | Thomsen |
| 9,901,252 B2 | 2/2018 | Tran |
| 9,903,718 B2 | 2/2018 | Thompson et al. |
| 9,905,992 B1 | 2/2018 | Welford et al. |
| 9,906,869 B2 | 2/2018 | Miles et al. |
| 9,907,473 B2 | 3/2018 | Tran |
| 9,910,061 B2 | 3/2018 | Waters et al. |
| 9,910,062 B2 | 3/2018 | Waters et al. |
| 9,915,520 B2 | 3/2018 | Cable et al. |
| 9,919,913 B2 | 3/2018 | Pan et al. |
| 9,921,114 B2 | 3/2018 | Fuji et al. |
| 9,927,393 B2 | 3/2018 | Rearick et al. |
| 9,929,603 B2 | 3/2018 | Perry |
| 9,930,451 B2 | 3/2018 | Muza et al. |
| 9,936,304 B2 | 4/2018 | Bach et al. |
| 9,938,133 B2 | 4/2018 | Kautzsch et al. |
| 9,941,817 B2 | 4/2018 | Takezaki et al. |
| 9,942,666 B2 | 4/2018 | Yoshino et al. |
| 9,944,514 B2 | 4/2018 | Rothberg et al. |
| 9,944,981 B2 | 4/2018 | Rothberg et al. |
| 9,945,746 B2 | 4/2018 | Wiesbauer et al. |
| 9,945,884 B2 | 4/2018 | Froemel et al. |
| 9,947,858 B2 | 4/2018 | Fujisawa et al. |
| 9,949,023 B2 | 4/2018 | Astgimath et al. |
| 9,949,025 B2 | 4/2018 | Frazier |
| 9,949,037 B2 | 4/2018 | Chau |
| 9,953,787 B2 | 4/2018 | Gudeman et al. |
| 9,955,269 B2 | 4/2018 | Doller et al. |
| 9,955,273 B2 | 4/2018 | Rocca et al. |
| 9,956,562 B2 | 5/2018 | Huang et al. |
| 9,958,348 B2 | 5/2018 | Classen et al. |
| 9,958,414 B2 | 5/2018 | Rothberg et al. |
| 9,958,415 B2 | 5/2018 | Rothberg et al. |
| 9,958,545 B2 | 5/2018 | Eichenholz et al. |
| 9,961,440 B2 | 5/2018 | Gabai et al. |
| 9,961,451 B2 | 5/2018 | Nicollini et al. |
| 9,966,090 B2 | 5/2018 | Thomas |
| 9,966,966 B2 | 5/2018 | Czaplewski et al. |
| 9,967,677 B2 | 5/2018 | Wiesbauer et al. |
| 9,967,678 B2 | 5/2018 | Akino |
| 9,967,679 B2 | 5/2018 | Krumbein et al. |
| 9,970,958 B2 | 5/2018 | Castellano et al. |
| 9,976,924 B2 | 5/2018 | Straeussnigg et al. |
| 2001/0002865 A1 | 6/2001 | Lipponen et al. |
| 2001/0005032 A1 | 6/2001 | Aigner et al. |
| 2001/0021058 A1 | 9/2001 | McClelland et al. |
| 2001/0022682 A1 | 9/2001 | McClelland et al. |
| 2001/0029983 A1 | 10/2001 | Unger et al. |
| 2001/0033670 A1 | 10/2001 | Tai et al. |
| 2001/0033796 A1 | 10/2001 | Unger et al. |
| 2001/0045525 A1 | 11/2001 | Gerlach et al. |
| 2001/0046306 A1 | 11/2001 | Bernert |
| 2001/0054778 A1 | 12/2001 | Unger et al. |
| 2002/0024569 A1 | 2/2002 | Silverbrook |
| 2002/0029814 A1 | 3/2002 | Unger et al. |
| 2002/0033863 A1 | 3/2002 | Silverbrook |
| 2002/0034312 A1 | 3/2002 | Ikeda |
| 2002/0036674 A1 | 3/2002 | Silverbrook |
| 2002/0048220 A1 | 4/2002 | Khuri-Yakub et al. |
| 2002/0049389 A1 | 4/2002 | Abreu |
| 2002/0067663 A1 | 6/2002 | Loeppert et al. |
| 2002/0068370 A1 | 6/2002 | Dwyer |
| 2002/0076069 A1 | 6/2002 | Norris et al. |
| 2002/0076076 A1 | 6/2002 | Kay et al. |
| 2002/0093038 A1 | 7/2002 | Ikeda et al. |
| 2002/0097300 A1 | 7/2002 | Silverbrook |
| 2002/0101474 A1 | 8/2002 | Hawkins et al. |
| 2002/0118850 A1 | 8/2002 | Yeh et al. |
| 2002/0122102 A1 | 9/2002 | Jeanmaire et al. |
| 2002/0122561 A1 | 9/2002 | Pelrine et al. |
| 2002/0127736 A1 | 9/2002 | Chou et al. |
| 2002/0127760 A1 | 9/2002 | Yeh et al. |
| 2002/0130931 A1 | 9/2002 | Hawkins et al. |
| 2002/0141606 A1 | 10/2002 | Schweder et al. |
| 2002/0144738 A1 | 10/2002 | Unger et al. |
| 2002/0151816 A1 | 10/2002 | Rich et al. |
| 2002/0171716 A1 | 11/2002 | Jeanmaire |
| 2002/0172387 A1 | 11/2002 | Horiuchi et al. |
| 2002/0177768 A1 | 11/2002 | Fleischman et al. |
| 2002/0193674 A1 | 12/2002 | Fleischman et al. |
| 2003/0016275 A1 | 1/2003 | Jeanmaire et al. |
| 2003/0016839 A1 | 1/2003 | Loeppert et al. |
| 2003/0019833 A1 | 1/2003 | Unger et al. |
| 2003/0020784 A1 | 1/2003 | Silverbrook |
| 2003/0020786 A1 | 1/2003 | Silverbrook |
| 2003/0021425 A1 | 1/2003 | Cheng |
| 2003/0021432 A1 | 1/2003 | Scheeper et al. |

(56) References Cited

U.S. PATENT DOCUMENTS

| | | |
|---|---|---|
| 2003/0025758 A1 | 2/2003 | Silverbrook |
| 2003/0025761 A1 | 2/2003 | Silverbrook |
| 2003/0033850 A1 | 2/2003 | Challoner et al. |
| 2003/0034536 A1 | 2/2003 | Scheeper et al. |
| 2003/0042117 A1 | 3/2003 | Ma |
| 2003/0057068 A1 | 3/2003 | McSwiggen |
| 2003/0063166 A1 | 4/2003 | Jeanmaire et al. |
| 2003/0063762 A1 | 4/2003 | Tajima et al. |
| 2003/0068055 A1 | 4/2003 | Tanabe et al. |
| 2003/0071686 A1 | 4/2003 | Lemkin |
| 2003/0081082 A1 | 5/2003 | Jeanmaire et al. |
| 2003/0103106 A1 | 6/2003 | Silverbrook |
| 2003/0118203 A1 | 6/2003 | Raicevich |
| 2003/0123683 A1 | 7/2003 | Raicevich |
| 2003/0128847 A1 | 7/2003 | Smith |
| 2003/0132824 A1 | 7/2003 | Ma |
| 2003/0132985 A1 | 7/2003 | Silverbrook |
| 2003/0132995 A1 | 7/2003 | Silverbrook |
| 2003/0133588 A1 | 7/2003 | Pedersen |
| 2003/0137021 A1 | 7/2003 | Wong et al. |
| 2003/0137567 A1 | 7/2003 | Silverbrook |
| 2003/0139687 A1 | 7/2003 | Abreu |
| 2003/0142175 A1 | 7/2003 | Silverbrook |
| 2003/0142934 A1 | 7/2003 | Pan et al. |
| 2003/0146957 A1 | 8/2003 | Jeanmaire |
| 2003/0174190 A1 | 9/2003 | Jeanmaire |
| 2003/0174850 A1 | 9/2003 | Gullov et al. |
| 2003/0179791 A1 | 9/2003 | Hiroshi et al. |
| 2003/0196489 A1 | 10/2003 | Dwyer |
| 2003/0202055 A1 | 10/2003 | Jeanmaire et al. |
| 2003/0202735 A1* | 10/2003 | Dunec .............. H02N 1/002 385/16 |
| 2003/0202738 A1* | 10/2003 | Dunec .............. G02B 6/352 385/18 |
| 2003/0210799 A1 | 11/2003 | Gabriel et al. |
| 2004/0001263 A1 | 1/2004 | Staker et al. |
| 2004/0007051 A1 | 1/2004 | Bashir et al. |
| 2004/0031150 A1 | 2/2004 | Silverbrook |
| 2004/0032440 A1 | 2/2004 | Silverbrook |
| 2004/0039297 A1 | 2/2004 | Abreu |
| 2004/0039298 A1 | 2/2004 | Abreu |
| 2004/0051759 A1 | 3/2004 | Silverbrook |
| 2004/0056923 A1 | 3/2004 | Silverbrook |
| 2004/0056924 A1 | 3/2004 | Silverbrook |
| 2004/0060355 A1 | 4/2004 | Nemirovsky et al. |
| 2004/0062405 A1 | 4/2004 | Corsaro et al. |
| 2004/0075715 A1 | 4/2004 | Silverbrook |
| 2004/0075718 A1 | 4/2004 | Silverbrook |
| 2004/0079724 A1 | 4/2004 | Silverbrook |
| 2004/0080556 A1 | 4/2004 | Silverbrook |
| 2004/0085159 A1 | 5/2004 | Kubena et al. |
| 2004/0088851 A1 | 5/2004 | Horiuchi et al. |
| 2004/0092121 A1 | 5/2004 | Silverbrook |
| 2004/0094506 A1 | 5/2004 | Silverbrook |
| 2004/0095434 A1 | 5/2004 | Silverbrook |
| 2004/0095441 A1 | 5/2004 | Jeanmaire |
| 2004/0099636 A1 | 5/2004 | Scipioni |
| 2004/0100529 A1 | 5/2004 | Silverbrook |
| 2004/0113153 A1 | 6/2004 | Wong et al. |
| 2004/0113983 A1 | 6/2004 | Silverbrook |
| 2004/0118808 A1 | 6/2004 | Silverbrook |
| 2004/0119591 A1 | 6/2004 | Peeters |
| 2004/0119784 A1 | 6/2004 | Silverbrook |
| 2004/0160495 A1 | 8/2004 | Silverbrook |
| 2004/0169697 A1 | 9/2004 | Silverbrook |
| 2004/0169701 A1 | 9/2004 | Silverbrook |
| 2004/0179705 A1 | 9/2004 | Wang et al. |
| 2004/0179706 A1 | 9/2004 | van Oerle |
| 2004/0179709 A1 | 9/2004 | Niederdraenk et al. |
| 2004/0184633 A1 | 9/2004 | Kay et al. |
| 2004/0207687 A1 | 10/2004 | Silverbrook |
| 2004/0207689 A1 | 10/2004 | Silverbrook |
| 2004/0207690 A1 | 10/2004 | Silverbrook |
| 2004/0207691 A1 | 10/2004 | Silverbrook |
| 2004/0207808 A1 | 10/2004 | Fleischman et al. |
| 2004/0218016 A1 | 11/2004 | Silverbrook |
| 2004/0218022 A1 | 11/2004 | Silverbrook |
| 2004/0237626 A1 | 12/2004 | Challoner et al. |
| 2004/0246305 A1 | 12/2004 | Silverbrook |
| 2004/0246308 A1 | 12/2004 | Silverbrook |
| 2004/0246311 A1 | 12/2004 | Silverbrook |
| 2004/0252858 A1 | 12/2004 | Boor et al. |
| 2004/0257400 A1 | 12/2004 | Silverbrook |
| 2004/0260470 A1 | 12/2004 | Rast |
| 2004/0263551 A1 | 12/2004 | Silverbrook |
| 2004/0263577 A1 | 12/2004 | Silverbrook |
| 2005/0001316 A1 | 1/2005 | Dean et al. |
| 2005/0001324 A1 | 1/2005 | Dunn et al. |
| 2005/0002536 A1 | 1/2005 | Gorelik et al. |
| 2005/0005421 A1 | 1/2005 | Wang et al. |
| 2005/0009197 A1 | 1/2005 | Adams et al. |
| 2005/0013455 A1 | 1/2005 | Loeb et al. |
| 2005/0016951 A1 | 1/2005 | Silverbrook |
| 2005/0018015 A1 | 1/2005 | Silverbrook |
| 2005/0018016 A1 | 1/2005 | Silverbrook |
| 2005/0018017 A1 | 1/2005 | Silverbrook |
| 2005/0020926 A1 | 1/2005 | Wiklof et al. |
| 2005/0024434 A1 | 2/2005 | Silverbrook |
| 2005/0024435 A1 | 2/2005 | Silverbrook |
| 2005/0024436 A1 | 2/2005 | Silverbrook |
| 2005/0024437 A1 | 2/2005 | Silverbrook |
| 2005/0024443 A1 | 2/2005 | Silverbrook |
| 2005/0030338 A1 | 2/2005 | Silverbrook |
| 2005/0030339 A1 | 2/2005 | Silverbrook |
| 2005/0030342 A1 | 2/2005 | Silverbrook |
| 2005/0030343 A1 | 2/2005 | Silverbrook |
| 2005/0035983 A1 | 2/2005 | Cruchon-Dupeyrat et al. |
| 2005/0036002 A1 | 2/2005 | Silverbrook |
| 2005/0037532 A1 | 2/2005 | Silverbrook |
| 2005/0039453 A1 | 2/2005 | Silverbrook |
| 2005/0041052 A1 | 2/2005 | Silverbrook |
| 2005/0041055 A1 | 2/2005 | Silverbrook |
| 2005/0041063 A1 | 2/2005 | Silverbrook |
| 2005/0046584 A1 | 3/2005 | Breed |
| 2005/0046663 A1 | 3/2005 | Silverbrook |
| 2005/0046673 A1 | 3/2005 | Silverbrook |
| 2005/0052497 A1 | 3/2005 | Silverbrook |
| 2005/0052514 A1 | 3/2005 | Silverbrook |
| 2005/0057628 A1 | 3/2005 | Silverbrook |
| 2005/0058298 A1 | 3/2005 | Smith |
| 2005/0061770 A1 | 3/2005 | Neumann, Jr. et al. |
| 2005/0066728 A1 | 3/2005 | Chojnacki et al. |
| 2005/0068612 A1 | 3/2005 | Wilson et al. |
| 2005/0069164 A1 | 3/2005 | Muthuswamy et al. |
| 2005/0072231 A1 | 4/2005 | Chojnacki et al. |
| 2005/0083377 A1 | 4/2005 | Silverbrook |
| 2005/0093933 A1 | 5/2005 | Silverbrook |
| 2005/0093934 A1 | 5/2005 | Silverbrook |
| 2005/0094832 A1 | 5/2005 | Song et al. |
| 2005/0097742 A1 | 5/2005 | Silverbrook |
| 2005/0099465 A1 | 5/2005 | Silverbrook |
| 2005/0099466 A1 | 5/2005 | Silverbrook |
| 2005/0104207 A1 | 5/2005 | Dean et al. |
| 2005/0104675 A1 | 5/2005 | Brunson et al. |
| 2005/0104922 A1 | 5/2005 | Silverbrook |
| 2005/0109730 A1 | 5/2005 | Silverbrook |
| 2005/0110832 A1 | 5/2005 | Silverbrook |
| 2005/0112882 A1 | 5/2005 | Unger et al. |
| 2005/0116990 A1 | 6/2005 | Silverbrook |
| 2005/0123155 A1 | 6/2005 | Song et al. |
| 2005/0128247 A1 | 6/2005 | Silverbrook |
| 2005/0128249 A1 | 6/2005 | Silverbrook |
| 2005/0131490 A1 | 6/2005 | Palanker |
| 2005/0134648 A1 | 6/2005 | Silverbrook |
| 2005/0134649 A1 | 6/2005 | Silverbrook |
| 2005/0139871 A1 | 6/2005 | Brunson et al. |
| 2005/0140726 A1 | 6/2005 | Silverbrook |
| 2005/0140728 A1 | 6/2005 | Silverbrook |
| 2005/0144781 A1 | 7/2005 | Silverbrook |
| 2005/0144782 A1 | 7/2005 | Silverbrook |
| 2005/0146559 A1 | 7/2005 | Silverbrook |
| 2005/0146562 A1 | 7/2005 | Silverbrook |
| 2005/0146563 A1 | 7/2005 | Silverbrook |
| 2005/0146566 A1 | 7/2005 | Silverbrook |

(56) References Cited

U.S. PATENT DOCUMENTS

| | | |
|---|---|---|
| 2005/0147017 A1 | 7/2005 | Gibson |
| 2005/0157042 A1 | 7/2005 | Silverbrook |
| 2005/0157081 A1 | 7/2005 | Silverbrook |
| 2005/0157082 A1 | 7/2005 | Silverbrook |
| 2005/0166980 A1 | 8/2005 | Unger et al. |
| 2005/0167508 A1 | 8/2005 | Syms et al. |
| 2005/0167769 A1 | 8/2005 | Dunec et al. |
| 2005/0168532 A1 | 8/2005 | Silverbrook |
| 2005/0168533 A1 | 8/2005 | Silverbrook |
| 2005/0174375 A1 | 8/2005 | Silverbrook |
| 2005/0174394 A1 | 8/2005 | Silverbrook |
| 2005/0185021 A1 | 8/2005 | Silverbrook |
| 2005/0189316 A1 | 9/2005 | Silverbrook |
| 2005/0189317 A1 | 9/2005 | Silverbrook |
| 2005/0196010 A1 | 9/2005 | Park et al. |
| 2005/0199047 A1 | 9/2005 | Adams et al. |
| 2005/0199071 A1 | 9/2005 | Ganapathi |
| 2005/0199072 A1 | 9/2005 | Ganapathi |
| 2005/0200659 A1 | 9/2005 | Silverbrook |
| 2005/0206684 A1 | 9/2005 | Silverbrook |
| 2005/0207596 A1 | 9/2005 | Beretta et al. |
| 2005/0215089 A1 | 9/2005 | Grundy et al. |
| 2005/0225601 A1 | 10/2005 | Siverbrrook |
| 2005/0225602 A1 | 10/2005 | Silverbrook |
| 2005/0225604 A1 | 10/2005 | Silverbrook |
| 2005/0226742 A1 | 10/2005 | Unger et al. |
| 2005/0231560 A1 | 10/2005 | Silverbrook |
| 2005/0237743 A1 | 10/2005 | Payne et al. |
| 2005/0242058 A1 | 11/2005 | Silverbrook |
| 2005/0243134 A1 | 11/2005 | Silverbrook |
| 2005/0248620 A1 | 11/2005 | Silverbrook |
| 2005/0253897 A1 | 11/2005 | Silverbrook |
| 2005/0254671 A1 | 11/2005 | Akino |
| 2005/0254679 A1 | 11/2005 | Akino |
| 2005/0259835 A1 | 11/2005 | Akino |
| 2005/0262947 A1 | 12/2005 | Dehe |
| 2005/0264607 A1 | 12/2005 | Silverbrook |
| 2005/0264612 A1 | 12/2005 | Silverbrook |
| 2005/0265124 A1 | 12/2005 | Smith |
| 2005/0269901 A1 | 12/2005 | Kubena et al. |
| 2005/0270335 A1 | 12/2005 | Silverbrook |
| 2005/0270338 A1 | 12/2005 | Silverbrook |
| 2005/0274888 A1 | 12/2005 | Darling et al. |
| 2005/0275690 A1 | 12/2005 | Silverbrook |
| 2005/0275691 A1 | 12/2005 | Silverbrook |
| 2005/0279090 A1 | 12/2005 | Silverbrook |
| 2005/0285901 A1 | 12/2005 | Nelson et al. |
| 2006/0007266 A1 | 1/2006 | Silverbrook |
| 2006/0007514 A1* | 1/2006 | Desai ............ B82Y 30/00 359/223.1 |
| 2006/0008097 A1 | 1/2006 | Stenberg et al. |
| 2006/0008098 A1 | 1/2006 | Tu |
| 2006/0017772 A1 | 1/2006 | Silverbrook |
| 2006/0018005 A1 | 1/2006 | Ishii |
| 2006/0032308 A1 | 2/2006 | Acar et al. |
| 2006/0032309 A1 | 2/2006 | Caminada et al. |
| 2006/0033588 A1 | 2/2006 | Caminada et al. |
| 2006/0033785 A1 | 2/2006 | Silverbrook |
| 2006/0034006 A1 | 2/2006 | Ishii |
| 2006/0054228 A1 | 3/2006 | Unger et al. |
| 2006/0056860 A1 | 3/2006 | Nojima |
| 2006/0061628 A1 | 3/2006 | Silverbrook |
| 2006/0072187 A1 | 4/2006 | McKinnell et al. |
| 2006/0072770 A1 | 4/2006 | Miyazaki |
| 2006/0077235 A1 | 4/2006 | Silverbrook |
| 2006/0078137 A1 | 4/2006 | Su et al. |
| 2006/0078148 A1 | 4/2006 | Akino |
| 2006/0081054 A1 | 4/2006 | Silverbrook et al. |
| 2006/0081057 A1 | 4/2006 | Silverbrook et al. |
| 2006/0092220 A1 | 5/2006 | Silverbrook |
| 2006/0093170 A1 | 5/2006 | Zhe et al. |
| 2006/0093171 A1 | 5/2006 | Zhe et al. |
| 2006/0093753 A1 | 5/2006 | Nickel |
| 2006/0098047 A1 | 5/2006 | Silverbrook |
| 2006/0107768 A1 | 5/2006 | Johnson et al. |
| 2006/0109310 A1 | 5/2006 | Silverbrook |
| 2006/0109313 A1 | 5/2006 | Silverbrook |
| 2006/0119661 A1 | 6/2006 | Silverbrook |
| 2006/0131163 A1 | 6/2006 | Mei et al. |
| 2006/0152551 A1 | 7/2006 | Silverbrook |
| 2006/0158662 A1 | 7/2006 | Schelinski et al. |
| 2006/0158666 A1 | 7/2006 | Schelinski et al. |
| 2006/0177083 A1 | 8/2006 | Sjursen et al. |
| 2006/0178586 A1 | 8/2006 | Dobak |
| 2006/0196266 A1 | 9/2006 | Holt et al. |
| 2006/0197810 A1 | 9/2006 | Anagnostopoulos et al. |
| 2006/0202933 A1 | 9/2006 | Pasch et al. |
| 2006/0205106 A1 | 9/2006 | Fukuda et al. |
| 2006/0208169 A1 | 9/2006 | Breed et al. |
| 2006/0210106 A1 | 9/2006 | Pedersen |
| 2006/0211912 A1 | 9/2006 | Dlugos et al. |
| 2006/0211913 A1 | 9/2006 | Dlugos et al. |
| 2006/0211914 A1 | 9/2006 | Hassler et al. |
| 2006/0215858 A1 | 9/2006 | Pedersen |
| 2006/0227156 A1 | 10/2006 | Silverbrook |
| 2006/0227167 A1 | 10/2006 | Silverbrook |
| 2006/0227168 A1 | 10/2006 | Silverbrook |
| 2006/0227984 A1 | 10/2006 | Sinclair |
| 2006/0230835 A1 | 10/2006 | Wang |
| 2006/0233400 A1 | 10/2006 | Ohbayashi et al. |
| 2006/0233401 A1 | 10/2006 | Wang |
| 2006/0233498 A1 | 10/2006 | Soskind et al. |
| 2006/0238571 A1 | 10/2006 | Silverbrook |
| 2006/0248950 A1 | 11/2006 | Silverbrook et al. |
| 2006/0250448 A1 | 11/2006 | Silverbrook |
| 2006/0256981 A1 | 11/2006 | Song et al. |
| 2006/0268048 A1 | 11/2006 | Silverbrook |
| 2006/0268064 A1 | 11/2006 | Silverbrook |
| 2006/0274119 A1 | 12/2006 | Silverbrook |
| 2006/0274121 A1 | 12/2006 | Silverbrook |
| 2006/0280319 A1 | 12/2006 | Wang et al. |
| 2006/0284516 A1 | 12/2006 | Shimaoka et al. |
| 2006/0285707 A1 | 12/2006 | Izuchi et al. |
| 2007/0002009 A1 | 1/2007 | Pasch et al. |
| 2007/0003082 A1 | 1/2007 | Pedersen |
| 2007/0008386 A1 | 1/2007 | Silverbrook |
| 2007/0008390 A1 | 1/2007 | Cruchon-Dupeyrat et al. |
| 2007/0009111 A1 | 1/2007 | Stenberg et al. |
| 2007/0016074 A1 | 1/2007 | Abreu |
| 2007/0023851 A1 | 2/2007 | Hartzell et al. |
| 2007/0024840 A1 | 2/2007 | Fetzer et al. |
| 2007/0029629 A1 | 2/2007 | Yazdi |
| 2007/0030315 A1 | 2/2007 | Silverbrook |
| 2007/0030321 A1 | 2/2007 | Silverbrook |
| 2007/0034005 A1 | 2/2007 | Acar et al. |
| 2007/0034013 A1 | 2/2007 | Moon et al. |
| 2007/0046759 A1 | 3/2007 | Silverbrook |
| 2007/0048887 A1 | 3/2007 | Erlach et al. |
| 2007/0048898 A1 | 3/2007 | Carlson et al. |
| 2007/0052766 A1 | 3/2007 | Trauernicht et al. |
| 2007/0056377 A1 | 3/2007 | Matsubara |
| 2007/0057603 A1 | 3/2007 | Azuma et al. |
| 2007/0058825 A1 | 3/2007 | Suzuki et al. |
| 2007/0058826 A1 | 3/2007 | Sawamoto et al. |
| 2007/0059494 A1 | 3/2007 | Unger et al. |
| 2007/0064034 A1 | 3/2007 | Hawkins et al. |
| 2007/0064037 A1 | 3/2007 | Hawkins et al. |
| 2007/0064066 A1 | 3/2007 | Piatt et al. |
| 2007/0064067 A1 | 3/2007 | Katerberg |
| 2007/0070133 A1 | 3/2007 | Silverbrook |
| 2007/0070161 A1 | 3/2007 | Silverbrook |
| 2007/0075956 A1 | 4/2007 | Satou et al. |
| 2007/0076904 A1 | 4/2007 | Deruginsky et al. |
| 2007/0080695 A1 | 4/2007 | Morrell et al. |
| 2007/0081031 A1 | 4/2007 | Silverbrook |
| 2007/0089512 A1 | 4/2007 | Matsuhisa et al. |
| 2007/0089513 A1 | 4/2007 | Rosenau et al. |
| 2007/0108541 A1 | 5/2007 | Wong et al. |
| 2007/0109345 A1 | 5/2007 | Silverbrook |
| 2007/0113664 A1 | 5/2007 | Wang |
| 2007/0115316 A1 | 5/2007 | Silverbrook |
| 2007/0115440 A1 | 5/2007 | Wiklof |
| 2007/0116305 A1 | 5/2007 | Okazawa |
| 2007/0119258 A1 | 5/2007 | Yee |

(56) References Cited

U.S. PATENT DOCUMENTS

| | | |
|---|---|---|
| 2007/0120891 A9 | 5/2007 | Silverbrook |
| 2007/0121967 A1 | 5/2007 | Sjursen et al. |
| 2007/0121972 A1 | 5/2007 | Suzuki et al. |
| 2007/0125161 A1 | 6/2007 | Bryzek et al. |
| 2007/0129623 A1 | 6/2007 | Fleischman et al. |
| 2007/0140514 A1 | 6/2007 | Pedersen |
| 2007/0142718 A1 | 6/2007 | Abreu |
| 2007/0146432 A1 | 6/2007 | Silverbrook |
| 2007/0153058 A1 | 7/2007 | Silverbrook |
| 2007/0154040 A1 | 7/2007 | Chen |
| 2007/0160248 A1 | 7/2007 | Sung |
| 2007/0176967 A1 | 8/2007 | Silverbrook |
| 2007/0176968 A1 | 8/2007 | Silverbrook |
| 2007/0176971 A1 | 8/2007 | Silverbrook |
| 2007/0182002 A1 | 8/2007 | Huang et al. |
| 2007/0182784 A1 | 8/2007 | Silverbrook |
| 2007/0182785 A1 | 8/2007 | Silverbrook |
| 2007/0183643 A1 | 8/2007 | Jayaraman |
| 2007/0188554 A1 | 8/2007 | Silverbrook |
| 2007/0188556 A1 | 8/2007 | Silverbrook |
| 2007/0188557 A1 | 8/2007 | Silverbrook |
| 2007/0188570 A1 | 8/2007 | Silverbrook |
| 2007/0189559 A1 | 8/2007 | Haan et al. |
| 2007/0193354 A1 | 8/2007 | Felix et al. |
| 2007/0194239 A1 | 8/2007 | McAllister et al. |
| 2007/0201709 A1 | 8/2007 | Suzuki et al. |
| 2007/0201710 A1 | 8/2007 | Suzuki et al. |
| 2007/0209437 A1 | 9/2007 | Xue et al. |
| 2007/0211102 A1 | 9/2007 | Silverbrook |
| 2007/0211112 A1 | 9/2007 | Silverbrook |
| 2007/0222807 A1 | 9/2007 | Silverbrook |
| 2007/0222819 A1 | 9/2007 | Silverbrook |
| 2007/0222821 A1 | 9/2007 | Silverbrook |
| 2007/0222826 A1 | 9/2007 | Hawkins et al. |
| 2007/0230721 A1 | 10/2007 | White et al. |
| 2007/0236313 A1 | 10/2007 | Wallis et al. |
| 2007/0241635 A1 | 10/2007 | Hunter et al. |
| 2007/0242844 A1 | 10/2007 | Harman |
| 2007/0257966 A1 | 11/2007 | Silverbrook |
| 2007/0257971 A1 | 11/2007 | Jeanmaire |
| 2007/0265533 A1 | 11/2007 | Tran |
| 2007/0268327 A9 | 11/2007 | Silverbrook |
| 2007/0268343 A1 | 11/2007 | Silverbrook |
| 2007/0273504 A1 | 11/2007 | Tran |
| 2007/0274544 A1 | 11/2007 | Takeuchi et al. |
| 2007/0276270 A1 | 11/2007 | Tran |
| 2007/0284682 A1 | 12/2007 | Laming et al. |
| 2007/0286438 A1 | 12/2007 | Hirade et al. |
| 2007/0287923 A1 | 12/2007 | Adkins et al. |
| 2007/0289382 A1 | 12/2007 | Caminada et al. |
| 2007/0291070 A9 | 12/2007 | Silverbrook |
| 2007/0291091 A9 | 12/2007 | Silverbrook |
| 2007/0296765 A9 | 12/2007 | Silverbrook |
| 2007/0297631 A1 | 12/2007 | Miles |
| 2008/0001735 A1 | 1/2008 | Tran |
| 2008/0004904 A1 | 1/2008 | Tran |
| 2008/0006093 A1 | 1/2008 | Ueya |
| 2008/0007693 A1 | 1/2008 | Williams et al. |
| 2008/0012913 A1 | 1/2008 | Silverbrook |
| 2008/0012923 A1 | 1/2008 | Silverbrook |
| 2008/0019543 A1 | 1/2008 | Suzuki et al. |
| 2008/0021336 A1 | 1/2008 | Dobak |
| 2008/0024556 A9 | 1/2008 | Silverbrook |
| 2008/0030544 A1 | 2/2008 | Silverbrook |
| 2008/0031476 A1 | 2/2008 | Wang et al. |
| 2008/0036821 A1 | 2/2008 | Silverbrook |
| 2008/0042223 A1 | 2/2008 | Liao et al. |
| 2008/0047128 A1 | 2/2008 | Suzuki |
| 2008/0050283 A1 | 2/2008 | Chou et al. |
| 2008/0075193 A1 | 3/2008 | Rofougaran |
| 2008/0075306 A1 | 3/2008 | Poulsen et al. |
| 2008/0079444 A1 | 4/2008 | Denison |
| 2008/0079760 A1 | 4/2008 | Silverbrook |
| 2008/0081958 A1 | 4/2008 | Denison et al. |
| 2008/0083961 A1 | 4/2008 | Suzuki et al. |
| 2008/0089536 A1 | 4/2008 | Josefsson |
| 2008/0094432 A1 | 4/2008 | Silverbrook |
| 2008/0104825 A1 | 5/2008 | Dehe et al. |
| 2008/0111853 A1 | 5/2008 | Silverbrook |
| 2008/0111863 A1 | 5/2008 | Silverbrook |
| 2008/0117258 A1 | 5/2008 | Silverbrook |
| 2008/0123242 A1 | 5/2008 | Zhou |
| 2008/0123876 A1 | 5/2008 | Sato et al. |
| 2008/0123878 A1 | 5/2008 | Zhe et al. |
| 2008/0129800 A1 | 6/2008 | Silverbrook |
| 2008/0129809 A1 | 6/2008 | Silverbrook |
| 2008/0141884 A1 | 6/2008 | Daniel et al. |
| 2008/0149832 A1 | 6/2008 | Zorn |
| 2008/0163687 A1 | 7/2008 | Kranz et al. |
| 2008/0164888 A1 | 7/2008 | Suzuki et al. |
| 2008/0165226 A1 | 7/2008 | Silverbrook |
| 2008/0169921 A1 | 7/2008 | Peeters |
| 2008/0173365 A1 | 7/2008 | Unger et al. |
| 2008/0175418 A1 | 7/2008 | Zhang et al. |
| 2008/0180778 A1 | 7/2008 | Ishii |
| 2008/0188059 A1 | 8/2008 | Yazdi |
| 2008/0190198 A1 | 8/2008 | Prandi et al. |
| 2008/0190200 A1 | 8/2008 | Caminada et al. |
| 2008/0190203 A1 | 8/2008 | Sugimori |
| 2008/0191132 A1 | 8/2008 | Boyle et al. |
| 2008/0192096 A1 | 8/2008 | Silverbrook |
| 2008/0192962 A1 | 8/2008 | Halteren |
| 2008/0202237 A1 | 8/2008 | Hammerschmidt |
| 2008/0203560 A1 | 8/2008 | Suzuki |
| 2008/0204379 A1 | 8/2008 | Perez-Noguera |
| 2008/0204514 A1 | 8/2008 | Silverbrook |
| 2008/0204518 A1 | 8/2008 | Silverbrook |
| 2008/0204519 A1 | 8/2008 | Silverbrook |
| 2008/0205668 A1 | 8/2008 | Torii et al. |
| 2008/0210319 A1 | 9/2008 | Unger et al. |
| 2008/0210320 A1 | 9/2008 | Unger et al. |
| 2008/0210321 A1 | 9/2008 | Unger et al. |
| 2008/0210322 A1 | 9/2008 | Unger et al. |
| 2008/0211876 A1 | 9/2008 | Silverbrook |
| 2008/0211877 A1 | 9/2008 | Silverbrook |
| 2008/0211879 A1 | 9/2008 | Silverbrook |
| 2008/0212807 A1 | 9/2008 | Wang |
| 2008/0220216 A1 | 9/2008 | Unger et al. |
| 2008/0220535 A1 | 9/2008 | LeBoeuf et al. |
| 2008/0229840 A1 | 9/2008 | Shirasaka et al. |
| 2008/0231669 A1 | 9/2008 | Brost |
| 2008/0236669 A1 | 10/2008 | Unger et al. |
| 2008/0246817 A1 | 10/2008 | Silverbrook |
| 2008/0247573 A1 | 10/2008 | Pedersen |
| 2008/0252691 A9 | 10/2008 | Silverbrook |
| 2008/0266341 A1 | 10/2008 | Silverbrook |
| 2008/0266356 A1 | 10/2008 | Silverbrook |
| 2008/0266361 A1 | 10/2008 | Silverbrook |
| 2008/0273059 A1 | 11/2008 | Silverbrook |
| 2008/0277005 A1 | 11/2008 | Unger et al. |
| 2008/0277007 A1 | 11/2008 | Unger et al. |
| 2008/0277258 A1 | 11/2008 | Foster et al. |
| 2008/0278268 A1 | 11/2008 | Foster et al. |
| 2008/0278559 A1 | 11/2008 | Silverbrook |
| 2008/0281212 A1 | 11/2008 | Nunez et al. |
| 2008/0285784 A1 | 11/2008 | Huang et al. |
| 2008/0289710 A1 | 11/2008 | Unger et al. |
| 2008/0294019 A1 | 11/2008 | Tran |
| 2008/0303866 A1 | 12/2008 | Silverbrook |
| 2008/0303871 A1 | 12/2008 | Silverbrook |
| 2008/0309693 A1 | 12/2008 | Silverbrook |
| 2008/0309694 A1 | 12/2008 | Silverbrook |
| 2008/0309695 A1 | 12/2008 | Silverbrook |
| 2008/0309696 A1 | 12/2008 | Silverbrook |
| 2008/0309697 A1 | 12/2008 | Silverbrook |
| 2008/0309699 A1 | 12/2008 | Silverbrook |
| 2008/0309720 A1 | 12/2008 | Silverbrook |
| 2008/0309721 A1 | 12/2008 | Silverbrook |
| 2008/0309722 A1 | 12/2008 | Silverbrook |
| 2008/0316240 A1 | 12/2008 | Silverbrook |
| 2008/0316241 A1 | 12/2008 | Silverbrook |
| 2008/0316242 A1 | 12/2008 | Silverbrook |
| 2008/0316262 A1 | 12/2008 | Silverbrook |
| 2008/0316271 A1 | 12/2008 | Silverbrook |

(56) References Cited

U.S. PATENT DOCUMENTS

| | | |
|---|---|---|
| 2008/0316276 A1 | 12/2008 | Silverbrook |
| 2008/0318349 A1 | 12/2008 | Erlach et al. |
| 2009/0002470 A1 | 1/2009 | Silverbrook |
| 2009/0003629 A1 | 1/2009 | Shajaan et al. |
| 2009/0003630 A1 | 1/2009 | Kuroda et al. |
| 2009/0016550 A1 | 1/2009 | Qiao |
| 2009/0022341 A1 | 1/2009 | Shams et al. |
| 2009/0022505 A1 | 1/2009 | Nojima |
| 2009/0024042 A1 | 1/2009 | Nunez et al. |
| 2009/0027448 A1 | 1/2009 | Silverbrook |
| 2009/0027459 A1 | 1/2009 | Hawkins et al. |
| 2009/0036761 A1 | 2/2009 | Abreu |
| 2009/0049911 A1 | 2/2009 | Fukuda et al. |
| 2009/0050989 A1 | 2/2009 | Nakatani |
| 2009/0060230 A1 | 3/2009 | Kutilainen et al. |
| 2009/0060232 A1 | 3/2009 | Hirade et al. |
| 2009/0064781 A1 | 3/2009 | Ayazi et al. |
| 2009/0064785 A1 | 3/2009 | Fukuda et al. |
| 2009/0067659 A1 | 3/2009 | Wang et al. |
| 2009/0072840 A1 | 3/2009 | Lang et al. |
| 2009/0078044 A1 | 3/2009 | Wang et al. |
| 2009/0085975 A1 | 4/2009 | Silverbrook |
| 2009/0087002 A1 | 4/2009 | Nakaya et al. |
| 2009/0087009 A1 | 4/2009 | van Halteren et al. |
| 2009/0090190 A1 | 4/2009 | Ueya |
| 2009/0091601 A1 | 4/2009 | Silverbrook |
| 2009/0091603 A1 | 4/2009 | Silverbrook |
| 2009/0114016 A1 | 5/2009 | Nasiri et al. |
| 2009/0121156 A1 | 5/2009 | Mahoney et al. |
| 2009/0122116 A1 | 5/2009 | Silverbrook |
| 2009/0124029 A1 | 5/2009 | Silverbrook |
| 2009/0128604 A1 | 5/2009 | Silverbrook |
| 2009/0130783 A1 | 5/2009 | Miyashita et al. |
| 2009/0133508 A1 | 5/2009 | Johansson et al. |
| 2009/0136064 A1 | 5/2009 | Suzuki et al. |
| 2009/0140356 A1 | 6/2009 | Yazdi |
| 2009/0151422 A1 | 6/2009 | Unger et al. |
| 2009/0153619 A1 | 6/2009 | Silverbrook |
| 2009/0153936 A1 | 6/2009 | Desai |
| 2009/0154729 A1 | 6/2009 | Jennings |
| 2009/0160910 A1 | 6/2009 | Silverbrook |
| 2009/0161886 A1 | 6/2009 | Tanaka et al. |
| 2009/0161890 A1 | 6/2009 | Lin |
| 2009/0169035 A1 | 7/2009 | Rombach et al. |
| 2009/0174014 A1 | 7/2009 | Kunze et al. |
| 2009/0174885 A1 | 7/2009 | Li |
| 2009/0185007 A1 | 7/2009 | Silverbrook |
| 2009/0185700 A1 | 7/2009 | Suzuki |
| 2009/0189953 A1 | 7/2009 | Silverbrook |
| 2009/0190782 A1 | 7/2009 | Suzuki et al. |
| 2009/0195598 A1 | 8/2009 | Silverbrook |
| 2009/0195614 A1 | 8/2009 | Silverbrook |
| 2009/0201339 A1 | 8/2009 | Silverbrook |
| 2009/0202083 A1 | 8/2009 | Kageyama |
| 2009/0208037 A1 | 8/2009 | Zhe |
| 2009/0213186 A1 | 8/2009 | Silverbrook |
| 2009/0213191 A1 | 8/2009 | Silverbrook |
| 2009/0214049 A1 | 8/2009 | Lee et al. |
| 2009/0214061 A1 | 8/2009 | Johansen et al. |
| 2009/0214062 A1 | 8/2009 | Reining |
| 2009/0218642 A1 | 9/2009 | Miller et al. |
| 2009/0227876 A1 | 9/2009 | Tran |
| 2009/0227877 A1 | 9/2009 | Tran |
| 2009/0229020 A1 | 9/2009 | Adams et al. |
| 2009/0232336 A1 | 9/2009 | Pahl |
| 2009/0237433 A1 | 9/2009 | Silverbrook |
| 2009/0237450 A1 | 9/2009 | Silverbrook |
| 2009/0237456 A1 | 9/2009 | Silverbrook |
| 2009/0237461 A1 | 9/2009 | Silverbrook |
| 2009/0243058 A1 | 10/2009 | Shirasaka |
| 2009/0244193 A1 | 10/2009 | Silverbrook |
| 2009/0244194 A1 | 10/2009 | Silverbrook |
| 2009/0252351 A1 | 10/2009 | Rosener |
| 2009/0255336 A1 | 10/2009 | Horning et al. |
| 2009/0256890 A1 | 10/2009 | Silverbrook |
| 2009/0261244 A1 | 10/2009 | Syms |
| 2009/0262958 A1 | 10/2009 | Miles |
| 2009/0278217 A1 | 11/2009 | Laming et al. |
| 2009/0278897 A1 | 11/2009 | Silverbrook |
| 2009/0282916 A1 | 11/2009 | Modugno et al. |
| 2009/0285414 A1 | 11/2009 | Wu |
| 2009/0289606 A1 | 11/2009 | Lauxtermann et al. |
| 2009/0289979 A1 | 11/2009 | Silverbrook |
| 2009/0295861 A1 | 12/2009 | Trauernicht et al. |
| 2009/0301193 A1 | 12/2009 | Schwartz et al. |
| 2009/0303290 A1 | 12/2009 | Silverbrook |
| 2009/0303297 A1 | 12/2009 | Silverbrook |
| 2009/0303303 A1 | 12/2009 | Silverbrook |
| 2009/0309909 A1 | 12/2009 | Silverbrook |
| 2009/0316935 A1 | 12/2009 | Furst et al. |
| 2009/0318779 A1 | 12/2009 | Tran |
| 2009/0320591 A1 | 12/2009 | Johnson |
| 2009/0322812 A1 | 12/2009 | Silverbrook |
| 2010/0000289 A1 | 1/2010 | Prandi et al. |
| 2010/0003772 A1 | 1/2010 | Carlson et al. |
| 2010/0013501 A1 | 1/2010 | Van Den Boom |
| 2010/0024546 A1 | 2/2010 | Challoner et al. |
| 2010/0024560 A1 | 2/2010 | Shcheglov |
| 2010/0026765 A1 | 2/2010 | Silverbrook |
| 2010/0039106 A1 | 2/2010 | Edelstein |
| 2010/0039478 A1 | 2/2010 | Silverbrook |
| 2010/0049063 A1 | 2/2010 | Dobak |
| 2010/0050415 A1 | 3/2010 | Desai |
| 2010/0053268 A1 | 3/2010 | Silverbrook |
| 2010/0053274 A1 | 3/2010 | Silverbrook |
| 2010/0053275 A1 | 3/2010 | Silverbrook |
| 2010/0053276 A1 | 3/2010 | Silverbrook |
| 2010/0072561 A1 | 3/2010 | Lee et al. |
| 2010/0073441 A1 | 3/2010 | Silverbrook |
| 2010/0078564 A1 | 4/2010 | McAllister et al. |
| 2010/0083756 A1 | 4/2010 | Merz et al. |
| 2010/0084721 A1 | 4/2010 | Wu et al. |
| 2010/0098284 A1 | 4/2010 | Conklin et al. |
| 2010/0100079 A1 | 4/2010 | Berkcan et al. |
| 2010/0110129 A1 | 5/2010 | Silverbrook |
| 2010/0110130 A1 | 5/2010 | Silverbrook |
| 2010/0118071 A1 | 5/2010 | Piatt et al. |
| 2010/0119088 A1 | 5/2010 | Sheplak et al. |
| 2010/0132466 A1 | 6/2010 | Spahlinger |
| 2010/0137143 A1 | 6/2010 | Rothberg et al. |
| 2010/0142742 A1 | 6/2010 | Tanaka et al. |
| 2010/0142744 A1 | 6/2010 | Rombach et al. |
| 2010/0145180 A1 | 6/2010 | Abreu |
| 2010/0147073 A1 | 6/2010 | Johnson et al. |
| 2010/0149268 A1 | 6/2010 | Silverbrook |
| 2010/0149274 A1 | 6/2010 | Silverbrook |
| 2010/0155864 A1 | 6/2010 | Laming et al. |
| 2010/0155883 A1 | 6/2010 | Wenzler et al. |
| 2010/0158279 A1 | 6/2010 | Conti et al. |
| 2010/0158280 A1 | 6/2010 | Coronato et al. |
| 2010/0166227 A1 | 7/2010 | Pennock |
| 2010/0166228 A1 | 7/2010 | Steele et al. |
| 2010/0175767 A1 | 7/2010 | Unger et al. |
| 2010/0177846 A1 | 7/2010 | Rofougaran |
| 2010/0177922 A1 | 7/2010 | Park et al. |
| 2010/0186510 A1 | 7/2010 | Robert |
| 2010/0187105 A1 | 7/2010 | Unger et al. |
| 2010/0194374 A1 | 8/2010 | Trumper et al. |
| 2010/0200782 A1 | 8/2010 | Unger et al. |
| 2010/0201750 A1 | 8/2010 | Silverbrook |
| 2010/0208000 A1 | 8/2010 | Silverbrook |
| 2010/0208919 A1 | 8/2010 | Park et al. |
| 2010/0212432 A1 | 8/2010 | Kasai et al. |
| 2010/0213791 A1 | 8/2010 | Kandori et al. |
| 2010/0219839 A1 | 9/2010 | Steele et al. |
| 2010/0231645 A1 | 9/2010 | Silverbrook |
| 2010/0238454 A1 | 9/2010 | Pruessner et al. |
| 2010/0242606 A1 | 9/2010 | Kanemoto |
| 2010/0242765 A1 | 9/2010 | Cruchon-Dupeyrat et al. |
| 2010/0244160 A1 | 9/2010 | Kanemoto |
| 2010/0251800 A1 | 10/2010 | Mueck |
| 2010/0253332 A1 | 10/2010 | Trumper et al. |
| 2010/0253745 A1 | 10/2010 | Silverbrook |
| 2010/0254561 A1 | 10/2010 | Kimura et al. |

(56) References Cited

U.S. PATENT DOCUMENTS

| | | |
|---|---|---|
| 2010/0265298 A1 | 10/2010 | Silverbrook |
| 2010/0267164 A1 | 10/2010 | Adams et al. |
| 2010/0271003 A1 | 10/2010 | Jensen et al. |
| 2010/0275675 A1 | 11/2010 | Seppa et al. |
| 2010/0276588 A1 | 11/2010 | Syms |
| 2010/0276606 A1 | 11/2010 | Baars et al. |
| 2010/0277229 A1 | 11/2010 | Lee et al. |
| 2010/0277549 A1 | 11/2010 | Silverbrook |
| 2010/0284553 A1 | 11/2010 | Conti et al. |
| 2010/0295887 A1 | 11/2010 | Silverbrook |
| 2010/0301398 A1 | 12/2010 | Rothberg et al. |
| 2010/0302292 A1 | 12/2010 | Dockery et al. |
| 2010/0308690 A1 | 12/2010 | Currano et al. |
| 2010/0308930 A1 | 12/2010 | Ayazi et al. |
| 2010/0313657 A1 | 12/2010 | Trusov et al. |
| 2010/0315272 A1 | 12/2010 | Steele et al. |
| 2010/0328836 A1 | 12/2010 | Kinbara |
| 2010/0329487 A1 | 12/2010 | David et al. |
| 2011/0003614 A1 | 1/2011 | Langereis et al. |
| 2011/0006196 A1 | 1/2011 | Boyle et al. |
| 2011/0010107 A1 | 1/2011 | Fedder et al. |
| 2011/0019845 A1 | 1/2011 | Kelloniemi et al. |
| 2011/0024923 A1 | 2/2011 | Foster et al. |
| 2011/0025350 A1 | 2/2011 | Clark |
| 2011/0025780 A1 | 2/2011 | Panchawagh et al. |
| 2011/0026739 A1 | 2/2011 | Thomsen et al. |
| 2011/0028807 A1 | 2/2011 | Abreu |
| 2011/0037796 A1 | 2/2011 | Silverbrook |
| 2011/0037797 A1 | 2/2011 | Silverbrook |
| 2011/0037809 A1 | 2/2011 | Silverbrook |
| 2011/0038493 A1 | 2/2011 | Li |
| 2011/0038497 A1 | 2/2011 | Chae et al. |
| 2011/0040161 A1 | 2/2011 | Abreu |
| 2011/0045616 A1 | 2/2011 | Miyashita et al. |
| 2011/0049653 A1 | 3/2011 | Kanemoto |
| 2011/0061460 A1 | 3/2011 | Seeger et al. |
| 2011/0062956 A1 | 3/2011 | Edelstein |
| 2011/0073447 A1 | 3/2011 | Edwards |
| 2011/0073967 A1 | 3/2011 | Chen et al. |
| 2011/0075865 A1 | 3/2011 | Yang et al. |
| 2011/0089324 A1 | 4/2011 | Edwards |
| 2011/0089504 A1 | 4/2011 | Traynor et al. |
| 2011/0090009 A1 | 4/2011 | Van Veldhoven |
| 2011/0090288 A1 | 4/2011 | Silverbrook |
| 2011/0100126 A1 | 5/2011 | Jeong et al. |
| 2011/0108838 A1 | 5/2011 | Kageyama |
| 2011/0109675 A1 | 5/2011 | Montz et al. |
| 2011/0109677 A1 | 5/2011 | Montz et al. |
| 2011/0109705 A1 | 5/2011 | Montz et al. |
| 2011/0110536 A1 | 5/2011 | Hovesten et al. |
| 2011/0115624 A1 | 5/2011 | Tran |
| 2011/0120221 A1 | 5/2011 | Yoda |
| 2011/0123043 A1 | 5/2011 | Felberer et al. |
| 2011/0131794 A1 | 6/2011 | Chen |
| 2011/0135122 A1 | 6/2011 | Awamura et al. |
| 2011/0138891 A1 | 6/2011 | Agache et al. |
| 2011/0138902 A1 | 6/2011 | White et al. |
| 2011/0154905 A1 | 6/2011 | Hsu et al. |
| 2011/0155548 A1 | 6/2011 | Foster et al. |
| 2011/0163615 A1 | 7/2011 | Leonov |
| 2011/0164081 A1 | 7/2011 | Silverbrook |
| 2011/0167908 A1 | 7/2011 | Agache |
| 2011/0170108 A1 | 7/2011 | Degertekin |
| 2011/0170714 A1 | 7/2011 | Hanzlik et al. |
| 2011/0170735 A1 | 7/2011 | Dehe et al. |
| 2011/0181422 A1 | 7/2011 | Tran |
| 2011/0182150 A1 | 7/2011 | Cohen et al. |
| 2011/0192226 A1 | 8/2011 | Hayner et al. |
| 2011/0192229 A1 | 8/2011 | Chen et al. |
| 2011/0194711 A1 | 8/2011 | Avenson et al. |
| 2011/0194857 A1 | 8/2011 | Avenson et al. |
| 2011/0200212 A1 | 8/2011 | Wismar |
| 2011/0204018 A1 | 8/2011 | Vaeth et al. |
| 2011/0205306 A1 | 8/2011 | Vaeth et al. |
| 2011/0205319 A1 | 8/2011 | Vaeth et al. |
| 2011/0222713 A1 | 9/2011 | Akino |
| 2011/0226065 A1 | 9/2011 | Lebental et al. |
| 2011/0227448 A1 | 9/2011 | Kandori et al. |
| 2011/0228954 A1 | 9/2011 | Saulespurens et al. |
| 2011/0228957 A1 | 9/2011 | Statham |
| 2011/0248320 A1 | 10/2011 | Rothberg et al. |
| 2011/0254107 A1 | 10/2011 | Bulovic et al. |
| 2011/0255228 A1 | 10/2011 | Kimura et al. |
| 2011/0258851 A1 | 10/2011 | Xie et al. |
| 2011/0261123 A1 | 10/2011 | Mehta et al. |
| 2011/0261124 A1 | 10/2011 | Baumer et al. |
| 2011/0261125 A1 | 10/2011 | Xie et al. |
| 2011/0261126 A1 | 10/2011 | Faisst et al. |
| 2011/0267212 A1 | 11/2011 | Denison |
| 2011/0271857 A1 | 11/2011 | Daniel et al. |
| 2011/0275522 A1 | 11/2011 | Rothberg et al. |
| 2011/0281737 A1 | 11/2011 | Rothberg et al. |
| 2011/0281741 A1 | 11/2011 | Rothberg et al. |
| 2011/0295270 A1 | 12/2011 | Giordano et al. |
| 2011/0303994 A1 | 12/2011 | Jenkins et al. |
| 2011/0317245 A1 | 12/2011 | Sampsell |
| 2012/0004564 A1 | 1/2012 | Daniel |
| 2012/0006114 A1 | 1/2012 | Caminada et al. |
| 2012/0009713 A1 | 1/2012 | Ollier et al. |
| 2012/0013392 A1 | 1/2012 | Rothberg et al. |
| 2012/0014543 A1 | 1/2012 | Chiang et al. |
| 2012/0017693 A1 | 1/2012 | Robert et al. |
| 2012/0025277 A1 | 2/2012 | Franke |
| 2012/0026251 A1 | 2/2012 | Xie et al. |
| 2012/0026252 A1 | 2/2012 | Xie et al. |
| 2012/0026253 A1 | 2/2012 | Xie et al. |
| 2012/0026259 A1 | 2/2012 | Gao et al. |
| 2012/0026260 A1 | 2/2012 | Gao et al. |
| 2012/0026261 A1 | 2/2012 | Xie et al. |
| 2012/0032286 A1 | 2/2012 | Trusov et al. |
| 2012/0032747 A1 | 2/2012 | Vermeeren et al. |
| 2012/0033832 A1 | 2/2012 | van Lippen et al. |
| 2012/0034954 A1 | 2/2012 | Tabe |
| 2012/0038695 A1 | 2/2012 | Silverbrook |
| 2012/0043203 A1 | 2/2012 | Lin et al. |
| 2012/0043974 A1 | 2/2012 | van den Boom et al. |
| 2012/0045615 A1 | 2/2012 | Kirkpatrick et al. |
| 2012/0056282 A1 | 3/2012 | Van Lippen et al. |
| 2012/0056952 A1 | 3/2012 | Silverbrook |
| 2012/0068776 A1 | 3/2012 | Asamura et al. |
| 2012/0075168 A1 | 3/2012 | Osterhout et al. |
| 2012/0076322 A1 | 3/2012 | Kimura et al. |
| 2012/0076329 A1 | 3/2012 | Miles |
| 2012/0086307 A1 | 4/2012 | Kandori et al. |
| 2012/0091374 A1 | 4/2012 | Unger et al. |
| 2012/0091544 A1 | 4/2012 | Reichenbach et al. |
| 2012/0091545 A1 | 4/2012 | Reichenbach et al. |
| 2012/0092156 A1 | 4/2012 | Tran |
| 2012/0092157 A1 | 4/2012 | Tran |
| 2012/0095352 A1 | 4/2012 | Tran |
| 2012/0095357 A1 | 4/2012 | Tran |
| 2012/0099753 A1 | 4/2012 | van der Avoort et al. |
| 2012/0104898 A1 | 5/2012 | Qu et al. |
| 2012/0105535 A1 | 5/2012 | Sowinski et al. |
| 2012/0105548 A1 | 5/2012 | Irving et al. |
| 2012/0105549 A1 | 5/2012 | Irving et al. |
| 2012/0105550 A1 | 5/2012 | Irving et al. |
| 2012/0105553 A1 | 5/2012 | Sowinski et al. |
| 2012/0106769 A1 | 5/2012 | Jennings |
| 2012/0112056 A1 | 5/2012 | Brucker et al. |
| 2012/0121106 A1 | 5/2012 | Henriksen |
| 2012/0133005 A1 | 5/2012 | Langeries et al. |
| 2012/0133245 A1 | 5/2012 | Edwards |
| 2012/0140956 A1 | 6/2012 | Poulsen |
| 2012/0153771 A1 | 6/2012 | Formosa et al. |
| 2012/0168605 A1 | 7/2012 | Milanovic |
| 2012/0170777 A1 | 7/2012 | Akino |
| 2012/0172256 A1 | 7/2012 | Adams et al. |
| 2012/0187983 A1 | 7/2012 | Lin et al. |
| 2012/0192647 A1 | 8/2012 | Ayazi et al. |
| 2012/0194107 A1 | 8/2012 | Kandori et al. |
| 2012/0194418 A1 | 8/2012 | Osterhout et al. |
| 2012/0194419 A1 | 8/2012 | Osterhout et al. |
| 2012/0194420 A1 | 8/2012 | Osterhout et al. |

(56) References Cited

U.S. PATENT DOCUMENTS

| | | |
|---|---|---|
| 2012/0194549 A1 | 8/2012 | Osterhout et al. |
| 2012/0194550 A1 | 8/2012 | Osterhout et al. |
| 2012/0194551 A1 | 8/2012 | Osterhout et al. |
| 2012/0194552 A1 | 8/2012 | Osterhout et al. |
| 2012/0194553 A1 | 8/2012 | Osterhout et al. |
| 2012/0200488 A1 | 8/2012 | Osterhout et al. |
| 2012/0200499 A1 | 8/2012 | Osterhout et al. |
| 2012/0200601 A1 | 8/2012 | Osterhout et al. |
| 2012/0206134 A1 | 8/2012 | Fischer et al. |
| 2012/0206322 A1 | 8/2012 | Osterhout et al. |
| 2012/0206323 A1 | 8/2012 | Osterhout et al. |
| 2012/0206334 A1 | 8/2012 | Osterhout et al. |
| 2012/0206335 A1 | 8/2012 | Osterhout et al. |
| 2012/0206485 A1 | 8/2012 | Osterhout et al. |
| 2012/0212398 A1 | 8/2012 | Border et al. |
| 2012/0212399 A1 | 8/2012 | Border et al. |
| 2012/0212400 A1 | 8/2012 | Border et al. |
| 2012/0212406 A1 | 8/2012 | Osterhout et al. |
| 2012/0212414 A1 | 8/2012 | Osterhout et al. |
| 2012/0212484 A1 | 8/2012 | Haddick et al. |
| 2012/0212499 A1 | 8/2012 | Haddick et al. |
| 2012/0213390 A1 | 8/2012 | Akino |
| 2012/0217171 A1 | 8/2012 | Wurzinger et al. |
| 2012/0218172 A1 | 8/2012 | Border et al. |
| 2012/0218301 A1 | 8/2012 | Miller |
| 2012/0223770 A1 | 9/2012 | Muza |
| 2012/0224722 A1 | 9/2012 | Nystrom |
| 2012/0224726 A1 | 9/2012 | Pahl et al. |
| 2012/0227498 A1 | 9/2012 | Kandori et al. |
| 2012/0230522 A1 | 9/2012 | Nowak |
| 2012/0235847 A1 | 9/2012 | Viikari et al. |
| 2012/0235883 A1 | 9/2012 | Border et al. |
| 2012/0235884 A1 | 9/2012 | Miller et al. |
| 2012/0235885 A1 | 9/2012 | Miller et al. |
| 2012/0235886 A1 | 9/2012 | Border et al. |
| 2012/0235887 A1 | 9/2012 | Border et al. |
| 2012/0235900 A1 | 9/2012 | Border et al. |
| 2012/0235969 A1 | 9/2012 | Burns et al. |
| 2012/0236030 A1 | 9/2012 | Border et al. |
| 2012/0236031 A1 | 9/2012 | Haddick et al. |
| 2012/0242501 A1 | 9/2012 | Tran et al. |
| 2012/0242678 A1 | 9/2012 | Border et al. |
| 2012/0242697 A1 | 9/2012 | Border et al. |
| 2012/0242698 A1 | 9/2012 | Haddick et al. |
| 2012/0245464 A1 | 9/2012 | Tran |
| 2012/0249797 A1 | 10/2012 | Haddick et al. |
| 2012/0250897 A1 | 10/2012 | Michel et al. |
| 2012/0250910 A1 | 10/2012 | Shajaan et al. |
| 2012/0260500 A1 | 10/2012 | Zhou |
| 2012/0261274 A1 | 10/2012 | Rearick et al. |
| 2012/0265474 A1 | 10/2012 | Rearick et al. |
| 2012/0268525 A1 | 10/2012 | Baumer et al. |
| 2012/0268527 A1 | 10/2012 | Ellinger et al. |
| 2012/0268528 A1 | 10/2012 | Ellinger et al. |
| 2012/0268529 A1 | 10/2012 | Baumer et al. |
| 2012/0268530 A1 | 10/2012 | Katerberg et al. |
| 2012/0268531 A1 | 10/2012 | Katerberg et al. |
| 2012/0269363 A1 | 10/2012 | Suvanto |
| 2012/0291549 A1 | 11/2012 | Seeger et al. |
| 2012/0294464 A1 | 11/2012 | Zhang et al. |
| 2012/0299130 A1 | 11/2012 | Langereis et al. |
| 2012/0299998 A1 | 11/2012 | Panchawagh et al. |
| 2012/0299999 A1 | 11/2012 | Panchawagh et al. |
| 2012/0300000 A1 | 11/2012 | Panchawagh et al. |
| 2012/0300001 A1 | 11/2012 | Panchawagh et al. |
| 2012/0304341 A1 | 11/2012 | Polesel |
| 2012/0307211 A1 | 12/2012 | Hofmann et al. |
| 2012/0313711 A1 | 12/2012 | Muguet |
| 2012/0319174 A1 | 12/2012 | Wang |
| 2012/0319303 A1 | 12/2012 | Foster et al. |
| 2012/0321111 A1 | 12/2012 | Lillelund |
| 2012/0325683 A1 | 12/2012 | Milgrew |
| 2012/0326213 A1 | 12/2012 | Bustillo et al. |
| 2012/0326249 A1 | 12/2012 | Rombach |
| 2012/0326767 A1 | 12/2012 | Milgrew |
| 2012/0327368 A1 | 12/2012 | Williams et al. |
| 2012/0328132 A1 | 12/2012 | Wang |
| 2012/0328834 A1 | 12/2012 | Unger et al. |
| 2012/0329043 A1 | 12/2012 | Milgrew |
| 2012/0329044 A1 | 12/2012 | Milgrew |
| 2012/0329192 A1 | 12/2012 | Bustillo et al. |
| 2012/0330109 A1 | 12/2012 | Tran |
| 2013/0001653 A1 | 1/2013 | Milgrew et al. |
| 2013/0002244 A1 | 1/2013 | Quevy |
| 2013/0004948 A1 | 1/2013 | Milgrew |
| 2013/0004949 A1 | 1/2013 | Rearick |
| 2013/0009214 A1 | 1/2013 | Bustillo et al. |
| 2013/0009783 A1 | 1/2013 | Tran |
| 2013/0010990 A1 | 1/2013 | Sridharan et al. |
| 2013/0010996 A1 | 1/2013 | Kim et al. |
| 2013/0016859 A1 | 1/2013 | Buck |
| 2013/0017642 A1 | 1/2013 | Milgrew et al. |
| 2013/0023794 A1 | 1/2013 | Stein et al. |
| 2013/0023795 A1 | 1/2013 | Stein et al. |
| 2013/0025368 A1 | 1/2013 | Donadel et al. |
| 2013/0028450 A1 | 1/2013 | Cortese et al. |
| 2013/0028459 A1 | 1/2013 | Wang |
| 2013/0032936 A1 | 2/2013 | Formosa |
| 2013/0044899 A1 | 2/2013 | Barber et al. |
| 2013/0047746 A1 | 2/2013 | Nakamura et al. |
| 2013/0050155 A1 | 2/2013 | Petersen et al. |
| 2013/0050226 A1 | 2/2013 | Shenoy et al. |
| 2013/0050227 A1 | 2/2013 | Petersen et al. |
| 2013/0050228 A1 | 2/2013 | Petersen et al. |
| 2013/0051582 A1 | 2/2013 | Kropfitsch et al. |
| 2013/0051583 A1 | 2/2013 | Gueorguiev |
| 2013/0051586 A1 | 2/2013 | Stephanou et al. |
| 2013/0051587 A1 | 2/2013 | Stephanou et al. |
| 2013/0059396 A1 | 3/2013 | LeBoeuf et al. |
| 2013/0062710 A1 | 3/2013 | Dehe |
| 2013/0064035 A1 | 3/2013 | Kandori |
| 2013/0068131 A1 | 3/2013 | Bermel et al. |
| 2013/0069780 A1 | 3/2013 | Tran et al. |
| 2013/0070031 A1 | 3/2013 | Nelson et al. |
| 2013/0070940 A1 | 3/2013 | Khenkin et al. |
| 2013/0071915 A1 | 3/2013 | Bustillo et al. |
| 2013/0072614 A1 | 3/2013 | Lindstrom et al. |
| 2013/0072807 A1 | 3/2013 | Tran |
| 2013/0080085 A1 | 3/2013 | Von Herzen et al. |
| 2013/0089222 A1 | 4/2013 | Akino |
| 2013/0095459 A1 | 4/2013 | Tran |
| 2013/0104656 A1 | 5/2013 | Smith |
| 2013/0108074 A1 | 5/2013 | Reining |
| 2013/0109990 A1 | 5/2013 | Akingba et al. |
| 2013/0119243 A1 | 5/2013 | Yuan et al. |
| 2013/0119492 A1 | 5/2013 | Feiertag et al. |
| 2013/0121523 A1 | 5/2013 | Pahl |
| 2013/0127980 A1 | 5/2013 | Haddick et al. |
| 2013/0129117 A1 | 5/2013 | Thomsen et al. |
| 2013/0129119 A1 | 5/2013 | Miyatake et al. |
| 2013/0129133 A1 | 5/2013 | Inoda et al. |
| 2013/0133396 A1 | 5/2013 | Coronato et al. |
| 2013/0139285 A1 | 5/2013 | Adams |
| 2013/0156234 A1 | 6/2013 | Daley |
| 2013/0156615 A1 | 6/2013 | Puleo et al. |
| 2013/0160554 A1 | 6/2013 | Chen et al. |
| 2013/0170673 A1 | 7/2013 | Shajaan et al. |
| 2013/0170681 A1 | 7/2013 | Kohl et al. |
| 2013/0172691 A1 | 7/2013 | Tran |
| 2013/0172869 A1 | 7/2013 | Bonfeld |
| 2013/0177180 A1 | 7/2013 | Bharatan et al. |
| 2013/0178718 A1 | 7/2013 | Tran et al. |
| 2013/0180333 A1 | 7/2013 | Swanson et al. |
| 2013/0186171 A1 | 7/2013 | Merrill, Jr. et al. |
| 2013/0191513 A1 | 7/2013 | Kamen et al. |
| 2013/0195291 A1 | 8/2013 | Josefsson |
| 2013/0197322 A1 | 8/2013 | Tran |
| 2013/0199730 A1 | 8/2013 | Gudeman et al. |
| 2013/0201316 A1 | 8/2013 | Binder et al. |
| 2013/0204488 A1 | 8/2013 | Von Herzen et al. |
| 2013/0208915 A1 | 8/2013 | Hammerschmidt et al. |
| 2013/0210128 A1 | 8/2013 | Rothberg et al. |
| 2013/0210182 A1 | 8/2013 | Rothberg et al. |
| 2013/0211291 A1 | 8/2013 | Tran |

(56) References Cited

U.S. PATENT DOCUMENTS

| | | |
|---|---|---|
| 2013/0215931 A1 | 8/2013 | Vaiana et al. |
| 2013/0217004 A1 | 8/2013 | Rothberg et al. |
| 2013/0221453 A1 | 8/2013 | Dehe et al. |
| 2013/0221457 A1 | 8/2013 | Conti et al. |
| 2013/0223023 A1 | 8/2013 | Dehe et al. |
| 2013/0223654 A1 | 8/2013 | Dehe et al. |
| 2013/0226034 A1 | 8/2013 | Stein et al. |
| 2013/0226035 A1 | 8/2013 | Stein et al. |
| 2013/0226036 A1 | 8/2013 | Stein et al. |
| 2013/0230183 A1 | 9/2013 | Eriksson et al. |
| 2013/0231574 A1 | 9/2013 | Tran |
| 2013/0231870 A1 | 9/2013 | Sugnet et al. |
| 2013/0233078 A1 | 9/2013 | Sinclair |
| 2013/0235101 A1 | 9/2013 | Grace et al. |
| 2013/0235102 A1 | 9/2013 | Grace et al. |
| 2013/0247669 A1 | 9/2013 | Swanson et al. |
| 2013/0249982 A1 | 9/2013 | Marcus et al. |
| 2013/0249983 A1 | 9/2013 | Marcus et al. |
| 2013/0249984 A1 | 9/2013 | Marcus et al. |
| 2013/0249985 A1 | 9/2013 | Marcus et al. |
| 2013/0252234 A1 | 9/2013 | Nassef et al. |
| 2013/0256816 A1 | 10/2013 | Traynor et al. |
| 2013/0257991 A1 | 10/2013 | Panchawagh et al. |
| 2013/0257992 A1 | 10/2013 | Panchawagh et al. |
| 2013/0257994 A1 | 10/2013 | Panchawagh et al. |
| 2013/0257996 A1 | 10/2013 | Panchawagh et al. |
| 2013/0257997 A1 | 10/2013 | Panchawagh et al. |
| 2013/0258002 A1 | 10/2013 | Panchawagh et al. |
| 2013/0263665 A1 | 10/2013 | Opris et al. |
| 2013/0271123 A1 | 10/2013 | Trumper et al. |
| 2013/0271307 A1 | 10/2013 | Kropfitsch et al. |
| 2013/0276510 A1 | 10/2013 | Valdevit et al. |
| 2013/0277776 A1 | 10/2013 | Herzum et al. |
| 2013/0278631 A1 | 10/2013 | Border et al. |
| 2013/0278677 A1 | 10/2013 | Vaeth et al. |
| 2013/0278689 A1 | 10/2013 | Sowinski et al. |
| 2013/0279717 A1 | 10/2013 | Reimann et al. |
| 2013/0279738 A1 | 10/2013 | Daley |
| 2013/0280831 A1 | 10/2013 | Vaeth et al. |
| 2013/0286108 A1 | 10/2013 | Xie et al. |
| 2013/0286109 A1 | 10/2013 | Xie et al. |
| 2013/0287231 A1 | 10/2013 | Kropfitsch |
| 2013/0297330 A1 | 11/2013 | Kamen et al. |
| 2013/0302785 A1 | 11/2013 | Nassef et al. |
| 2013/0302932 A1 | 11/2013 | Bustillo et al. |
| 2013/0314303 A1 | 11/2013 | Osterhout et al. |
| 2013/0317753 A1 | 11/2013 | Kamen et al. |
| 2013/0328109 A1 | 12/2013 | Lal et al. |
| 2013/0328976 A1 | 12/2013 | Marcus et al. |
| 2013/0328977 A1 | 12/2013 | Marcus et al. |
| 2013/0330232 A1 | 12/2013 | Pruessner et al. |
| 2013/0330475 A1 | 12/2013 | Marcus et al. |
| 2013/0334627 A1 | 12/2013 | Conti et al. |
| 2013/0340524 A1 | 12/2013 | Maeda et al. |
| 2013/0342597 A1 | 12/2013 | Panchawagh et al. |
| 2014/0000344 A1 | 1/2014 | Birkholz et al. |
| 2014/0003609 A1 | 1/2014 | Rombach et al. |
| 2014/0009523 A1 | 1/2014 | Marcus et al. |
| 2014/0010384 A1 | 1/2014 | Kanaya et al. |
| 2014/0011697 A1 | 1/2014 | Vasan et al. |
| 2014/0013581 A1 | 1/2014 | Chiang et al. |
| 2014/0015878 A1 | 1/2014 | Marcus et al. |
| 2014/0015879 A1 | 1/2014 | Marcus et al. |
| 2014/0015880 A1 | 1/2014 | Marcus et al. |
| 2014/0015893 A1 | 1/2014 | Marcus et al. |
| 2014/0015901 A1 | 1/2014 | Marcus et al. |
| 2014/0021343 A1 | 1/2014 | Kirkpatrick et al. |
| 2014/0026686 A1 | 1/2014 | Bashir et al. |
| 2014/0028997 A1 | 1/2014 | Cable et al. |
| 2014/0031263 A1 | 1/2014 | Norling et al. |
| 2014/0037113 A1 | 2/2014 | David et al. |
| 2014/0037121 A1 | 2/2014 | Mortensen |
| 2014/0038335 A1 | 2/2014 | Merassi et al. |
| 2014/0041452 A1 | 2/2014 | Westberg et al. |
| 2014/0047921 A1 | 2/2014 | Seeger et al. |
| 2014/0049256 A1 | 2/2014 | Smith et al. |
| 2014/0053651 A1 | 2/2014 | Besling et al. |
| 2014/0055284 A1 | 2/2014 | Tran et al. |
| 2014/0062619 A1 | 3/2014 | Montanya Silvestre et al. |
| 2014/0063054 A1 | 3/2014 | Osterhout et al. |
| 2014/0063055 A1 | 3/2014 | Osterhout et al. |
| 2014/0072150 A1 | 3/2014 | Liu et al. |
| 2014/0072152 A1 | 3/2014 | Yang et al. |
| 2014/0077946 A1 | 3/2014 | Tran |
| 2014/0079277 A1 | 3/2014 | Dehe et al. |
| 2014/0084390 A1 | 3/2014 | Mayer et al. |
| 2014/0086433 A1 | 3/2014 | Josefsson |
| 2014/0090469 A1 | 4/2014 | Comi et al. |
| 2014/0090884 A1 | 4/2014 | Kobayashi et al. |
| 2014/0093881 A1 | 4/2014 | Sugnet et al. |
| 2014/0094715 A1 | 4/2014 | Stein et al. |
| 2014/0104059 A1 | 4/2014 | Tran |
| 2014/0104618 A1 | 4/2014 | Potsaid et al. |
| 2014/0105428 A1 | 4/2014 | Zoellin et al. |
| 2014/0109680 A1 | 4/2014 | Tsai |
| 2014/0111019 A1 | 4/2014 | Roy et al. |
| 2014/0111154 A1 | 4/2014 | Roy et al. |
| 2014/0113828 A1 | 4/2014 | Gilbert et al. |
| 2014/0119573 A1 | 5/2014 | Kropfitsch et al. |
| 2014/0121476 A1 | 5/2014 | Tran et al. |
| 2014/0126762 A1 | 5/2014 | Zoellin et al. |
| 2014/0130587 A1 | 5/2014 | Von Herzen et al. |
| 2014/0132294 A1 | 5/2014 | Steele et al. |
| 2014/0133685 A1 | 5/2014 | Liu et al. |
| 2014/0137668 A1 | 5/2014 | Fukuzawa et al. |
| 2014/0140538 A1 | 5/2014 | Kropfitsch et al. |
| 2014/0140560 A1 | 5/2014 | Melanson et al. |
| 2014/0142398 A1 | 5/2014 | Patil et al. |
| 2014/0143064 A1 | 5/2014 | Tran |
| 2014/0144230 A1 | 5/2014 | Magnoni et al. |
| 2014/0145276 A1 | 5/2014 | Rombach |
| 2014/0147337 A1 | 5/2014 | Urey et al. |
| 2014/0159748 A1 | 6/2014 | Cannon et al. |
| 2014/0159826 A1 | 6/2014 | Phan Le et al. |
| 2014/0163425 A1 | 6/2014 | Tran |
| 2014/0176251 A1 | 6/2014 | Seth et al. |
| 2014/0176958 A1 | 6/2014 | Flanders et al. |
| 2014/0185054 A1 | 7/2014 | Atia et al. |
| 2014/0188404 A1 | 7/2014 | Von Herzen et al. |
| 2014/0188407 A1 | 7/2014 | Von Herzen et al. |
| 2014/0191344 A1 | 7/2014 | Traynor et al. |
| 2014/0192061 A1 | 7/2014 | Payne et al. |
| 2014/0192836 A1 | 7/2014 | Neilson |
| 2014/0194301 A1 | 7/2014 | Milgrew |
| 2014/0194302 A1 | 7/2014 | Milgrew |
| 2014/0194303 A1 | 7/2014 | Milgrew |
| 2014/0194702 A1 | 7/2014 | Tran |
| 2014/0212917 A1 | 7/2014 | Durack et al. |
| 2014/0217929 A1 | 8/2014 | Lin et al. |
| 2014/0220621 A1 | 8/2014 | Durack et al. |
| 2014/0224971 A1 | 8/2014 | Hong |
| 2014/0225205 A1 | 8/2014 | Zoellin et al. |
| 2014/0225250 A1 | 8/2014 | Montanya Silvestre et al. |
| 2014/0226846 A1 | 8/2014 | Sheplak et al. |
| 2014/0230547 A1 | 8/2014 | El-Gamal et al. |
| 2014/0233784 A1 | 8/2014 | Norris |
| 2014/0235452 A1 | 8/2014 | Rothberg et al. |
| 2014/0235463 A1 | 8/2014 | Rothberg et al. |
| 2014/0235965 A1 | 8/2014 | Tran |
| 2014/0239352 A1 | 8/2014 | Wang |
| 2014/0247954 A1* | 9/2014 | Hall .............. H04R 17/02 381/92 |
| 2014/0249429 A1 | 9/2014 | Tran |
| 2014/0250969 A1 | 9/2014 | Alagarsamy et al. |
| 2014/0251017 A1 | 9/2014 | Kandori |
| 2014/0253219 A1 | 9/2014 | Caffee et al. |
| 2014/0257141 A1 | 9/2014 | Giuffrida et al. |
| 2014/0260608 A1 | 9/2014 | Lin et al. |
| 2014/0262972 A1 | 9/2014 | Adiga et al. |
| 2014/0264652 A1 | 9/2014 | Cagdaser et al. |
| 2014/0265720 A1 | 9/2014 | El-Gamal et al. |
| 2014/0266065 A1 | 9/2014 | Von Herzen et al. |
| 2014/0266260 A1 | 9/2014 | Wurzinger et al. |
| 2014/0266263 A1 | 9/2014 | Wurzinger et al. |

(56) References Cited

U.S. PATENT DOCUMENTS

| | | |
|---|---|---|
| 2014/0266787 A1 | 9/2014 | Tran |
| 2014/0270204 A1 | 9/2014 | Zeleznik |
| 2014/0270271 A1 | 9/2014 | Dehe et al. |
| 2014/0270273 A1 | 9/2014 | Muza et al. |
| 2014/0270312 A1 | 9/2014 | Melanson et al. |
| 2014/0273408 A1 | 9/2014 | Adiga et al. |
| 2014/0286509 A1 | 9/2014 | Sciutti et al. |
| 2014/0287958 A1 | 9/2014 | Adams et al. |
| 2014/0291781 A1 | 10/2014 | Shaw et al. |
| 2014/0294218 A1 | 10/2014 | Suvanto et al. |
| 2014/0296687 A1 | 10/2014 | Irazoqui et al. |
| 2014/0299949 A1 | 10/2014 | Conti et al. |
| 2014/0301167 A1 | 10/2014 | Kandori |
| 2014/0301571 A1 | 10/2014 | Melanson et al. |
| 2014/0301572 A1 | 10/2014 | Melanson et al. |
| 2014/0306623 A1 | 10/2014 | Caffee et al. |
| 2014/0307885 A1 | 10/2014 | Schultz et al. |
| 2014/0307909 A1 | 10/2014 | Yang et al. |
| 2014/0308770 A1 | 10/2014 | Mayer et al. |
| 2014/0318395 A1 | 10/2014 | Jenninger et al. |
| 2014/0319630 A1 | 10/2014 | Conti et al. |
| 2014/0321682 A1 | 10/2014 | Kofod-Hansen et al. |
| 2014/0322489 A1 | 10/2014 | Unger et al. |
| 2014/0324376 A1 | 10/2014 | Rearick et al. |
| 2014/0330256 A1 | 11/2014 | Hyde et al. |
| 2014/0331367 A1 | 11/2014 | Lal et al. |
| 2014/0341402 A1 | 11/2014 | Traynor et al. |
| 2014/0352446 A1 | 12/2014 | Kuisma |
| 2014/0360272 A1 | 12/2014 | Kandori |
| 2014/0363678 A1 | 12/2014 | Kirkpatrick et al. |
| 2014/0369530 A1 | 12/2014 | Fuji et al. |
| 2014/0372057 A1 | 12/2014 | Van der Plas et al. |
| 2014/0376749 A1 | 12/2014 | Nielsen |
| 2015/0001647 A1 | 1/2015 | Dehe et al. |
| 2015/0003643 A1 | 1/2015 | Terazono et al. |
| 2015/0003646 A1 | 1/2015 | Kamitani et al. |
| 2015/0003660 A9 | 1/2015 | Melanson et al. |
| 2015/0010174 A1 | 1/2015 | Fukuoka et al. |
| 2015/0014797 A1 | 1/2015 | Schelling et al. |
| 2015/0016635 A1 | 1/2015 | Haas-Christensen et al. |
| 2015/0019135 A1 | 1/2015 | Kacyvenski et al. |
| 2015/0023529 A1 | 1/2015 | Barzen et al. |
| 2015/0029490 A1 | 1/2015 | Horibe et al. |
| 2015/0031160 A1 | 1/2015 | Wang |
| 2015/0035091 A1 | 2/2015 | Ziglioli |
| 2015/0043002 A1 | 2/2015 | Kuznetsov et al. |
| 2015/0049886 A1 | 2/2015 | Daley et al. |
| 2015/0055799 A1 | 2/2015 | Nandy et al. |
| 2015/0061458 A1 | 3/2015 | Kageyama |
| 2015/0063608 A1 | 3/2015 | Schelling et al. |
| 2015/0065837 A1 | 3/2015 | Abreu |
| 2015/0068069 A1 | 3/2015 | Tran et al. |
| 2015/0071466 A1 | 3/2015 | Lasseuguette et al. |
| 2015/0078587 A1 | 3/2015 | Dehe et al. |
| 2015/0078589 A1 | 3/2015 | Uchida |
| 2015/0078592 A1 | 3/2015 | Uchida |
| 2015/0082872 A1 | 3/2015 | Von Herzen et al. |
| 2015/0082917 A1 | 3/2015 | Fuji et al. |
| 2015/0085249 A1 | 3/2015 | Abreu |
| 2015/0088008 A1 | 3/2015 | Fuji et al. |
| 2015/0091477 A1 | 4/2015 | Kandori et al. |
| 2015/0096377 A1 | 4/2015 | Membretti et al. |
| 2015/0099941 A1 | 4/2015 | Tran |
| 2015/0102435 A1 | 4/2015 | Zinn |
| 2015/0105631 A1 | 4/2015 | Tran et al. |
| 2015/0110333 A1 | 4/2015 | Norris |
| 2015/0125003 A1 | 5/2015 | Wiesbauer et al. |
| 2015/0125832 A1 | 5/2015 | Tran |
| 2015/0126900 A1 | 5/2015 | Walraevens et al. |
| 2015/0131820 A1 | 5/2015 | Veneri et al. |
| 2015/0137834 A1 | 5/2015 | Steiner |
| 2015/0139453 A1 | 5/2015 | Akino |
| 2015/0141772 A1 | 5/2015 | LeBoeuf et al. |
| 2015/0143905 A1 | 5/2015 | Kuisma |
| 2015/0154364 A1 | 6/2015 | Biasi et al. |
| 2015/0162883 A1 | 6/2015 | Nielsen |
| 2015/0163568 A1 | 6/2015 | Von Herzen et al. |
| 2015/0163594 A1 | 6/2015 | Andersen |
| 2015/0166332 A1 | 6/2015 | Billiot |
| 2015/0168344 A1 | 6/2015 | Milgrew |
| 2015/0171595 A1 | 6/2015 | Atia et al. |
| 2015/0171885 A1 | 6/2015 | Juang et al. |
| 2015/0176992 A1 | 6/2015 | Entringer et al. |
| 2015/0177272 A1 | 6/2015 | Clark |
| 2015/0181352 A1 | 6/2015 | Astgimath et al. |
| 2015/0183633 A1 | 7/2015 | Unger et al. |
| 2015/0189443 A1 | 7/2015 | Wang et al. |
| 2015/0189446 A1 | 7/2015 | Wang et al. |
| 2015/0202656 A1 | 7/2015 | Takahashi et al. |
| 2015/0208176 A1 | 7/2015 | Melanson et al. |
| 2015/0211853 A1 | 7/2015 | Anac et al. |
| 2015/0213996 A1 | 7/2015 | Kirkpatrick et al. |
| 2015/0220199 A1 | 8/2015 | Wang et al. |
| 2015/0226558 A1 | 8/2015 | Seeger et al. |
| 2015/0228265 A1 | 8/2015 | Muza et al. |
| 2015/0230010 A1 | 8/2015 | Suvanto et al. |
| 2015/0230027 A1 | 8/2015 | Inoue et al. |
| 2015/0245123 A1 | 8/2015 | Uchida et al. |
| 2015/0250393 A1 | 9/2015 | Tran |
| 2015/0256913 A1 | 9/2015 | Dehe |
| 2015/0256914 A1 | 9/2015 | Wiesbauer et al. |
| 2015/0260751 A1 | 9/2015 | Han et al. |
| 2015/0264465 A1 | 9/2015 | Bharatan et al. |
| 2015/0264498 A1 | 9/2015 | Shams et al. |
| 2015/0266726 A1 | 9/2015 | Gudeman et al. |
| 2015/0268060 A1 | 9/2015 | Coronato et al. |
| 2015/0268284 A1 | 9/2015 | Opris et al. |
| 2015/0269825 A1 | 9/2015 | Tran |
| 2015/0271586 A1 | 9/2015 | Fukuzawa et al. |
| 2015/0276089 A1 | 10/2015 | Unger et al. |
| 2015/0276529 A1 | 10/2015 | Wiesbauer et al. |
| 2015/0289046 A1 | 10/2015 | Dehe et al. |
| 2015/0293243 A1 | 10/2015 | Avenson et al. |
| 2015/0294838 A1 | 10/2015 | Kirkpatrick et al. |
| 2015/0296303 A1 | 10/2015 | Nakamura |
| 2015/0304741 A1 | 10/2015 | McCall |
| 2015/0304777 A1 | 10/2015 | Xu et al. |
| 2015/0308829 A1 | 10/2015 | Caminada et al. |
| 2015/0309316 A1 | 10/2015 | Osterhout et al. |
| 2015/0309563 A1 | 10/2015 | Connor |
| 2015/0311870 A1 | 10/2015 | Kropfitsch et al. |
| 2015/0318829 A1 | 11/2015 | Astgimath |
| 2015/0319538 A1 | 11/2015 | Sridharan |
| 2015/0323466 A1 | 11/2015 | Pruessner et al. |
| 2015/0323560 A1 | 11/2015 | Castellano et al. |
| 2015/0323694 A1 | 11/2015 | Roy et al. |
| 2015/0326978 A1 | 11/2015 | Daley et al. |
| 2015/0336790 A1 | 11/2015 | Geen et al. |
| 2015/0338217 A1 | 11/2015 | Balachandran et al. |
| 2015/0341720 A1 | 11/2015 | Akino |
| 2015/0341721 A1 | 11/2015 | Akino |
| 2015/0350760 A1 | 12/2015 | Nandy et al. |
| 2015/0351648 A1 | 12/2015 | Harvey et al. |
| 2015/0359467 A1 | 12/2015 | Tran |
| 2015/0373446 A1 | 12/2015 | Chen et al. |
| 2015/0374378 A1 | 12/2015 | Giordano et al. |
| 2015/0377622 A1 | 12/2015 | Waters et al. |
| 2015/0377623 A1 | 12/2015 | Waters et al. |
| 2015/0377662 A1 | 12/2015 | Ray |
| 2015/0377916 A1 | 12/2015 | Waters et al. |
| 2015/0377917 A1 | 12/2015 | Waters et al. |
| 2015/0377918 A1 | 12/2015 | Waters et al. |
| 2015/0380636 A1 | 12/2015 | Fujisawa et al. |
| 2015/0381078 A1 | 12/2015 | Massoner |
| 2015/0381782 A1 | 12/2015 | Park |
| 2015/0382091 A1 | 12/2015 | Kim et al. |
| 2016/0000431 A1 | 1/2016 | Giordano et al. |
| 2016/0000437 A1 | 1/2016 | Giordano et al. |
| 2016/0002026 A1 | 1/2016 | Chodavarapu et al. |
| 2016/0003698 A1 | 1/2016 | Wiesbauer et al. |
| 2016/0003868 A1 | 1/2016 | Prater |
| 2016/0006414 A1 | 1/2016 | Chodavarapu et al. |
| 2016/0014521 A1 | 1/2016 | Kim et al. |
| 2016/0014528 A1 | 1/2016 | Kasai |

(56) References Cited

U.S. PATENT DOCUMENTS

| | | |
|---|---|---|
| 2016/0014529 A1 | 1/2016 | Hecht et al. |
| 2016/0029110 A1 | 1/2016 | Xu |
| 2016/0029126 A1 | 1/2016 | Buck et al. |
| 2016/0029129 A1 | 1/2016 | Nicollini et al. |
| 2016/0030683 A1 | 2/2016 | Taylor et al. |
| 2016/0033448 A1 | 2/2016 | Milgrew |
| 2016/0035314 A1 | 2/2016 | Pan |
| 2016/0037257 A1 | 2/2016 | Josefsson |
| 2016/0037263 A1 | 2/2016 | Pal et al. |
| 2016/0041211 A1 | 2/2016 | Wurzinger et al. |
| 2016/0044396 A1 | 2/2016 | Wang |
| 2016/0050475 A1 | 2/2016 | Khenkin et al. |
| 2016/0054400 A1 | 2/2016 | van Beek et al. |
| 2016/0057532 A1 | 2/2016 | Melanson et al. |
| 2016/0061772 A1 | 3/2016 | Rothberg et al. |
| 2016/0062112 A1 | 3/2016 | Potsaid et al. |
| 2016/0065152 A1 | 3/2016 | Kropfitsch et al. |
| 2016/0066099 A1 | 3/2016 | Dehe et al. |
| 2016/0066788 A1 | 3/2016 | Tran et al. |
| 2016/0069686 A1 | 3/2016 | Lee et al. |
| 2016/0072472 A1 | 3/2016 | Fedder et al. |
| 2016/0073212 A1 | 3/2016 | Zeleznik |
| 2016/0076962 A1 | 3/2016 | Baldo et al. |
| 2016/0079953 A1 | 3/2016 | Wenzler et al. |
| 2016/0087551 A1 | 3/2016 | Kandori et al. |
| 2016/0087606 A1 | 3/2016 | Herzum et al. |
| 2016/0091378 A1 | 3/2016 | Tsai et al. |
| 2016/0091479 A1 | 3/2016 | Nassef et al. |
| 2016/0103174 A1 | 4/2016 | Aaltonen et al. |
| 2016/0105748 A1 | 4/2016 | Pal et al. |
| 2016/0107884 A1 | 4/2016 | Formosa |
| 2016/0111954 A1 | 4/2016 | Bach et al. |
| 2016/0130133 A1 | 5/2016 | Boillot et al. |
| 2016/0131480 A1 | 5/2016 | Gregory et al. |
| 2016/0134967 A1 | 5/2016 | Kwon |
| 2016/0134973 A1 | 5/2016 | Oliaei et al. |
| 2016/0137486 A1 | 5/2016 | Bharatan |
| 2016/0139173 A1 | 5/2016 | El-Gamal et al. |
| 2016/0139176 A1 | 5/2016 | Shirazi et al. |
| 2016/0140834 A1 | 5/2016 | Tran |
| 2016/0142829 A1 | 5/2016 | Berger et al. |
| 2016/0149542 A1 | 5/2016 | Mucha et al. |
| 2016/0155532 A1 | 6/2016 | Kokubo et al. |
| 2016/0156319 A1 | 6/2016 | Barbieri et al. |
| 2016/0157017 A1 | 6/2016 | Lesso et al. |
| 2016/0157022 A1 | 6/2016 | Zhou et al. |
| 2016/0157025 A1 | 6/2016 | Miles et al. |
| 2016/0161256 A1 | 6/2016 | Lee et al. |
| 2016/0165355 A1 | 6/2016 | Khenkin et al. |
| 2016/0165356 A1 | 6/2016 | Ikeda et al. |
| 2016/0167946 A1 | 6/2016 | Jenkins et al. |
| 2016/0172197 A1 | 6/2016 | Kirkpatrick et al. |
| 2016/0173001 A1 | 6/2016 | Langa et al. |
| 2016/0173967 A1 | 6/2016 | Nawrocki |
| 2016/0173992 A1 | 6/2016 | Nicollini et al. |
| 2016/0173993 A1 | 6/2016 | Han et al. |
| 2016/0173994 A1 | 6/2016 | Nicollini |
| 2016/0176704 A1 | 6/2016 | Cargill et al. |
| 2016/0182989 A1 | 6/2016 | Kim et al. |
| 2016/0183008 A1 | 6/2016 | Kropfitsch |
| 2016/0187289 A1 | 6/2016 | Rearick et al. |
| 2016/0187654 A1 | 6/2016 | Border et al. |
| 2016/0192084 A1 | 6/2016 | Oliaei |
| 2016/0192086 A1 | 6/2016 | Barzen et al. |
| 2016/0192511 A1 | 6/2016 | Won et al. |
| 2016/0202286 A1 | 7/2016 | Aaltonen et al. |
| 2016/0202755 A1 | 7/2016 | Connor |
| 2016/0209648 A1 | 7/2016 | Haddick et al. |
| 2016/0213934 A1 | 7/2016 | Shen et al. |
| 2016/0218688 A1 | 7/2016 | David et al. |
| 2016/0219374 A1 | 7/2016 | Hall et al. |
| 2016/0219378 A1 | 7/2016 | Hall et al. |
| 2016/0221822 A1 | 8/2016 | Krumbein et al. |
| 2016/0223319 A1 | 8/2016 | Munro et al. |
| 2016/0223579 A1 | 8/2016 | Froemel et al. |
| 2016/0231792 A1 | 8/2016 | Richter et al. |
| 2016/0232807 A1 | 8/2016 | Ghaffari et al. |
| 2016/0235494 A1 | 8/2016 | Shelton et al. |
| 2016/0241958 A1 | 8/2016 | Rombach et al. |
| 2016/0241961 A1 | 8/2016 | Josefsson |
| 2016/0241965 A1 | 8/2016 | Chau |
| 2016/0243827 A1 | 8/2016 | Hawkins et al. |
| 2016/0255441 A1 | 9/2016 | Hecht et al. |
| 2016/0255442 A1 | 9/2016 | Traynor et al. |
| 2016/0268084 A1 | 9/2016 | Gudeman et al. |
| 2016/0274141 A1 | 9/2016 | Enjalbert |
| 2016/0277844 A1 | 9/2016 | Kopetz et al. |
| 2016/0287166 A1 | 10/2016 | Tran |
| 2016/0295333 A1 | 10/2016 | Hall et al. |
| 2016/0298963 A1 | 10/2016 | Kapusta et al. |
| 2016/0304337 A1 | 10/2016 | Miao |
| 2016/0305780 A1 | 10/2016 | Comi et al. |
| 2016/0305835 A1 | 10/2016 | Kollias et al. |
| 2016/0305838 A1 | 10/2016 | Wiesbauer et al. |
| 2016/0305997 A1 | 10/2016 | Wiesbauer et al. |
| 2016/0309264 A1 | 10/2016 | Murthy et al. |
| 2016/0310020 A1 | 10/2016 | Warnking et al. |
| 2016/0320426 A1 | 11/2016 | Boysel et al. |
| 2016/0324564 A1 | 11/2016 | Gerlach et al. |
| 2016/0327446 A1 | 11/2016 | Classen et al. |
| 2016/0327523 A1 | 11/2016 | Shimoyama et al. |
| 2016/0329682 A1 | 11/2016 | Flanders et al. |
| 2016/0330550 A1 | 11/2016 | Berger et al. |
| 2016/0334439 A1 | 11/2016 | Malvern |
| 2016/0336013 A1 | 11/2016 | Wiesbauer et al. |
| 2016/0337751 A1 | 11/2016 | Gabai et al. |
| 2016/0338644 A1 | 11/2016 | Connor |
| 2016/0340173 A1 | 11/2016 | Klein et al. |
| 2016/0341758 A1 | 11/2016 | Waters et al. |
| 2016/0341761 A1 | 11/2016 | Waters et al. |
| 2016/0341762 A1 | 11/2016 | Waters et al. |
| 2016/0341765 A1 | 11/2016 | Adams et al. |
| 2016/0344360 A1 | 11/2016 | Kropfitsch et al. |
| 2016/0344368 A1 | 11/2016 | Ayazi et al. |
| 2016/0345097 A1 | 11/2016 | Akino |
| 2016/0347605 A1 | 12/2016 | Thompson et al. |
| 2016/0349056 A1 | 12/2016 | Thompson et al. |
| 2016/0352294 A1 | 12/2016 | Nicollini et al. |
| 2016/0360304 A1 | 12/2016 | Northemann |
| 2016/0360322 A1 | 12/2016 | Liu et al. |
| 2016/0360965 A1 | 12/2016 | Tran |
| 2016/0362292 A1 | 12/2016 | Chang et al. |
| 2016/0363575 A1 | 12/2016 | Von Herzen et al. |
| 2016/0370362 A1 | 12/2016 | Lin et al. |
| 2016/0373864 A1 | 12/2016 | Hecht et al. |
| 2016/0373874 A1 | 12/2016 | Guo et al. |
| 2016/0374703 A1 | 12/2016 | Yu et al. |
| 2016/0377569 A1 | 12/2016 | Rajaraman et al. |
| 2017/0001195 A1 | 1/2017 | Unger et al. |
| 2017/0003314 A1 | 1/2017 | Waters et al. |
| 2017/0003316 A1 | 1/2017 | Yang et al. |
| 2017/0023429 A1 | 1/2017 | Straeussnigg et al. |
| 2017/0025736 A1 | 1/2017 | McAllister |
| 2017/0025904 A1 | 1/2017 | Roy et al. |
| 2017/0034634 A1 | 2/2017 | Dehe et al. |
| 2017/0041708 A1 | 2/2017 | Barzen |
| 2017/0041716 A1 | 2/2017 | Barzen |
| 2017/0048634 A1 | 2/2017 | Muza |
| 2017/0051884 A1 | 2/2017 | Raring et al. |
| 2017/0052083 A1 | 2/2017 | Wiesbauer et al. |
| 2017/0059433 A1 | 3/2017 | Akingba et al. |
| 2017/0059530 A1 | 3/2017 | Kandori |
| 2017/0064449 A1 | 3/2017 | Furuya et al. |
| 2017/0067856 A1 | 3/2017 | Kandori |
| 2017/0068319 A1 | 3/2017 | Viswanathan |
| 2017/0070816 A1 | 3/2017 | Muza et al. |
| 2017/0074640 A1 | 3/2017 | Cable et al. |
| 2017/0074853 A1 | 3/2017 | Von Herzen et al. |
| 2017/0078400 A1 | 3/2017 | Binder et al. |
| 2017/0078798 A1 | 3/2017 | Palmer et al. |
| 2017/0078801 A1 | 3/2017 | Daley et al. |
| 2017/0086281 A1 | 3/2017 | Avrahamy |
| 2017/0086672 A1 | 3/2017 | Tran |
| 2017/0094436 A1 | 3/2017 | Sheplak et al. |

(56) References Cited

U.S. PATENT DOCUMENTS

| | | |
|---|---|---|
| 2017/0099549 A1 | 4/2017 | Wurzinger et al. |
| 2017/0102276 A1 | 4/2017 | Fuji et al. |
| 2017/0121173 A1 | 5/2017 | Hoekstra |
| 2017/0126206 A1 | 5/2017 | Nguyen et al. |
| 2017/0127189 A1 | 5/2017 | Miles et al. |
| 2017/0135592 A1 | 5/2017 | Fuji et al. |
| 2017/0135633 A1 | 5/2017 | Connor |
| 2017/0142519 A1 | 5/2017 | Lasseuguette |
| 2017/0142525 A1 | 5/2017 | Glacer et al. |
| 2017/0146364 A1 | 5/2017 | Aaltonen |
| 2017/0146484 A1 | 5/2017 | Milgrew et al. |
| 2017/0152135 A1 | 6/2017 | Hennes et al. |
| 2017/0153319 A1 | 6/2017 | Villeneuve et al. |
| 2017/0155225 A1 | 6/2017 | Villeneuve et al. |
| 2017/0155365 A1 | 6/2017 | Yan et al. |
| 2017/0156002 A1 | 6/2017 | Han et al. |
| 2017/0160308 A1 | 6/2017 | Alaoui |
| 2017/0160337 A1 | 6/2017 | Steele et al. |
| 2017/0164105 A1 | 6/2017 | Rocca et al. |
| 2017/0164119 A1 | 6/2017 | Sridharan |
| 2017/0164839 A1 | 6/2017 | Kandori |
| 2017/0164878 A1 | 6/2017 | Connor |
| 2017/0166437 A1 | 6/2017 | Klein |
| 2017/0167945 A1 | 6/2017 | Coronato et al. |
| 2017/0167946 A1 | 6/2017 | Coronato et al. |
| 2017/0168084 A1 | 6/2017 | Gafforelli et al. |
| 2017/0168085 A1 | 6/2017 | Gafforelli et al. |
| 2017/0168566 A1 | 6/2017 | Osterhout et al. |
| 2017/0176596 A1 | 6/2017 | Shpunt et al. |
| 2017/0180853 A1 | 6/2017 | Mehta et al. |
| 2017/0180864 A1 | 6/2017 | Zhang et al. |
| 2017/0180900 A1 | 6/2017 | Dehe et al. |
| 2017/0184644 A1 | 6/2017 | Vohra et al. |
| 2017/0185954 A1 | 6/2017 | McAllister |
| 2017/0191894 A1 | 7/2017 | Wiesbauer et al. |
| 2017/0194985 A1 | 7/2017 | Sugnet et al. |
| 2017/0195788 A1 | 7/2017 | Nicollini et al. |
| 2017/0199035 A1 | 7/2017 | Seeger |
| 2017/0199277 A1 | 7/2017 | Villeneuve et al. |
| 2017/0201059 A1 | 7/2017 | Villeneuve et al. |
| 2017/0201192 A1 | 7/2017 | Tumpold et al. |
| 2017/0205223 A1 | 7/2017 | Cable et al. |
| 2017/0215006 A1 | 7/2017 | van Nieuwkerk et al. |
| 2017/0217765 A1 | 8/2017 | Rajaraman et al. |
| 2017/0219521 A1 | 8/2017 | Suri |
| 2017/0219622 A1 | 8/2017 | Yang et al. |
| 2017/0223450 A1 | 8/2017 | Paton Alvarez et al. |
| 2017/0230750 A1 | 8/2017 | Pawlowski et al. |
| 2017/0238108 A1 | 8/2017 | Muza |
| 2017/0245035 A1 | 8/2017 | Lee et al. |
| 2017/0245059 A1 | 8/2017 | Durand et al. |
| 2017/0245061 A1 | 8/2017 | Yoshinaga |
| 2017/0247248 A1 | 8/2017 | Hoekstra |
| 2017/0251302 A1 | 8/2017 | Lesso et al. |
| 2017/0251303 A1 | 8/2017 | Lesso et al. |
| 2017/0254831 A1 | 9/2017 | Li et al. |
| 2017/0257093 A1 | 9/2017 | Buffa et al. |
| 2017/0258320 A1 | 9/2017 | Abreu |
| 2017/0258386 A1 | 9/2017 | Woltjer et al. |
| 2017/0258585 A1 | 9/2017 | Marquez et al. |
| 2017/0260044 A1 | 9/2017 | Cargill et al. |
| 2017/0265005 A1 | 9/2017 | Wiggins et al. |
| 2017/0265009 A1 | 9/2017 | Sridharan et al. |
| 2017/0265287 A1 | 9/2017 | Avrahamy |
| 2017/0271610 A1 | 9/2017 | Takahashi |
| 2017/0272878 A1 | 9/2017 | Partio et al. |
| 2017/0272886 A1 | 9/2017 | Family et al. |
| 2017/0275152 A1 | 9/2017 | Ziglioli |
| 2017/0276723 A1 | 9/2017 | Buffa et al. |
| 2017/0277125 A1 | 9/2017 | Jung et al. |
| 2017/0277138 A1 | 9/2017 | Kaji et al. |
| 2017/0277902 A1 | 9/2017 | Bae et al. |
| 2017/0278226 A1 | 9/2017 | Pacheco et al. |
| 2017/0278447 A1 | 9/2017 | Yaras et al. |
| 2017/0278465 A1 | 9/2017 | Wu |
| 2017/0278480 A1 | 9/2017 | Sung et al. |
| 2017/0278733 A1 | 9/2017 | Chang et al. |
| 2017/0278874 A1 | 9/2017 | Yamazaki et al. |
| 2017/0278878 A1 | 9/2017 | Kuwabara et al. |
| 2017/0278973 A1 | 9/2017 | Ando |
| 2017/0280041 A1 | 9/2017 | Yu |
| 2017/0280237 A1 | 9/2017 | Kopetz et al. |
| 2017/0280263 A1 | 9/2017 | Guo et al. |
| 2017/0280265 A1 | 9/2017 | Po |
| 2017/0281083 A1 | 10/2017 | Sawano |
| 2017/0284825 A1 | 10/2017 | Lesso et al. |
| 2017/0284882 A1 | 10/2017 | Baldo et al. |
| 2017/0285404 A1 | 10/2017 | Kubota et al. |
| 2017/0285815 A1 | 10/2017 | Yamazaki et al. |
| 2017/0285871 A1 | 10/2017 | Jung et al. |
| 2017/0286588 A1 | 10/2017 | Sukharev et al. |
| 2017/0287127 A1 | 10/2017 | Chung et al. |
| 2017/0287228 A1 | 10/2017 | Torii et al. |
| 2017/0287293 A1 | 10/2017 | Saboune et al. |
| 2017/0287414 A1 | 10/2017 | Uriostigue et al. |
| 2017/0287943 A1 | 10/2017 | Ma et al. |
| 2017/0288023 A1 | 10/2017 | Yamazaki et al. |
| 2017/0288125 A1 | 10/2017 | Glacer |
| 2017/0288670 A1 | 10/2017 | Kozuma et al. |
| 2017/0289678 A1 | 10/2017 | Melanson et al. |
| 2017/0289702 A1 | 10/2017 | Inoue |
| 2017/0290097 A1 | 10/2017 | Pindl et al. |
| 2017/0293155 A1 | 10/2017 | Saracco |
| 2017/0293156 A1 | 10/2017 | Saracco et al. |
| 2017/0293171 A1 | 10/2017 | Yamazaki et al. |
| 2017/0294543 A1 | 10/2017 | Yamazaki |
| 2017/0295325 A1 | 10/2017 | Yoon et al. |
| 2017/0295434 A1 | 10/2017 | Hoekstra |
| 2017/0297895 A1 | 10/2017 | Kautzsch et al. |
| 2017/0297899 A1 | 10/2017 | Dehe et al. |
| 2017/0299494 A1 | 10/2017 | Lin et al. |
| 2017/0299721 A1 | 10/2017 | Eichenholz et al. |
| 2017/0300162 A1 | 10/2017 | Jang |
| 2017/0301391 A1 | 10/2017 | Kurokawa |
| 2017/0301699 A1 | 10/2017 | Yamazaki et al. |
| 2017/0303383 A1 | 10/2017 | Kirkpatrick et al. |
| 2017/0308216 A1 | 10/2017 | Lee et al. |
| 2017/0309856 A1 | 10/2017 | Yamazaki et al. |
| 2017/0310743 A1 | 10/2017 | Aoyama et al. |
| 2017/0316487 A1 | 11/2017 | Mazed |
| 2017/0316713 A1 | 11/2017 | Hyman |
| 2017/0317610 A1 | 11/2017 | Loi et al. |
| 2017/0318385 A1 | 11/2017 | Harney et al. |
| 2017/0318388 A1 | 11/2017 | Risberg et al. |
| 2017/0318393 A1 | 11/2017 | Valli et al. |
| 2017/0318394 A1 | 11/2017 | Hashiguchi et al. |
| 2017/0319179 A1 | 11/2017 | Kandori et al. |
| 2017/0320726 A1 | 11/2017 | Leitgeb et al. |
| 2017/0323481 A1 | 11/2017 | Tran et al. |
| 2017/0323892 A1 | 11/2017 | Endo |
| 2017/0323908 A1 | 11/2017 | Yamazaki et al. |
| 2017/0325025 A1 | 11/2017 | Dorfmeister et al. |
| 2017/0325081 A1 | 11/2017 | Chrisikos et al. |
| 2017/0328702 A1 | 11/2017 | Vossough et al. |
| 2017/0328931 A1 | 11/2017 | Zhang et al. |
| 2017/0329162 A1 | 11/2017 | Yamazaki et al. |
| 2017/0329439 A1 | 11/2017 | Jeong et al. |
| 2017/0331899 A1 | 11/2017 | Binder et al. |
| 2017/0332170 A1 | 11/2017 | Laaksonen et al. |
| 2017/0332178 A1 | 11/2017 | Traynor et al. |
| 2017/0334187 A1 | 11/2017 | Kumakura et al. |
| 2017/0336205 A1 | 11/2017 | Thompson |
| 2017/0336396 A1 | 11/2017 | Yu et al. |
| 2017/0336903 A1 | 11/2017 | Rivaud et al. |
| 2017/0337888 A1 | 11/2017 | Nakagawa et al. |
| 2017/0338107 A1 | 11/2017 | Yamazaki et al. |
| 2017/0338108 A1 | 11/2017 | Yamazaki et al. |
| 2017/0338353 A1 | 11/2017 | Koezuka et al. |
| 2017/0338818 A1 | 11/2017 | Harada et al. |
| 2017/0340396 A1 | 11/2017 | Romo et al. |
| 2017/0343350 A1 | 11/2017 | Geisberger |
| 2017/0343874 A1 | 11/2017 | Kimura |
| 2017/0344114 A1 | 11/2017 | Osterhout et al. |
| 2017/0347886 A1 | 12/2017 | Tran |

(56) References Cited

U.S. PATENT DOCUMENTS

| | | |
|---|---|---|
| 2017/0348095 A1 | 12/2017 | Wortz et al. |
| 2017/0352233 A1 | 12/2017 | Rivaud et al. |
| 2017/0352540 A1 | 12/2017 | Watanabe et al. |
| 2017/0352746 A1 | 12/2017 | Yamazaki et al. |
| 2017/0354031 A1 | 12/2017 | Aoki et al. |
| 2017/0355591 A1 | 12/2017 | Hedenig et al. |
| 2017/0355594 A1 | 12/2017 | Zeleznik |
| 2017/0355599 A1 | 12/2017 | Bhagavat et al. |
| 2017/0356928 A1 | 12/2017 | Bernal et al. |
| 2017/0357113 A1 | 12/2017 | Yamazaki et al. |
| 2017/0357144 A1 | 12/2017 | Kim et al. |
| 2017/0357365 A1 | 12/2017 | Cho et al. |
| 2017/0359113 A1 | 12/2017 | Lee et al. |
| 2017/0359536 A1 | 12/2017 | Lee et al. |
| 2017/0359658 A1 | 12/2017 | Jenkins et al. |
| 2017/0359669 A1 | 12/2017 | Vilermo et al. |
| 2017/0362648 A1 | 12/2017 | Hassibi et al. |
| 2017/0363493 A1 | 12/2017 | Fain et al. |
| 2017/0363906 A1 | 12/2017 | Yanagisawa et al. |
| 2017/0364154 A1 | 12/2017 | Levesque et al. |
| 2017/0365224 A1 | 12/2017 | Okamoto |
| 2017/0365234 A1 | 12/2017 | Yamazaki et al. |
| 2017/0365451 A1 | 12/2017 | Yamazaki |
| 2017/0365648 A1 | 12/2017 | Yamazaki et al. |
| 2017/0366104 A1 | 12/2017 | Kandori et al. |
| 2017/0366235 A1 | 12/2017 | Kim et al. |
| 2017/0366898 A1 | 12/2017 | Melanson et al. |
| 2017/0367578 A1 | 12/2017 | Melodia et al. |
| 2017/0370869 A1 | 12/2017 | Yu et al. |
| 2017/0372114 A1 | 12/2017 | Cho et al. |
| 2017/0372542 A1 | 12/2017 | Romero et al. |
| 2017/0372669 A1 | 12/2017 | Takesue et al. |
| 2017/0373196 A1 | 12/2017 | Koezuka et al. |
| 2017/0374441 A1 | 12/2017 | Hoekstra et al. |
| 2017/0374442 A1 | 12/2017 | Pennock et al. |
| 2017/0374457 A1 | 12/2017 | Su et al. |
| 2017/0374469 A1 | 12/2017 | Pal et al. |
| 2017/0374473 A1 | 12/2017 | Hoekstra et al. |
| 2017/0374474 A1 | 12/2017 | Hoekstra |
| 2018/0000344 A1 | 1/2018 | Melodia et al. |
| 2018/0000545 A1 | 1/2018 | Giordano et al. |
| 2018/0002159 A1 | 1/2018 | Cargill et al. |
| 2018/0002160 A1 | 1/2018 | Piechocinski et al. |
| 2018/0002161 A1 | 1/2018 | Jenkins et al. |
| 2018/0002162 A1 | 1/2018 | Thompson et al. |
| 2018/0002167 A1 | 1/2018 | Frischmuth et al. |
| 2018/0002168 A1 | 1/2018 | Cargill et al. |
| 2018/0004047 A1 | 1/2018 | Yamazaki et al. |
| 2018/0004282 A1 | 1/2018 | Aonuma et al. |
| 2018/0004701 A1 | 1/2018 | Pappu et al. |
| 2018/0004702 A1 | 1/2018 | Pappu et al. |
| 2018/0005566 A1 | 1/2018 | Kurokawa |
| 2018/0005588 A1 | 1/2018 | Kurokawa |
| 2018/0005600 A1 | 1/2018 | Ikeda |
| 2018/0005946 A1 | 1/2018 | Alur et al. |
| 2018/0006356 A1 | 1/2018 | McAllister |
| 2018/0007032 A1 | 1/2018 | Pappu et al. |
| 2018/0007472 A1 | 1/2018 | Puria et al. |
| 2018/0007473 A1 | 1/2018 | Cargill |
| 2018/0007474 A1 | 1/2018 | Cargill et al. |
| 2018/0008356 A1 | 1/2018 | Giordano et al. |
| 2018/0008357 A1 | 1/2018 | Giordano et al. |
| 2018/0009374 A1 | 1/2018 | Kim et al. |
| 2018/0011355 A1 | 1/2018 | Miyake et al. |
| 2018/0011447 A1 | 1/2018 | Yoshizumi et al. |
| 2018/0011590 A1 | 1/2018 | Lee et al. |
| 2018/0012536 A1 | 1/2018 | Shishido |
| 2018/0012538 A1 | 1/2018 | Asami |
| 2018/0012588 A1 | 1/2018 | Albers et al. |
| 2018/0012912 A1 | 1/2018 | Yamazaki et al. |
| 2018/0013003 A1 | 1/2018 | Yamazaki |
| 2018/0014128 A1 | 1/2018 | Puria et al. |
| 2018/0017385 A1 | 1/2018 | Shirvani et al. |
| 2018/0017996 A1 | 1/2018 | Ryu et al. |
| 2018/0018014 A1 | 1/2018 | Lutnick et al. |
| 2018/0018565 A1 | 1/2018 | Kurokawa |
| 2018/0018752 A1 | 1/2018 | Kurokawa |
| 2018/0018918 A1 | 1/2018 | Miyake |
| 2018/0018934 A1 | 1/2018 | Lim et al. |
| 2018/0019425 A1 | 1/2018 | Yasumoto et al. |
| 2018/0020291 A1 | 1/2018 | Puria et al. |
| 2018/0021679 A1 | 1/2018 | Ito et al. |
| 2018/0024241 A1 | 1/2018 | Eichenholz et al. |
| 2018/0024286 A1 | 1/2018 | Schubert et al. |
| 2018/0024546 A1 | 1/2018 | Ha et al. |
| 2018/0024656 A1 | 1/2018 | Kim et al. |
| 2018/0024680 A1 | 1/2018 | Sakuishi et al. |
| 2018/0025297 A1 | 1/2018 | Knickrehm et al. |
| 2018/0025905 A1 | 1/2018 | Yamazaki et al. |
| 2018/0025913 A1 | 1/2018 | Yamazaki et al. |
| 2018/0025918 A1 | 1/2018 | Yamazaki et al. |
| 2018/0026037 A1 | 1/2018 | Shishido et al. |
| 2018/0026218 A1 | 1/2018 | Kobayashi et al. |
| 2018/0027325 A1 | 1/2018 | Kim |
| 2018/0027338 A1 | 1/2018 | Shajaan et al. |
| 2018/0027339 A1 | 1/2018 | Blumkin et al. |
| 2018/0029878 A1 | 2/2018 | Dehe et al. |
| 2018/0031601 A1 | 2/2018 | Anac et al. |
| 2018/0031603 A1 | 2/2018 | Huang et al. |
| 2018/0031943 A1 | 2/2018 | Yamazaki et al. |
| 2018/0032160 A1 | 2/2018 | Park et al. |
| 2018/0032163 A1 | 2/2018 | Park et al. |
| 2018/0033362 A1 | 2/2018 | Yamazaki et al. |
| 2018/0033399 A1 | 2/2018 | Kawashima et al. |
| 2018/0033696 A1 | 2/2018 | Nakagawa et al. |
| 2018/0033978 A1 | 2/2018 | Ohno et al. |
| 2018/0034912 A1 | 2/2018 | Binder et al. |
| 2018/0035190 A1 | 2/2018 | Hoekstra et al. |
| 2018/0035206 A1 | 2/2018 | Barzen |
| 2018/0035228 A1 | 2/2018 | Boyd |
| 2018/0035229 A1 | 2/2018 | Deas et al. |
| 2018/0035888 A1 | 2/2018 | Irazoqui et al. |
| 2018/0038699 A1 | 2/2018 | Ikeda |
| 2018/0038746 A1 | 2/2018 | Barnard et al. |
| 2018/0039117 A1 | 2/2018 | Ikeda et al. |
| 2018/0039302 A1 | 2/2018 | Levesque et al. |
| 2018/0039815 A1 | 2/2018 | Jung et al. |
| 2018/0040274 A1 | 2/2018 | Kurokawa |
| 2018/0040642 A1 | 2/2018 | Umezaki |
| 2018/0040722 A1 | 2/2018 | Obonai et al. |
| 2018/0041140 A1 | 2/2018 | Fujita et al. |
| 2018/0042513 A1 | 2/2018 | Connor |
| 2018/0044167 A1 | 2/2018 | Jenkins et al. |
| 2018/0046004 A1 | 2/2018 | Yamazaki et al. |
| 2018/0046305 A1 | 2/2018 | Kang et al. |
| 2018/0047260 A1 | 2/2018 | Ullrich et al. |
| 2018/0047582 A1 | 2/2018 | Lemke et al. |
| 2018/0047609 A1 | 2/2018 | Ohno et al. |
| 2018/0048359 A1 | 2/2018 | Kim et al. |
| 2018/0048953 A1 | 2/2018 | Park et al. |
| 2018/0050900 A1 | 2/2018 | Duffy et al. |
| 2018/0052274 A1 | 2/2018 | Nichol et al. |
| 2018/0052535 A1 | 2/2018 | Sakuishi et al. |
| 2018/0052844 A1 | 2/2018 | Seo et al. |
| 2018/0052950 A1 | 2/2018 | Hofmann et al. |
| 2018/0052951 A1 | 2/2018 | Hofmann et al. |
| 2018/0053459 A1 | 2/2018 | Fukai |
| 2018/0055159 A1 | 3/2018 | Park |
| 2018/0055625 A1 | 3/2018 | Wortz et al. |
| 2018/0058967 A1 | 3/2018 | Jang et al. |
| 2018/0059318 A1 | 3/2018 | Nichol et al. |
| 2018/0059466 A1 | 3/2018 | Koyama |
| 2018/0059690 A1 | 3/2018 | Coleman |
| 2018/0059708 A1 | 3/2018 | Wiesbauer et al. |
| 2018/0061344 A1 | 3/2018 | Kurokawa |
| 2018/0061638 A1 | 3/2018 | Yamazaki et al. |
| 2018/0061639 A1 | 3/2018 | Yamazaki et al. |
| 2018/0062588 A1 | 3/2018 | Barbieri et al. |
| 2018/0063644 A1 | 3/2018 | Bach et al. |
| 2018/0063647 A1 | 3/2018 | Blumkin et al. |
| 2018/0066980 A1 | 3/2018 | Zhou et al. |
| 2018/0067005 A1 | 3/2018 | Fuji et al. |
| 2018/0067303 A1 | 3/2018 | Sourani |
| 2018/0067373 A1 | 3/2018 | Kimura et al. |

(56) References Cited

U.S. PATENT DOCUMENTS

| | | |
|---|---|---|
| 2018/0067586 A1 | 3/2018 | Shishido et al. |
| 2018/0069064 A1 | 3/2018 | Ito et al. |
| 2018/0069367 A1 | 3/2018 | Villeneuve et al. |
| 2018/0070821 A1 | 3/2018 | Liebschner et al. |
| 2018/0072033 A1 | 3/2018 | Ohno et al. |
| 2018/0074592 A1 | 3/2018 | Birnbaum et al. |
| 2018/0075924 A1 | 3/2018 | Umezaki |
| 2018/0075994 A1 | 3/2018 | Gudeman |
| 2018/0076195 A1 | 3/2018 | Yamazaki et al. |
| 2018/0076231 A1 | 3/2018 | Yamazaki et al. |
| 2018/0076232 A1 | 3/2018 | Kimura et al. |
| 2018/0076332 A1 | 3/2018 | Yamazaki et al. |
| 2018/0076333 A1 | 3/2018 | Koezuka et al. |
| 2018/0076385 A1 | 3/2018 | Fuji et al. |
| 2018/0076394 A1 | 3/2018 | Kawakami et al. |
| 2018/0076507 A1 | 3/2018 | Heo |
| 2018/0076893 A1 | 3/2018 | Aoyama et al. |
| 2018/0077408 A1 | 3/2018 | Suzuki et al. |
| 2018/0077497 A1 | 3/2018 | Hatipoglu |
| 2018/0077499 A1 | 3/2018 | Yoo |
| 2018/0079429 A1 | 3/2018 | Prokhorov |
| 2018/0079640 A1 | 3/2018 | Gudeman et al. |
| 2018/0080954 A1 | 3/2018 | Ono et al. |
| 2018/0081449 A1 | 3/2018 | Tanabe et al. |
| 2018/0081536 A1 | 3/2018 | Ueno et al. |
| 2018/0082102 A1 | 3/2018 | Lee et al. |
| 2018/0082118 A1 | 3/2018 | Kozuma et al. |
| 2018/0083048 A1 | 3/2018 | Koezuka et al. |
| 2018/0083074 A1 | 3/2018 | Yamazaki et al. |
| 2018/0084245 A1 | 3/2018 | Lapstun |
| 2018/0084365 A1 | 3/2018 | Ugur et al. |
| 2018/0085593 A1 | 3/2018 | Fayram et al. |
| 2018/0085605 A1 | 3/2018 | Maharbiz et al. |
| 2018/0085859 A1 | 3/2018 | Yamazaki et al. |
| 2018/0086625 A1 | 3/2018 | Kub et al. |
| 2018/0086628 A1 | 3/2018 | Vossough et al. |
| 2018/0087984 A1 | 3/2018 | Hagelin et al. |
| 2018/0088068 A1 | 3/2018 | Yu et al. |
| 2018/0088236 A1 | 3/2018 | Eichenholz et al. |
| 2018/0088776 A1 | 3/2018 | Motta et al. |
| 2018/0090602 A1 | 3/2018 | Koezuka et al. |
| 2018/0090616 A1 | 3/2018 | Nakagawa et al. |
| 2018/0090621 A1 | 3/2018 | Yamazaki et al. |
| 2018/0091900 A1 | 3/2018 | Parker et al. |
| 2018/0091903 A1 | 3/2018 | Palmer et al. |
| 2018/0091906 A1 | 3/2018 | Khenkin et al. |
| 2018/0092313 A1 | 4/2018 | Avrahamy |
| 2018/0093117 A1 | 4/2018 | Hyland et al. |
| 2018/0095127 A1 | 4/2018 | Pappu et al. |
| 2018/0095336 A1 | 4/2018 | Fukutome |
| 2018/0095502 A1 | 4/2018 | Yamazaki et al. |
| 2018/0095504 A1 | 4/2018 | Knepper et al. |
| 2018/0096177 A1 | 4/2018 | Srinivasan et al. |
| 2018/0096735 A1 | 4/2018 | Pappu |
| 2018/0096971 A1 | 4/2018 | Pappu et al. |
| 2018/0096979 A1 | 4/2018 | Pappu et al. |
| 2018/0097040 A1 | 4/2018 | Yamazaki et al. |
| 2018/0097275 A1 | 4/2018 | Lee et al. |
| 2018/0097516 A1 | 4/2018 | Kim |
| 2018/0097622 A1 | 4/2018 | Kurokawa |
| 2018/0097983 A1 | 4/2018 | Park et al. |
| 2018/0098001 A1 | 4/2018 | Park et al. |
| 2018/0098139 A1 | 4/2018 | Arevalo Carreno et al. |
| 2018/0098143 A1 | 4/2018 | Silvestri et al. |
| 2018/0099867 A1 | 4/2018 | Walther et al. |
| 2018/0099868 A1 | 4/2018 | Gogoi |
| 2018/0100721 A1 | 4/2018 | Lee |
| 2018/0101359 A1 | 4/2018 | Harada et al. |
| 2018/0101388 A1 | 4/2018 | Hummel et al. |
| 2018/0101422 A1 | 4/2018 | Flanigan et al. |
| 2018/0101715 A1 | 4/2018 | Lee et al. |
| 2018/0101965 A1 | 4/2018 | Park et al. |
| 2018/0102086 A1 | 4/2018 | Katayama et al. |
| 2018/0102420 A1 | 4/2018 | Ando et al. |
| 2018/0102442 A1 | 4/2018 | Wang et al. |
| 2018/0102586 A1 | 4/2018 | Shin et al. |
| 2018/0102667 A1 | 4/2018 | Choi et al. |
| 2018/0102981 A1 | 4/2018 | Kurtzman et al. |
| 2018/0103029 A1 | 4/2018 | Visinescu et al. |
| 2018/0103132 A1 | 4/2018 | Prushinskiy et al. |
| 2018/0103320 A1 | 4/2018 | Kim |
| 2018/0103323 A1 | 4/2018 | Kim et al. |
| 2018/0103324 A1 | 4/2018 | Yoo |
| 2018/0103325 A1 | 4/2018 | Dehe et al. |
| 2018/0103326 A1 | 4/2018 | Veneri et al. |
| 2018/0104407 A1 | 4/2018 | Dacey, Jr. et al. |
| 2018/0105270 A1 | 4/2018 | Xu et al. |
| 2018/0106759 A1 | 4/2018 | de Oliveira Botelho et al. |
| 2018/0107221 A1 | 4/2018 | Droz et al. |
| 2018/0107280 A1 | 4/2018 | Oh et al. |
| 2018/0107303 A1 | 4/2018 | Park et al. |
| 2018/0107333 A1 | 4/2018 | Harrison et al. |
| 2018/0107353 A1 | 4/2018 | Lee |
| 2018/0107382 A1 | 4/2018 | Tamai et al. |
| 2018/0107849 A1 | 4/2018 | Park |
| 2018/0107908 A1 | 4/2018 | Park |
| 2018/0108002 A1 | 4/2018 | Jang et al. |
| 2018/0108172 A1 | 4/2018 | Huston et al. |
| 2018/0108227 A1 | 4/2018 | Levesque |
| 2018/0108440 A1 | 4/2018 | Stevens et al. |
| 2018/0108760 A1 | 4/2018 | Okamoto et al. |
| 2018/0109061 A1 | 4/2018 | Pardhan et al. |
| 2018/0109180 A1 | 4/2018 | Opris et al. |
| 2018/0109267 A1 | 4/2018 | Shionoiri et al. |
| 2018/0109676 A1 | 4/2018 | Yeoum et al. |
| 2018/0109710 A1 | 4/2018 | Lee et al. |
| 2018/0109724 A1 | 4/2018 | Kang et al. |
| 2018/0109751 A1 | 4/2018 | Choi et al. |
| 2018/0109752 A1 | 4/2018 | Aoki et al. |
| 2018/0109835 A1 | 4/2018 | Kozuma |
| 2018/0109869 A1 | 4/2018 | Opris et al. |
| 2018/0109875 A1 | 4/2018 | Opris et al. |
| 2018/0109892 A1 | 4/2018 | Wiesbauer et al. |
| 2018/0109947 A1 | 4/2018 | Kim et al. |
| 2018/0110148 A9 | 4/2018 | Jun et al. |
| 2018/0110466 A1 | 4/2018 | Ralston |
| 2018/0111824 A1 | 4/2018 | Wu et al. |
| 2018/0112837 A1 | 4/2018 | Sadwick |
| 2018/0112887 A1 | 4/2018 | Fanelli et al. |
| 2018/0113138 A1 | 4/2018 | Moran et al. |
| 2018/0113304 A1 | 4/2018 | Alexander et al. |
| 2018/0113305 A1 | 4/2018 | Alexander et al. |
| 2018/0113501 A1 | 4/2018 | Iwaki et al. |
| 2018/0113512 A1 | 4/2018 | Kang et al. |
| 2018/0113566 A1 | 4/2018 | Shigemori |
| 2018/0113607 A1 | 4/2018 | Kim et al. |
| 2018/0114047 A1 | 4/2018 | Kim et al. |
| 2018/0114386 A1 | 4/2018 | Steinmetz |
| 2018/0114942 A1 | 4/2018 | Chida |
| 2018/0115116 A1 | 4/2018 | Han et al. |
| 2018/0115579 A1 | 4/2018 | Schieman et al. |
| 2018/0115755 A1 | 4/2018 | Xu |
| 2018/0115756 A1 | 4/2018 | Xu |
| 2018/0115811 A1 | 4/2018 | Zhang et al. |
| 2018/0115836 A1 | 4/2018 | Hsieh et al. |
| 2018/0115837 A1 | 4/2018 | Zhang |
| 2018/0115838 A1 | 4/2018 | Zhang et al. |
| 2018/0115864 A1 | 4/2018 | Ryu |
| 2018/0115867 A1 | 4/2018 | Cho et al. |
| 2018/0116514 A1 | 5/2018 | Turner |
| 2018/0116535 A1 | 5/2018 | Fuji et al. |
| 2018/0116561 A1 | 5/2018 | Jo et al. |
| 2018/0116728 A1 | 5/2018 | Lang |
| 2018/0116904 A1 | 5/2018 | Lieberman et al. |
| 2018/0117341 A1 | 5/2018 | Kane et al. |
| 2018/0117436 A1 | 5/2018 | Coza et al. |
| 2018/0118560 A1 | 5/2018 | Liu et al. |
| 2018/0120172 A1 | 5/2018 | Kaji et al. |
| 2018/0120264 A1 | 5/2018 | Sato et al. |
| 2018/0120265 A1 | 5/2018 | Yoskovitz et al. |
| 2018/0120433 A1 | 5/2018 | Eichenholz et al. |
| 2018/0120436 A1 | 5/2018 | Smits |
| 2018/0120902 A1 | 5/2018 | Rider et al. |
| 2018/0120930 A1 | 5/2018 | Turner |

(56) References Cited

U.S. PATENT DOCUMENTS

| | | |
|---|---|---|
| 2018/0120948 A1 | 5/2018 | Aleem et al. |
| 2018/0121067 A1 | 5/2018 | Lee et al. |
| 2018/0121671 A1 | 5/2018 | Bhandari et al. |
| 2018/0121703 A1 | 5/2018 | Jung et al. |
| 2018/0121738 A1 | 5/2018 | Womack et al. |
| 2018/0121796 A1 | 5/2018 | Deisher et al. |
| 2018/0122356 A1 | 5/2018 | Yoo |
| 2018/0122506 A1 | 5/2018 | Grantcharov et al. |
| 2018/0122831 A1 | 5/2018 | Yamazaki |
| 2018/0123224 A1 | 5/2018 | Jung et al. |
| 2018/0123379 A1 | 5/2018 | Ha et al. |
| 2018/0123402 A1 | 5/2018 | Cheatham et al. |
| 2018/0123412 A1 | 5/2018 | Karplus et al. |
| 2018/0124181 A1 | 5/2018 | Binder et al. |
| 2018/0124225 A1 | 5/2018 | Boesen et al. |
| 2018/0124230 A1 | 5/2018 | Muthukumar |
| 2018/0124495 A1 | 5/2018 | Boesen |
| 2018/0124514 A1 | 5/2018 | Peeler et al. |
| 2018/0124521 A1 | 5/2018 | Giusti et al. |
| 2018/0124564 A1 | 5/2018 | Phillips et al. |
| 2018/0124601 A1 | 5/2018 | Vutukuri |
| 2018/0124846 A1 | 5/2018 | Jung et al. |
| 2018/0125363 A1 | 5/2018 | Kaib et al. |
| 2018/0125366 A1 | 5/2018 | Lucey et al. |
| 2018/0125404 A1 | 5/2018 | Bott et al. |
| 2018/0125584 A1 | 5/2018 | Lang |
| 2018/0126075 A1 | 5/2018 | Kaplan et al. |
| 2018/0126273 A1 | 5/2018 | Lee et al. |
| 2018/0127265 A1 | 5/2018 | Brioschi et al. |
| 2018/0127266 A1 | 5/2018 | Wachtler et al. |
| 2018/0128783 A1 | 5/2018 | Bittner et al. |
| 2018/0128851 A1 | 5/2018 | Malvern |
| 2018/0128896 A1 | 5/2018 | Kim et al. |
| 2018/0129112 A1 | 5/2018 | Osterhout |
| 2018/0129170 A1 | 5/2018 | Yun et al. |
| 2018/0129290 A1 | 5/2018 | Levesque |
| 2018/0129409 A1 | 5/2018 | Lim et al. |
| 2018/0129459 A1 | 5/2018 | Sylvan et al. |
| 2018/0129511 A1 | 5/2018 | Krzyzanowski et al. |
| 2018/0129831 A1 | 5/2018 | Yokoi et al. |
| 2018/0129849 A1 | 5/2018 | Strohmann et al. |
| 2018/0130318 A1 | 5/2018 | Shin et al. |
| 2018/0130320 A1 | 5/2018 | Khoshkava et al. |
| 2018/0130434 A1 | 5/2018 | Okamoto |
| 2018/0130441 A1 | 5/2018 | Jeon |
| 2018/0130483 A1 | 5/2018 | Dimino, Jr. et al. |
| 2018/0130484 A1 | 5/2018 | Dimino, Jr. et al. |
| 2018/0130539 A1 | 5/2018 | Ikeda et al. |
| 2018/0130861 A1 | 5/2018 | Eguchi et al. |
| 2018/0130940 A1 | 5/2018 | Chaput |
| 2018/0130967 A1 | 5/2018 | Hiroki et al. |
| 2018/0131091 A1 | 5/2018 | Chang et al. |
| 2018/0131201 A1 | 5/2018 | Calhoun et al. |
| 2018/0131478 A1 | 5/2018 | Song et al. |
| 2018/0131543 A1 | 5/2018 | Li et al. |
| 2018/0131664 A1 | 5/2018 | Kim et al. |
| 2018/0131797 A1 | 5/2018 | Choi |
| 2018/0131804 A1 | 5/2018 | Song et al. |
| 2018/0131858 A1 | 5/2018 | Goo et al. |
| 2018/0131869 A1 | 5/2018 | Kim et al. |
| 2018/0131873 A1 | 5/2018 | Vacura |
| 2018/0132023 A1 | 5/2018 | Yoo |
| 2018/0132024 A1 | 5/2018 | Polo et al. |
| 2018/0132031 A1 | 5/2018 | Seo et al. |
| 2018/0132043 A1 | 5/2018 | Bakish |
| 2018/0132048 A1 | 5/2018 | Usher et al. |
| 2018/0132116 A1 | 5/2018 | Shekhar et al. |
| 2018/0132171 A1 | 5/2018 | Mendahawi |
| 2018/0132192 A1 | 5/2018 | Yang et al. |
| 2018/0132815 A1 | 5/2018 | Tsai et al. |
| 2018/0133431 A1 | 5/2018 | Malchano et al. |
| 2018/0133504 A1 | 5/2018 | Malchano et al. |
| 2018/0133507 A1 | 5/2018 | Malchano et al. |
| 2018/0133583 A1 | 5/2018 | Tran et al. |
| 2018/0133801 A1 | 5/2018 | Buller et al. |
| 2018/0134385 A1 | 5/2018 | Lee et al. |
| 2018/0134544 A1 | 5/2018 | Seshia et al. |
| 2018/0134546 A1 | 5/2018 | Oh et al. |
| 2018/0136321 A1 | 5/2018 | Verghese et al. |
| 2018/0136363 A1 | 5/2018 | Yoon et al. |
| 2018/0136712 A1 | 5/2018 | Niikura et al. |
| 2018/0136715 A1 | 5/2018 | Kim et al. |
| 2018/0136801 A1 | 5/2018 | Lee et al. |
| 2018/0136819 A1 | 5/2018 | Lee et al. |
| 2018/0136899 A1 | 5/2018 | Risberg et al. |
| 2018/0137467 A1 | 5/2018 | Jung et al. |
| 2018/0137488 A1 | 5/2018 | Kim et al. |
| 2018/0137498 A1 | 5/2018 | Kim et al. |
| 2018/0138102 A1 | 5/2018 | Pan et al. |
| 2018/0138155 A1 | 5/2018 | Kim et al. |
| 2018/0138201 A1 | 5/2018 | Nakamura et al. |
| 2018/0138283 A1 | 5/2018 | Kimura |
| 2018/0138391 A1 | 5/2018 | Grosh et al. |
| 2018/0138416 A1 | 5/2018 | Seo et al. |
| 2018/0138882 A1 | 5/2018 | Kim et al. |
| 2018/0139389 A1 | 5/2018 | Park et al. |
| 2018/0139398 A1 | 5/2018 | Kovacovsky et al. |
| 2018/0139431 A1 | 5/2018 | Simek et al. |
| 2018/0139534 A1 | 5/2018 | Fishman et al. |
| 2018/0139536 A1 | 5/2018 | Nicollini et al. |
| 2018/0139543 A1 | 5/2018 | Clerici et al. |
| 2018/0139544 A1 | 5/2018 | Hu |
| 2018/0139545 A1 | 5/2018 | Goorevich et al. |
| 2018/0139862 A1 | 5/2018 | Park et al. |
| 2018/0186623 A1* | 7/2018 | Vossough ............ H01L 29/0669 |

OTHER PUBLICATIONS

Berenschot, Rob Legtenberg Erwin, Miko Elwenspoek, and Jan Fluitman. "Electrostatic Curved Electrode Actuators."

Baxter, Larry K. "Capacitive sensors." Design and Applications (1997).

Miles, Ronald N., Weili Cui, Quang T. Su, and Dorel Homentcovschi. "A MEMS low-noise sound pressure gradient microphone with capacitive sensing." Journal of Microelectromechanical Systems 24, No. 1 (2014): 241-248.

Kuntzman, Michael L., Nishshanka N. Hewa-Kasakarage, Alexandro Rocha, Donghwan Kim, and Neal A. Hall. "Micromachined in-plane pressure-gradient piezoelectric microphones." IEEE Sensors Journal 15, No. 3 (2014): 1347-1357.

Towfighian, Shahrzad, Siyuan He, and Ridha Ben Mrad. "A low voltage electrostatic micro actuator for large out-of-plane displacement." In International Design Engineering Technical Conferences and Computers and Information in Engineering Conference, vol. 46353, p. V004T09A015. American Society of Mechanical Engineers, 2014.

Zhou, Jian, and Ronald N. Miles. "Sensing fluctuating airflow with spider silk." Proceedings of the National Academy of Sciences 114, No. 46 (2017): 12120-12125.

Miles, R. N., and J. Zhou. "Sound-induced motion of a nanoscale fiber." Journal of Vibration and Acoustics 140, No. 1 (2018).

Miles, R. N., Q. Su, W. Cui, M. Shetye, F. L. Degertekin, B. Bicen, C. Garcia, S. Jones, and N. Hall. "A low-noise differential microphone inspired by the ears of the parasitoid fly Ormia ochracea." The Journal of the Acoustical Society of America 125, No. 4 (2009): 2013-2026.

He, Siyuan, R. Ben Mrad, and J. S. Chang. "Development of a high-performance microelectrostatic repulsive-force rotation actuator." Journal of microelectromechanical systems 19, No. 3 (2010): 561-69.

Chen, Yu-Min, Shih-Ming He, Chi-Hsien Huang, Cheng-Chun Huang, Wen-Pin Shih, Chun-Lin Chu, Jing Kong, Ju Li, and Ching-Yuan Su. "Ultra-large suspended graphene as a highly elastic membrane for capacitive pressure sensors." Nanoscale 8, No. 6 (2016): 3555-3564.

Kim, Byung-Hun, and Hwa-Sun Lee. "Acoustical-thermal noise in a capacitive MEMS microphone." IEEE Sensors Journal 15, No. 12 (2015): 6853-6860.

Bicen, Baris, Sunny Jolly, Kamran Jeelani, Caesar T. Garcia, Neal A. Hall, F. Levent Degertekin, Quang Su, Weili Cui, and Ronald N.

(56) References Cited

OTHER PUBLICATIONS

Miles. "Integrated optical displacement detection and electrostatic actuation for directional optical microphones with micromachined biomimetic diaphragms." IEEE Sensors Journal 9, No. 12 (2009): 1933-1941.

London, Albert. "Transmission of reverberant sound through single walls." J. Research Nat. Bur. of Stand 42, No. 605 (1949): 2.

Berger, Christian, Rory Phillips, Alba Centeno, Amaia Zurutuza, and Aravind Vijayaraghavan. "Capacitive pressure sensing with suspended graphene-polymer heterostructure membranes." Nanoscale 9, No. 44 (2017): 17439-17449.

PCT Search Report, PCT/US 2019/033855, dated Sep. 12, 2019.

\* cited by examiner

MULTIELECTRODE CAPACITIVE SENSOR WITHOUT PULL-IN RISK

CROSS REFERENCE TO RELATED APPLICATIONS

The present application is a PCT National Stage application of PCT/US2019/033855, published as WO 2019/226958, filed May 23, 2019, which claims benefit of priority from U.S. Provisional Patent Application No. 62/676,058, filed May 24, 2018, and from U.S. Provisional Patent Application No. 62/676,071, filed May 24, 2018, each of which are each expressly incorporated herein by reference in their entirety.

FIELD OF THE INVENTION

The present technology relates to the field of capacitive sensors.

BACKGROUND OF THE INVENTION

Sensors that rely on changes in capacitance are used in a very large number of important electronic products and systems. Capacitive sensors intended to detect motion or sound typically employ a lightweight, moveable electrode along with a fixed electrode. A bias voltage applied between these two electrodes enables the detection of changes in capacitance due to their relative motion. When detecting small motion, flow, or sound pressure, the performance of the sensor is normally improved when the effective stiffness between the moving and fixed electrodes is reduced. In sensitive microphones, the use of highly compliant moving electrodes having mass and stiffness as small as possible may be desired. In this situation, care must be taken in designing the capacitive electrodes to minimize the influence of electrostatic forces.

It is well-known that the design of capacitive motion sensors that use parallel plate capacitance require that the mechanical stiffness of the moving electrode be large enough to prevent collapse against the biasing electrode. This is because the electrostatic force acts as a negative stiffness for small motions about the static equilibrium position. If the bias voltage is high enough, the magnitude of this negative stiffness can exceed that of the mechanical stiffness, leading to instability. Other electrode designs can cause the electrostatic force to act as a positive stiffness which increases the overall system stiffness as the bias voltage is increased. In this case, an overly high bias voltage will lead to reduced response which reduces sensitivity. Responsivity measures the input-output gain of a detector system. Regardless of whether the electrostatic stiffness is positive or negative, it is nearly always true that the stiffness due to the electrostatic force has the effect of reducing the performance of the sensor.

If an electrostatic sensor has two electrodes, changes in the position of the moving electrode will typically result in a change in the electrostatic potential energy. The effective force applied by the electric field will be equal to the derivative of this potential energy with respect to the position of the moving electrode. To minimize the electrostatic force on the moving electrode, one may incorporate an additional fixed electrode such that the total potential energy of the system remains roughly constant with changes in the position of the moving electrode. While the total potential energy is nearly constant, resulting in a small electrostatic force and corresponding stiffness, the two fixed electrodes will experience dissimilar charges with changes in position of the moving electrode. Sensing these two fixed electrodes separately provides a sensor with greatly reduced influence of electrostatic forces on its motion.

In addition to seeking a design in which the total electrostatic potential energy remains roughly constant as the electrode moves, it is also desired to achieve absolute stability for large motions. This may be accomplished if the electrostatic force on the moving electrode always acts to restore it to its nominal equilibrium position for all possible motions.

Extremely thin, compliant materials are available for constructing these sensing electrodes, such as graphene [1], [2]. These structures have such low bending stiffness, however, that it is difficult to incorporate them into conventional microphone designs without their motion being strongly influenced by the electrostatic forces; their use in acoustic sensing requires new approaches to electrode design.

Highly compliant materials have shown considerable promise for acoustic sensing. Fine fibers such as spider silk have been found to very accurately represent the motion of air in a sound field [3], [4]. The challenges of incorporating highly compliant electrodes has motivated the creation of microphones that incorporate optical sensing [5]-[7]. While optical microphones do achieve the goal of preventing the designer from needing to consider the influence of the sensing mechanism on the forces applied to the mechanical elements, they have not yet proven competitive in high-volume, low-cost devices. The use of piezoelectric materials has also shown promise in avoiding the challenges of capacitive sensing for compliant microphone diaphragms [8]. It should also be mentioned that another motivation for avoiding the parallel plate capacitive sensing scheme is that the viscous damping caused by flow between the electrodes is a major source of thermal noise in miniature microphones [9].

FIGS. 1A-1D show conventional capacitive sensing schemes. FIG. 1A shows parallel plates separated by a gap that varies with acoustic pressure. FIG. 1B shows parallel plates separated by a gap, and shows overlap in a plane parallel to the plates varies with acoustic pressure. FIG. 1C shows a triplet of parallel plates, in which a distance between the central plate and the respective outer plates varies with acoustic pressure. FIG. 1D shows a triplet of parallel plates, in which one plate moves parallel to the plane of the plates in response to acoustic pressure, which causes differential overlap of the other two plates which are adjacent and coplanar, and separated by a gap.

There are, of course, countless electrode geometries that are possible in electrostatic sensing schemes. Depending on the amount of mass, stiffness and damping allowed in the moving electrode for the specific sensing application, existing approaches may achieve varying amounts of electrostatic force and stiffness. Four common configurations are shown in FIG. 1. The two shown on the left in FIGS. 1A and 1B, are composed of two electrodes and those on the right in FIGS. 1C and 1D contain three electrodes. In FIGS. 1A and 1C, the electrodes move transverse to their parallel planes, while in FIGS. 1B and 1D, the motion is parallel to the electrode planes. The configuration of FIG. 1A is by far the most common in acoustic sensors with the moving electrode comprising a pressure-sensing diaphragm. Each of these may be analyzed approximately using the well-known expression for the capacitance of parallel plates. This approximation assumes that the distance between plane surfaces is sufficiently small relative to all other dimensions so that the electric field is dominated by field lines that are straight and orthogonal to the plane surfaces.

The approximate expressions for the electrostatic potential energy, force, and effective stiffness for each of the four sensing configurations shown in FIGS. 1A-1D are considered. Assume that the second electrode in each panel shown is the moving electrode with the remaining electrodes held stationary. Let x be the displacement of the moving electrode relative to its nominal position. Each panel shows a cross section with the electrodes assumed to have constant cross section through the dimension, L, which is orthogonal to the plane of FIGS. 1A-1D. Also assume that electrode 2 is biased with a constant voltage, $V_2$, while the other electrodes are held at zero potential.

The potential energy of the configuration of FIG. 1A is $$V_a = \frac{1}{2}\epsilon V_2^2 \frac{WL}{d+x} \tag{1}$$

where $\epsilon$=8.854 pF/m is the permittivity of the medium. The effective electrostatic force associated with the coordinate x, will be the derivative of $V_a$, evaluated at x, which we will assume is the equilibrium position [11], $$f_a = \frac{\partial}{\partial x}\left(\frac{1}{2}\epsilon V_2^2 \frac{WL}{d+x}\right) = -\frac{1}{2}\epsilon V_2^2 \frac{WL}{(d+x)^2} \tag{2}$$

This force always acts to pull the moving electrode toward the fixed electrode. For small perturbations about the equilibrium point x, this force will be proportional to the motion where the negative of this proportionality constant is the equivalent electrostatic stiffness, $k_a$, $$k_a = -\epsilon V_2^2 \frac{WL}{(d+x)^3} \tag{3}$$

The electrostatic force in FIG. 1A is thus always negative for realizable values of x. This is the electrode configuration of nearly all pressure-sensing microphones.

A similar approach can be taken to estimate the electrostatic energy, force, and stiffness of the configuration shown in FIG. 1B, $$V_b = \frac{1}{2}\epsilon V_2^2 \frac{(W-x)L}{d} \tag{4}$$

The effective electrostatic force is, $$f_a = \frac{\partial}{\partial x}\left(\frac{1}{2}\epsilon V_2^2 \frac{(W-x)L}{d+x}\right) = -\frac{1}{2}\epsilon V_2^2 \frac{L}{d} \tag{5}$$

In this approximation, the force is independent of x and also acts to pull the moving electrode toward its nominal position. For this constant force, the effective stiffness is zero, $k_b \approx 0$. This configuration can be realized using interdigitated fingers or fins and has been successfully incorporated in some acoustic pressure sensors [12]. It should be noted that a more detailed electrostatic analysis of this configuration shows that when x is not small relative to W the electrostatic stiffness becomes positive [13]. While instability is avoided, the electrostatic force can impede the electrode motion.

The electrostatic potential energy of FIG. 1C is $$V_c = \frac{1}{2}\epsilon V_2^2\left(\frac{WL}{d+x} + \frac{WL}{d-x}\right) \tag{6}$$

This expression depends on two terms, one that increases with x while the other decreases. The effective electrostatic force is, $$f_c = \frac{\partial}{\partial x}V_c = \frac{1}{2}\epsilon V_2^2 WL \frac{4xd}{(d+x)^2(d-x)^2} \tag{7}$$

And the effective electrostatic stiffness is $$k_c = -\frac{\partial}{\partial x}f_c = -\frac{1}{2}\epsilon V_2^2 WL \frac{4d}{(d+x)^2(d-x)^2} \tag{8}$$

In FIG. 1D, when x=0, we will assume that electrode 2 is centered over the intersection of the two fixed electrodes so that the overlap with each of them has width W/2. The electrostatic potential energy of the three electrode configuration in FIG. 1D is then $$V_d = \frac{1}{2}\epsilon V_2^2 WL\left(\frac{\left(\frac{W}{2}-x\right)}{d} + \frac{\left(\frac{W}{2}+x\right)}{d}\right) = \frac{1}{2}\epsilon V_2^2 \frac{WL}{d} \tag{9}$$

Because the energy is independent of x, the effective electro-static force and stiffness are zero, $f_d$=0, $k_d$=0. While this is highly desirable in a sensor, it is difficult to implement in a capacitive microphone. The electrode configuration presented in the following could be viewed as an attempt to realize an approximation to FIG. 1D in which the moving electrode is displaced in the direction normal to its plane rather than parallel to its plane as shown in FIG. 1D. Further analysis of the system is provided in Miles, R. N., "Notes on Electrostatics", State University of New York, Binghamton, N.Y. 13902-6000, which is expressly incorporated herein by reference in its entirety.

See, U.S. Pat. Nos. 3,931,469; 3,935,397; 3,941,946; 3,942,029; 3,944,756; 3,946,422; 3,958,662; 3,961,202; 3,980,838; 3,992,585; 4,006,317; 4,014,091; 4,034,332; 4,037,062; 4,046,974; 4,063,050; 4,081,626; 4,085,297; 4,093,884; 4,122,302; 4,149,095; 4,151,480; 4,160,882; 4,170,721; 4,188,513; 4,207,412; 4,215,249; 4,225,755; 4,246,448; 4,246,449; 4,249,043; 4,281,221; 4,288,735; 4,289,936; 4,302,634; 4,311,881; 4,323,736; 4,329,547; 4,360,955; 4,101,858; 4,103,117; 4,109,411; 4,114,133; 4,120,790; 4,129,189; 4,129,191; 4,129,192; 4,129,193; 4,134,327; 4,436,648; 4,439,641; 4,139,642; 4,461,931; 4,489,278; 4,491,697; 4,192,825; 4,515,997; 4,524,247; 4,533,795; 4,541,112; 4,542,264; 4,558,184; 4,567,415; 4,582,961; 4,615,105; 4,621,171; 4,764,690; 4,767,973; 4,790,021; 4,796,725; 4,802,227; 4,849,050; 4,849,071; 4,922,471; 4,977,590; 4,993,072; 5,014,322; 5,038,459; 5,054,081; 5,097,224; 5,161,128; 5,206,914; 5,208,789; 5,214,709; 5,335,210; 5,392,358; 5,452,268; 5,471,540; 5,490,220; 5,570,428; 5,573,679; 5,590,212; 5,600,610; 5,712,598; 5,745,438; 5,802,198; 5,854,846; 5,862,239;

5,870,482; 5,978,491; 6,075,867; 6,125,189; 6,145,186; 6,175,636; 6,178,249; 6,188,772; 6,201,874; 6,218,883; 6,243,474; 6,249,075; 6,304,662; 6,308,398; 6,343,129; 6,357,299; 6,366,678; 6,376,971; 6,393,129; 6,427,015; 6,434,245; 6,441,451; 6,449,370; 6,483,924; 6,493,288; 6,504,937; 6,510,231; 6,535,460; 6,535,612; 6,543,110; 6,545,384; 6,580,797; 6,583,533; 6,584,206; 6,600,825; 6,628,791; 6,630,639; 6,661,897; 6,664,718; 6,667,189; 6,677,176; 6,724,058; 6,731,766; 6,741,709; 6,744,896; 6,756,248; 6,760,455; 6,781,284; 6,785,393; 6,788,794; 6,788,795; 6,804,362; 6,806,593; 6,812,620; 6,812,624; 6,818,092; 6,819,769; 6,829,131; 6,842,964; 6,870,938; 6,870,939; 6,911,764; 6,940,211; 6,941,308; 6,978,029; 6,987,859; 7,003,127; 7,019,955; 7,023,066; 7,034,132; 7,039,202; 7,040,173; 7,049,732; 7,054,156; 7,062,055; 7,064,172; 7,074,634; 7,095,864; 7,107,665; 7,132,307; 7,142,684; 7,146,016; 7,152,481; 7,158,646; 7,193,256; 7,194,095; 7,199,501; 7,208,996; 7,215,527; 7,218,742; 7,221,768; 7,224,106; 7,233,097; 7,233,679; 7,256,927; 7,259,503; 7,269,267; 7,269,268; 7,292,700; 7,295,675; 7,298,856; 7,305,096; 7,317,234; 7,320,457; 7,327,851; 7,329,933; 7,346,178; 7,352,876; 7,359,286; 7,362,032; 7,362,873; 7,368,862; 7,377,175; 7,386,136; 7,394,182; 7,400,737; 7,425,749; 7,447,326; 7,461,281; 7,466,835; 7,468,575; 7,489,791; 7,493,821; 7,570,773; 7,579,678; 7,585,743; 7,595,580; 7,607,355; 7,608,989; 7,620,197; 7,642,575; 7,668,323; 7,697,899; 7,702,118; 7,702,124; 7,710,371; 7,715,583; 7,756,279; 7,761,981; 7,769,193; 7,781,249; 7,804,968; 7,804,969; 7,804,971; 7,805,821; 7,812,418; 7,829,366; 7,835,533; 7,848,532; 7,855,095; 7,856,804; 7,860,258; 7,880,565; 7,884,467; 7,888,840; 7,889,882; 7,894,616; 7,898,159; 7,899,196; 7,903,831; 7,907,743; 7,911,115; 7,912,235; 7,912,236; 7,916,879; 7,923,064; 7,923,902; 7,925,033; 7,925,221; 7,932,117; 7,940,944; 7,948,731; 7,949,142; 7,951,636; 7,953,235; 7,970,154; 7,974,130; 8,000,483; 8,004,373; 8,005,242; 8,009,838; 8,018,301; 8,023,667; 8,036,401; 8,041,059; 8,042,264; 8,045,733; 8,045,734; 8,047,995; 8,054,566; 8,059,837; 8,059,838; 8,059,842; 8,064,620; 8,072,010; 8,073,166; 8,073,167; 8,073,179; 8,080,835; 8,081,784; 8,085,956; 8,085,965; 8,090,125; 8,093,783; 8,094,839; 8,094,841; 8,094,844; 8,098,853; 8,098,855; 8,103,039; 8,104,354; 8,107,651; 8,111,847; 8,111,871; 8,114,700; 8,126,166; 8,126,167; 8,126,171; 8,130,986; 8,134,375; 8,138,034; 8,139,762; 8,139,790; 8,139,794; 8,165,323; 8,170,237; 8,175,293; 8,175,294; 8,183,739; 8,184,832; 8,188,557; 8,194,908; 8,196,282; 8,199,939; 8,218,794; 8,229,140; 8,242,840; 8,243,962; 8,243,966; 8,254,598; 8,259,963; 8,265,287; 8,284,967; 8,295,514; 8,295,528; 8,300,858; 8,300,860; 8,327,521; 8,327,711; 8,335,328; 8,345,898; 8,345,910; 8,369,545; 8,369,552; 8,374,363; 8,379,890; 8,385,570; 8,385,586; 8,389,349; 8,391,520; 8,401,217; 8,401,513; 8,405,419; 8,406,437; 8,411,882; 8,416,973; 8,433,084; 8,438,710; 8,447,049; 8,448,326; 8,456,958; 8,467,550; 8,467,559; 8,468,665; 8,497,149; 8,502,329; 8,503,702; 8,508,109; 8,509,459; 8,515,100; 8,519,492; 8,526,656; 8,542,850; 8,542,852; 8,542,853; 8,546,170; 8,548,178; 8,553,913; 8,559,660; 8,562,565; 8,565,452; 8,565,454; 8,582,787; 8,588,433; 8,588,438; 8,588,451; 8,590,136; 8,594,349; 8,600,083; 8,605,919; 8,611,566; 8,618,718; 8,625,809; 8,625,823; 8,625,824; 8,625,825; 8,630,429; 8,630,430; 8,637,945; 8,638,249; 8,643,129; 8,643,382; 8,641,529; 8,664,733; 8,666,094; 8,666,095; 8,666,097; 8,670,581; 8,673,732; 8,675,895; 8,686,519; 8,692,340; 8,698,255; 8,698,256; 8,699,726; 8,699,728; 8,699,740; 8,705,767; 8,705,775; 8,710,601; 8,718,297; 8,723,277; 8,724,832; 8,731,220; 8,737,646; 8,742,517; 8,744,117; 8,755,539; 8,755,541; 8,755,556; 8,758,253; 8,760,031; 8,767,980; 8,774,128; 8,783,113; 8,787,600; 8,787,601; 8,790,567; 8,792,658; 8,803,261; 8,804,982; 8,811,635; 8,818,007; 8,824,706; 8,824,707; 8,824,713; 8,831,246; 8,836,111; 8,837,754; 8,842,858; 8,847,289; 8,848,950; 8,855,335; 8,855,337; 8,860,154; 8,861,764; 8,873,777; 8,885,853; 8,897,465; 8,913,762; 8,921,957; 8,929,584; 8,942,389; 8,942,394; 8,958,574; 8,958,581; 8,962,368; 8,965,008; 8,965,013; 8,965,027; 8,975,791; 8,975,984; 8,976,997; 8,983,090; 8,983,097; 8,983,099; 8,988,911; 8,995,690; 9,001,622; 9,002,037; 9,002,043; 9,008,332; 9,008,336; 9,008,344; 9,031,266; 9,042,578; 9,056,760; 9,059,630; 9,061,318; 9,071,694; 9,078,069; 9,083,286; 9,083,288; 9,084,366; 9,085,012; 9,094,110; 9,094,111; 9,094,112; 9,094,764; 9,096,424; 9,107,008; 9,111,548; 9,113,260; 9,113,263; 9,124,220; 9,128,136; 9,131,319; 9,133,016; 9,139,418; 9,143,869; 9,143,870; 9,143,876; 9,148,712; 9,148,726; 9,148,729; 9,148,730; 9,154,886; 9,161,113; 9,167,354; 9,170,164; 9,179,221; 9,181,080; 9,181,086; 9,197,967; 9,204,224; 9,210,516; 9,212,046; 9,214,151; 9,215,532; 9,216,897; 9,219,963; 9,221,675; 9,226,079; 9,232,317; 9,236,837; 9,241,205; 9,242,275; 9,247,331; 9,250,142; 9,253,579; 9,258,651; 9,258,660; 9,264,815; 9,266,713; 9,270,238; 9,271,067; 9,277,327; 9,277,329; 9,281,744; 9,282,389; 9,282,415; 9,287,834; 9,288,583; 9,290,375; 9,294,847; 9,301,036; 9,301,055; 9,319,765; 9,319,772; 9,321,626; 9,327,967; 9,332,332; 9,332,342; 9,332,345; 9,337,722; 9,338,557; 9,338,559; 9,340,413; 9,342,179; 9,341,805; 9,341,807; 9,341,808; 9,344,809; 9,344,810; 9,350,305; 9,351,062; 9,351,074; 9,351,083; 9,357,294; 9,357,296; 9,363,610; 9,369,804; 9,369,810; 9,382,109; 9,392,359; 9,402,137; 9,403,670; 9,407,991; 9,408,555; 9,413,317; 9,414,175; 9,419,562; 9,420,365; 9,420,380; 9,420,391; 9,426,563; 9,428,379; 9,438,979; 9,439,002; 9,441,928; 9,445,173; 9,445,188; 9,451,359; 9,455,671; 9,456,283; 9,462,364; 9,462,395; 9,466,277; 9,467,774; 9,470,710; 9,470,910; 9,479,875; 9,488,541; 9,491,531; 9,497,552; 9,499,395; 9,502,019; 9,503,814; 9,503,820; 9,503,821; 9,503,823; 9,510,108; 9,510,121; 9,516,415; 9,516,420; 9,516,425; 9,516,428; 9,518,884; 9,520,505; 9,521,492; 9,525,925; 9,537,359; 9,538,273; 9,540,226; 9,544,672; 9,544,697; 9,548,632; 9,548,655; 9,554,212; 9,554,213; 9,559,647; 9,560,454; 9,571,931; 9,575,116; 9,578,424; 9,584,924; 9,584,941; 9,590,570; 9,591,408; 9,591,417; 9,596,995; 9,602,921; 9,602,924; 9,609,429; 9,609,432; 9,609,764; 9,611,135; 9,615,167; 9,628,886; 9,628,909; 9,628,920; 9,634,628; 9,635,460; 9,641,949; 9,648,433; 9,654,071; 9,658,179; 9,661,411; 9,661,423; 9,667,173; 9,668,047; 9,668,056; 9,668,062; 9,673,768; 9,673,785; 9,674,627; 9,676,615; 9,676,617; 9,681,229; 9,681,243; 9,685,254; 9,686,617; 9,686,618; 9,692,372; 9,693,135; 9,695,038; 9,706,294; 9,706,312; 9,706,618; 9,708,174; 9,712,923; 9,716,945; 9,722,563; 9,723,423; 9,729,014; 9,729,114; 9,729,988; 9,736,586; 9,736,594; 9,738,514; 9,743,167; 9,743,191; 9,743,196; 9,743,203; 9,756,159; 9,756,430; 9,762,188; 9,769,573; 9,774,969; 9,778,302; 9,781,518; 9,787,142; 9,790,087; 9,791,341; 9,793,764; 9,794,661; 9,794,711; 9,800,212; 9,800,980; 9,809,414; 9,809,418; 9,809,451; 9,812,906; 9,813,831; 9,815,685; 9,820,056; 9,825,492; 9,828,236; 9,828,237; 9,831,723; 9,832,573; 9,838,767; 9,843,862; 9,854,360; 9,854,367; 9,860,649; 9,866,938; 9,866,959; 9,866,972; 9,877,106; 9,878,901; 9,893,691; 9,894,137; 9,900,707; 9,906,869; 9,919,913; 9,921,114; 9,929,603; 9,930,451; 9,936,304; 9,941,817; 9,942,666; 9,944,514; 9,947,858; 9,949,023; 9,949,025; 9,949,037; 9,955,269; 9,955,273; 9,961,440;

9,961,451; 9,966,090; 9,967,677; 9,967,678; 9,967,679; 20010002865; 20010005032; 20010033670; 20010046306; 20020034312; 20020048220; 20020067663; 20020076069; 20020076076; 20020093038; 20020118850; 20020122561; 20020127760; 20020141606; 20020172387; 20030016839; 20030021425; 20030021432; 20030034536; 20030057068; 20030063762; 20030068055; 20030118203; 20030123683; 20030128847; 20030133588; 20030137021; 20030174850; 20030210799; 20040062405; 20040088851; 20040113153; 20040179705; 20040179706; 20040179709; 20040184633; 20040252858; 20050002536; 20050005421; 20050013455; 20050058298; 20050061770; 20050069164; 20050094832; 20050123155; 20050196010; 20050207596; 20050254671; 20050254679; 20050259835; 20050262947; 20060008097; 20060008098; 20060072770; 20060078137; 20060078148; 20060093170; 20060093171; 20060131163; 20060177083; 20060210106; 20060215858; 20060227984; 20060230835; 20060233400; 20060233401; 20060256981; 20060280319; 20060284516; 20060285707; 20070003082; 20070009111; 20070023851; 20070056377; 20070057603; 20070058825; 20070058826; 20070075956; 20070076904; 20070108541; 20070113664; 20070116305; 20070121967; 20070121972; 20070140514; 20070154040; 20070160248; 20070182002; 20070189559; 20070193354; 20070201709; 20070201710; 20070230721; 20070242844; 20070274541; 20070284682; 20070286438; 20070297631; 20080006093; 20080019543; 20080031476; 20080042223; 20080047128; 20080075193; 20080075306; 20080083961; 20080089536; 20080104825; 20080123242; 20080123876; 20080123878; 20080164888; 20080175418; 20080190203; 20080192962; 20080203560; 20080204379; 20080205668; 20080212807; 20080229840; 20080247573; 20080285784; 20090003629; 20090003630; 20090016550; 20090022341; 20090050989; 20090060230; 20090060232; 20090067659; 20090087002; 20090087009; 20090090190; 20090130783; 20090136064; 20090154729; 20090161886; 20090161890; 20090169035; 20090185700; 20090190782; 20090202083; 20090208037; 20090214049; 20090214061; 20090214062; 20090218642; 20090232336; 20090243058; 20090252351; 20090262958; 20090278217; 20090285414; 20090316935; 20100013501; 20100072561; 20100084721; 20100098284; 20100119088; 20100142742; 20100142744; 20100155864; 20100158279; 20100158280; 20100166227; 20100166228; 20100177846; 20100177922; 20100208919; 20100212432; 20100219839; 20100254561; 20100277229; 20100284553; 20100315272; 20100328836; 20100329487; 20110003614; 20110019845; 20110026739; 20110038493; 20110038497; 20110045616; 20110073967; 20110075865; 20110089504; 20110090009; 20110108838; 20110110536; 20110123043; 20110131794; 20110135122; 20110154905; 20110163615; 20110170714; 20110170735; 20110182150; 20110200212; 20110222713; 20110228954; 20110228957; 20110255228; 20110303994; 20120014543; 20120017693; 20120033832; 20120043974; 20120056282; 20120076322; 20120076329; 20120091541; 20120091545; 20120099753; 20120104898; 20120106769; 20120121106; 20120133005; 20120140956; 20120153771; 20120170777; 20120213390; 20120217171; 20120223770; 20120224722; 20120224726; 20120230522; 20120250897; 20120250910; 20120260500; 20120269363; 20120294464; 20120299130; 20120319174; 20120321111; 20120326249; 20120328132; 20130010990; 20130010996; 20130016859; 20130028450; 20130028459; 20130032936; 20130044899; 20130051582; 20130051583; 20130051586; 20130051587; 20130062710; 20130070940; 20130089222; 20130108074; 20130109990; 20130119492; 20130121523; 20130129117; 20130129119; 20130129133; 20130156234; 20130160554; 20130170673; 20130177180; 20130195291; 20130208915; 20130221453; 20130221457; 20130223023; 20130223654; 20130230183; 20130233078; 20130256816; 20130271307; 20130277776; 20130279738; 20130287231; 20130334627; 20140003609; 20140010384; 20140013581; 20140037113; 20140037121; 20140038335; 20140072150; 20140072152; 20140079277; 20140086433; 20140090884; 20140105428; 20140109680; 20140119573; 20140126762; 20140132294; 20140133685; 20140137668; 20140140538; 20140140560; 20140145276; 20140191344; 20140225205; 20140226846; 20140233784; 20140239352; 20140247954; 20140264652; 20140266260; 20140266263; 20140270204; 20140270271; 20140270273; 20140270312; 20140286509; 20140291781; 20140294218; 20140299949; 20140301571; 20140301572; 20140307885; 20140307909; 20140318395; 20140341402; 20140369530; 20140376749; 20150001647; 20150003643; 20150003646; 20150003660; 20150010174; 20150014797; 20150016635; 20150023529; 20150031160; 20150035091; 20150049886; 20150055799; 20150061458; 20150063608; 20150071466; 20150078587; 20150078589; 20150078592; 20150082917; 20150088008; 20150102435; 20150110333; 20150125003; 20150131820; 20150137834; 20150139453; 20150162883; 20150163594; 20150181352; 20150189443; 20150189446; 20150202656; 20150208176; 20150228265; 20150230010; 20150230027; 20150245123; 20150256913; 20150256914; 20150264465; 20150264498; 20150271586; 20150289046; 20150296303; 20150304777; 20150311870; 20150318829; 20150319538; 20150326978; 20150336790; 20150341720; 20150341721; 20150350760; 20150373446; 20150380636; 20150381078; 20150381782; 20150382091; 20160014521; 20160014528; 20160014529; 20160029110; 20160029126; 20160029129; 20160037257; 20160037263; 20160041211; 20160044396; 20160050475; 20160057532; 20160065152; 20160066099; 20160073212; 20160087606; 20160091378; 20160105748; 20160107884; 20160111954; 20160134967; 20160134973; 20160142829; 20160149542; 20160155532; 20160156319; 20160157017; 20160157022; 20160157025; 20160165355; 20160165356; 20160167946; 20160173967; 20160173992; 20160173993; 20160173994; 20160176704; 20160182989; 20160183008; 20160192084; 20160192086; 20160192511; 20160218688; 20160219374; 20160219378; 20160221822; 20160241958; 20160241965; 20160255441; 20160255442; 20160277844; 20160295333; 20160304337; 20160309264; 20160330550; 20160336013; 20160337751; 20160340173; 20160344360; 20160345097; 20160352294; 20160360304; 20160360322; 20160362292; 20160373864; 20160373874; 20160377569; 20170034634; 20170041708; 20170041716; 20170048634; 20170059433; 20170064449; 20170070816; 20170078798; 20170078801; 20170094136; 20170099549; 20170102276; 20170127189; 20170135592; 20170142519; 20170142525; 20170155365; 20170156002; 20170160337; 20170164105; 20170164119; 20170166437; 20170180853; 20170180864; 20170180900; 20170195788; 20170215006; 20170217765; 20170223450; 20170230750; 20170238108; 20170245035; 20170245059; 20170245061; 20170247248; 20170251302; 20170251303; 20170257093; 20170260044; 20170265005; 20170265009; 20170275152; 20170280237; 20170280263; 20170284825; 20170289678; 20170318385; 20170318393; 20170318394; 20170332178; 20170355594; 20170363493; 20170366898; 20170374469; 20180002159; 20180002160; 20180002161; 20180002167; 20180002168; 20180007474; 20180012588; 20180027338; 20180035206; 20180035228; 20180035229; 20180044167; 20180050900; 20180059708; 20180062588; 20180063644; 20180066980; 20180067005; 20180077499; 20180091900; 20180091903; 20180091906; 20180103325; 20180103326; and RE40860 each of which is expressly incorporated herein by reference in its entirety.

SUMMARY OF THE INVENTION

A dynamic capacitive sensor configuration is provided that is intended to impose minimal force and resistance to motion on the moving electrode. The aim is to enable the use of moving electrodes having arbitrary levels of compliance without suffering the adverse effects of large bias voltages such as pull-in instability. This configuration facilitates incorporation of highly compliant and thin electrode materials that present the least possible resistance to motion. This type of material is particularly useful for sensing sound. Measured results show that for the highly compliant acoustic sensor design examined here, a large bias voltage of 400 volts can be applied without influencing its motion. The electrical sensitivity to sound is found to be approximately 0.5 volts/pascal, two orders of magnitude greater than typical acoustic sensors.

One aspect of the present technology seeks to provide electrode designs for capacitive sensors that can minimize the effects of electrostatic stiffness on the microphone performance. If this can be accomplished, the moving electrode can be designed for maximum performance without being limited by constraints resulting from electrostatic forces.

Another aspect of the present technology seeks to provide electrode designs which are stable under all operating conditions. The electrode arrangement described herein achieves the goals of maintaining nearly constant potential energy and guaranteed stability.

A further aspect of the present technology provides a microphone design where a moving, sensing electrode has as little mechanical stiffness and mass as possible in order to properly respond to the minute pressure and air velocity fluctuations in a sound field.

The present approach follows from previous work on repulsive electrostatic actuators and sensors [14], [15], These designs used an electrode configuration that permits the moving and sensing electrodes to move apart as the bias voltage is increased, rather than move toward each other as in the ubiquitous parallel plate configuration. While repulsive electrostatic devices avoid pull-in instability, it remains challenging to achieve an electrode design that doesn't suffer from electro-static stiffening, which limits the achievable performance.

In the following, a lightweight, compliant capacitive electrode configuration is provided that is intended to respond readily to acoustic pressure.

The preferred embodiment is a microphone, wherein the moving element responds to changes in air pressure or air flow, and the position of the moving element is sensed. However, the sensor design is not limited to microphones, and is more generally useful as an accelerometer, MEMS gyroscope, displacement sensor, vibrometer, shock sensor, etc. Further, while the basic design provides a pair of fixed electrodes maintained at virtual ground by a negative feedback transimpedance amplifier, this is not a limit of the technology. For example, if the voltage potential of one of the electrode surfaces is maintained at a different voltage than the other, the electric field experienced by the charged moving element will then be asymmetric, and rather than a normal force that acts parallel to the elongated axis of the element, a displacement forced will exist. Thus, the charged element will act as an actuator, for example of a digital mirror device, with analog control over displacement, and feedback control to maintain position. This same implementation also produces an output responsive to displacement of the charged element from its deflected position. Because the electrostatic forces on an inclined element are interactive with the effective stiffness of the sensor moving element, the result is a sensor whose sensitivity is controllable, dependent on the imbalance of the electrodes and the voltage potential of the charged element.

In another embodiment, the moving element is intentionally oscillated by a time-varying electrostatic field developed by the electrodes. For example, a chemi-selective sensor is possible if the diaphragm or fiber is coated with a chemi-specific material. As a species of interest is absorbed on the moving element, its mass changes, and this in turn alters its response to the oscillating electric field.

In a further embodiment, the moving element is thermally responsive, and for example changes in mechanical properties or dimensions. This in turn will alter the frequency and/or linear or non-linear response of the charged element to a perturbation, such as an oscillating electric field.

The repositioning of the nominal state of the moving charged element may also affect other sensor properties. For example, the charged element may be situated in an inhomogeneous medium. Therefore, a movement of the charged element will result in a different environment of operation.

In some cases, more than three electrodes may interact with a single moving element. In the case of a diaphragm, this may induce or sense twist. In the case of a fiber or filament, of other structure suspended for movement along two axes, the larger number of electrodes may detect the various axes of movement.

In some cases, more than one moving element is provided. These may interact with the electrodes and each other in various ways. For example, these can sense movement or effects along different axes (multi-axis sensor), and detect or process spatial variations in an exciting condition.

In some cases, the sensor can operate in a liquid medium. In the case of an electrostatic sensor, this typically implies a high dielectric liquid, in some cases it is possible to employ ionic liquids or low dielectric liquids, including water. For example, if the device according to the present technology is immersed in water, and the voltage potentials maintained below the hydrolysis potential of water, the result is that there will be a leakage current from the charged element to the electrodes resulting from the natural pKa (pH) of water, $\sim 10^{-7}$. This amount of ionization does not disqualify the embodiment Other liquids have lower leakage. For example, mineral oil, hydrocarbons, silicones, hydrofluorocarbons, cryogenic liquefied gasses, etc.

In another embodiment, the presumption of no elongation of the charged element due to voltage potential with respect to the electrodes is not strictly valid. Therefore, the length of the element, and its distance from the electrodes, will vary with applied voltage. Typically, one does not wish the sensor to experience pull-in, but in specific sensor types, this is exactly the effect sought, since it locks the moving element in place.

Other modifications of the basic system are also possible. The following patents and published patent applications, each of which is expressly incorporated herein by reference in its entirety, disclose various implementation technologies, applications, and contexts in which the sensing technology according to the present technology may be implemented: See, U.S. Pat. Nos. 5,948,981; 6,104,492; 6,312,393; 6,360, 601; 6,480,645; 6,529,652; 6,544,193; 6,549,692; 6,591, 029; 6,625,399; 6,642,067; 6,745,627; 6,768,181; 6,784, 500; 6,798,796; 6,847,036; 7,041,063; 7,054,519; 7,091, 715; 7,100,446; 7,123,111; 7,157,712; 7,159,411; 7,208, 729; 7,212,487; 7,214,298; 7,260,980; 7,275,433; 7,282, 709; 7,284,430; 7,286,743; 7,294,503; 7,305,880; 7,308, 827; 7,351,376; 7,403,805; 7,421,898; 7,448,995; 7,469, 834; 7,481,111; 7,482,589; 7,485,100; 7,521,257; 7,622,081; 7,640,803; 7,652,752; 7,654,957; 7,714,278; 7,756,559; 7,791,027; 7,804,374; 7,809,417; 7,818,871; 7,822,510; 7,826,629; 7,827,864; 7,836,765; 7,939,021; 7,990,539; 8,022,779; 8,037,756; 8,051,698; 8,061,201; 8,129,176; 8,136,385; 8,164,588; 8,193,869; 8,220,318; 8,226,236; 8,252,539; 8,257,666; 8,263,336; 8,319,177; 8,322,213; 8,333,112; 8,339,014; 8,367,426; 8,391,517; 8,427,249; 8,427,657; 8,445,210; 8,451,068; 8,461,936; 8,482,300; 8,488,973; 8,556,428; 8,580,597; 8,586,918; 8,592,153; 8,592,154; 8,592,215; 8,627,511; 8,650,955; 8,658,367; 8,658,368; 8,669,771; 8,677,821; 8,686,802; 8,698,212; 8,742,469; 8,742,770; 8,746,039; 8,746,048; 8,748,947; 8,766,327; 8,774,885; 8,776,573; 8,787,117; 8,793,811; 8,800,369; 8,822,205; 8,822,906; 8,844,340; 8,875,576; 8,912,580; 8,914,089; 8,928,203; 8,953,414; 8,994,076; 8,994,954; 9,072,429; 9,146,109; 9,182,454; 9,200,887; 9,209,746; 9,217,641; 9,233,395; 9,238,250; 9,267,923; 9,270,281; 9,372,154; 9,389,079; 9,395,317; 9,411,000; 9,423,254; 9,448,069; 9,515,676; 9,535,137; 9,575,089; 9,611,139; 9,618,475; 9,618,533; 9,638,617; 9,645,166; 9,658,247; 9,668,035; 9,680,414; 9,702,992; 9,719,847; 9,740,003; 9,774,276; 9,778,282; 9,780,435; 9,800,019; 9,804,264; 9,810,775; 9,810,786; 9,812,838; 9,823,353; 9,857,468; 9,864,846; 9,869,754; 9,874,635; 9,905,992; 9,910,061; 9,910,062; 9,915,520; 9,927,393; 9,941,981; 9,958,414; 9,958,415; 9,958,545; 9,966,966; 20020049389; 20020068370; 20030033850; 20030071686; 20030139687; 20030142934; 20030179791; 20030196489; 20040039297; 20040039298; 20040060355; 20040237626; 20050009197; 20050020926; 20050068612; 20050104675; 20050147017; 20050167508; 20050199047; 20050274888; 20060032308; 20060032309; 20060033588; 20060158662; 20060158666; 20060196266; 20060233498; 20070016074; 20070024840; 20070034005; 20070115440; 20070119258; 20070142718; 20070194239; 20070287923; 20070289382; 20080007693; 20080190198; 20080190200; 20080191132; 20090036761; 20090064781; 20090174885; 20090229020; 20090289606; 20090301193; 20100000289; 20100024546; 20100024560; 20100078564; 20100137143; 20100145180; 20100155883; 20100194374; 20100213791; 20100253332; 20100267164; 20100301398; 20100308930; 20100313657; 20110006196; 20110028807; 20110040161; 20110138891; 20110167908; 20110170108; 20110194711; 20110194857; 20110227448; 20110248320; 20110275522; 20110281737; 20110281741; 20120006114; 20120009713; 20120013392; 20120032747; 20120068776; 20120086307; 20120112056; 20120168605; 20120172256; 20120187983; 20120192647; 20120194107; 20120227498; 20120261274; 20120265474; 20120304341; 20120325683; 20120326213; 20120326767; 20120327368; 20120329043; 20120329044; 20120329192; 20130001653; 20130004948; 20130004949; 20130009214; 20130017642; 20130025368; 20130064035; 20130071915; 20130119243; 20130139285; 20130180333; 20130201316; 20130210128; 20130210182; 20130217004; 20130231870; 20130247669; 20130271123; 20130302932; 20140000344; 20140028997; 20140062619; 20140093881; 20140104618; 20140113828; 20140144230; 20140147337; 20140159748; 20140159826; 20140176958; 20140185054; 20140194301; 20140194302; 20140194303; 20140224971; 20140230547; 20140235452; 20140235463; 20140251017; 20140265720; 20140287958; 20140301167; 20140324376; 20140331367; 20140360272; 20140372057; 20150029490; 20150043002; 20150065837; 20150085249; 20150091477; 20150143905; 20150166332; 20150168344; 20150171595; 20150177272; 20150293243; 20150304741; 20150308829; 20150377622; 20150377623; 20150377916; 20150377917; 20150377918; 20160003868; 20160006414; 20160033448; 20160035314; 20160054400; 20160061772; 20160062112; 20160069686; 20160072472; 20160079953; 20160087551; 20160139176; 20160187289; 20160223319; 20160298963; 20160329682; 20160341758; 20160341761; 20160341762; 20160341765; 20160344368; 20160374703; 20170003314; 20170003316; 20170025736; 20170059530; 20170067856; 20170068319; 20170074640; 20170078400; 20170126206; 20170146484; 20170153319; 20170155225; 20170164839; 20170176596; 20170184644; 20170185954; 20170194985; 20170199277; 20170201059; 20170205223; 20170219521; 20170219622; 20170258320; 20170271610; 20170272878; 20170272886; 20170276723; 20170277125; 20170277138; 20170277902; 20170278226; 20170278447; 20170278465; 20170278480; 20170278733; 20170278874; 20170278878; 20170278973; 20170280041; 20170280265; 20170281083; 20170285404; 20170285815; 20170285871; 20170286588; 20170287127; 20170287228; 20170287293; 20170287414; 20170287943; 20170288023; 20170288125; 20170288670; 20170289678; 20170289702; 20170290097; 20170293155; 20170293156; 20170293171; 20170294543; 20170295325; 20170295434; 20170297895; 20170297899; 20170299494; 20170299721; 20170300162; 20170301391; 20170301699; 20170308216; 20170309856; 20170310743; 20170316487; 20170316713; 20170317610; 20170318388; 20170318394; 20170319179; 20170320726; 20170323481; 20170323892; 20170323908; 20170325025; 20170325081; 20170328702; 20170328931; 20170329162; 20170329439; 20170331899; 20170332170; 20170334187; 20170336205; 20170336396; 20170336903; 20170337888; 20170338107; 20170338108; 20170338353; 20170338818; 20170340396; 20170343874; 20170344114; 20170347886; 20170348095; 20170352233; 20170352540; 20170352746; 20170354031; 20170355591; 20170355599; 20170356928; 20170357113; 20170357144; 20170357365; 20170359113; 20170359536; 20170359658; 20170359669; 20170362648; 20170363493; 20170363906; 20170364154; 20170365224; 20170365234; 20170365451; 20170365648; 20170366104; 20170366235; 20170366898; 20170367578; 20170370869; 20170372114; 20170372542; 20170372669; 20170373196; 20170374111; 20170374112; 20170374457; 20170374469; 20170374473; 20170374474; 20180000341; 20180002159; 20180002160; 20180002161; 20180002162; 20180002167; 20180002168; 20180004047; 20180004282; 20180004701; 20180004702; 20180005566; 20180005588; 20180005600; 20180005946; 20180006356; 20180007032; 20180007472; 20180007473; 20180007474; 20180009374; 20180011355; 20180011447; 20180011590; 20180012536; 20180012538; 20180012912; 20180013003; 20180014128; 20180017996; 20180018014; 20180018565; 20180018752; 20180018918; 20180018934; 20180019425; 20180020291; 20180021679; 20180024241; 20180024286; 20180024546; 20180024656; 20180024680; 20180025297; 20180025905; 20180025913; 20180025918; 20180026037; 20180026218; 20180027325; 20180027339; 20180029878; 20180031601; 20180031603; 20180031943; 20180032160; 20180032163; 20180033362; 20180033399; 20180033696; 20180033978; 20180034912; 20180035190; 20180035229; 20180038699; 20180039117; 20180039302; 20180039815; 20180040274; 20180040642; 20180040722; 20180041140; 20180042513; 20180044167; 20180046004; 20180046305; 20180047260; 20180047582; 20180047609; 20180048359; 20180048953; 20180050900; 20180052274; 20180052535; 20180052844; 20180052950; 20180052951; 20180053459; 20180055159; 20180055625; 20180058967; 20180059318; 20180059466; 20180059690; 20180061344; 20180061638; 20180061639; 20180063647; 20180067005; 20180067303; 20180067373; 20180067586; 20180069064; 20180069367; 20180070821;

20180072033; 20180074592; 20180075924; 20180076195; 20180076231; 20180076232; 20180076332; 20180076333; 20180076385; 20180076371; 20180076394; 20180076507; 20180076893; 20180077408; 20180077497; 20180077499; 20180079429; 20180081449; 20180081536; 20180082102; 20180082118; 20180083048; 20180083074; 20180084245; 20180084365; 20180085593; 20180085859; 20180086628; 20180087984; 20180088068; 20180088236; 20180088776; 20180090602; 20180090616; 20180090621; 20180091906; 20180092313; 20180093117; 20180095127; 20180095336; 20180095502; 20180095504; 20180096177; 20180096735; 20180096971; 20180096979; 20180097040; 20180097275; 20180097516; 20180097622; 20180097983; 20180098001; 20180098139; 20180098143; 20180099867; 20180099868; 20180100721; 20180101359; 20180101388; 20180101422; 20180101715; 20180101965; 20180102086; 20180102420; 20180102442; 20180102586; 20180102667; 20180102981; 20180103029; 20180103132; 20180103320; 20180103323; 20180103324; 20180103325; 20180104407; 20180105270; 20180106759; 20180107221; 20180107280; 20180107303; 20180107333; 20180107353; 20180107382; 20180107849; 20180107908; 20180108002; 20180108172; 20180108227; 20180108440; 20180108760; 20180109061; 20180109180; 20180109267; 20180109676; 20180109710; 20180109724; 20180109751; 20180109752; 20180109835; 20180109869; 20180109875; 20180109892; 20180109947; 20180110148; 20180110466; 20180111824; 20180112837; 20180112887; 20180113138; 20180113304; 20180113305; 20180113501; 20180113512; 20180113566; 20180113607; 20180114047; 20180114386; 20180114942; 20180115116; 20180115579; 20180115755; 20180115756; 20180115811; 20180115836; 20180115837; 20180115838; 20180115864; 20180115867; 20180116514; 20180116535; 20180116561; 20180116728; 20180116904; 20180117341; 20180117436; 20180118560; 20180120172; 20180120264; 20180120265; 20180120433; 20180120436; 20180120902; 20180120930; 20180120948; 20180121067; 20180121671; 20180121703; 20180121738; 20180121796; 20180122356; 20180122506; 20180122831; 20180123224; 20180123379; 20180123402; 20180123412; 20180124181; 20180124225; 20180124230; 20180124495; 20180124514; 20180124521; 20180124564; 20180124601; 20180124846; 20180125363; 20180125366; 20180125404; 20180125584; 20180126075; 20180126273; 20180127265; 20180127267; 20180128783; 20180128851; 20180128896; 20180129112; 20180129170; 20180129290; 20180129409; 20180129459; 20180129511; 20180129831; 20180129849; 20180130318; 20180130320; 20180130434; 20180130441; 20180130483; 20180130484; 20180130539; 20180130861; 20180130940; 20180130967; 20180131091; 20180131201; 20180131478; 20180131543; 20180131664; 20180131797; 20180131804; 20180131858; 20180131869; 20180131873; 20180132023; 20180132024; 20180132031; 20180132043; 20180132048; 20180132116; 20180132171; 20180132192; 20180132815; 20180133431; 20180133504; 20180133507; 20180133583; 20180133801; 20180134385; 20180134546; 20180136321; 20180136363; 20180136712; 20180136715; 20180136801; 20180136819; 20180136899; 20180137467; 20180137488; 20180137498; 20180138102; 20180138155; 20180138201; 20180138283; 20180138391; 20180138416; 20180138882; 20180139389; 20180139398; 20180139431; 20180139534; 20180139536; 20180139543; 20180139544; 20180139545; and 20180139862; each of which is expressly incorporated herein by reference in its entirety.

Microelectromechanical electrostatic actuators of various types are known. See: U.S. Pat. Nos. 6,128,122; 6,164,134; 6,201,629; 6,273,544; 6,309,048; 6,312,114; 6,353,492; 6,360,035; 6,378,989; 6,408,878; 6,424,466; 6,433,911; 6,439,689; 6,439,699; 6,443,558; 6,450,628; 6,474,781; 6,481,835; 6,491,362; 6,508,546; 6,517,197; 6,531,668; 6,538,799; 6,547,371; 6,554,110; 6,572,220; 6,575,566; 6,588,882; 6,592,207; 6,594,057; 6,598,964; 6,623,108; 6,634,735; 6,641,273; 6,644,793; 6,652,082; 6,666,548; 6,698,867; 6,733,116; 6,742,873; 6,746,108; 6,786,573; 6,793,328; 6,793,753; 6,798,729; 6,799,835; 6,805,435; 6,805,454; 6,808,253; 6,824,257; 6,827,428; 6,827,429; 6,832,828; 6,848,181; 6,851,796; 6,860,590; 6,863,378; 6,863,384; 6,866,369; 6,880,235; 6,880,922; 6,883,904; 6,883,906; 6,886,915; 6,890,059; 6,891,240; 6,899,137; 6,899,416; 6,902,255; 6,905,195; 6,905,620; 6,913,347; 6,916,087; 6,916,091; 6,918,655; 6,921,150; 6,922,118; 6,923,526; 6,929,030; 6,929,350; 6,938,989; 6,938,991; 6,938,994; 6,949,756; 6,955,428; 6,974,206; 6,988,785; 6,988,789; 6,988,790; 6,991,318; 6,994,124; 6,994,126; 6,994,130; 6,998,278; 7,001,007; 7,004,563; 7,004,577; 7,006,720; 7,014,296; 7,014,298; 7,014,785; 7,025,324; 7,028,474; 7,032,992; 7,032,997; 7,034,854; 7,040,338; 7,048,868; 7,052,114; 7,052,120; 7,064,883; 7,066,579; 7,070,256; 7,070,258; 7,073,881; 7,080,893; 7,080,895; 7,083,262; 7,086,717; 7,101,020; 7,111,924; 7,132,056; 7,134,740; 7,141,519; 7,141,616; 7,147,304; 7,147,307; 7,152,944; 7,152,961; 7,152,967; 7,155,823; 7,159,968; 7,160,475; 7,168,167; 7,169,314; 7,175,775; 7,178,899; 7,182,431; 7,182,437; 7,183,618; 7,184,193; 7,188,935; 7,188,938; 7,189,334; 7,198,346; 7,207,656; 7,210,764; 7,216,671; 7,216,956; 7,219,427; 7,219,982; 7,226,147; 7,227,687; 7,229,154; 7,233,101; 7,234,795; 7,249,830; 7,250,128; 7,258,421; 7,258,774; 7,264,333; 7,273,270; 7,278,713; 7,282,834; 7,284,836; 7,290,859; 7,293,855; 7,322,680; 7,328,975; 7,331,101; 7,331,659; 7,334,874; 7,338,147; 7,347,535; 7,347,697; 7,350,901; 7,350,906; 7,354,787; 7,359,106; 7,360,871; 7,370,942; 7,375,872; 7,380,339; 7,380,906; 7,380,913; 7,384,131; 7,387,365; 7,387,368; 7,393,083; 7,396,108; 7,399,068; 7,401,884; 7,401,895; 7,401,900; 7,401,906; 7,410,243; 7,410,250; 7,413,293; 7,416,275; 7,419,244; 7,419,247; 7,419,250; 7,431,427; 7,434,919; 7,441,867; 7,442,317; 7,417,547; 7,418,728; 7,457,021; 7,467,850; 7,468,997; 7,472,984; 7,475,965; 7,494,555; 7,506,966; 7,517,055; 7,524,029; 7,524,032; 7,527,357; 7,528,691; 7,537,314; 7,537,325; 7,549,726; 7,553,001; 7,556,351; 7,556,352; 7,556,353; 7,556,358; 7,556,361; 7,562,962; 7,562,963; 7,569,926; 7,578,569; 7,578,582; 7,585,047; 7,585,066; 7,588,327; 7,591,539; 7,591,541; 7,597,435; 7,601,270; 7,611,220; 7,615,744; 7,616,367; 7,625,061; 7,625,067; 7,625,068; 7,628,468; 7,637,582; 7,654,628; 7,654,642; 7,658,473; 7,661,793; 7,661,796; 7,661,797; 7,669,950; 7,669,951; 7,669,964; 7,669,971; 7,673,976; 7,677,685; 7,677,686; 7,699,410; 7,703,890; 7,708,372; 7,708,381; 7,717,542; 7,731,334; 7,731,336; 7,731,341; 7,735,963; 7,735,968; 7,740,337; 7,746,538; 7,748,827; 7,753,469; 7,753,487; 7,753,491; 7,753,504; 7,754,010; 7,758,160; 7,758,162; 7,758,166; 7,758,171; 7,762,638; 7,766,055; 7,771,025; 7,771,032; 7,775,634; 7,780,264; 7,784,905; 7,784,910; 7,794,050; 7,815,290; 7,815,291; 7,835,055; 7,864,006; 7,874,644; 7,891,773; 7,893,798; 7,896,468; 7,896,473; 7,901,023; 7,905,574; 7,905,588; 7,914,115; 7,918,540; 7,918,541; 7,931,351; 7,934,797; 7,934,799; 7,934,808; 7,938,524; 7,939,994; 7,946,671; 7,950,771; 7,950,773; 7,950,774; 7,960,208; 7,967,422; 7,971,967; 7,971,972; 7,971,975; 7,973,278; 7,976,131; 7,987,784; 7,992,968; 8,002,933; 8,011,757; 8,021,614; 8,025,355; 8,047,633; 8,057,014; 8,061,795; 8,066,355; 8,079,669; 8,079,688; 8,087,740; 8,087,757; 8,104,497; 8,104,515; 8,104,878; 8,110,813; 8,124,218; 8,167,406; 8,220,487; 8,226,199;

8,226,217; 8,231,207; 8,251,495; 8,264,307; 8,282,181; 8,282,202; 8,288,211; 8,323,982; 8,336,990; 8,376,513; 8,382,258; 8,382,259; 8,393,714; 8,398,210; 8,398,221; 8,398,222; 8,419,176; 8,440,093; 8,444,260; 8,455,570; 8,459,787; 8,465,129; 8,465,142; 8,468,939; 8,469,496; 8,480,224; 8,485,654; 8,506,039; 8,517,516; 8,523,327; 8,523,328; 8,529,021; 8,530,854; 8,534,818; 8,550,119; 8,562,120; 8,585,189; 8,585,971; 8,602,531; 8,602,535; 8,604,111; 8,629,393; 8,632,162; 8,633,955; 8,641,175; 8,646,882; 8,646,883; 8,651,632; 8,651,633; 8,652,409; 8,656,958; 8,657,419; 8,659,631; 8,668,312; 8,668,313; 8,684,483; 8,695,640; 8,696,094; 8,714,676; 8,717,395; 8,736,081; 8,770,722; 8,783,804; 8,784,549; 8,791,971; 8,802,568; 8,806,751; 8,845,914; 8,846,183; 8,847,148; 8,916,395; 8,929,584; 8,932,677; 8,936,353; 8,936,354; 8,939,551; 8,991,986; 8,992,858; 9,010,909; 9,017,537; 9,103,761; 9,151,949; 9,162,878; 9,174,222; 9,174,438; 9,234,797; 9,508,823; 9,653,254; 9,696,375; 9,799,488; 9,897,530; 9,953,787; 9,956,562; 20010021058; 20010022682; 20010029983; 20010033796; 20010045525; 20010054778; 20020024569; 20020029814; 20020033863; 20020036674; 20020097300; 20020101474; 20020122102; 20020127736; 20020130931; 20020144738; 20020171471; 20030016275; 20030019833; 20030020784; 20030020786; 20030025758; 20030025761; 20030042117; 20030063166; 20030081082; 20030103106; 20030132824; 20030132985; 20030132995; 20030137567; 20030142175; 20030146957; 20030174190; 20030202055; 20030202735; 20030202738; 20040001263; 20040031150; 20040032440; 20040051759; 20040056923; 20040056924; 20040075715; 20040075718; 20040079724; 20040080556; 20040085159; 20040092121; 20040094506; 20040095434; 20040095411; 20040099636; 20040100529; 20040113983; 20040118808; 20040119784; 20040160495; 20040169697; 20040169701; 20040207687; 20040207689; 20040207690; 20040207691; 20040218016; 20040218022; 20040246305; 20040246308; 20040246311; 20040257400; 20040263551; 20040263577; 20050016951; 20050018015; 20050018016; 20050018017; 20050024134; 20050024135; 20050024136; 20050024137; 20050024113; 20050030338; 20050030339; 20050030342; 20050030343; 20050035983; 20050036002; 20050037532; 20050039453; 20050041052; 20050041055; 20050041063; 20050046663; 20050046673; 20050052497; 20050052514; 20050057628; 20050083377; 20050093933; 20050093934; 20050097742; 20050099465; 20050099466; 20050104922; 20050109730; 20050110832; 20050112882; 20050116990; 20050128247; 20050128249; 20050131490; 20050134648; 20050134649; 20050140726; 20050140728; 20050144781; 20050141782; 20050146559; 20050146562; 20050146563; 20050146566; 20050157042; 20050157081; 20050157082; 20050166980; 20050167769; 20050168532; 20050168533; 20050174375; 20050174394; 20050185021; 20050189316; 20050189317; 20050200659; 20050206684; 20050215089; 20050225601; 20050225602; 20050225604; 20050226742; 20050231560; 20050237743; 20050242058; 20050243134; 20050248620; 20050253897; 20050264607; 20050264612; 20050269901; 20050270335; 20050270338; 20050275690; 20050275691; 20050279090; 20050285901; 20060007266; 20060007514; 20060017772; 20060018005; 20060033785; 20060034006; 20060054228; 20060061628; 20060072187; 20060077235; 20060092220; 20060093753; 20060098047; 20060109310; 20060109313; 20060119661; 20060152551; 20060197810; 20060202933; 20060227156; 20060227167; 20060227168; 20060238571; 20060250448; 20060268048; 20060268064; 20060274119; 20060274121; 20070002009; 20070008386; 20070008390; 20070030315; 20070030321; 20070046759; 20070048887; 20070048898; 20070052766; 20070059494; 20070064034; 20070064037; 20070064066; 20070064067; 20070070133; 20070070161; 20070080695; 20070081031; 20070109345; 20070115316; 20070120891; 20070146432; 20070153058; 20070176967; 20070176968; 20070176971; 20070182784; 20070182785; 20070183643; 20070188554; 20070188556; 20070188557; 20070188570; 20070211102; 20070211112; 20070222807; 20070222819; 20070222821; 20070222826; 20070236313; 20070257966; 20070257971; 20070268327; 20070268343; 20070291070; 20070291091; 20070296765; 20080012913; 20080012923; 20080024556; 20080030541; 20080036821; 20080050283; 20080079760; 20080094132; 20080111853; 20080111863; 20080117258; 20080129800; 20080129809; 20080141884; 20080165226; 20080173365; 20080180778; 20080192096; 20080204514; 20080204518; 20080204519; 20080210319; 20080210320; 20080210321; 20080210322; 20080211876; 20080211877; 20080211879; 20080220216; 20080220535; 20080231669; 20080236669; 20080246817; 20080252691; 20080266341; 20080266356; 20080266361; 20080273059; 20080277005; 20080277007; 20080277258; 20080278268; 20080278559; 20080289710; 20080303866; 20080303871; 20080309693; 20080309694; 20080309695; 20080309696; 20080309697; 20080309699; 20080309709; 20080309721; 20080309722; 20080316240; 20080316241; 20080316242; 20080316262; 20080316271; 20080316276; 20080318349; 20090002470; 20090027418; 20090027459; 20090085975; 20090091601; 20090091603; 20090121156; 20090122116; 20090124029; 20090128604; 20090151422; 20090153619; 20090153936; 20090160910; 20090174014; 20090185007; 20090189953; 20090195598; 20090195614; 20090201339; 20090213186; 20090213191; 20090237433; 20090237450; 20090237456; 20090237461; 20090244193; 20090241194; 20090256890; 20090261244; 20090278897; 20090289979; 20090295861; 20090303290; 20090303297; 20090303303; 20090309909; 20090322812; 20100003772; 20100026765; 20100039478; 20100050415; 20100053268; 20100053274; 20100053275; 20100053276; 20100073441; 20100110129; 20100110130; 20100118071; 20100149268; 20100149274; 20100175767; 20100187105; 20100200782; 20100201750; 20100208000; 20100231645; 20100242765; 20100253745; 20100265298; 20100276588; 20100276606; 20100277549; 20100295887; 20100302292; 20110024923; 20110025350; 20110025780; 20110037796; 20110037797; 20110037809; 20110090288; 20110109675; 20110109677; 20110109705; 20110155548; 20110164081; 20110204018; 20110205306; 20110205319; 20110258851; 20110261123; 20110261124; 20110261125; 20110261126; 20110271857; 20120026251; 20120026252; 20120026253; 20120026259; 20120026260; 20120026261; 20120038695; 20120045615; 20120056952; 20120091374; 20120105535; 20120105548; 20120105549; 20120105550; 20120105553; 20120268525; 20120268527; 20120268528; 20120268529; 20120268530; 20120268531; 20120299998; 20120299999; 20120300000; 20120300001; 20120307211; 20120319303; 20120328834; 20130059396; 20130068131; 20130070031; 20130072614; 20130199730; 20130235101; 20130235102; 20130249982; 20130249983; 20130249984; 20130249985; 20130252234; 20130257991; 20130257992; 20130257994; 20130257996; 20130257997; 20130258002; 20130278677; 20130278689; 20130280831; 20130286108; 20130286109; 20130302785; 20130328976; 20130328977; 20130330475; 20130342597; 20140009523; 20140015878; 20140015879; 20140015880; 20140015893; 20140015901; 20140021343; 20140084390; 20140126762; 20140212917; 20140220621; 20140262972; 20140273408; 20140308770; 20140322489; 20140363678; 20150043002; 20150183633; 20150213996; 20150266726; 20150276089; 20150294838; 20160091479; 20160103174; 20160172197; 20160173001;

20160202286; 20160243827; 20160268084; 20160324564; 20170001195; 20170146364; 20170303383; 20180075994; and 20180079640; each of which is expressly incorporated herein by reference in its entirety.

It is an object to provide a sensor, comprising at least two electrodes within an electrical field; and an elongated displaceable element configured to be charged, disposed proximate to the at least two electrodes within the electrical field, and having an aspect ratio of at least IO, the element being configured to interact with each of the at least two electrodes to produce a composite force within the element that is at least 95% tensile along an elongated axis, such that the element when displaced by a condition, induces a charge redistribution on the at least two electrodes corresponding to a magnitude of the condition substantially without altering a responsivity of the charge redistribution to the condition or pull-in instability.

It is also an object to provide a sensor, comprising: an element configured to be charged, disposed proximate to at least two electrodes within an electrical field, the element interacting with each of the at least two electrodes to produce a composite force within the element that is at least 95% tensile, such that the element when displaced from the nominal position by a condition, induces a charge redistribution on the at least two electrodes corresponding to a magnitude of the condition. The at least two electrically isolated and separated electrodes may comprise a pair of fixed conductors, separated by a linear gap, each of the pair of fixed conductors may be maintained at a respective electric potential, and sensing an electrical field in a space above the pair of fixed conductors based on charge redistribution. The axis preferably has a vector component directed across the linear gap, wherein the net force on the charged element is insensitive to a state of displacement of the charged element in response to the sensed condition.

It is also an object to provide a method for sensing a capacitive difference, comprising: providing a charged element in an electric field, having a movement along an axis in response to a sensed condition; proving at least two electrically isolated and separated conductors, each interacting with the electric field, and having a respective electrode for electrically sensing a perturbation of the electric field, the at least two electrically isolated and separated conductors producing a net force on the charged element normal to the axis; and sensing a perturbation of the electric field caused by movement of the charged element along the axis in response to the condition, wherein over a range of the movement of the charged element, a position of the charged element in the electric field does not substantially alter a responsivity of the displaceable element to the condition or cause pull-in instability.

The at least two electrically isolated and separated conductors may comprise a pair of fixed conductors, separated by a linear gap, each of the pair of fixed conductors being maintained at a respective electric potential, to sense an electrical field in a space above the pair of fixed conductors based on charge redistribution, and the axis may have a vector component directed across the gap, wherein the net force on the charged element is insensitive to a state of displacement of the charged element in response to the sensed condition.

The charged element may be responsive to acoustic vibrations, and the sensed perturbation quantitatively represents the acoustic vibrations.

The charged element may have an elongated axis, being suspended from one end, having a restoring force which tends to return the charged element to a nominal position, and in the nominal position a free end of the charged element being proximate to the at least two electrically isolated and separated electrodes. A vector of the net force between the charged element and the at least two electrically isolated and separated electrodes may deviate from the elongated axis by less than 5 degrees, e.g., 4 degrees, 3 degrees, 2 degrees, 1 degree, etc.

It is a further object to provide a capacitive sensor, comprising at least two conductors, isolated from each other by at least one spatial gap, each respective conductor interacting with an electrostatic field occupying a region proximate to the at least two conductors and the at least one spatial gap, being electrically responsive to a perturbation of the electrostatic field; and a displaceable element configured to move along an axis of displacement having a directional component crossing the spatial gap selectively responsive to a sensed condition, and perturbing the electrostatic field corresponding to the movement, wherein over a range of the movement of the displaceable element, the electrostatic field does not substantially alter a responsivity of the displaceable element to the sensed condition or cause pull-in instability.

The at least two conductors may co arise a pair of fixed conductors, separated by a linear spatial gap, each of the pair of fixed conductors being maintained at a respective electric potential, to generate the electrostatic field in a space above the pair of fixed conductors having a major field vector component directed across the linear spatial gap dependent on a difference between the respective electric potentials of the pair of fixed conductors, and the displaceable element may comprise a charged element configured with the axis of displacement having a vector component directed across the linear spatial gap, such that a force imposed on the displaceable element due to the electrostatic field is insensitive to a state of displacement of the displaceable element in response to the sensed condition.

The displaceable element is unsupported on at least one edge.

The displaceable element comprises a metallic or metallized polymer diaphragm having a thickness of less than about 10 μm; a fiber; a mesh; at least one of a carbon nanotube and a graphene sheet; and/or an electret, a thin metal sheet, polysilicon or any doped semiconductor.

The displaceable element may be configured to displace along two different sensing axes, and the at least two conductors comprises at least three conductors.

The displaceable element may comprise a diaphragm, and the at least two fixed conductors be together configured such that a change in an electric potential difference between the diaphragm and either of the at least two fixed conductors does not substantially displace or alter an effective stiffness of the diaphragm with respect to the axis of displacement.

The capacitive sensor may further comprise a respective transimpedance amplifier configured to produce an output signal from each respective conductor.

The displaceable element may comprise a micromachined silicon diaphragm having opposite sides which are sufficiently isolated to maintain a pressure difference across the diaphragm, further comprising a housing configured to selectively define at least one path for a fluid medium from a respective environmental port to a respective side of the micromachined silicon diaphragm, to selectively alter the pressure on the respective side of the micromachined silicon diaphragm.

The deflectable element may have a movement dynamically responsive to changes in inertial state. The deflectable element may have a movement dynamically responsive to aerodynamic influences. The deflectable element may have a movement dynamically responsive to a chemical or biochemical process.

A potential between the displaceable element and at least one of the conductors may be at least 1 V, e.g., 3V, 5V, 10V, 15V, 20V, 30V, 50V, 100V, 200V, 300V, 400V, or 500V. The electric field between the displaceable element and at least one of the conductors is at least 0.1 V/mm, e.g., 0.5V/mm, 1 V/mm, 2V/mm, 3V/mm, 4V/mm, 5V/mm, 10V/mm, 25V/mm, 50V/mm, 75V/mm, 100V/mm, 200V/mm, 300V/mm, 400V/mm, 500V/mm, 750V/mm, 1000V/mm, 1500V/mm, 2000V/mm, 2500V/mm, etc. In some cases, the potential may be established at the dielectric strength of the isolating medium. For example, air has a dielectric strength of about 3000V/mm.

It is therefore an object to provide a capacitive sensor, comprising a pair of coplanar surfaces, separated by a gap; a diaphragm, disposed in a plane perpendicular to the coplanar surfaces, and configured to move along an axis perpendicular to the gap and parallel to the coplanar surfaces, the diaphragm and the pair of coplanar surfaces being together configured such that a voltage difference between the conductive diaphragm and either of the pair of coplanar conductive surfaces does not substantially deflect or alter an effective stiffness of the diaphragm; and a set of electrodes, in electrical communication with each of the pair of coplanar surfaces and the diaphragm, configured to determine a differential charge induced between the pair of coplanar surfaces by a potential of the diaphragm.

It is also an object to provide a method of sensing a vibration or sound, comprising providing a pair of coplanar surfaces, separated by a gap, and a diaphragm, disposed in a plane perpendicular to the coplanar surfaces, configured to flex along an axis perpendicular to the gap and parallel to the coplanar surfaces; inducing a voltage potential on the diaphragm with respect to the pair of coplanar surfaces; and sensing a change in induced charge on the pair of coplanar surfaces resulting from flexion of the diaphragm along the perpendicular axis, wherein the diaphragm and the pair of coplanar surfaces are together configured such that the voltage potential does not substantially deflect or alter an effective stiffness of the diaphragm.

The sensor may further comprise a transimpedance amplifier configured to amplify the differential charge. A potential at each of the coplanar surfaces may be maintained at ground potential by a respective transimpedance amplifier while a change in charge is induced on the respective coplanar surfaces by a movement of the diaphragm.

The diaphragm may comprise a metallized polymer membrane or micromachined silicon, for example, having a thickness of, e.g., <10 µm, <7.5 µm, <5 µm, <3 µm, <2 µm, <1 µm, for example.

The diaphragm is preferably configured to oscillate, e.g., in response to acoustic vibrations, e.g., sounds produced by human speech, or electric field variations, though it may act as an electrometer, accelerometer, shock sensor, flow sensor, or other type of electrical or mechanical sensor.

The sensor may further comprise a housing configured to selectively direct acoustic vibrations from an environmental port to one side of the diaphragm, or from each of a pair of environmental ports to respective sides of the diaphragm, or provide a defined path for a fluid medium from an environmental port to one side of the deflectable element.

The diaphragm may have a movement which approximates an air movement within a sound field.

The diaphragm has a lowest resonant frequency of movement, and may be configured to have a velocity of movement in response to a movement of air within a sound field having a frequency above the lowest resonant frequency approximately in phase with an acoustic velocity of the acoustic waves. The lowest resonant frequency may be <250 Hz, <200 Hz, <150 Hz, <100 Hz, <80 Hz, <50 Hz, <35 Hz, <24 Hz, <20 Hz, <15 Hz, or <10 Hz, for example.

A potential between the diaphragm and at least one of the coplanar surfaces may be >400 V, >200 V, >100V, >50V, >24V, >12V, >10V, >6V, or >5V, for example.

It is also an object to provide a capacitive sensor, comprising at least two fixed conductive surfaces, separated by at least one non-conductive gap, each having an associated electrostatic field, and together causing a composite force vector; and a deflectable element configured to move along an axis perpendicular to the composite force vector, having an amplitude of movement corresponding to a sensed condition, the element being configured to have an electrostatic interaction with the associated electrostatic field of each of the pair of fixed conductive surfaces, wherein over a range of the movement of the element along the axis, the composite force vector does not substantially alter a deflection of the deflectable element. The capacitive sensor may be a microphone, and the sensed condition comprise acoustic waves.

The deflectable element may comprise a diaphragm, e.g., a cantilever supported diaphragm, a diaphragm or beam supported on opposed edges (and free to flex between the supports), a perforated diaphragm, a solid diaphragm, or a metallized polymer diaphragm. The deflectable element may comprise a fiber, a fiber mesh, a fiber mat, or a metallized electrospun fiber. The deflectable element may have a solid edge, e.g., an intrinsic part of a mechanical diaphragm, or a fiber mesh having a solid border element. The deflectable element may comprise a carbon nanotube, graphene, silicon, micromachined silicon or other material, and/or silicon nitride. The deflectable element may be metallized, a doped semiconductor, or an electret. The sensor may be manufactured using an additive manufacturing process, a subtractive manufacturing process, or aspects of each. For example, semiconductor fabrication typically employs both deposition and etching. The manufacturing process may be customized to produce a single sensor, or an array of sensors.

A moving electrode may be provided that represents a beam or plate supported on opposite ends with two free edges. These two edges may be adjacent to pairs of fixed electrodes, similar to those shown in FIG. 2. This configuration looks a lot like a ribbon microphone, allows capacitive transduction rather than electrodynamic, as in all ribbon microphones. Using capacitive transduction enables miniaturization, which is extremely difficult with electrodynamic transduction.

The deflectable element may be configured to oscillate in response to acoustic vibrations.

The deflectable element may be configured to deflect in response to vibrations or acoustic waves along a single axis, along two axes, or have a greater number of degrees of freedom (e.g., rotational, internal vibrations and harmonics, flexion, etc.).

The at least two fixed conductive surfaces may be coplanar or reside in different planes. The at least two fixed conductive surfaces may comprise at least three conductive surfaces.

The deflectable element may comprise a diaphragm, and the at least two fixed conductive surfaces be together configured such that a voltage difference between the diaphragm and either of the at least two fixed conductive surfaces does not substantially deflect or alter an effective stiffness of the diaphragm.

The capacitive sensor may further comprise a set of electrodes, in electrical communication with each of the at least two pair of conductive surfaces, configured to determine a charge redistribution induced between the movement of the deflectable element.

A respective transimpedance amplifier may be provided, configured to produce an output signal from each respective conductive surface.

The capacitive sensor may have a housing configured to selectively direct acoustic vibrations from an environmental port to one side of the deflectable element, or to selectively direct acoustic vibrations from each of a pair of environmental ports to respective sides of the deflectable element. The housing may be configured to selectively provide a set of defined paths from a fluid medium from each of a pair of environmental ports to respective sides of the deflectable element.

The deflectable element may have a movement which approximates an air movement within a sound field surrounding the deflectable element. The deflectable element may have a movement which corresponds to an inertial state of the deflectable element, i.e., acceleration, angular rotation, etc.

The deflectable element may comprise a diaphragm having a thickness of less than about 10 μm, 7.5 μm, 5 μm, 3 μm, or 1 μm. The deflectable element may comprise a fiber having a diameter of about 1 μm, less than 800 nm, 750 nm, 700 nm, 600 nm, 550 nm, 500 nm, 400 nm, 300 nm, 250 nm, 225 nm, 200 nm, 175 nm. 150 nm, 125 nm, 100 nm, 80 nm, 75 nm, 60 nm or 50 nm. The diaphragm or fiber may be metallized, for example with a coating of gold of <100 nm, 90 nm, 80 nm, 75 nm, 70 nm, 60 nm, 50 nm, 40 nm, 30 nm, 25 nm, 20 nm, 15 nm, or 10 nm.

The deflectable element has a lowest resonant frequency of movement, e.g., less than 250 Hz, 200 Hz, 175 Hz, 150 Hz, 125 Hz, 100 Hz, 80 Hz, 75 Hz, 70 Hz, 65 Hz, 60 Hz, 55 Hz, 50 Hz, 45 Hz, 40 Hz, 35 Hz, 30 Hz, 25 Hz, 20 Hz, 15 Hz, or 10 Hz. The deflectable element may be configured to move in response to changes in air pressure corresponding to acoustic waves within a sound field having a frequency above its lowest resonant frequency in phase with an acoustic velocity of the acoustic waves.

A potential between the deflectable element and at least one of the conductive surfaces may be at least 400 V, 300 V, 240 V, 200 V, 150 V, 120 V, 100 V, 75 V, 48 V, 24 V, 12 V, 10 V, 6 V, 5 V, 3.3 V, 3 V, 2.5 V, 2 V, 1.5 V, 1 V, or 0.5 V.

The deflectable element may have a lowest resonant frequency of movement less than 250 Hz, and is configured to have a velocity which has a phase lag of less than 90 degrees of a movement of air in response to acoustic waves within a sound field having a frequency above the lowest resonant frequency. The deflectable element may have a lowest resonant frequency of movement less than 150 Hz, and is configured to have a velocity which has a phase lag of less than 90 degrees of a movement of air in response to acoustic waves within a sound field having a frequency above the lowest resonant frequency. The deflectable element may have a lowest resonant frequency of movement less than 80 Hz, and is configured to have a velocity which has a phase lag of less than 90 degrees of a movement of air in response to acoustic waves within a sound field having a frequency above the lowest resonant frequency. The deflectable element may have a lowest resonant frequency of movement less than 50 Hz, and is configured to have a velocity which has a phase lag of less than 90 degrees of a movement of air in response to acoustic waves within a sound field having a frequency above the lowest resonant frequency. The deflectable element may have a lowest resonant frequency of movement less than 25 Hz, and is configured to have a velocity which has a phase lag of less than 90 degrees of a movement of air in response to acoustic waves within a sound field having a frequency above the lowest resonant frequency. The deflectable element may have a lowest resonant frequency, and move with a phase lag of less than 90 degrees in response to pressure changes in air having a frequency above the lowest resonant frequency.

A potential at each of the conductive surfaces may be maintained at ground potential by a respective transimpedance amplifier while a change in charge is induced on the respective conductive surfaces by a movement of the deflectable element.

It is also an object to provide a method of sensing a vibration, comprising: providing at least two separated conductive surfaces, and a deflectable element, having an axis of deflection perpendicular to a force on the deflectable element generated by the at least two separated conductive surfaces; inducing a voltage potential on the deflectable element with respect to the at least two conductive surfaces; and sensing a change in induced charge on the at least two conductive surfaces resulting from deflection of the deflectable element along the axis of deflection, wherein the force on the deflectable element generated by the at least two separated conductive surfaces does not substantially alter a deflection of the deflectable element. The change in induced charge may be sensed by at least one transimpedance amplifier. The deflectable element may have a movement in response to acoustic waves in air at standard temperature and pressure, and 20% relative humidity, which approximates an air movement within a sound field surrounding the deflectable element.

The deflectable element may have a lowest resonant frequency, and moves with a phase lag of less than 90 degrees in response to an acoustic wave in air having a frequency above the lowest resonant frequency. The lowest resonant frequency is, for example, 250 Hz. The movement of the deflectable element may correspond to an external force, viscous drag, pressure differential, etc. The movement of the deflectable element may correspond to an external force, e.g., a change in stress or strain, expansion, contraction, swelling, heating, cooling, etc. of the deflectable element.

A potential at each of the conductive surfaces may be maintained at ground potential by a respective transimpedance amplifier while the deflection causes a movement of the deflectable element to induce the change in charge on the respective conductive surfaces.

It is a further object to provide a capacitive sensing method, comprising: providing a sensor comprising at least two electrically isolated electrodes having an associated electrical field, and a charged element within the associated electrical field, having an axis of movement in response to a sensed condition which is orthogonal to an electrostatic force between the charged element and the at least two electrically isolated electrodes, and being mechanically unresponsive to a magnitude of the electrostatic force between the charged element and the at least two electrically isolated electrodes; inducing a movement of the charged element with respect to the at least two electrically isolated electrodes along the axis of movement; sensing an induced charge on each of the at least two electrically isolated electrodes as a result of the movement of the charged element; and generating a signal corresponding to the movement. The sensed condition may be sound.

The charged element may be suspended from one end and have an elongated axis and has a restoring force which tends to return the charged element to a nominal position, and in the nominal position a free end of the charged element is proximate to the at least two electrically isolated electrodes, and the electrostatic force between the charged element and the at least two electrically isolated electrodes is parallel to the elongated axis.

The charged element may have an elongated axis and be supported by an elastic cantilever, the elongated axis being parallel to the electrostatic force and directed at a gap between the at least two electrically isolated electrodes.

Each of the at least two electrically isolated electrodes may exert a force component on the charged element along the axis of movement, wherein a superposition of the force components exerted on the charged element along the axis of movement cancels a net force along the axis of movement.

The charged element may comprise a filament, having a diameter less than about 1 micron. The charged element may comprise a filament or conductive filament having a diameter less than about 550 nm. The movement in air may be in response to an acoustic vibration at frequencies above 250 Hz dominated by viscous drag.

The charged element may comprise a conductive perforated plate having a cantilever support which supports movement of the conductive perforated plate only along the axis of movement. The charged element may have a movement in air in response to an acoustic vibration at frequencies above 100 Hz dominated by viscous drag.

The charged element may have an elongated profile and an elongated axis, the elongated axis having an angle with respect to a vector of the electrostatic force of less than about 3 degrees, less than 2 degrees, less than 1 degree, or less than 0.5 degree.

The charged element may have an elongated profile and an elongated axis perpendicular to the axis of movement, and a force component of the electrostatic force along the axis of movement is at least −18 dB, −20 dB, −24 dB, −28 dB, −30 dB, −33 dB. −36 dB, or −40 dB lower than a force component of the electrostatic force along elongated axis.

The charged element may have an elongated axis parallel to the electrostatic force, and have a tensile stiffness, and wherein the charged element is not subject to pull-in by the electrostatic force before the electrostatic force exceeds the tensile stiffness.

The at least two electrically isolated electrodes may be symmetric with respect to the charged element, and the signal be generated by providing a transimpedance amplifier for each respective electrode, and a movement of the charged element determined based on voltage differences in outputs of the respective transimpedance amplifiers.

It is another object to provide a directional microphone or sensor, comprising at least two electrically isolated electrodes having an associated electrical field; a charged element within the associated electrical field, having an axis of movement about a fixed position, configured to move along the axis of movement; e.g., in response to sound, which is orthogonal to an electrostatic force between the charged element and the at least two electrically isolated electrodes; and an electronic circuit configured to produce an output dependent on the movement, e.g., in response to sound, and to produce a deflection force on the charged element, to thereby alter the axis of movement of the charged element. An input may receive a signal defining a desired axis of movement of the charged element.

It is also an object to provide a method of determining a propagation vector of a wave, e.g., a sound or vibration, comprising: providing at least two electrically isolated electrodes having an associated electrical field; and a charged element within the associated electrical field, having an axis of movement about a fixed position, configured to move about the axis of movement which is orthogonal to an electrostatic force between the charged element and the at least two electrically isolated electrodes; producing a first output dependent on the movement along the axis; receiving a signal for altering the associated electrical field and thereby deflecting the charged element, to thereby alter the axis of movement to a second axis of movement; producing a second output dependent on the movement along the second axis; and analyzing the first output and the second output to determine a vector propagation property of the vibration.

It is also an object to provide a sensor comprising a charged (or chargeable) element which is disposed within an electrical field having at least two electrodes, the charged or chargeable element interacting with each of the at least two electrodes to produce a composite force within the charged element that is tensile only does not have a deflection tendency from a nominal position of the charged element, such that the charged element when deflected from the nominal position induces a charge redistribution on the electrodes which can be sensed.

The deflection may be caused by various effects. For example, in a microphone embodiment, sound may act on the charged element to displace it in a movement pattern that corresponds to pressure variations or bulk flow patterns (e.g., viscous drag).

In an accelerometer embodiment, the charged element may be, or may have a movement corresponding to a proof mass or inertial mass.

In a shock sensor, the inertial mass has either a mechanical integration over time, or the output is electrically integrated over time, to determine the impulse magnitude.

Similarly, in a gyroscope (e.g., MEMS gyroscope), the charged element may be directly or indirectly responsive to a Coriolis force or gyroscopic reaction force.

The charged element may be a microcantilever beam, which, for example, can sense asymmetric bending effects. For example, if one side of a beam is coated with a chemically responsive material, and the other is not, or one side is selectively exposed to a chemical to which it is responsive, the deflection may be measured. Typically, the low frequency response (<1 Hz or 0.1 Hz) of the device may be low or subject to noise, and therefore the charged element may be induced to vibrate. In this case, the vibration will act as a frequency modulation of the offset position of the charged element.

The microcantilever may also be coated with a selective chemisorbent, which has the effect of changing the mass of the charged element based on an amount of exposure to a particular type of chemical species. In this case, it is often useful to sense the mass change of the charged element by vibrating the microcantilever, and sensing dynamic characteristics. For example, there the microcantilever has an elastic mount, the resonant frequency of movement of the charged element will depend on its mass. In non-resonant systems, the inertia of the charged element induced in response to a defined force will change with the mass of the charged element.

In some cases, the mount for the charged element has a relevant physical property that varies with a sensed condition. For example, the mount may be a thermally responsive material. Therefore, as the temperature of the mount changes, a mechanical property of the mounting of the charged element may be sensed. This may be a deflection, damping coefficient, spring force, or the like.

The charged element may also act as a sensor for fluid dynamical properties of the medium in which it is immersed. For example, instead of providing a fiber for which fluid drag is a dominating factor in the response to bulk flow, such as a submicron fiber, a larger fiber is provided which is in a transition region range. Therefore, the movement of the fiber in response to a standardized vibration within the medium will alter based on properties of the medium. If the medium is homogeneous and constant temperature and pressure, changes in mass and/or viscosity will be reflected in the response of the charged element.

In some cases, an array of sensors may be provided. For example, the array may sense spatial or volumetric differences in a condition, such as sound waves. Note that the charged element may be directional, and as a result, spatial and volumetric sensors may produce information about propagation vectors, scattering, and other influences. In other cases, the array of sensors may be configured or processed to null or cancel undesired signal components, and select or respond to desired signal components.

It is another object to provide a sensor, comprising an element configured to be charged disposed within an electrical field having at least two electrodes, the element interacting with each of the at least two electrodes to produce a composite force within the element that is tensile only, and without a deflection tendency from a nominal position, such that the element when deflected from the nominal position induces a charge redistribution on the at least two electrodes.

The element may have a movement or deflection responsive to an acceleration, Coriolis force, asymmetric bending force, a chemical interaction of a medium and a surface of the element, a biological interaction of a medium and a surface of the element, or a chemisorptive interaction of a medium and a surface of the element, for example. The sensor may further comprise a mechanical integrator, wherein the element has a movement responsive to a shock.

The composite force may be oscillating, and the element have a deflection responsive to at least the oscillating composite force.

The sensor may further comprise an electronic amplifier configured to produce a signal corresponding to the deflection of the element.

The sensor may further comprise an electronic device configured to determine analyze a time-response of the deflection of the element.

The time response may comprise a vibration frequency, a resonant frequency, or a phase delay.

The deflection of the element may be responsive to a temperature, pressure, an illumination, and/or a viscosity of a fluid surrounding the element, for example.

The sensor may further comprise an elastic mount for the element, which pivotally supports the element. The deflection of the element may be responsive to a change in physical properties of the elastic mount. The deflection of the element may be responsive to a chemical interaction of the elastic mount with a surrounding medium.

The element may have an associated catalyst, wherein a deflection of the element is responsive to an amount of substrate for the associated catalyst.

It is another object to provide a sensor array, comprising a plurality of elements arranged in a spatial array, the plurality of elements being configured to be electrically charged, each respective element of the spatial being disposed within an electrical field controlled by at least two respective electrodes, the respective element interacting with each of the at least two respective electrodes to produce a composite tensile force within the respective element, substantially without a deflection tendency from a nominal position due to the composite force, such that the respective element induces a charge redistribution on the at least two respective electrodes upon deflection. The spatial array may provide a three dimensional array of the plurality of elements. The sensor array may further comprise an external condition gradient surrounding the plurality of elements. The sensor array may further comprise a thermal control configured to create a thermal gradient in the plurality of elements. The sensor array may further comprise an optical system configured to project an image onto the spatial array. The respective elements may have a plurality of respective different selective chemical responses.

An array may also be provided in which the environment of the sensor is controlled to provide difference conditions, typically incrementally varying, over a range. For example, a linear array of sensors may be provided which are maintained at different temperatures. This may be as simple as providing a temperature gradient cause by a heat source at one end of the array. The array may then sense characteristics of the medium over the range of temperatures. Similarly, other gradients may be imposed, such as illumination or other electromagnetic radiation, magnetic field, distance from an axis of rotation, or the like.

As discussed above, chemisensors may be employed, and the array may have incrementally (or otherwise) varying properties of the sensors, environment of sensing, or the medium to be sensed.

The sensor may, for example, include a catalyst (inorganic, organic, enzyme, etc.) which selectively interacts with an analyte in the medium. This may produce various effects, but often heat (thermal energy) or change in redox potential are available outputs. To sense heat, the static properties (deflection position) or dynamic properties (frequency of vibration, amplitude of vibration, etc.) can be measured.

Redox changes are especially interesting because these can be used to alter the voltage (charge) of the charged element, and therefore produce an output dependent on a modulated charge. Redox changes may also alter electrical conductivity, and other properties. For example, a redox change may be measured with a colorimetric redox indicator, which can interact with an optical system, such as a laser or light emitting diode (semiconductor or organic semiconductor). The result can be a change in temperature. However, in a pulse illumination system, the coupling of the charged element to the pulse may vary depending on its optical absorption, and therefore a dynamic response without significant change in bulk temperature may be measured.

In some cases, the sensor may provide fluidic sensing. Typically, the presence of a liquid between the sensing electrodes and the charge element is problematic, since many liquids are conductive and will bleed the charge on the charged element, though some liquids are dielectric and non-conductive. However, considering aqueous solutions and biological analytes, these are typically contraindicated for the space in which the relevant electrical field is to be sensed, and even a high humidity in this region may be problematic for reliable sensing. One solution is to fabricate a sensor which operates at <1.23 V (hydrolysis potential of water), and provide a current supply to the charged element that replenishes the drained charge. Note that this sensor may act as a conductive sensor, in which current flow split between the electrodes is dependent on position. However, in some cases, the attractive force between the electrode and charged element may still be relevant, since regardless of current flow, the force is dependent on the charge and distance.

An alternate is to provide an analyte in a fluid space with a wall, and have the charged element mounted outside of the fluid space on the opposite side of the wall. Changes in the fluid space that alter electrical or thermodynamic factors may be sensed through the wall, and reflected in a change in electrical (charge) or mechanical property of the charged element(s). For example, a glucose sensor may be implemented by an immobilized glucose oxidase enzyme in a fluid space. Glucose oxidase catalyzes the conversion of glucose to gluconolactone, FAD is reduced to FADHZ, which is oxidized back to FAD by a redox mediator, which is then oxidized by an electrode reaction. (Of course, this potential may be measured directly). The electrode, in this case is coupled to the charged element, and the charge on the charged element is dependent on the glucose oxidation. If the charged element is induced to move, the amplitude of the signal will be dependent on the charge induced on the charged element by the glucose oxidation. Other enzyme-coupled reactions may be similarly sensed. One advantage of this embodiment is that it achieves electrical isolation of the aqueous medium and the electronics. Another advantage is that it is potentially responsive to intervening conditions and superposed effects. For example, if two enzymes engage in competing or parallel reactions, outputs of their reaction can sum or difference.

The charged element may be induced to motion directly by a sensed effect, or coupled with another mechanical element and indirectly induced to move. Likewise, a modulation of motion by a sensed effect may be a direct effect of the sensing interaction, or indirectly through an intervening element.

An imaging sensor, e.g., a spatial array of elements whose displacement or vibration is modulated by illumination by ultraviolet, visible, infrared, far infrared, terahertz radiation, etc., and an optical system which projects an image on the array for sensing, may be implemented. Long wavelength sensing, which is relatively difficult with semiconductor CCD or photodiode imagers, are particularly attractive applications. It is noted that the sensing electrodes are designed to have an electrical field which is aligned with the elongated axis of the moving element over its range of movement, so that a pull-in effect is avoided; however, this can be implemented to permit a "back side" illumination, i.e., the image is projected onto the array (or single element sensor) through the electrode side of the device. Vibration of the moving elements may be induced by providing a time-varying electrical field around the moving element, for example my modulating the sensing electrodes or providing an additional "drive" electrode system. In any case, where the electric field is modulated, the electronics would generally filter or compensate for the modulation, while demodulating the imposed signal.

A system employing the sensor may be a cellphone (smartphone) or other consumer electronic device, automobile or component thereof, flying object or drone, telephone, computer, display device, military munition, toy, or the like.

The sensor can replace traditional types of capacitive sensors in a variety of applications, and the advantages permit new applications.

Various sensors which may be modified to employ the present technology, and uses of such sensors are known. See, U.S. Pat. Nos. 6,199,575; 6,621,134; 6,670,809; 6,749,568; 6,848,317; 6,889,555; 6,926,670; 6,935,165; 6,994,672; 7,036,372; 7,046,002; 7,073,397; 7,077,010; 7,078,796; 7,093,494; 7,109,859; 7,143,652; 7,164,117; 7,169,106; 7,204,162; 7,205,173; 7,260,980; 7,260,993; 7,340,941; 7,368,312; 7,397,421; 7,402,449; 7,425,749; 7,451,647; 7,474,872; 7,518,493; 7,518,504; 7,539,532; 7,539,533; 7,543,502; 7,558,622; 7,562,573; 7,663,502; 7,677,099; 7,689,159; 7,694,346; 7,732,302; 7,733,224; 7,748,272; 7,775,215; 7,775,966; 7,784,344; 7,786,738; 7,795,695; 7,810,394; 7,849,745; 7,878,075; 7,915,891; 7,923,999; 7,950,281; 7,977,635; 7,984,648; 8,000,789; 8,016,744; 8,020,440; 8,037,757; 8,061,201; 8,103,333; 8,108,036; 8,118,751; 8,121,673; 8,121,687; 8,129,802; 8,130,986; 8,136,385; 8,143,576; 8,146,424; 8,171,794; 8,187,795; 8,215,168; 8,235,055; 8,268,630; 8,278,919; 8,323,188; 8,323,189; 8,328,718; 8,338,896; 8,344,322; 8,347,717; 8,352,030; 8,368,154; 8,371,166; 8,390,916; 8,397,579; 8,418,556; 8,425,415; 8,427,177; 8,434,160; 8,434,161; 8,449,471; 8,461,988; 8,464,571; 8,467,133; 8,472,120; 8,475,368; 8,477,425; 8,477,983; 8,482,859; 8,488,246; 8,500,636; 8,516,905; 8,525,673; 8,525,687; 8,531,291; 8,534,127; 8,542,365; 8,578,775; 8,615,374; 8,646,308; 8,652,038; 8,669,814; 8,677,821; 8,680,991; 8,684,253; 8,684,900; 8,684,922; 8,708,903; 8,713,711; 8,717,046; 8,719,960; 8,727,978; 8,742,944; 8,747,313; 8,747,336; 8,750,971; 8,764,651; 8,787,600; 8,814,691; 8,831,705; 8,833,171; 8,833,175; 8,845,557; 8,848,197; 8,850,893; 8,875,578; 8,878,528; 8,924,166; 8,939,154; 8,963,262; 8,964,298; 8,968,195; 9,000,833; 9,007,119; 9,020,766; 9,028,405; 9,034,764; 9,046,547; 9,052,194; 9,052,335; 9,060,683; 9,074,985; 9,086,302; 9,094,027; 9,096,424; 9,097,890; 9,097,891; 9,107,586; 9,118,338; 9,128,136; 9,128,281; 9,129,295; 9,134,534; 9,151,723; 9,159,710; 9,182,596; 9,190,937; 9,194,704; 9,199,201; 9,204,796; 9,215,980; 9,222,867; 9,223,134; 9,228,916; 9,229,227; 9,237,211; 9,238,580; 9,250,113; 9,252,707; 9,285,589; 9,291,638; 9,307,319; 9,322,685; 9,329,689; 9,335,271; 9,341,843; 9,351,640; 9,359,188; 9,364,362; 9,366,862; 9,389,077; 9,389,215; 9,400,233; 9,404,954; 9,423,254; 9,441,940; 9,444,404; 9,459,100; 9,459,673; 9,465,064; 9,473,831; 9,476,975; 9,494,177; 9,518,886; 9,522,276; 9,528,831; 9,534,974; 9,541,464; 9,549,691; 9,557,345; 9,568,461; 9,575,089; 9,582,072; 9,584,931; 9,588,190; 9,596,988; 9,628,919; 9,631,996; 9,644,963; 9,651,538; 9,658,179; 9,683,844; 9,689,889; 9,695,038; 9,696,222; 9,708,176; 9,722,561; 9,733,230; 9,733,268; 9,759,917; 9,775,520; 9,778,302; 9,781,521; 9,801,542; 9,814,425; 9,820,657; 9,820,658; 9,835,647; 9,838,767; 9,839,103; 9,843,858; 9,843,862; 9,844,335; 9,846,097; 9,856,133; 9,863,769; 9,865,176; 9,866,066; 9,867,263; 9,875,406; 9,897,460; 9,897,504; 9,901,252; 9,903,718; 9,907,473; 9,910,061; 9,910,062; 9,938,133; 9,945,746; 9,945,884; 9,958,348; 9,970,958; 9,976,924; 20020151816; 20020177768; 20020193674; 20040007051; 20040119591; 20040207808; 20040260470; 20050001316; 20050001324; 20050046584; 20050066728; 20050072231; 20050104207; 20050139871; 20050199071; 20050199072; 20050265124; 20060056860; 20060081054; 20060081057; 20060107768; 20060178586; 20060205106; 20060208169; 20060211912; 20060211913; 20060211914; 20060248950; 20070023851; 20070029629; 20070089512; 20070089513; 20070125161;

20070129623; 20070209437; 20070230721; 20070241635; 20070265533; 20070273504; 20070276270; 20080001735; 20080004904; 20080021336; 20080079411; 20080081958; 20080149832; 20080163687; 20080169921; 20080188059; 20080202237; 20080281212; 20080294019; 20090022505; 20090024042; 20090049911; 20090064781; 20090064785; 20090072840; 20090078044; 20090114016; 20090133508; 20090140356; 20090227876; 20090227877; 20090255336; 20090282916; 20090318779; 20090320591; 20100039106; 20100049063; 20100083756; 20100100079; 20100132466; 20100147073; 20100186510; 20100238454; 20100242606; 20100241160; 20100251800; 20100271003; 20100275675; 20100308690; 20110010107; 20110049653; 20110061460; 20110062956; 20110073447; 20110089324; 20110100126; 20110115624; 20110120221; 20110138902; 20110181422; 20110192226; 20110192229; 20110226065; 20110254107; 20110267212; 20110295270; 20110317245; 20120004564; 20120025277; 20120032286; 20120034954; 20120043203; 20120075168; 20120092156; 20120092157; 20120095352; 20120095357; 20120133245; 20120192647; 20120194118; 20120194119; 20120194420; 20120194549; 20120194550; 20120194551; 20120194552; 20120194553; 20120200488; 20120200499; 20120200601; 20120206134; 20120206322; 20120206323; 20120206334; 20120206335; 20120206485; 20120212398; 20120212399; 20120212400; 20120212406; 20120212414; 20120212484; 20120212499; 20120218172; 20120218301; 20120235847; 20120235883; 20120235884; 20120235885; 20120235886; 20120235887; 20120235900; 20120235969; 20120236030; 20120236031; 20120242501; 20120242678; 20120242697; 20120242698; 20120245464; 20120249797; 20120291549; 20120313711; 20120330109; 20130002244; 20130009783; 20130023794; 20130023795; 20130047746; 20130050155; 20130050226; 20130050227; 20130050228; 20130069780; 20130072807; 20130080085; 20130095459; 20130104656; 20130127980; 20130133396; 20130156615; 20130170681; 20130172691; 20130172869; 20130178718; 20130186171; 20130191513; 20130197322; 20130201316; 20130201188; 20130211291; 20130215931; 20130221457; 20130226034; 20130226035; 20130226036; 20130231574; 20130263665; 20130276510; 20130278631; 20130279717; 20130297330; 20130314303; 20130317753; 20130328109; 20130330232; 20130340524; 20140011697; 20140026686; 20140031263; 20140041452; 20140047921; 20140049256; 20140053651; 20140055284; 20140063054; 20140063055; 20140077946; 20140090469; 20140094715; 20140104059; 20140111019; 20140111154; 20140121476; 20140130587; 20140142398; 20140143064; 20140163425; 20140176251; 20140188404; 20140188407; 20140192061; 20140192836; 20140194702; 20140217929; 20140225250; 20140235965; 20140249429; 20140250969; 20140253219; 20140257141; 20140260608; 20140266065; 20140266263; 20140266787; 20140296687; 20140299949; 20140306623; 20140319630; 20140321682; 20140330256; 20140352416; 20150019135; 20150068069; 20150082872; 20150096377; 20150099941; 20150105631; 20150125003; 20150125832; 20150126900; 20150141772; 20150154364; 20150163568; 20150171885; 20150176992; 20150211853; 20150220199; 20150226558; 20150250393; 20150260751; 20150268060; 20150268284; 20150269825; 20150276529; 20150309316; 20150309563; 20150323466; 20150323560; 20150323694; 20150338217; 20150351648; 20150359467; 20150374378; 20150377662; 20150377916; 20150377917; 20150377918; 20160000431; 20160000437; 20160002026; 20160003698; 20160006414; 20160030683; 20160041211; 20160066788; 20160076962; 20160130133; 20160131480; 20160137486; 20160139173; 20160140834; 20160161256; 20160176704; 20160187654; 20160202755; 20160209648; 20160213934; 20160223579; 20160231792; 20160232807; 20160235494; 20160241961; 20160274141; 20160287166; 20160305780; 20160305835; 20160305838; 20160305997; 20160310020; 20160320426; 20160327416; 20160327523; 20160334139; 20160338641; 20160341761; 20160347605; 20160349056; 20160360304; 20160360965; 20160363575; 20160370362; 20160377569; 20170003314; 20170023429; 20170025904; 20170041708; 20170051884; 20170052083; 20170074853; 20170078400; 20170086281; 20170086672; 20170121173; 20170135633; 20170142525; 20170146364; 20170152135; 20170160308; 20170164878; 20170167945; 20170167946; 20170168084; 20170168085; 20170168566; 20170191894; 20170199035; 20170201192; 20170217765; 20170223450; 20170254831; 20170257093; 20170258386; 20170258585; 20170260044; 20170265287; 20170284882; 20170295434; 20170297895; 20170318385; 20170318393; 20170331899; 20170336205; 20170343350; 20170341114; 20170347886; 20180000545; 20180002162; 20180008356; 20180008357; 20180017385; 20180034912; 20180035206; 20180035228; 20180035229; 20180035888; 20180038746; 20180080954; 20180085605; 20180086625; 20180092313; 20180108440; 20180124181; 20180124521; and 20180134544, each of which is expressly incorporated herein by reference in its entirety.

The moving element may be used in an actuation mode, for example to define a carrier excitation upon which a sensed effect is modulated, either by altering an amplitude of a defined frequency, or altering a frequency or time delay (phase) characteristic. This is especially useful to move a baseband (DC) signal into a range in which the sensor displays better properties, such as higher sensitivity, lower noise, etc.

The intentional movement of the moving element, by altering the electric field surrounding it, may be used for various purposes. In one case, a pull-in response may be desired to protect the sensor from hostile environmental conditions, and therefore the moving element intentionally displaced out of harm's way. In another case, the space in which the moving element is operating may be inhomogeneous, and the movement of the moving element allows exploration of the space.

As noted above, the sensor may be highly directional, and for example have a cardioid response pattern. By deflecting the moving element from its nominal position, information regarding the vector direction of an effect may be determined. Further, this deflection can then distinguish between excitation having directional components, and excitation or noise which is non-directional. The deflection need not be binary, and in the case of a fiber sensor, can sense two axes, using 3 or more electrodes. Other configurations with larger numbers of electrodes are possible. For example, instead of having the elongated axis of the moving element directed to a gap between electrodes (the nominal design in a two-electrode, symmetric sensor), a third electrode disposed between two lateral electrodes may smooth a gradient (i.e., linearize the transition, and therefore the response of the moving electrode)) when the two lateral electrodes are maintained at different potentials, and the central electrode is maintained at an intermediate potential.

The moving element may act as a valve or flow-control vane, for a medium surrounding the element, having a position controlled by the potentials on the electrodes.

In media where the fluid is near a turbulent flow threshold, the position of one or more elements Deflection of the moving element, especially significant deflection, can alter an effective stiffness of the sensor, which can alter both the amplitude of a response, and a resonant frequency. Each of these may be useful in various types of sensors.

DETAILED DESCRIPTION OF THE PREFERRED EMBODIMENTS

Figure 2:
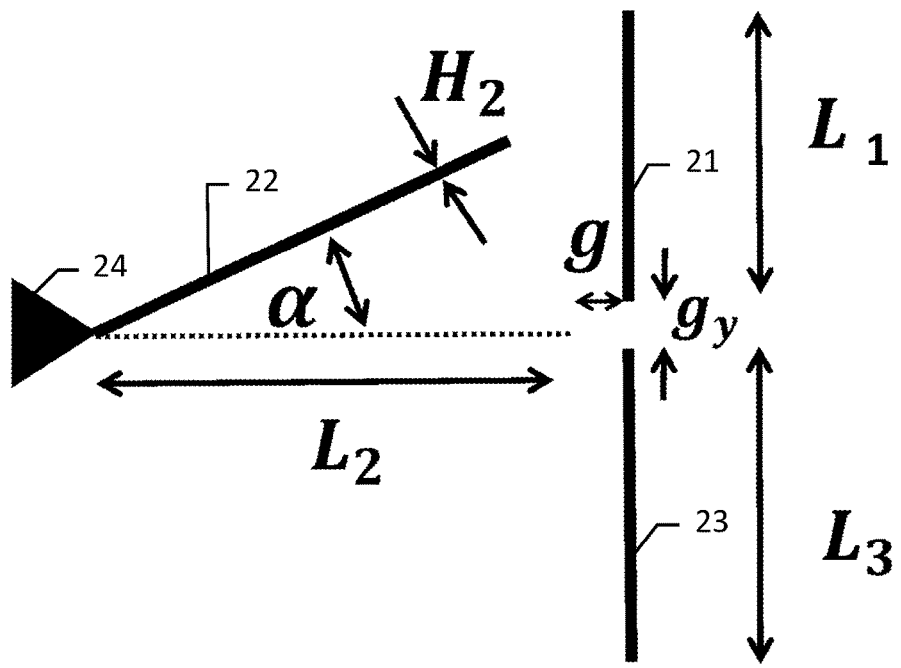
FIG. 2 shows a compliant electrostatic sensor.

FIG. 2 shows a compliant electrostatic sensor according to the present technology.

The moving electrode 22 according to a preferred embodiment examined herein is composed of a thin sheet of material that is extremely flexible in the direction normal to its plane surface. It is supported along one edge so that it can rotate or bend easily about that supporting line as illustrated in FIG. 2. The figure represents a two-dimensional cross section of the system which is unchanged throughout the dimension that is perpendicular to this section. The moving electrode consists of a thin flexible element of length $L_2$ and thickness $H_2$ shown deflected relative to the horizontal orientation by the angle $\alpha$. The moving electrode 22 is shown as a straight solid body that pivots about its attachment point 24. It could also consist of a flexible beam or string hung at one end having small enough bending stiffness that it is free to rotate in a manner similar to that shown in FIG. 2. The moving electrode 22 is separated from a pair of fixed electrodes 21, 23 separated near a null position of the moving electrode 22 by a gap g. The fixed electrodes have an interelectrode gap $g_y$. Fixed electrode 21 extends for a distance of $L_2$ from the interelectrode gap g and fixed electrode 23 extends for a distance of $L_3$ from the interelectrode gap $g_y$.

The fixed electrodes are oriented so that they create plane surfaces that are orthogonal to the plane of the moving electrode. Orienting the fixed and moving electrodes so that their surfaces are orthogonal helps to minimize the net electrostatic force on the moving electrode because the electric field will always be normal to the surface of the conductors. With proper arrangement of the positions and orientations of these electrodes, one can cause the electrostatic forces acting on the plane surfaces of the moving electrode to effectively cancel, leaving the comparatively small force that is applied normal to the free edge.

According to an exemplary embodiment, the moving electrode consists of a thin flexible element of length $L_2=6.2$ mm and thickness $H_2=5$ μm shown deflected relative to the horizontal orientation by the angle $\alpha$. Two vertical, fixed electrodes of length $L_1=L_3=2.5$ mm and thickness $H_1=H_3=200$ μm are shown to the right of the moving electrode. The horizontal gap between the moving electrode and the two fixed electrodes is g=300 μm. They are separated by a gap in the vertical direction of $g_y=50$ μm and are held at the same potential.

Sensing the position of the moving electrode is achieved by dividing the fixed electrode into two surfaces, denoted by electrodes 1 and 3, which are both held at the same voltage. The charge on these two fixed electrodes will vary with the moving electrode's position. For electrodes having practical dimensions, it is found that the electrostatic forces can be made to be negligible in comparison to those associated with the electrode's elastic properties.

The two vertical, fixed electrodes of length $L_1$ and $L_3$ and thicknesses $H_1$ and $H_3$ are shown to the right of the moving electrode in FIG. 2. As the moving electrode rotates, it changes the charge distribution and net capacitance on this set of electrodes. The voltage applied to the moving electrode will be set by a voltage source, $V_2$. The two fixed electrodes will be set at a voltage of V=0. In this example, to simplify our calculations we will assume that the moving electrode maintains the shape of a straight line so that it moves as a rigid pendulum that is free to pivot about its attachment point Small deviations from this straight line shape due to bending will not significantly change the results. The length $L_2=6.2$ mm and thickness $H_2=5$ μm of the moving electrode ensure that the electrode is highly compliant Their values were chosen to correspond to the measured configuration described below.

Figure 3:
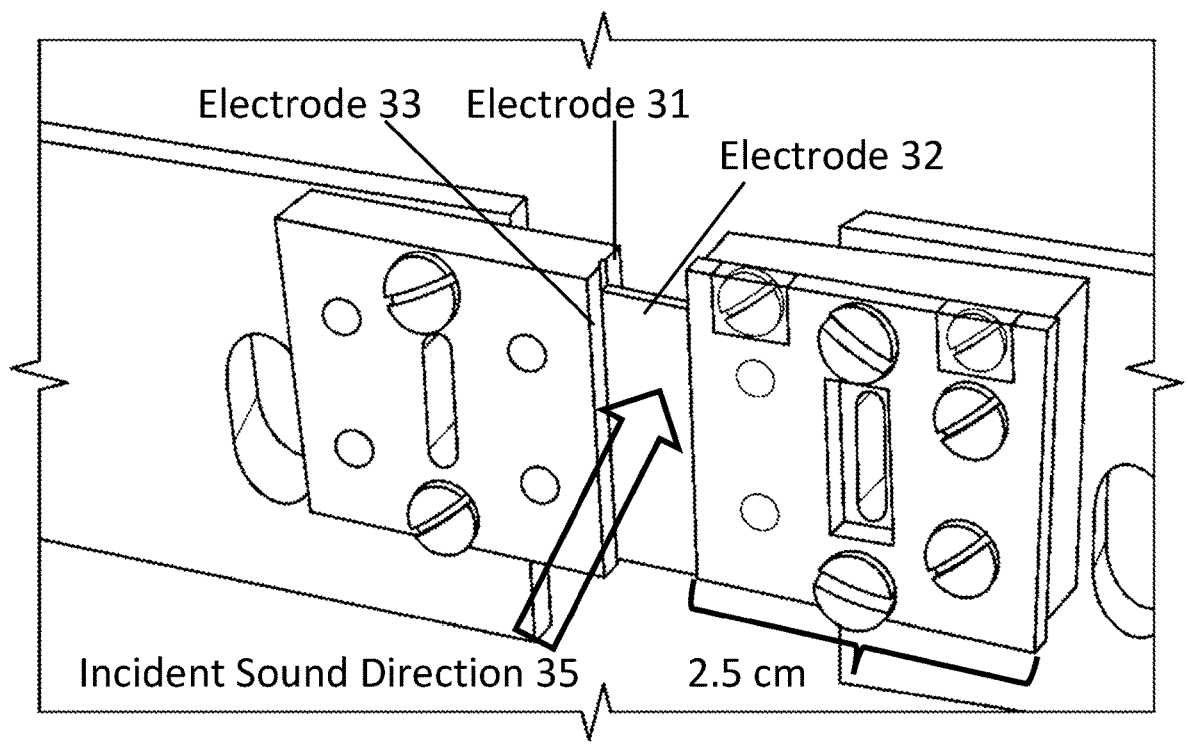
FIG. 3 shows the physical setup according to FIG. 2.

The fabricated device is represented in FIG. 3. The three electrodes 31, 32, 33 are supported on insulating blocks that were attached to micromanipulators that allowed electrode 32 to be positioned close to the line separating electrodes 31 and 33. The distances between the electrodes and the overall dimensions were determined optically using a microscope. The incident sound direction is normal to the surface of the electrode 32.

To very roughly estimate the mechanical stiffness of a realizable moving electrode, the stiffness of a cantilever beam supported by a fixed boundary may be considered. Assume that this electrode is constructed of a polymer having a Young's modulus of elasticity of $E=2\times10^9$ N/m². In order for the electrode to be conductive, it is coated with a very thin layer of aluminum, which is taken to be thin enough to not add appreciable stiffness. Considering the force to be applied uniformly along the length, the equivalent mechanical stiffness per unit width may be approximated by $k\approx 8EI/L^{3/2}$ where $I=H^{3/2}/12$. Since $L_2=6.2\times10^{-3}$ m and $H_2=5\times10^{-6}$ m, the mechanical stiffness per unit width is $k\approx 0.7$ N/m². While this is a very approximate estimate, the results below indicate that the effective stiffness due to electrostatic forces is significantly less than this mechanical stiffness, and will thus have negligible influence on the motion.

FIG. 3 shows a photograph of the physical setup used to realize the concept shown in FIG. 2. Electrodes 1 and 3 are formed using thin strips of copper tape aligned vertically near the left, free end of electrode 2. Electrode 2 is clamped at its right end. The sound field was incident as shown from a direction normal to the plane of electrode 2.

While the electrode configuration of FIG. 2 does not lend itself to analysis by simple design equations as do parallel plate capacitive sensors, it is possible to estimate the charge distribution numerically for a given set of applied electrode voltages. Here a boundary element approach is utilized, which provides a numerical solution to the following integral equation:

$$v(\vec{r}) = \int \frac{\rho(\vec{r})}{\epsilon 4\pi R(\vec{r},\vec{r}')} ds' \qquad (10)$$

where $$R(\vec{r},\vec{r}') = \sqrt{(\vec{r}-\vec{r}') \cdot (\vec{r}-\vec{r}')} \qquad (11)$$

is the distance between $\vec{r}$ and $\vec{r}\,'$, which are any two points on the surface of the electrodes, $v(\vec{r})$ is the given surface voltage specified at each position $\vec{r}$, and $\rho(\vec{r})$ is the unknown surface charge density. $\epsilon$=8.854 pF/m is the permittivity of the medium. When the domain is two dimensional, equation (10) becomes [16]

$$v(\vec{r}) = -\int \frac{\rho(\vec{r})\log R(\vec{r},\vec{r}')}{\epsilon 2\pi} ds' \qquad (12)$$

Discretizing the surface into a finite number of areas enables one to solve for the charge distribution for any given electrode geometry. Knowing the charge density for a variety of positions of the moving electrode enables the calculation of the electrostatic potential energy as a function of the electrode position. These data may then be numerically differentiated to estimate the first and second derivatives which provide the electrostatic force and effective stiffness associated with the given motion.

Figure 4A:
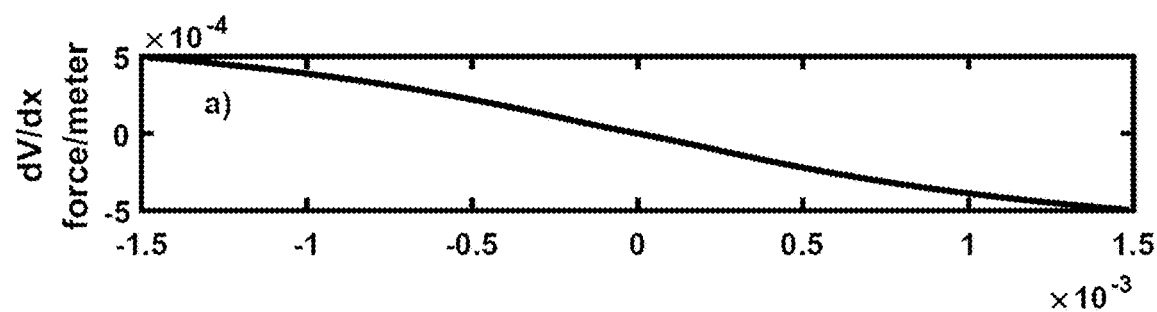
FIGS. 4A-4C show estimated first and second derivatives of the potential energy and charge sensitivity as a function of the tip displacement of the moving electrode for the electrode configuration of FIG. 2.
Figure 4B:
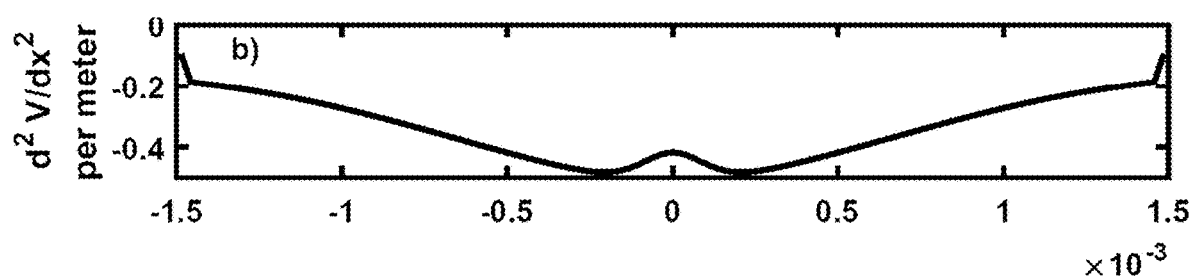
Figure 4C:
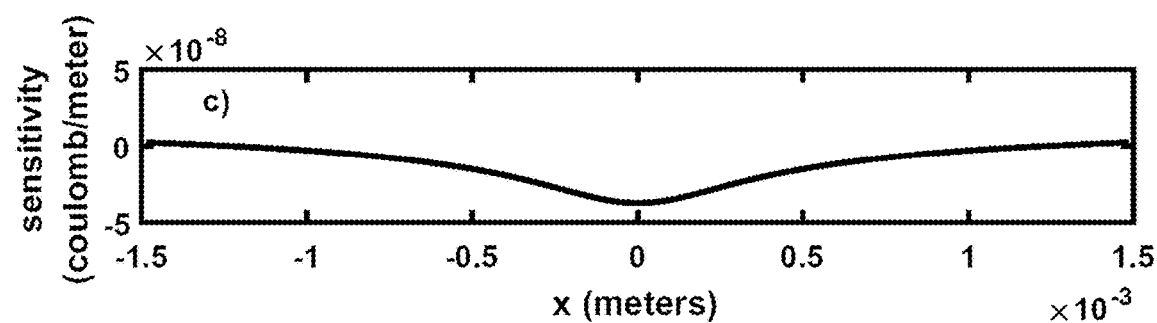

FIGS. 4A-4C show the estimated first and second derivatives of the potential energy as a function of the tip displacement of the moving electrode for the electrode configuration of FIG. 2. The effective electrostatic force is proportional to the first derivative of the potential energy shown in FIG. 4A and the electrostatic stiffness is proportional to the negative of the second derivative shown in FIG. 4B. The estimated force is always attractive and stiffening since it always acts to return the electrode to the equilibrium position at x=0. It is assumed that the bias voltage applied to the moving electrode is V=400 volts and the two fixed electrodes are at zero volts. The maximum magnitude of the charge sensitivity shown in FIG. 4C is approximately $4\times10^{-8}$ coulombs/meter.

Because the domain is taken to be two dimensional, the results are for a unit length in the direction normal to the plane of FIG. 2. FIG. 2 shows that the force is always attractive, restoring the electrode to its single equilibrium position at x=0. The second derivative of the electrostatic energy provides the effective electrostatic stiffness at the equilibrium position. This electrostatic stiffness can be compared to an estimate of the mechanical stiffness of a cantilever beam as discussed above. The electrostatic stiffness is found to be approximately 0.4 N/m². The mechanical stiffness is estimated above to be k≈0.7 N/m². Note that this electrostatic stiffness is estimated with the bias applied to the moving electrode having a large value of 400 volts. This bias voltage is expected to have little noticeable effect on the electrode motion. This voltage is beyond what would be practical in a miniature microphone design. Precision microphones, however, (such as the Bruel and Kjaer 4138 used below) commonly employ a 200-volt bias. The use of this rather extreme voltage provides evidence that this electrode design is not adversely impacted by bias voltages likely to be used in practice.

The total charge $Q_i$, for i=1, 2, 3, on each of the three electrodes can be computed knowing the charge density $\rho$ on all surfaces, $S_i$, $$Q_i = \int_{S_i} \rho(\vec{r}) ds' \qquad (13)$$

The output of the sensor will be taken to be the difference in charge between electrodes 1 and 3.

FIG. 4C shows the predicted charge sensitivity of the device which is computed knowing the difference $Q_1$-$Q_3$ for a range of displacements of the moving electrode 2.

The derivative of this charge difference with respect to the displacement of the tip of electrode 2 is then computed, giving the sensitivity in coulombs/meter as shown in FIG. 4C.

The overall sensor sensitivity can be expressed as a combination of the charge sensitivity, denoted by $S_Q$ in coulombs/meter, the electrical sensitivity, $S_e$ in volts/coulomb, and the mechanical sensitivity $S_m$ in meters/pascal. The over-all sensitivity will then be:

$$S = S_Q \times S_e \times S_m \text{ volt/pascal} \qquad (14)$$

In the experimental results presented below, a transimpedance, or charge amplifier is used to obtain an electronic output. This is accomplished using a general purpose operational amplifier where the gain is set primarily through the effective feedback capacitance $C_f$. The electrical sensitivity may then be approximated by:

$$S_e \approx \frac{1}{C_f} \text{ volt/coulomb} \qquad (15)$$

The mechanical sensitivity, $S_m$ will, of course, depend on the mechanical properties of the moving electrode 2. As a rough approximation, in a hypothetical 'ideal' sensor, the average motion of electrode 2 is sought to be very nearly the same as that of the air in a sound field, such as what has been demonstrated in [3]. Taking the sound field to consist of a plane wave traveling in one direction, the acoustic particle velocity is given by $U=P/(\rho_0 c)$, where $\rho_0$ is the nominal air density and c is the speed of propagation of an acoustic wave. The quantity $\rho_0 c$ is the characteristic acoustic impedance of the medium [17]. Because the electrode is assumed to rotate about its fixed end, the free end, where the sensing occurs, will move with approximately twice the average displacement, which will occur at the center. For a harmonic wave at the frequency ω, the mechanical sensitivity of the displacement of the free end of the electrode in this idealized case can then be approximated by:

$$S_m \approx \frac{2}{\omega \rho_0 c} \text{ meter/pascal} \qquad (16)$$

Figure 5:
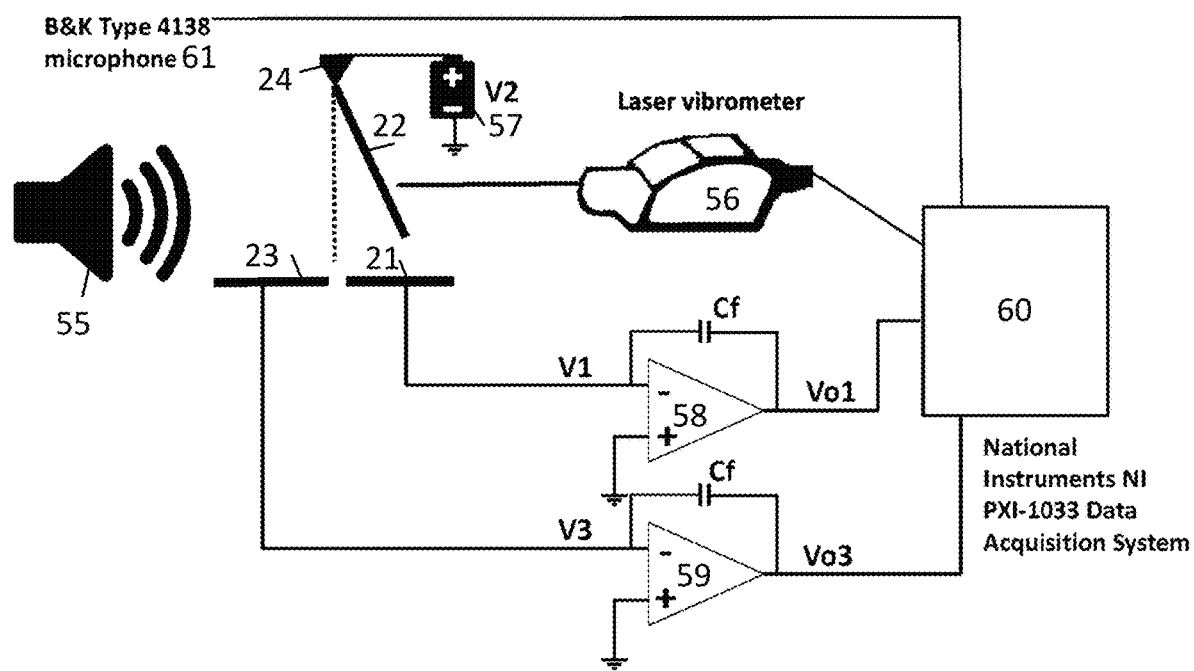
FIG. 5 shows a schematic representation for the characterization setup.

To obtain experimental results for the electrode system of FIG. 2, a 5 µm thick polyethylene terephthalate film, metallized with a thin layer of aluminum was used to create electrode 2 (Goodfellow.com part No. ES301855). The fixed electrodes 1 and 3 were constructed using two strips of 2.5 mm wide copper tape. The assembly was supported on micromanipulators to enable adjustment of the nominal position of the moving electrode relative to the fixed electrodes. The moving electrode was driven acoustically by a loudspeaker placed roughly 1 meter away. Measurements were performed in an anechoic chamber. FIG. 5 shows a schematic representation for the characterization setup.

An electronic output was obtained through the use of transimpedance circuits connected to electrodes 1 and 3. These circuits were not optimized for performance and used a general purpose TL074 quad operational amplifier using 1 GΩ feedback resistors. Note that the impedance of such high-value resistors is often significantly influenced by parasitic capacitance, typically on the order of $C_f=1$ pF, in parallel with the resistor, which can dominate the impedance over a wide range of frequencies. The circuit was realized using through-hole components on a prototype circuit board, which can also influence the parasitic capacitance.

FIG. 5 shows a schematic representation for the characterization setup. The motion of moving electrode 22 about its pivotal mount 24 was detected using a laser vibrometer 56. The sound field created by a loudspeaker 55 was measured using a Bruel and Kjaer 4138 reference microphone 61. The moving electrode 22 was biasd at $V_2$ using a bias generator 57. The electronic output $V_1$ and $V_3$ of fixed electrodes 21 and 23, respectively was measured using charge/transimpedance amplifiers 58 and 59. All signals $V_{O1}$, $V_{O3}$, produced by the charge/transimpedance amplifiers 58 and 59 were recorded using a National Instruments PXI-1033 Data Acquisition System 60.

Figure 9:
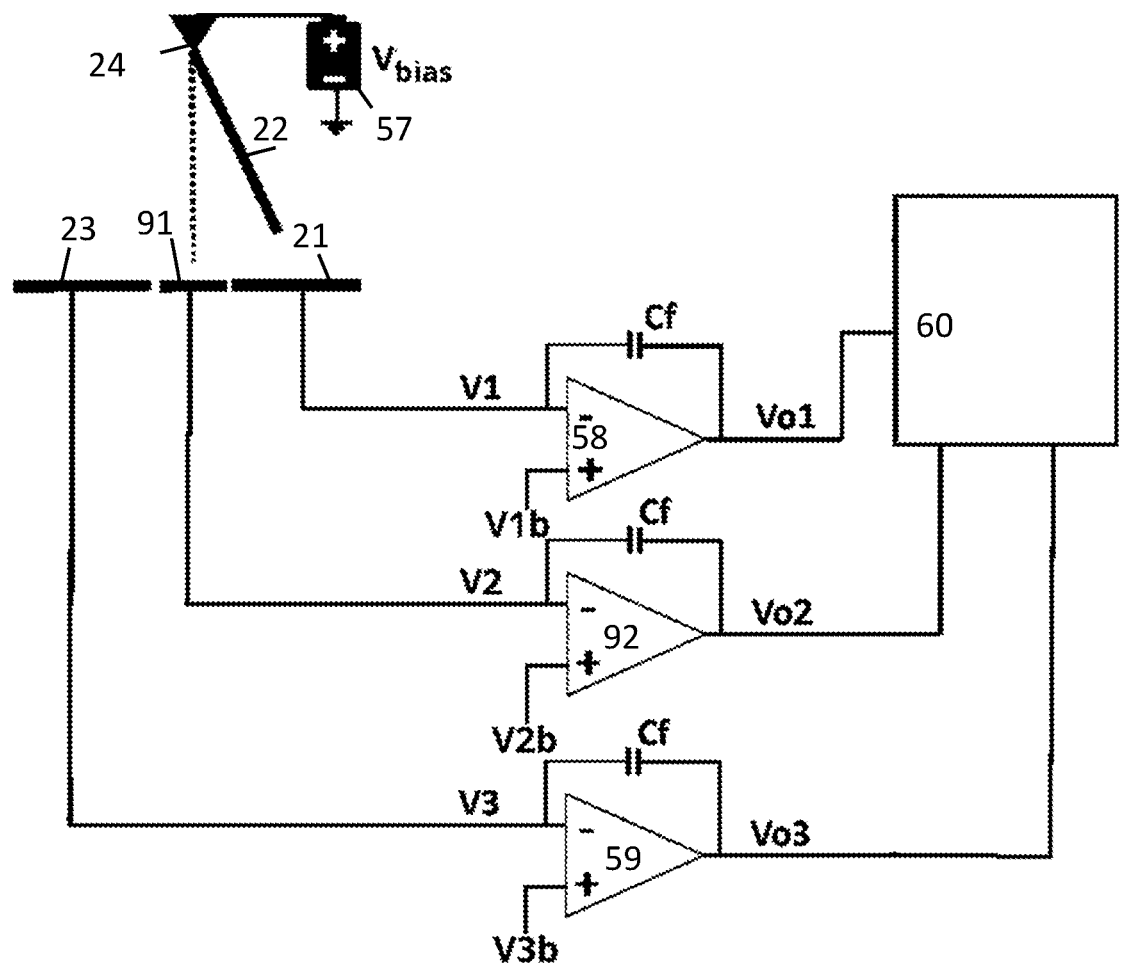
FIG. 9 shows a circuit diagram similar to FIG. 5, but with an additional center electrode.

FIG. 9 shows a schematic representation of a setup similar to that shown in FIG. 5. Diaphragm 22 is biased at $V_{bias}$ by a bias generator 57, which deflects about pivotal mount 24 in response to acoustic waves. The distal tip of the diaphragm 22 is moved from a center position in proximity to electrode 91, to either proximity to electrode 21 or proximity to electrode 23. In doing so, it alters the electrostatic field. Charge/transimpedance amplifiers 58, 59, 92, each with a feedback capacitor Cf, integrate the charge redistribution due to the altered electrostatic field, to produce voltage outputs $V_{O1}$, $V_{O2}$, and $V_{O3}$ fed to data acquisition system 60. Electrode 21 voltage $V_1$ is held at reference voltage $V_{1b}$, electrode 91 voltage $V_2$ is held at reference voltage $V_{2b}$, and electrode 23 voltage $V_3$ is held at reference voltage $V_{3b}$. The circuit of FIG. 5 omits the center electrode, and a null position is intermediate the two electrodes at $V_1$ and $V_3$.

The velocity of the moving electrode was also measured using a Polytec laser vibrometer consisting of a Polytec OFV-534 compact sensor head and a Polytec OFV-5000 Vibrometer Controller. The sound pressure near the moving electrode was measured using a Bruel and Kjaer 4138 precision microphone having a ⅛-inch diameter pressure sensing diaphragm. A bias voltage of $V_2=400$ volts was applied to electrode 2 using a M5-1000 DC-DC converter from American Power Designs.

Figure 6A:
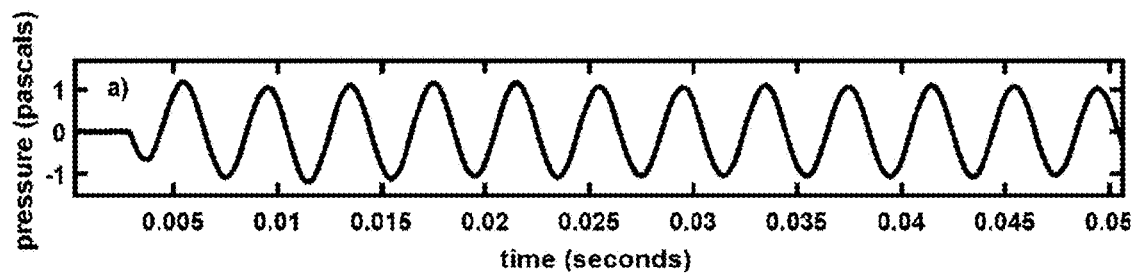
FIGS. 6A-6D shows measured results for the electrode configuration of FIG. 2.
Figure 6B:
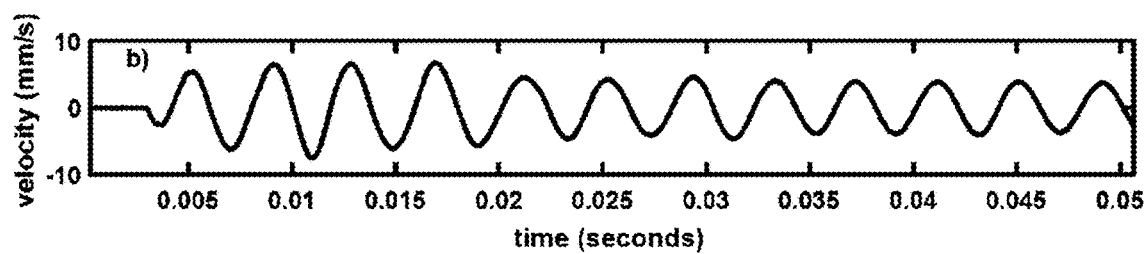

FIGS. 6A-6D show the measured results for the electrode configuration of FIG. 2. The bias voltage applied to the moving electrode is V=400 volts and the two fixed electrodes are at zero volts. The moving electrode was driven by a sound field consisting of a 250 Hz tone produced by a loudspeaker having an amplitude of approximately 1 pascal. FIG. 6A shows the measured sound pressure (pascals) at the location of the moving electrode as measured by a Bruel and Kjaer 4138 reference microphone. FIG. 6B shows the measured velocity (mm/s) halfway between the clamped and free ends of the moving electrode as obtained using a laser vibrometer. The velocity is nearly proportional to, and in phase with the pressure as occurs when the sound field propagates as a plane wave. This design may be employed using the beam response above its first resonant frequency. Because the beam is then highly-compliant i.e., mass-dominated, as opposed to stiffness-dominated, the beam velocity is expected to be in phase with the acoustic velocity.

Figure 6C:
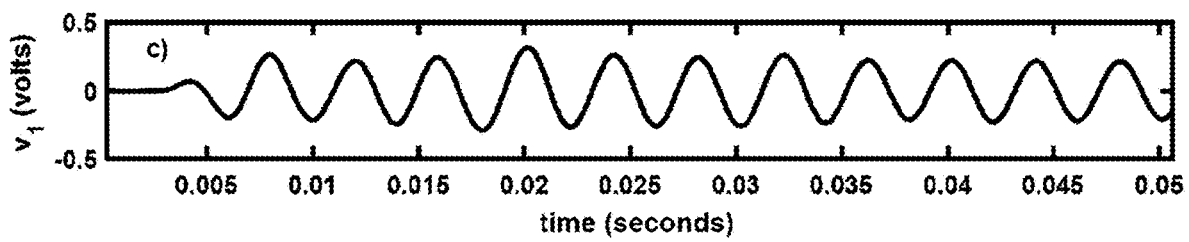
Figure 6D:
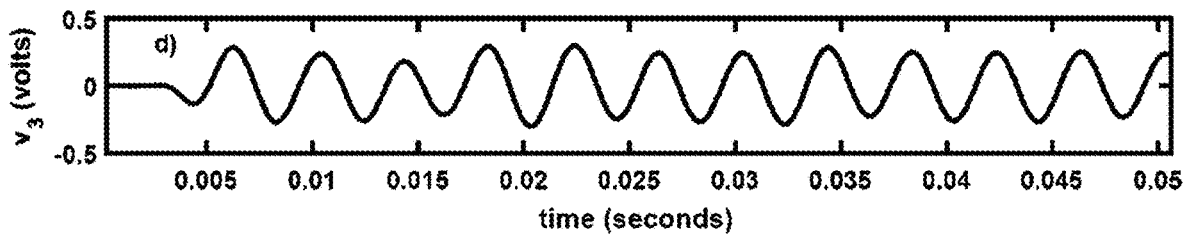

FIGS. 6C and 6D show the output voltages produced by the detection circuits, employing simple transimpedance amplifiers, that respond to the charge on electrodes 1 and 3. These signals are seen to be roughly out of phase with each other as would be expected given that, when the moving electrode moves toward one of the fixed electrodes, it moves away from the other. One could then subtract the two outputs to obtain an improved detection with increased sensitivity. The output voltages have an amplitude of approximately 250 mV so that the difference output would have a sensitivity of approximately 0.5 volts/pascal. The DC bias voltage applied to electrode 2 is 400 volts for the data shown in FIGS. 6A-6D.

The displacement corresponding to the velocity shown in FIGS. 6A-6D is approximately 2.5 microns for a sound pressure of approximately 1 pascal. Note that this displacement is measured at a point halfway between the clamped and free ends of the electrode. We can then estimate that the displacement of the free end will be approximately 5 microns for a 1 pascal sound field. The effective mechanical sensitivity may then be taken to be $S_m \approx 5 \times 10^{-6}$ meter/pascal. This measured result can be compared to the rough estimate provided in equation (16) where $\rho_c \approx 415$ pascal-second/meter and $\omega = 2\pi 250$. Equation (16) then gives $S_m \approx 3 \times 10^{-6}$ meter/pascal, in reasonable agreement with the measured result.

The estimated charge sensitivity shown in FIG. 4C is about $S_Q \approx 40$ nanoCoulombs/meter. The electrical sensitivity given in equation (15) depends on the effective capacitance, $C_f$, which as mentioned above, is estimated to be $C_f \approx 1$ pF. The terms in equation (14) are evaluated:

$$S = S_Q \times S_e \times S_m \approx (40 \times 10^{-9}) \times 10^{12} \times 3 \times 10^{-6} \approx 0.12 \text{ volt/pascal} \quad (17)$$

The measured electrical output can be taken to be the difference in the signals shown in FIGS. 6C and 6D would give a measured signal having a peak voltage of about 0.5 volts for a 1 pascal sound field, which is greater than but within reasonable proximity to the rough approximation of 0.12 volts.

The data in FIGS. 6A-6D show that the sensor is capable of producing a sizable electronic output due to acoustic excitation. This is due to the use of a generous bias voltage applied to the moving electrode of 400 volts. The use of such a large bias voltage on a highly compliant electrode could normally be expected to have a marked influence on its motion.

Figure 7A:
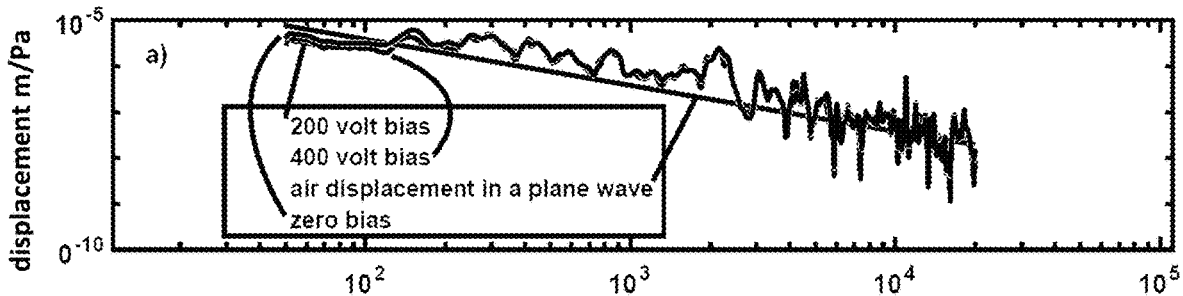
FIGS. 7A-7B show measured results versus frequency for the electrode configuration of FIG. 2.
Figure 7B:
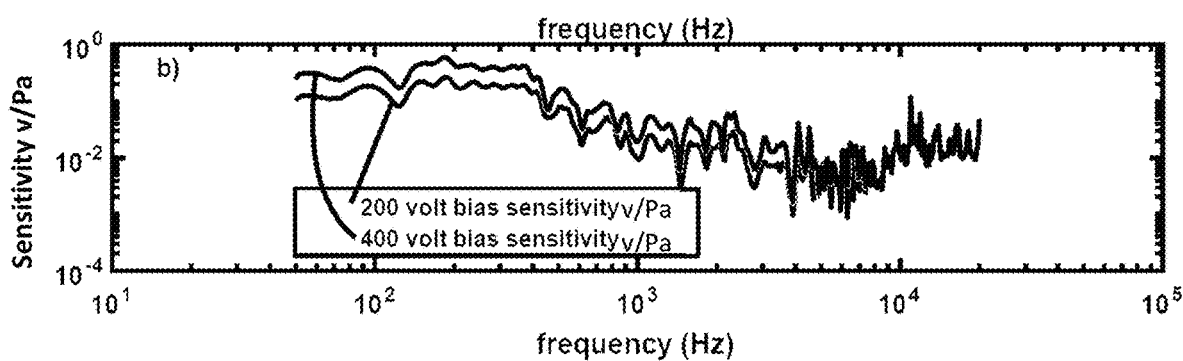

FIGS. 7A and 7B show measured results versus frequency for the electrode configuration of FIG. 2. These results show that the bias voltage has negligible effect on the motion of the electrode while the electrical sensitivity is roughly proportional to the bias voltage over a wide range of frequencies per FIG. 7A. The measured electrode displacement amplitude as a function of frequency is independent of bias voltage for bias voltages of zero, 200 volts, and 400 volts. Also shown is the predicted air displacement amplitude for a 1 pascal plane sound wave. This shows that the electrode moves at least as much as the air in a plane wave, per FIG. 7B. The electrical sensitivity is taken to be the difference in output voltages obtained from electrodes 1 and 3 relative to the amplitude of the sound pressure at the moving electrode. This shows that the sensitivity roughly doubles for a doubling of the bias voltage, as expected.

In spite of the use of a rather large bias voltage, the results shown in FIGS. 7A-7B indicate that the electric field does not result in stiffening (or softening) of the motion of the moving electrode. The figure shows the measured electrode displacement amplitude as a function of frequency (FIG. 7A) along with the measured electrical sensitivity, defined as the difference in the output voltages acquired from electrodes 1 and 3 (shown in FIG. 2) relative to the incident sound pressure (FIG. 7B). Results are shown for bias voltages of zero, 200 volts, and 400 volts. While the response as a function of frequency is not ideal (i.e. not flat) owing to the effects of sound reflections from the fixture and from resonances of the moving electrode, it is clear that the measured electrode velocity is essentially unaffected by significant changes in the bias voltage. This indicates that the electrostatic force is negligible relative to other mechanical forces acting on the electrode, as expected from the data of FIGS. 4A-4C.

FIGS. 7A-7B also show the predicted amplitude of the fluctuating air displacement in a plane wave sound field. This indicates that the measured electrode displacement due to sound is generally higher than predicted for a plane sound wave. This also suggests that the electrode is highly compliant and its motion is unencumbered by either electrostatic or mechanical forces or stiffness.

The observation that this thin electrode can move with a displacement that is similar to that of the air in a sound field is in line with what is predicted for the sound-induced motion of a thin, flexible wall [18]. While numerous additional effects influence the motion of the electrode examined here and it does not closely resemble the problem of predicting sound transmission through walls, it is clear that a thin, lightweight membrane can move with the air in a sound field. If we consider the incident sound to be a harmonic wave at the frequency ω, propagating normal to the plane of the membrane, one can calculate the ratio of the complex amplitude of the sound wave transmitted through the membrane, $p_t$ to that of the incident pressure, $p_1$ [18], $$\frac{p_t}{p_1} = \frac{1}{1 + \frac{i\rho_w h\omega}{2\rho_0 c}} \quad (18)$$

where $\rho_w$ is the mass density of the membrane material, h is its thickness, $\rho_0 c \approx 415$ pascal-s/m is the product of the nominal air density $\rho_0$ and the sound speed c. In a plane sound wave the ratio of the pressure to the acoustic particle velocity is equal to $\rho_0 c$ This leads to:

$$u_1 = \frac{p_1}{\rho_0 c}, u_w = \frac{p_t}{\rho_0 c} \quad (19)$$

where $u_1$ is the complex amplitude of the acoustic particle velocity of the incident plane wave. Equations (18) and (19) give the ratio of the membrane velocity relative to the velocity of the acoustic medium if the membrane weren't present, $$\frac{U_w}{U_1} = \frac{1}{1 + \frac{i\rho_w h\omega}{2\rho_0 c}} \quad (20)$$

Because both velocities $U_w$ and $U_1$ are related to the corresponding displacements by the same factor iω, the ratio in equation (20) will also equal the ratio of the displacements. This ratio depends only on the factor, $(\rho_w h\omega/2\rho_0 c)$. For the metalized polymer electrode used here, the density is estimated to be $\rho_w \approx 1380$ kg/m$^3$ and the thickness is h≈5 μm. Over the range of frequencies shown in FIGS. 7A-7B, this factor varies from approximately 0.003 at 50 Hz to unity at 20 kHz. Over this range of frequencies, it is thus plausible that this thin electrode can move with a displacement that is similar to that of the air in a sound field.

The fact that the electrode is highly compliant is, of course, a major reason that its motion is easily detected by this capacitive sensing scheme. The use of a highly compliant electrode can be effective as long as the sensing configuration does not itself introduce significant electrostatic forces that would affect the motion.

The measured electrical sensitivity is shown in FIG. 7B. Again, the frequency response is not ideal due to mechanical resonances but the sensitivity is in the range between 0.1 and 1 volt/pascal over the lower frequency range shown. An optimized electrode design and a more refined readout circuit would doubtless provide improved results over these measurements.

Comparing FIGS. 7A and 7B shows that an increase in the bias voltage increases the sensitivity at nearly all frequencies in proportion to the bias voltage change while having no noticeable effect on the measured motion. The electrode configuration examined here thus achieves a decoupling of the sensing approach from the mechanical design of the electrode; one does not need to design the electrode so that it will withstand the forces applied by the electric field. The designer is free to construct as compliant a moving electrode as desired to achieve a given sensitivity without concerns that the electrostatic forces will cause instability or will impede the motion.

Figure 1A:
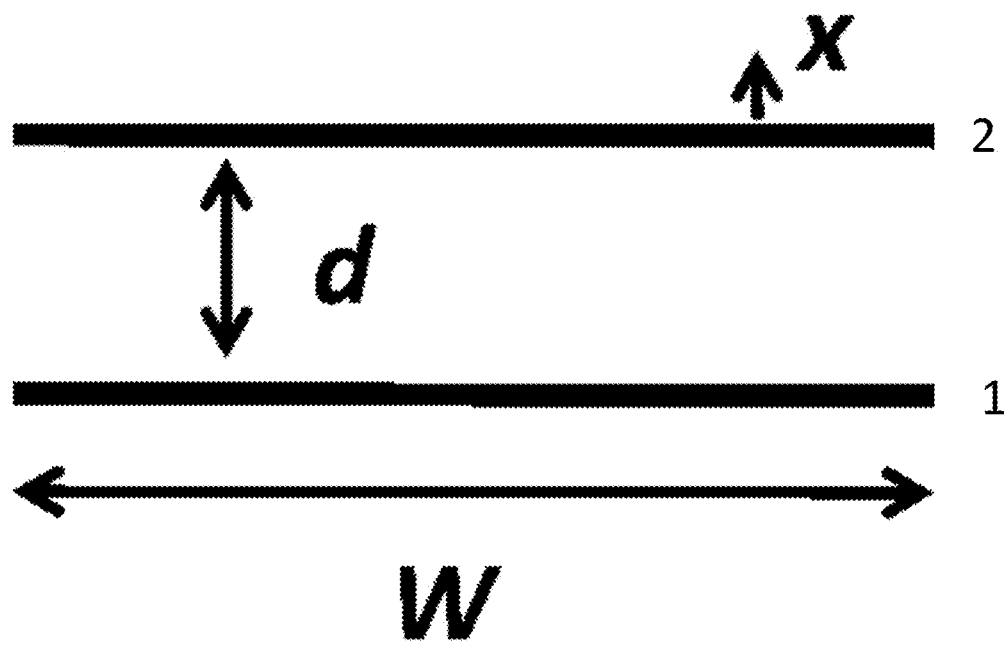
FIGS. 1A-1D show conventional capacitive sensing schemes.
Figure 1B:
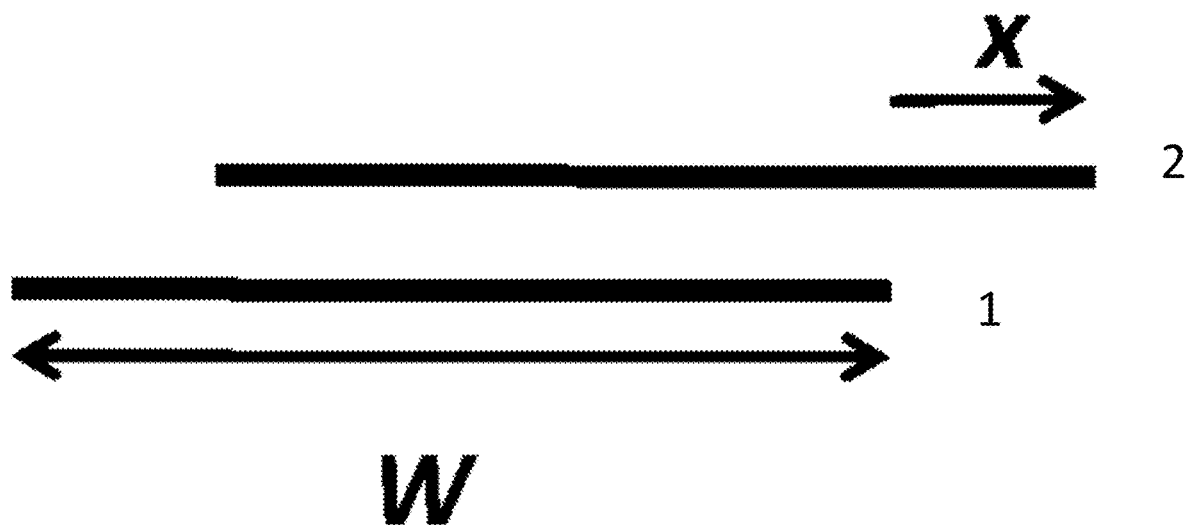
Figure 1C:
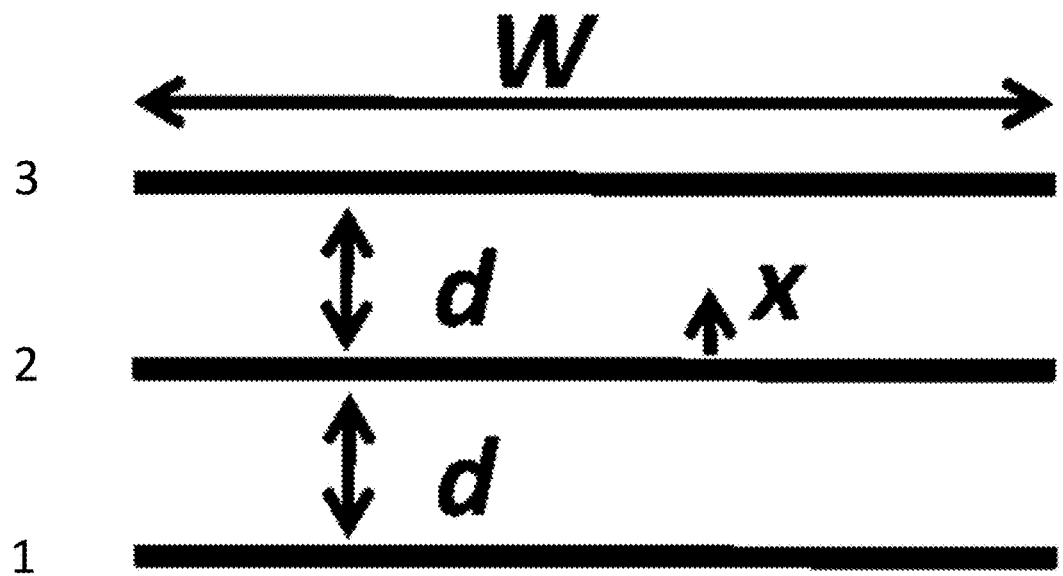
Figure 1D:
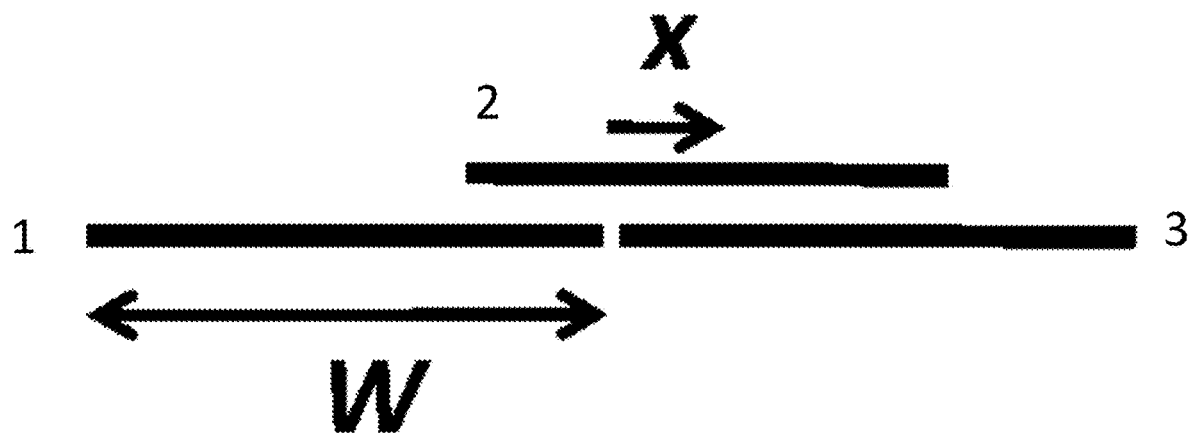

In the foregoing, it has been assumed that the moving electrode consists of a flat planar member. However, in some cases, it may be beneficial that its free edge be curved. Further, the plane of the moving member could also be oriented so that it is not parallel to the gap between the fixed electrodes. In this case, motion of the electrode will result in its overlap area with one of the fixed electrodes to increase while the overlap area with the other fixed electrode decreases. This would cause it to function much like the embodiment shown in FIG. 1D, in which the charge on the fixed electrodes depends on overlap area rather than distance as in FIG. 1C. In this case, however, the overlap area is formed by only the free edge of the moving electrode rather than its planar surfaces. The motion occurs in a direction that is generally orthogonal to the fixed electrodes rather than parallel as shown in FIG. 1D. As in the other situation previously described, large motion causes a reduced force back to the equilibrium position, causing the system to be globally stable. One could achieve this effect also by using a flat, planar moving electrode and making the gap between the fixed electrodes not parallel to it or not straight in the direction normal to the plane of FIG. 2.

Reviewing FIG. 3, the free end of the prototype embodiment of moving electrode 22 is not perfectly straight. This may contribute to the lack of electrostatic stiffness seen in the data.

There are numerous sensing applications where it is very desirable that the moving element is driven with diminutive forces and must therefore be as lightweight and compliant as possible so that it provides the least possible resistance and subsequently responds with the largest possible displacement. In cases where the moving element is an electrode in a capacitive sensor, care must be taken to ensure that the forces associated with the electric field do not adversely affect the motion and subsequent sensor performance. The present electrode geometries minimize the electrostatic forces that actin the direction of motion.

In the electrode design examined here, the electrostatic potential energy is considered as a function of the electrode motion. If the potential energy is roughly constant as the electrode moves, the force will tend to be small since, for this conservative force, the force is equal to the derivative of the potential energy. By splitting the fixed electrode into two elements, one can retain the insensitivity of the potential energy to the electrode displacement while enabling one to sense the differences in charge on the two fixed electrodes. The result is an ability to sense the motion without imposing significant electrostatic forces that affect the motion.

In addition to designing the sensor to maintain a nearly constant potential energy for the range of motion of interest, because the electric field is orthogonal to the surface of a conductor, the fact that the moving electrode is thin and oriented orthogonally to the fixed electrodes causes the force between them to be small. By maintaining geometric symmetry about the nominal position of the moving electrode, the electrostatic forces applied normal to its surface will approximately cancel. This enables the design of moving electrodes having altogether negligible mechanical stiffness in their primary direction of motion. A negligible stiffness can be achieved by supporting the moving electrode by a hinge that has virtually no resistance to rotation or by making the moving electrode out of an extremely thin material that has negligible resistance to bending. If the material is thin enough, one could configure it to resemble a cantilevered beam, which is fully-fixed to the supporting structure and free at its other end. The mechanical restoring stiffness need only be sufficient to resist any other environmental forces that may act on it, such as gravity.

Because electrostatic forces don't affect the motion, the bias voltage applied to the moving electrode can be set to a high value which improves the overall electrical sensitivity. In the results provided here, a highly compliant moving electrode is used that readily moves in response to acoustic pressure. The electrode configuration enables the use of a relatively large bias voltage of 400 volts while having negligible effect on the electrode motion. This produces an output electrical sensitivity of approximately 0.5 volts/pascal.

Another desirable characteristic of the capacitive sensor is the assurance of stability for the entire range of possible motions and bias voltages. As shown in FIGS. 4A-4C, when the moving electrode undergoes large motions, the restoring force will always act to return it to the equilibrium position, ensuring global stability, despite having very small resistance to small excursions from the equilibrium position.

The motion of the moving electrode is essentially unaffected by changes in the bias voltage while the overall electrical output sensitivity to sound is increased as expected.

The sensor may be designed as a microphone which achieves an equivalent acoustic pressure noise floor of 20 dBA, with a frequency response will be flat±3 decibels over the frequency range of 20 Hz to 20 kHz.

While a cantilevered plate-shaped element has been described above as the transducing element for the acoustic waves in air to mechanical motion of a charge, it is also possible to employ one or more fibers, which have the advantage of a high aerodynamic drag to mass ratio. According to the present technology, since the electrostatic interaction of the sensing plates and the moving element does not substantially deflect the element nor materially alter its stiffness, the technology permits sensing of the approximate particle motion in the air surrounding the fiber by viscous drag, as compared to the pressure difference induced deflection of a plate as is more typically measured. Further, the sensor is not limited to a single fiber, and therefore a plurality of fibers may be provided, either as independently moving parallel elements each interacting with the sensing electrodes, or formed into a loose mat or mesh, so that all fibers move together. See, [4, 30, 41, 42, 3]. For example, the fibers may be spider silk coated with 80 nm gold, or electro spun poly methyl methacrylate.

The operation of a viscous drag moving element can be analyzed based on differences in pressure from a plane traveling acoustic wave acting on its two plane surfaces. One may construct an approximate, qualitative model by considering the moving element to be an elastic beam. Focusing attention on response at a single frequency, $\omega$, the beam deflection at a point along its length x, at time t, w(x, t), may be calculated by solving the following standard partial differential equation, $$EI\frac{\partial^4 w}{\partial x^4} + pbh\ddot{w} = P(e^{i\omega t/2} - e^{-i\omega t/2})be^{i\omega t} + C(Ue^{i\omega t} - \dot{w}) \quad (21)$$

where E is Young's modulus of elasticity, I is the area moment of inertia, $\rho$ is the density of the material, b is the width, his the thickness, P is the plane wave sound pressure amplitude, k=$\omega$/c is the wave number with c being the wave propagation speed, d is the effective distance that sound would travel between the two plane surfaces of the beam, and C is a viscous damping coefficient. U is the complex amplitude of the acoustic particle velocity.

As the beam becomes sufficiently thin (i.e., as h and b become small), all of the terms in equation (21) become negligible in comparison to the viscous damping force, C $(Ue^{i\omega t}-\dot{w})$ [4] because C has a very much weaker dependence on h and b than all other terms. In addition, for an isolated fiber or beam, the effective separation distance dis approximately equal to b so the acoustic pressure difference term, the first term on the right hand side, also becomes small. Consequently, in this limiting case where the viscous term dominates, the relative motion between the fiber and the air becomes negligible leading to $\dot{w} \approx Ue^{i\omega t}$ [4]. Therefore, with suitable design of the sensing element so that viscous forces dominate, the sensing element will move with the acoustic medium.

Figure 8A:
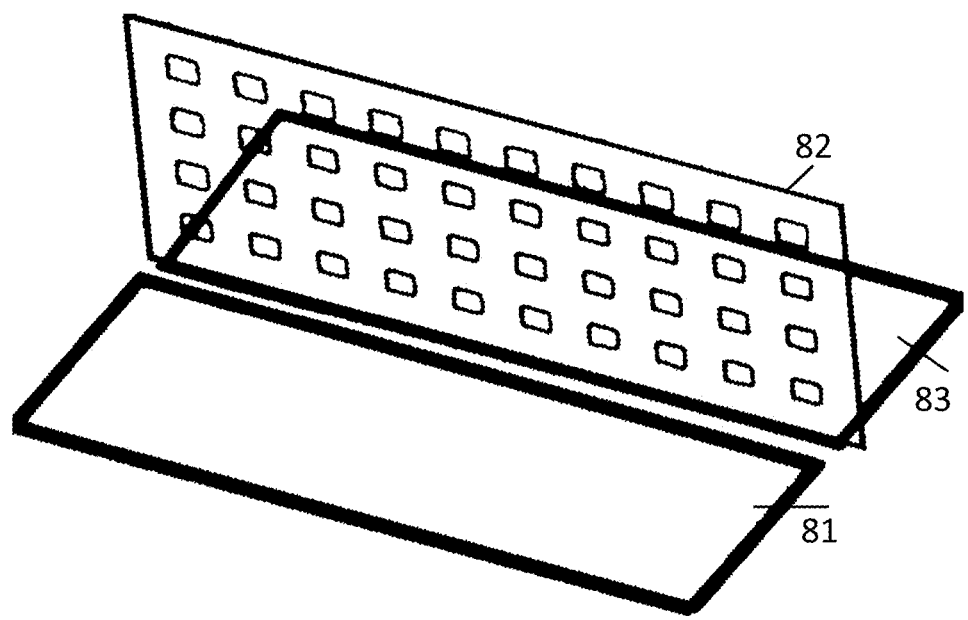
FIG. 8A shows a perforated plate diaphragm embodiment of the invention.

Extremely thin, compliant materials are widely available for constructing these sensing electrodes, such as graphene [1, 2], and carbon nanotubes or nanotube yarn. Flow sensing has also been accomplished with electrospun polymer fibers [41]. These very thin structures have such low bending stiffness, however, that it is not possible to incorporate them into conventional capacitive microphone designs without having their motion be strongly influenced by the electrostatic forces which occur normal to their long axis. FIG. 8A shows a planar diaphragm having an array of apertures, which is situated normal to a pair of fixed electrodes 81, 83, with a resting position near a pag between the electrodes. This design senses drag of moving air through the diaphragm, but such a design has a significant stiffness, and therefore a presumption that all terms of equation (21) are fully dominated by the viscous drag term is not generally satisfied. In some cases, however, a perforated diaphragm represents an acceptable sensor. In one example, a diaphragm may be formed of multilayer graphene. This diaphragm may also be formed of polycrystalline silicon or silicon nitride in a microelectromechanical system (MEMS) design. The diaphragm may be intrinsically conductive or metallized, such as with a layer of gold. The diaphragm, or more generally the moving element, may be formed of an electret material.

A typical silicon microfabrication process to create the thin velocity-sensing film begins with a bare silicon wafer on which a one-micron oxide is grown through wet oxidation. This oxide film provides an etch stop for a through wafer etch used to create an open air space behind the film. A silicon nitride film having thickness approximately 0.5 micron is then deposited using a low pressure chemical vapor deposition (LPCVD) furnace. The silicon nitride is patterned through optical lithography to define the holes to achieve porosity and to define the electrode edges. Portions of the nitride film are made to be conductive by depositing and patterning a thin (approximately 80 nm) layer of phosphorous doped silicon using a LPCVD process. The film is then annealed to form polycrystalline silicon. A throughwafer backside reactive ion etch (RIE) is performed to expose the backside of the silicon electrode. The electrode is released by removing the thermal oxide, using buffered hydrofluoric acid. The fabrication of the sensing electrodes is performed by depositing conductive films around the perimeter of the moving electrode.

Figure 8B:
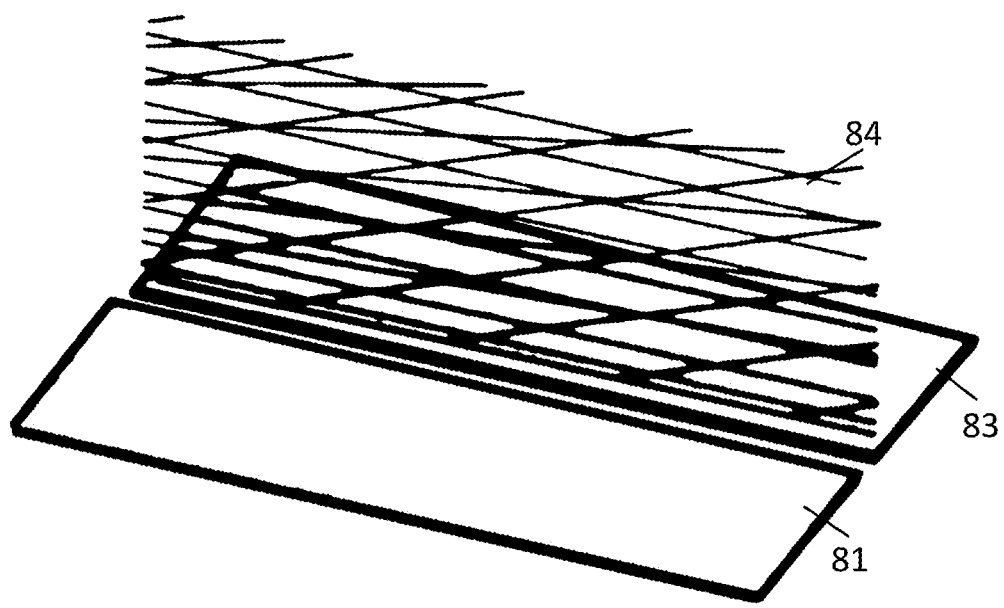
FIG. 8B shows a fiber mesh moving element embodiment of the invention.

FIG. 8B shows a fiber mesh element 84 which forms a loose plate which generally moves as a unit by viscous drag of moving air against the fibers. The fiber mesh element 84 is designed to have high stiffness due to forces applied in the plane of the fiber mesh element 84 while having high compliance when out of plane forces (such as those due to the acoustic flow) are applied. Because the fiber mesh element 84 consists of a large number of loosely arranged individual fibers, dimensional precision and in plane stiffness at the edge nearest the sensing electrodes 84, 83 is difficult to assure if the fibers in proximity to the sensing electrodes are free. This, in turn, impairs repeatable sensitivity and resistance to in-plane electrostatic attractive forces. Therefore, a thin solid frame or binding may be provided attached to the fiber mesh element 84 at the edge nearest the sensing electrodes 81, 83. Suitable fibers include metallized electrospun PMMA and carbon nanotubes, or both in combination.

The fibers may be less and 1μ, and for example may be about 500 nm diameter.

The device according to the present technology may be used not only as a sensor, but also as an actuator. In this case, for example, we may apply a small time-varying differential voltage to electrodes which will effectively modulate the system's equilibrium position about a null position. A voltage applied to the moving element electrode may be set to a value that adjusts the electrostatic stiffness to nearly any value desired, leaving the motion to be limited only by the mechanical stiffness and mass of the moving electrode.

The use of an extremely compliant and lightweight moving electrode material, such as for example, graphene, would enable actuation with very small driving voltage. This configuration permits a wide range of adjustment of the equilibrium position as a function of small changes in the driving voltage. The response of the moving electrode to changes in voltage is linear, instead of quadratic, as might otherwise be expected for a parallel plate actuator. Further, in a 4-electrode embodiment which has three static electrodes instead of two as described above, may also be used. In this case, the additional electrode provides additional ability to adjust the effective electrostatic stiffness of the moving electrode. Note that the forces may be repulsive rather than attractive as discussed in various embodiments above.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

REFERENCES

Each of the following its expressly incorporated herein by reference in its entirety:

[1] Y.-M. Chen, S.-M. He, C.-H. Huang, C.-C. Huang, W.-P. Shih, C.-L, Chu, J. Kong, J. Li, and C.-Y. Su, "Ultra-large suspended graphene as a highly elastic membrane for capacitive pressure sensors," *Nanoscale*, vol. 8, no. 6, pp, 3555-3564, 2016.

[2] C. Berger, R. Phillips, A. Centeno, A. Zurutuza, and A. Vijayaraghavan, "Capacitive pressure sensing with suspended graphene-polymer heterostructure membranes", *Nanoscale*, vol. 9, no. 44, pp. 17439-17449, 2017.

[3] J. Zhouand R. N. Miles, "Sensing fluctuating airflow with spider silk," *Proceedings of the National Academy of Sciences*, p. 201710559, 2017.

[4] R. Miles and J. Zhou, "Sound-induced motion of a nanoscale fiber," *Journal of Vibration and Acoustics*, vol. 140, no. 1, p. 011009, 2018,

[5] R. Miles and F. Degertekin, "Optical sensing in a directional mems microphone," Nov. 2, 2010, U.S. Pat. No. 7,826,629.

[6] B. Bicen, S, Jolly, K. Jeelani, C. T. Garcia, N. A. Hall, F. L. Degertekin, Q. Su, W. Cui, and R. N. Miles, "Integrated Optical Displacement Detection and Electrostatic Actuation for Directional Optical Microphones With Micromachined Biometric Diaphragms," *IEEE Sensors Journal*, vol. 9, no. 12, pp. 1933-1941, December 2009.

[7] R. N. Miles, Q. Su, W. Cui, M. Shetye, F. L. Degertekin, B. Bicen, C. Garcia, S. Jones, and N. Hall, "A low-noise differential microphone inspired by die ears of the parasitoid fly *Ormia ochracea,*" *Journal of the Acoustical Society of America*, vol. 125, no. 4, Part I, pp. 2013-2026, April 2009.

[8] M. L. Kuntzman, N. N. Hewa-Kasakarage, A. Rocha, D. Kim, and N. A. Hall, "Micromachined in-plane pressure-gradient piezoelectric microphones," *IEEE Sensors Journal*, vol. 15, no. 3, pp. 1347-1357, 2015.

[9] B.-H. Kim and H.-S. Lee, "Acoustical-thermal noise in a capacitive mems microphone," *IEEE Sensors Journal*, vol. 15, no. 12, pp. 6853-6860, 2015.

[10] L. K. Baxter, "Capacitive sensors," *Ann Arbor*, vol. 1001, p. 48109, 2000.

[11] D. K. Miu, *Mechantronics: electromechanics and contromechanics*. Springer Science & Business Media, 2012.

[12] R. Miles, "Comb sense microphone," Jun. 9, 2009, U.S. Pat. No. 7,545,945.

[13] R. N. Miles, W. Cui, Q. T. Su. and D. Homentcovschi, "A mems low-noise sound pressure gradient microphone with capacitive sensing," *Journal of Microelectromechanical Systems*, vol. 24, no. 1, pp. 241-248, 2015.

[14] S. Towfighian, S. He, and R. B. Mrad, "A low voltage electrostatic micro actuator for large out-of-plane displacement," in *ASME 2014 International Design Engineering Technical Conferences and Computers and Information in Engineering Conference, American Society of Mechanical Engineers*, 2014, pp. V004T09A015-V004T09A015.

[15] S. He, R. B. Mrad, and J. Chang, "Development of a high-performance microelectrostatic repulsive-force rotation actuator," *Journal of Microelectromechanical Systems*, vol. 19, no. 3, pp. 561-569, 2010.

[16] D. Poljak and C. A. Brebbia, *Boundary element methods for electrical engineers*. WIT Press, 2005, vol. 4.

[17] P. Morse and K. Ingard, *Theoretical Acoustics*. Princeton Univ Pr. 1986.

[18] A. London, "Transmission of reverberant sound through single walls," *J. Research Nat. Bur. of Stand*. vol. 42, no. 605, p. 2, 1949.

[19] R. N. Miles, W. Cui, Q. T. Su, and D. Homentcovschi, "A mems low-noise sound pressure gradient microphone with capacitive sensing," Journal of Microelectromechanical Systems, vol. 24, no. 1, pp. 241-248, 2015.

[20] T. T. Bringley. Analysis of the immersed boundary method for Stokes flow. PhD thesis, New York University, 2008.

[21] K. K. Charaziak and C. A. Shera, Compensating for ear-canal acoustics when measuring otoacoustic emissions. The Journal of the Acoustical Society of America, 141(1):515-531, 2017.

[22] R. Cox. The motion of long slender bodies in a viscous fluid part I. general theory. Journal of Fluid mechanics, 44(4):791-810, 1970.

[23] W. Cui, B. Bicen, N. Hall, S. Jones, F. Degertekin, and R. Miles. Optical sensing in a directional MEMS microphone inspired by the ears of the parasitoid fly, Ormia ochracea. In MEMS 2006: 19th IEEE International Conference on Micro Electro Mechanical Systems, Technical Digest, Proceedings: IEEE Micro Electro Mechanical Systems Workshop, pages 614-617, 2006., Istanbul, TURKEY, Jan. 22-26, 2006.

[24] H. Droogendijk, J. Casas, T. Steinmann, and G. Krijnen. Performance assessment of bio-inspired systems: flow sensing mems hairs. Bioinspiration & biomimetics, 10(1): 016001, 2014.

[25] T. Götz. Interactions of fibers and flow: asymptotics, theory and numerics. PhD thesis, Technical University of Kaiserslautern, 2000.

[26] K. Grosh and R. J. Littrell. Piezoelectric mems microphone, Dec. 26, 2017. U.S. Pat. No. 9,853,201.

[27] D. Homentcovschi, R. Miles, P. Loeppert, and A. Zuckerwar. A microacoustic analysis including viscosity and thermal conductivity to model the effect of the protective cap on the acoustic response of a mems microphone. Microsystem technologies, 20(2):265-272, 2014.

[27] W.-X. Huang, S. J. Shin, and H. J. Sung. Simulation of flexible filaments in a uniform flow by the immersed boundary method. Journal of Computational Physics, 226(2):2206-2228, 2007.

[28] G. Kämper and H.-U. Kleindienst. Oscillation of cricket sensory hairs in a low-frequency sound field. Journal of Comparative Physiology A, 167(2): 193-200, 1990.

[29] R. Miles. Comb sense capacitive microphone, Jun. 9, 2009. US Patent App. 2009/0262958.

[30] R. N. Miles. "A Compliant Capacitive Sensor for Acoustics: Avoiding Electrostatic Forces at High Bias Voltages." IEEE Sensors Journal 18, no. 14 (2018): 5691-5698.

[31] C. Motchenbacher and J. Connelly. Low-Noise Electronic System Design. John Wiley & Sons, Inc., 1993.

[32] L. Rosenhead. Laminar Boundary Layers: An Account of the Development, Structure, and Stability of Laminar Boundary Layers in Incompressible Fluids, Together with a Description of the Associated Experimental Techniques. Clarendon Press, 1963.

[33] M. J. Shelley and T. Ueda. The stokesian hydrodynamics of flexing, stretching filaments. Physica D: Nonlinear Phenomena, 146(1):221-245, 2000.

[34] R. Sisto, L. Cerini, F. Sanjust, and A. Moleti. Intensimetric detection of distortion product otoacoustic emissions with ear canal calibration. The Journal of the Acoustical Society of America, 142(1):EL13-EL17, 2017.

[35] G. G. Stokes. On the effect of the internal friction of fluids on the motion of pendulums, volume 9. Pitt Press, 1851.

[36] A.-K. Tornberg and K. Gustaysson. A numerical method for simulations of rigid fiber suspensions. Journal of Computational Physics, 215(1):172-196, 2006.

[37] A.-K. Tornberg and M. J. Shelley. Simulating the dynamics and interactions of flexible fibers in stokes flows. Journal of Computational Physics, 196(1):8-40, 2004.

[38] S. Towfighian and R. N. Miles. A new approach to capacitive sensing. Repulsive sensors, Sep. 1, 2016. NSF Grant I608692.

[39] B. Varanda, R. Miles, and D. Warren. Characterization of the dominant structural vibration of hearing aid receivers. Journal of Vibration and Acoustics, 138(6):061009, 2016.

[40] E. Wente. A condenser transmitter as a uniformly sensitive instrument for the absolute measurement of sound intensity. Physical Review, 10(1):39, 1917.

[41] J. Zhou, B. Li, J. Liu, W. Jones Jr., and R. Miles. Highly-damped nanofiber mesh for ultrasensitive broadband acoustic flow detection, 2018. to appear Journal of Micromechanics and Microengineering.

[42] J. Zhou and R. Miles. Directional sound detection by sensing acoustic flow, 2018. to appear IEEE Sensors.

[43] J. M. Crowley, Fundamentals of applied electrostatics. John Wiley & Sons, 1986.

[44] N. Jonassen, Electrostatics. Springer Science & Business Media, 2013.

[45] T. F. Eibert and V. Hansen, "On the calculation of potential integrals for linear source distributions on triangular domains," IEEE Transactions on Antennas and Propagation, vol. 43, no. 12, pp. 1499-1502, 1995.

[46] J. Zhou, R. N. Miles, and S. Towfighian, "A novel capacitive sensing principle for microdevices," in ASME 2015 International Design Engineering Technical Conferences and Computers and Information in Engineering Conference. American Society of Mechanical Engineers, 2015, pp. V004T09A024-V004T09A024.

What is claimed is:

1. A capacitive sensor, comprising:
   at least two conductors, isolated from each other by at least one spatial gap, each respective conductor having a respective conductor voltage potential; and
   a planar displaceable element configured to move along an axis of displacement having a directional component crossing the spatial gap selectively responsive to a sensed condition, the displaceable element having a displaceable element voltage potential;

the at least two conductors and the displaceable element establishing an electrostatic field occupying a region proximate to the at least two conductors, the displaceable element, and the at least one spatial gap, based on the respective conductor voltage potentials and the displaceable element voltage potential, a charge distribution between the at least two conductors and the displaceable element being electrically responsive to a perturbation of the electrostatic field by a movement of the displaceable element with respect to the at least two conductors, wherein the at least two conductors and the displaceable element are configured such that over a range of the movement of the displaceable element with respect to the at least two conductors, the electrostatic field produces an electrostatic force in a plane of the displaceable element and does not substantially alter a responsivity of displacement of the displaceable element to the sensed condition due to an electrostatic force variation dependent on a displacement of the displaceable element, and the electrostatic field does not cause pull-in instability due to a diminishing distance between the displaceable element and one of the at least two conductors having an opposite charge.

2. The capacitive sensor according to claim 1, wherein:
the at least one spatial gap comprises a linear spatial gap;
the at least two conductors comprise a pair of fixed conductors, separated by the linear spatial gap, each of the pair of fixed conductors being maintained at the respective conductor voltage potential, the electrostatic field in a space above the pair of fixed conductors having a major field vector component directed across the linear spatial gap dependent on a difference between the respective conductor voltage potentials of the pair of fixed conductors, and the displaceable element comprises a charged element configured with the axis of displacement having a vector component directed across the linear spatial gap, such that a force imposed on the displaceable element due to the electrostatic field is insensitive to a state of displacement of the displaceable element in response to the sensed condition.

3. The capacitive sensor according to claim 1, wherein the displaceable element comprises a cantilever supported diaphragm.

4. The capacitive sensor according to claim 1, wherein the displaceable element comprises at least one of a perforated diaphragm, a fiber mesh, a fiber mat, metallized electrospun fiber, carbon nanotubes, and graphene.

5. The capacitive sensor according to claim 1, wherein the respective voltage potential at each of the at least two conductors is maintained at predefined potential by a respective transimpedance amplifier while a change in charge is induced on the respective at least two conductors by a movement of the displaceable element.

6. The capacitive sensor according to claim 1, wherein the capacitive sensor comprises a microphone, and the displaceable element has an amplitude of movement corresponding to an acoustic wave.

7. A method of sensing a vibration, comprising:
providing at least two separated conductive surfaces each having a respective conductive surface voltage potential, and a deflectable element having a null position and an axis of deflection perpendicular to a force generated by the at least two separated conductive surfaces on the deflectable element based on an induced voltage potential on the deflectable element with respect to the respective conductive surface voltage potential of the at least two conductive surfaces; and sensing a change in induced charge on the at least two conductive surfaces resulting from deflection of the deflectable element along the axis of deflection due to a vibration, wherein the at least two separated conductive surfaces and the deflectable element are configured such that the force generated by the at least two separated conductive surfaces on the deflectable element acts normal to the axis of deflection, provides a restoring force for returning the deflectable element to the null position, and does not substantially alter a deflection of the deflectable element.

8. A sensor comprising:
two conductors, each conductor of the two conductors having a planar surface;
a displaceable electrode configured for movement relative to the two conductors in response to an external condition to be sensed;
a voltage source configured to supply a bias voltage, the bias voltage establishing an electrostatic field in a space between the displaceable electrode and the planar surfaces of the two conductors dependent on a voltage potential of each of the two conductors and a voltage potential of the displaceable electrode; and
a circuit configured to determine a change in charge of the two conductors due to a displacement of the displaceable electrode with respect to the two conductors,
wherein:
the displaceable electrode has a thickness along an axis of movement and a length along an axis orthogonal to the axis of movement;
the length and the thickness are chosen such that the displaceable electrode is compliant and deflects in response to a sensed condition force along the axis of movement; and
the two conductors and the displaceable electrode are oriented such that the length of the displaceable electrode is orthogonal to the planar surfaces of the two conductors, to thereby induce an electrostatic force orthogonal to the axis of movement.

9. The sensor of claim 8, wherein the displaceable electrode is positioned and oriented relative to the two conductors such that the electrostatic force arising from the electrostatic field acts as a restoring force to return the displaceable electrode to an equilibrium position.

10. The sensor of claim 8, further comprising a further conductor disposed between the two conductors, wherein the voltage source is further configured to supply a bias voltage to the further conductor.

11. The sensor of claim 10, wherein:
the two conductors are biased via the voltage source at different voltages relative to the displaceable electrode; and
the further conductor is biased via the voltage source at an intermediate potential.

12. The sensor of claim 10, wherein:
the two conductors are biased via the voltage source such that the electrostatic force is a net attractive force on the displaceable electrode; and
the further conductor is biased to establish a repulsive electrostatic force on the displaceable electrode.

13. The sensor of claim 8, wherein the displaceable electrode is compliantly supported by a hinge.

14. The sensor of claim 8, wherein:
the displaceable electrode comprises a planar diaphragm; and
the planar diaphragm comprises a plurality of apertures such that the external condition to be sensed comprises viscous drag of air flowing through the plurality of apertures.

15. The sensor of claim 8, wherein the planar surfaces of the two conductors are coplanar.

16. The sensor of claim 8, wherein:
the two conductors are separated by a gap; and
the displaceable electrode has an equilibrium position disposed in the gap.

17. The sensor of claim 8, wherein the voltage potential of each of the two conductors differs by at least 50V from a voltage potential of the displaceable electrode.

18. The sensor of claim 8, wherein the circuit comprises at least one transimpedance amplifier configured to sense a change in charge between the two conductors.

19. The sensor of claim 8, wherein a potential at each of the two conductors is maintained at ground potential by a respective transimpedance amplifier while a change in charge is induced on the respective conductive surfaces by a movement of the displaceable electrode.

20. The sensor of claim 8, wherein the displaceable electrode is configured for movement relative to the two conductors selectively responding and corresponding to vibrations of an acoustic wave.

\* \* \* \* \*